United States Patent
Joei et al.

(10) Patent No.: US 11,515,360 B2
(45) Date of Patent: Nov. 29, 2022

(54) IMAGING DEVICE, STACKED IMAGING DEVICE, AND SOLID-STATE IMAGING APPARATUS

(71) Applicant: SONY SEMICONDUCTOR SOLUTIONS CORPORATION, Kanagawa (JP)

(72) Inventors: Masahiro Joei, Kanagawa (JP); Kenichi Murata, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 67 days.

(21) Appl. No.: 17/058,002

(22) PCT Filed: May 10, 2019

(86) PCT No.: PCT/JP2019/018666
§ 371 (c)(1),
(2) Date: Nov. 23, 2020

(87) PCT Pub. No.: WO2019/235130
PCT Pub. Date: Dec. 12, 2019

(65) Prior Publication Data
US 2021/0202581 A1 Jul. 1, 2021

(30) Foreign Application Priority Data

Jun. 8, 2018 (JP) .............................. JP2018-110560

(51) Int. Cl.
*H01L 27/146* (2006.01)
*H01L 27/30* (2006.01)
(Continued)

(52) U.S. Cl.
CPC .......... *H01L 27/307* (2013.01); *H01L 27/286* (2013.01); *H01L 51/4253* (2013.01); *H01L 51/442* (2013.01); *H01L 27/14647* (2013.01)

(58) Field of Classification Search
CPC ............. H01L 27/14665; H01L 27/307; H01L 51/0072; H01L 27/14636; H01L 27/146;
(Continued)

(56) References Cited

U.S. PATENT DOCUMENTS

2006/0118795 A1* 6/2006 Araki ................ H01L 27/14634
257/83
2016/0037098 A1 2/2016 Lee et al.
(Continued)

FOREIGN PATENT DOCUMENTS

CN 105448940 A * 3/2016
JP 2017-055085 3/2017
(Continued)

OTHER PUBLICATIONS

International Search Report and Written Opinion prepared by the Japanese Patent Office dated Jul. 5, 2019, for International Application No. PCT/JP2019/018666.

*Primary Examiner* — Samuel Park
(74) *Attorney, Agent, or Firm* — Sheridan Ross P.C.

(57) ABSTRACT

An imaging device includes: a first electrode; a charge storage electrode disposed at a distance from the first electrode; a photoelectric conversion layer in contact with the first electrode and above the charge storage electrode, with an insulating layer between the charge storage electrode and the photoelectric conversion layer; and a second electrode on the photoelectric conversion layer. The portion of the insulating layer between the charge storage electrode and the photoelectric conversion layer includes a first region and a second region, the first region is formed with a first insulating layer, the second region is formed with a second
(Continued)

insulating layer, and the absolute value of the fixed charge of the material forming the second insulating layer is smaller than the absolute value of the fixed charge of the material forming the first insulating layer.

11 Claims, 95 Drawing Sheets

(51) Int. Cl.
*H01L 27/28* (2006.01)
*H01L 51/42* (2006.01)
*H01L 51/44* (2006.01)

(58) Field of Classification Search
CPC ... H01L 51/006; H01L 51/42; H01L 51/5016; H01L 51/5056; H01L 27/286; H01L 51/4253; H01L 51/442; H01L 27/14647; H01L 27/14605; H01L 27/14607; H01L 27/14612; H01L 27/14623; H01L 27/14627; H01L 27/14638; H01L 27/14667; H01L 21/8234; H01L 27/06; H01L 27/088; H01L 27/14687; H01L 27/14632; H01L 27/30; H01L 31/02; H01L 31/10; Y02E 10/549; H04N 5/369
See application file for complete search history.

(56) References Cited

U.S. PATENT DOCUMENTS

| | | |
|---|---|---|
| 2017/0162617 A1 | 6/2017 | Takahashi et al. |
| 2018/0076252 A1 | 3/2018 | Togashi et al. |
| 2018/0324369 A1 | 11/2018 | Murata |

FOREIGN PATENT DOCUMENTS

| | | | | |
|---|---|---|---|---|
| JP | 2017055085 A * | 3/2017 | | |
| JP | 2017-108101 | 6/2017 | | |
| JP | 2017-157816 | 9/2017 | | |
| WO | WO-2012117670 A1 * | 9/2012 | ....... | H01L 27/14638 |
| WO | WO 2017/086180 | 5/2017 | | |
| WO | WO 2018/235895 | 12/2018 | | |

* cited by examiner

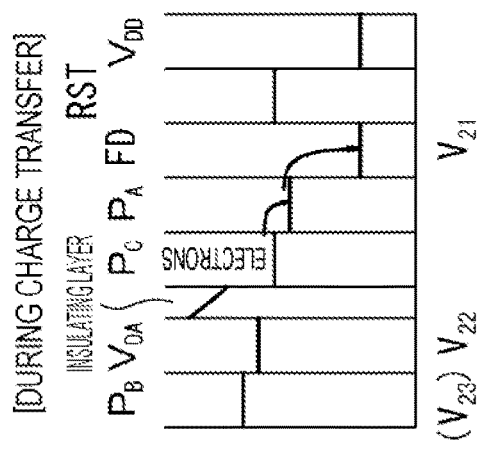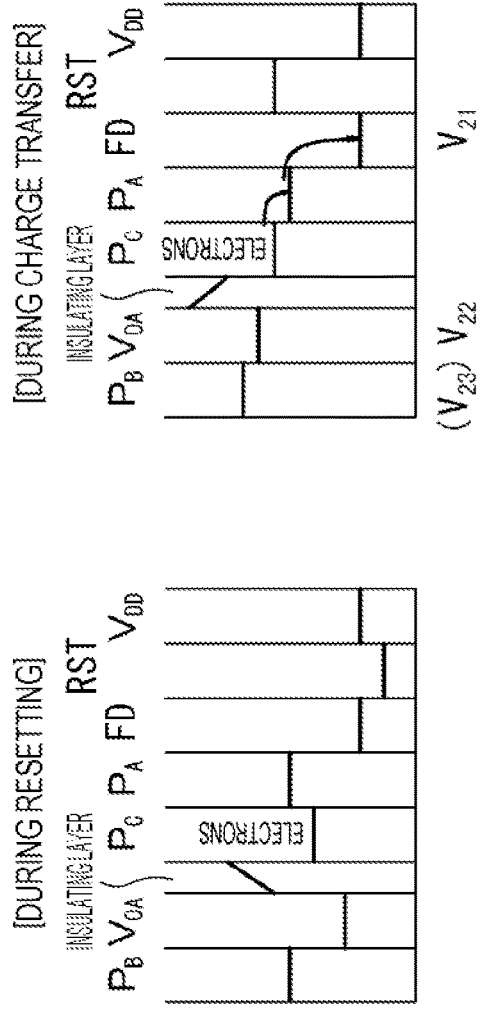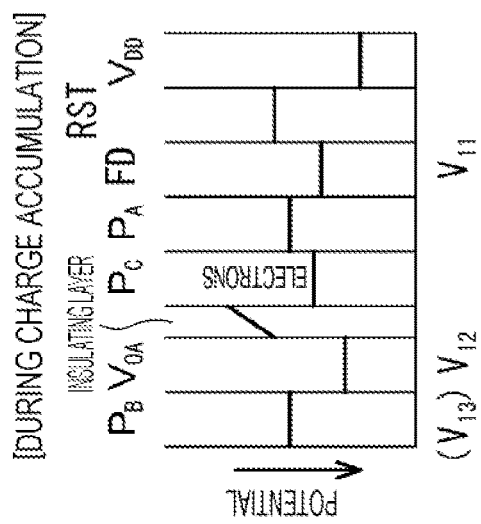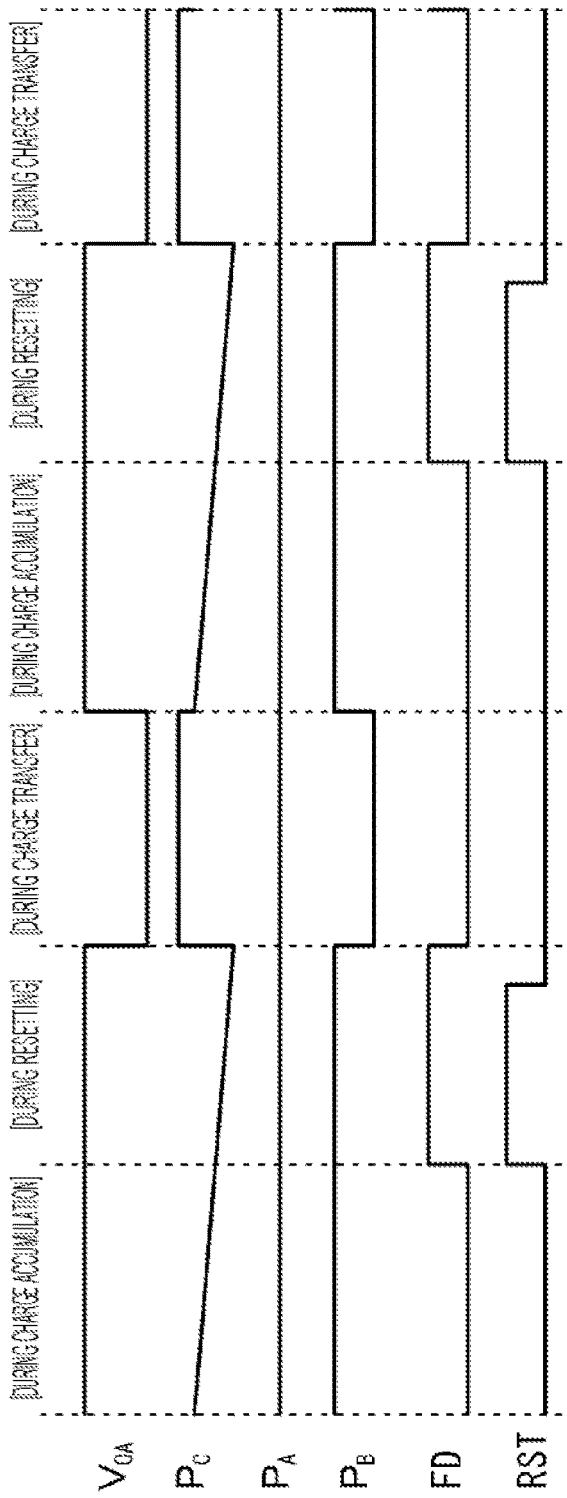
FIG. 18

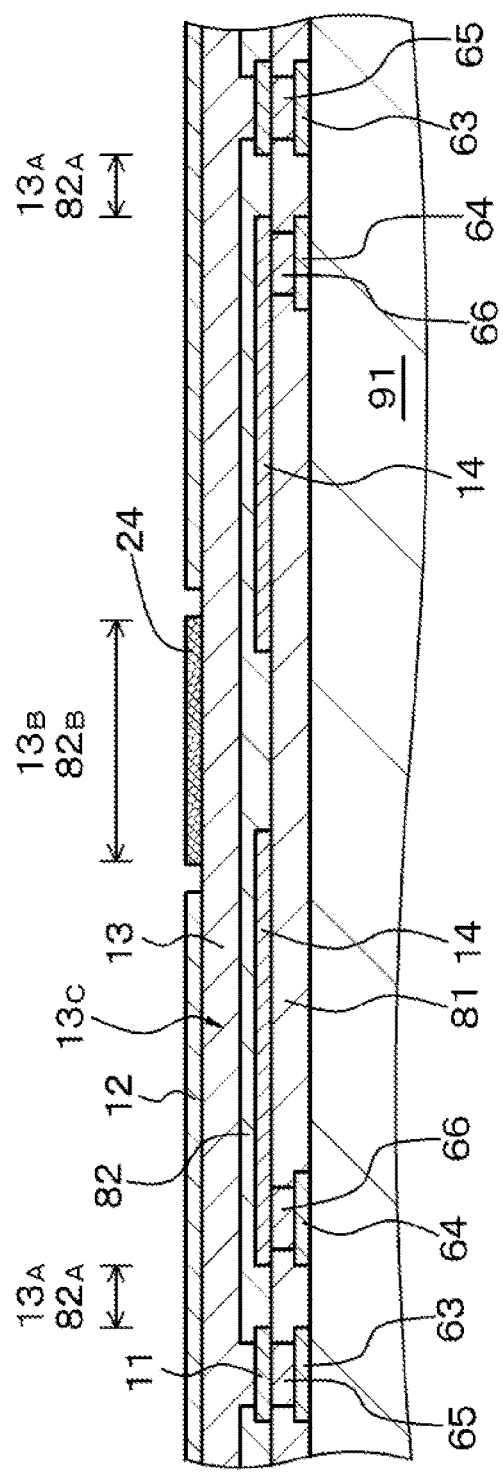
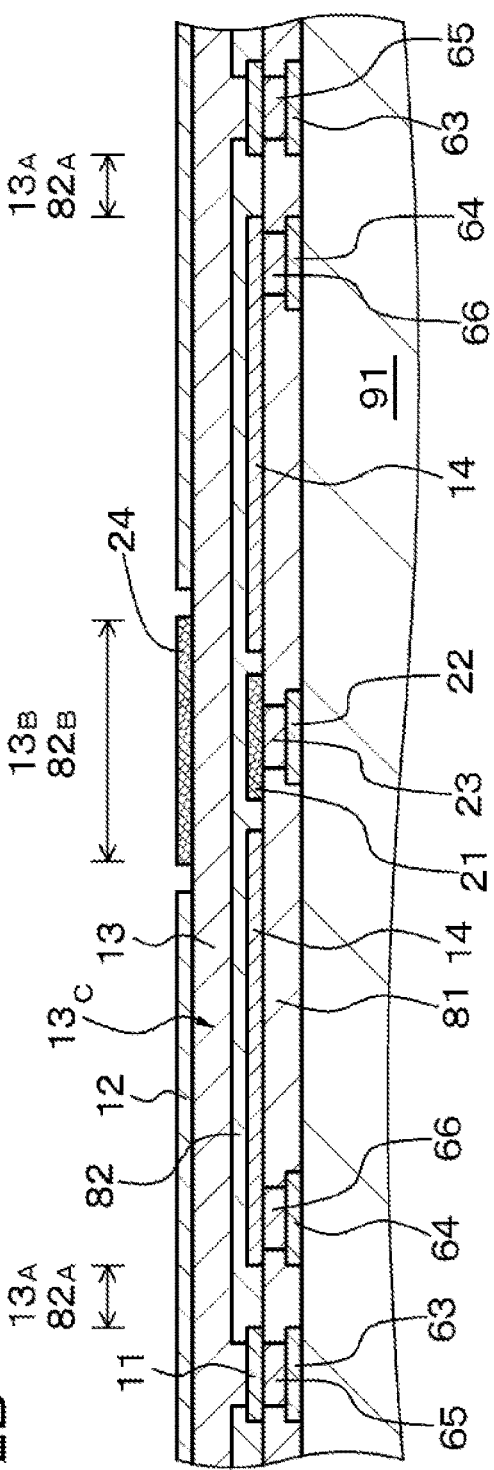
FIG. 32A
FIG. 32B

CHARGE STORAGE ELECTRODE SIDE

FIG. 86

IMAGING DEVICE, STACKED IMAGING DEVICE, AND SOLID-STATE IMAGING APPARATUS

CROSS REFERENCE TO RELATED APPLICATIONS

This application is a national stage application under 35 U.S.C. 371 and claims the benefit of PCT Application No. PCT/JP2019/018666 having an international filing date of 10 May 2019, which designated the United States, which PCT application claimed the benefit of Japanese Patent Application No. 2018-110560 filed 8 Jun. 2018, the entire disclosures of each of which are incorporated herein by reference.

TECHNICAL FIELD

The present disclosure relates to an imaging device, a stacked imaging device, and a solid-state imaging apparatus.

BACKGROUND ART

An imaging device using an organic semiconductor material for its photoelectric conversion layer can photoelectrically convert a specific color (wavelength band). In a case where such imaging devices are used in a solid-state imaging apparatus, because of such characteristics, it then becomes possible to obtain a structure (a stacked imaging device) in which subpixels are stacked, which is not possible in a conventional solid-state imaging apparatus in which an on-chip color filter (OCCF) and an imaging device constitute a subpixel, and subpixels are two-dimensionally arranged (see Japanese Patent Application Laid-Open No. 2011-138927, for example). Furthermore, there is an advantage that any false color does not appear, as demosaicing is not required. Note that, in the description below, an imaging device that is disposed on or above a semiconductor substrate and includes a photoelectric conversion unit may be referred to as a "first-type imaging device" for the sake of convenience, a photoelectric conversion unit forming a first-type imaging device may be referred to as a "first-type photoelectric conversion unit" for the sake of convenience, an imaging device disposed in the semiconductor substrate may be referred to as a "second-type imaging device" for the sake of convenience, and a photoelectric conversion unit forming a second-type imaging device may be referred to as a "second-type photoelectric conversion unit" for the sake of convenience.

FIG. 95 shows an example structure of a stacked imaging device (a stacked solid-state imaging apparatus) disclosed in Japanese Patent Application Laid-Open No. 2017-157816. In the example shown in FIG. 95, a third photoelectric conversion unit 331 and a second photoelectric conversion unit 321 that are the second-type photoelectric conversion units forming a third imaging device 330 and a second imaging device 320 that are second-type imaging devices are stacked and formed in a semiconductor substrate 370. Further, a first photoelectric conversion unit 310' that is a first-type photoelectric conversion unit is disposed above the semiconductor substrate 370 (specifically, above the second imaging device 320). Here, the first photoelectric conversion unit 310' includes a first electrode 311, a photoelectric conversion layer 313 formed with an organic material, and a second electrode 312, and forms a first imaging device 310 that is a first-type imaging device. Further, a charge storage electrode 314 is provided at a distance from the first electrode 311, and the photoelectric conversion layer 313 is located above the charge storage electrode 314 with an insulating layer 382 interposed in between. The second photoelectric conversion unit 321 and the third photoelectric conversion unit 331 photoelectrically convert blue light and red light, respectively, for example, depending on a difference in absorption coefficient. Meanwhile, the first photoelectric conversion unit 310' photoelectrically converts green light, for example.

After temporarily stored in the second photoelectric conversion unit 321 and the third photoelectric conversion unit 331, the electric charges generated through the photoelectric conversion in the second photoelectric conversion unit 321 and the third photoelectric conversion unit 331 are transferred to a second floating diffusion layer $FD_2$ and a third floating diffusion layer $FD_3$ by a vertical transistor (shown as a gate portion 322) and a transfer transistor (shown as a gate portion 332), respectively, and are further output to an external readout circuit (not shown). These transistors and the floating diffusion layers $FD_2$ and $FD_3$ are also formed in the semiconductor substrate 370.

The electric charges generated through photoelectric conversion in the first photoelectric conversion unit 310' are attracted to the charge storage electrode 314 during charge accumulation, and are stored into the photoelectric conversion layer 313. During charge transfer, the electric charges stored in the photoelectric conversion layer 313 are stored into the first floating diffusion layer $FD_1$ formed in the semiconductor substrate 370 via the first electrode 311, a contact hole portion 361, and a wiring layer 362. The first photoelectric conversion unit 310' is also connected to a gate portion 318 of an amplification transistor that converts a charge amount into a voltage, via the contact hole portion 361 and the wiring layer 362. The first floating diffusion layer $FD_1$ then forms part of a reset transistor (shown as a gate portion 317). Note that reference numeral 371 indicates a device separation region, reference numeral 372 indicates an oxide film formed on the surface of the semiconductor substrate 370, reference numerals 376 and 381 indicate interlayer insulating layers, reference numeral 383 indicates a protective layer, and reference numeral 390 indicates an on-chip microlens. Further, reference numbers 63, 64, 65, 66, and 81 will be described later in Example 6.

CITATION LIST

Patent Document

Patent Document 1: Japanese Patent Application Laid-Open No. 2017-157816

SUMMARY OF THE INVENTION

Problems to be Solved by the Invention

Although the imaging device disclosed in the patent publication described above has excellent characteristics, more reliable transfer of electric charges stored in the photoelectric conversion layer 313 to the first electrode 311 is required during charge transfer.

Therefore, an object of the present disclosure is to provide an imaging device having a configuration and a structure that enable more reliable transfer of electric charges accumulated in a photoelectric conversion layer to a first electrode during charge transfer, a stacked imaging device including the imaging device, and a solid-state imaging apparatus including the imaging device or the stacked imaging device.

Solutions to Problems

An imaging device according to a first embodiment of the present disclosure for achieving the above object includes:
a first electrode;
a charge storage electrode disposed at a distance from the first electrode;
a photoelectric conversion layer that is formed in contact with the first electrode and is located above the charge storage electrode, with an insulating layer being interposed between the charge storage electrode and the photoelectric conversion layer; and
a second electrode formed on the photoelectric conversion layer, in which
the portion of the insulating layer located between the charge storage electrode and the photoelectric conversion layer includes a first region and a second region,
the portion of the insulating layer that occupies the first region is formed with a first insulating layer,
the portion of the insulating layer that occupies the second region is formed with a second insulating layer, and
the absolute value of the fixed charge of the material forming the second insulating layer is smaller than the absolute value of the fixed charge of the material forming the first insulating layer.

An imaging device according to a second embodiment of the present disclosure for achieving the above object includes:
a first electrode;
a charge storage electrode disposed at a distance from the first electrode;
a photoelectric conversion layer that is formed in contact with the first electrode and is located above the charge storage electrode, with an insulating layer being interposed between the charge storage electrode and the photoelectric conversion layer; and
a second electrode formed on the photoelectric conversion layer, in which
an insulating material layer is provided between the first electrode and the charge storage electrode, and
the material forming the insulating material layer has a different polarity from the polarity of carriers to be generated in the photoelectric conversion layer and be sent to the first electrode.

An imaging device according to a third embodiment of the present disclosure for achieving the above object includes:
a first electrode;
a charge storage electrode disposed at a distance from the first electrode;
a photoelectric conversion layer that is formed in contact with the first electrode and is located above the charge storage electrode, with an insulating layer being interposed between the charge storage electrode and the photoelectric conversion layer; and
a second electrode formed on the photoelectric conversion layer, in which
an insulating material layer is formed in contact with at least part of the portion of the charge storage electrode not facing the first electrode, and the material forming the insulating material layer has the same polarity as the polarity of carriers to be generated in the photoelectric conversion layer and be sent to the first electrode.

A stacked imaging device of the present disclosure for achieving the above object includes at least one imaging device according to the first to third embodiments of the present disclosure.

A solid-state imaging apparatus according to the first embodiment of the present disclosure for achieving the above object includes a plurality of imaging devices according to the first to third embodiments of the present disclosure. Further, a solid-state imaging apparatus according to the second embodiment of the present disclosure for achieving the above object includes a plurality of stacked imaging devices of the present disclosure.

BRIEF DESCRIPTION OF DRAWINGS

FIG. 18 is a diagram schematically showing the states of the potentials at respective portions during an operation of an imaging device of Example 6.

FIGS. 32A and 32B are schematic cross-sectional views of part of a modification of an imaging device (two imaging devices arranged side by side) of Example 7 (Modification 4A and Modification 4B of Example 7).

FIG. 86 is a schematic partial cross-sectional view of yet another modification of an imaging device and a stacked imaging device of Example 6.

MODES FOR CARRYING OUT THE INVENTION

Figure 1A:
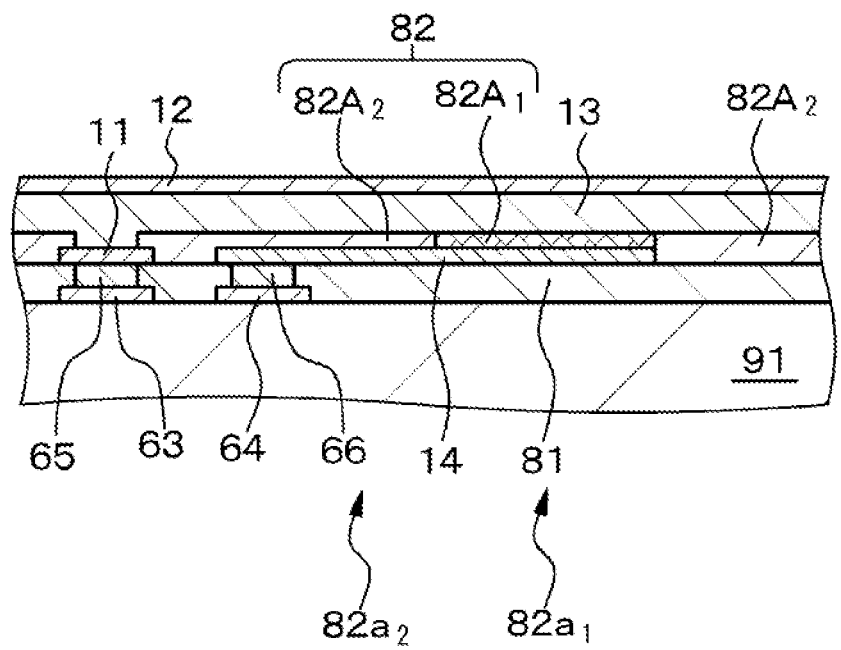
FIGS. 1A and 1B are schematic partial cross-sectional views of an imaging device of Example 1 and a modification thereof.

The following is a description of the present disclosure based on embodiments, with reference to the drawings. However, the present disclosure is not limited to the embodiments, and the various numerical values and materials mentioned in the embodiments are merely examples. Note that explanation will be made in the following order.

1. General description of imaging devices and stacked imaging devices according to first to third embodiments of the present disclosure, and solid-state imaging apparatuses according to the first and second embodiments of the present disclosure 2. Example 1 (an imaging device according to the first embodiment of the present disclosure, and an imaging device according to a first embodiment A of the present disclosure)

3. Example 2 (an imaging device according to a first embodiment B of the present disclosure)

4. Example 3 (an imaging device according to a first embodiment C of the present disclosure)

5. Example 4 (an imaging device according to the second embodiment of the present disclosure)

6. Example 5 (an imaging device according to the third embodiment of the present disclosure)

7. Example 6 (a stacked imaging device of the present disclosure, and a solid-state imaging apparatus according to the second embodiment of the present disclosure)

8. Example 7 (a stacked imaging device of the present disclosure, and a solid-state imaging apparatus according to the second embodiment of the present disclosure)

9. Example 8 (modifications of imaging devices of Examples 6 and 7)

10. Example 9 (modifications of Examples 6 to 8, and a solid-state imaging apparatus according to the first embodiment of the present disclosure)

11. Example 10 (modifications of Examples 6 to 9, and an imaging device including a transfer control electrode)

12. Example 11 (modifications of Examples 6 to 10, and an imaging device including a plurality of charge storage electrode segments)

13. Example 12 (imaging devices of first and sixth configurations)

14. Example 13 (imaging devices of second and sixth configurations of the present disclosure)

15. Example 14 (an imaging device of a third configuration)

16. Example 15 (an imaging device of a fourth configuration)

17. Example 16 (an imaging device of a fifth configuration)

18. Example 17 (an imaging device of the sixth configuration)

19. Example 18 (solid-state imaging apparatuses of the first and second configurations)

20. Example 19 (a modification of Example 18)

21. Other aspects

<General Description of Imaging Devices and Stacked Imaging Devices According to First to Third Embodiments of the Present Disclosure, and Solid-State Imaging Apparatuses According to the First and Second Embodiments of the Present Disclosure>

An imaging device according to a first embodiment of the present disclosure, an imaging device according to the first embodiment of the present disclosure forming a stacked imaging device, and an imaging device according to the first embodiment of the present disclosure forming a solid-state imaging apparatus according to the first or second embodiment of the present disclosure will be hereinafter collectively referred to as "imaging devices or the like according to the first embodiment of the present disclosure" in some cases. Also, an imaging device according to a second embodiment of the present disclosure, an imaging device according to the second embodiment of the present disclosure forming a stacked imaging device, and an imaging device according to the second embodiment of the present disclosure forming a solid-state imaging apparatus according to the first or second embodiment of the present disclosure will be hereinafter collectively referred to as "imaging devices or the like according to the second embodiment of the present disclosure" in some cases. Further, an imaging device according to a third embodiment of the present disclosure, an imaging device according to the third embodiment of the present disclosure forming a stacked imaging device, and an imaging device according to the third embodiment of the present disclosure forming a solid-state imaging apparatus according to the first or second embodiment of the present disclosure will be hereinafter collectively referred to as "imaging devices or the like according to the third embodiment of the present disclosure" in some cases.

In an imaging device or the like according to the first embodiment of the present disclosure, a second region may be located facing a first electrode, and a first region may be located adjacent to the second region. Note that an imaging device or the like according to the first embodiment of the present disclosure in such a mode may be referred to as an "imaging device or the like according to the first embodiment A of the present disclosure", for the sake of convenience. Further, in an imaging device or the like according to the first embodiment A of the present disclosure, the material forming a first insulating layer may have the same polarity as the polarity of carriers to be generated in a photoelectric conversion layer and be sent to a first electrode.

Furthermore, the carriers to be sent to the first electrode may be electrons, the first insulating layer may be formed with at least one material selected from the group including aluminum oxide, hafnium oxide, zirconium oxide, tantalum oxide, and titanium oxide, and a second insulating layer may be formed with silicon oxide. Further, in these cases, a second insulating layer extension portion extending from the second insulating layer may be formed between the first insulating layer and the photoelectric conversion layer. Note that, in a case where the carriers to be sent to the first electrode are holes, the first insulating layer may be formed with silicon oxynitride or silicon nitride, and the second insulating layer may be formed with silicon oxide.

Where the area of the first region is represented by $S_1$, and the area of the second region is represented by $S_2$, in the imaging device or the like according to the first embodiment A of the present disclosure, it is preferable to satisfy $$0.1 \leq S_2/(S_1+S_2) \leq 0.9$$

Alternatively, in an imaging device or the like according to the first embodiment of the present disclosure, the first region may be located facing the first electrode, and the second region may be located adjacent to the first region. Note that an imaging device or the like according to the first embodiment of the present disclosure in such a mode may be referred to as an "imaging device or the like according to a first embodiment B of the present disclosure", for the sake of convenience. Further, in an imaging device or the like according to the first embodiment B of the present disclosure, the material forming the first insulating layer may have a different polarity from the polarity of carriers to be generated in the photoelectric conversion layer and be sent to the first electrode.

Furthermore, the carriers to be sent to the first electrode may be electrons, the first insulating layer may be formed with silicon oxynitride or silicon nitride, and the second insulating layer may be formed with silicon oxide. Further, in these cases, a second insulating layer extension portion extending from the second insulating layer may be formed between the first insulating layer and the photoelectric conversion layer. Note that, in a case where the carriers to be sent to the first electrode are holes, the first insulating layer may be formed with at least one material selected from the group including aluminum oxide, hafnium oxide, zirconium oxide, tantalum oxide, and titanium oxide, and the second insulating layer may be formed with silicon oxide.

In the imaging device or the like according to the first embodiment B of the present disclosure, it is preferable to satisfy $$0.1 \leq S_2/(S_1+S_2) \leq 0.9$$

Alternatively, in an imaging device or the like according to the first embodiment of the present disclosure, the portion of the insulating layer located between the charge storage electrode and the photoelectric conversion layer may further have a third region, the first region may be located facing the first electrode, the third region may be located adjacent to the first region, the second region may be located between the first region and the photoelectric conversion layer, and between the third region and the photoelectric conversion layer, the portion of the insulating layer that occupies the third region may be formed with a third insulating layer, and the absolute value of the fixed charge of the material forming the second insulating layer may be smaller than the absolute value of the fixed charge of the material forming the third insulating layer. Note that an imaging device or the like according to the first embodiment of the present disclosure in such a mode may be referred to as an "imaging device or the like according to a first embodiment C of the present disclosure", for the sake of convenience. Further, in an imaging device or the like according to the first embodiment C of the present disclosure, the material forming the first insulating layer may have a different polarity from the polarity of carriers to be generated in the photoelectric conversion layer and be sent to the first electrode, and the material forming the third insulating layer may have the same polarity as the polarity of the carriers to be generated in the photoelectric conversion layer and be sent to the first electrode.

Furthermore, the carriers to be sent to the first electrode may be electrons, the first insulating layer may be formed with silicon oxynitride or silicon nitride, the third insulating layer may be formed with at least one material selected from the group including aluminum oxide, hafnium oxide, zirconium oxide, tantalum oxide, and titanium oxide, and the second insulating layer may be formed with silicon oxide. Note that, in a case where the carriers to be sent to the first electrode are holes, the first insulating layer may be formed with at least one material selected from the group including aluminum oxide, hafnium oxide, zirconium oxide, tantalum oxide, and titanium oxide, the third insulating layer may be formed with silicon oxynitride or silicon nitride, and the second insulating layer may be formed with silicon oxide.

Where the area of the third region is represented by $S_3$, in the imaging device or the like according to the first embodiment C of the present disclosure, it is preferable to satisfy $$0.1 \leq S_1/(S_1+S_3) \leq 0.9$$

In an imaging device or the like according to the first embodiment of the present disclosure, a fixed charge can be measured by a CV measurement method based on a nanoprobing technology. That is, a flat band voltage can be obtained from CV measurement, to evaluate the fixed charge amount.

Further, in an imaging device or the like according to the first embodiment of the present disclosure including an imaging device or the like according to the first embodiment A of the present disclosure, an imaging device or the like according to the first embodiment B of the present disclosure, and an imaging device or the like according to the first embodiment C of the present disclosure described above, an insulating material layer (which may be referred to as the "first insulating material layer", for the sake of convenience) may be provided between the first electrode and the charge storage electrode, and the material forming the insulating material layer (the first insulating material layer) may have a different polarity from the polarity of carriers to be generated in the photoelectric conversion layer and be sent to the first electrode. That is, such a mode is a combination of an imaging device or the like according to the first embodiment of the present disclosure and an imaging device or the like according to the second embodiment of the present disclosure.

Further, in an imaging device or the like according to the first embodiment of the present disclosure including the preferred mode described above, an imaging device or the like according to the first embodiment A of the present disclosure, an imaging device or the like according to the first embodiment B of the present disclosure, and an imaging device or the like according to the first embodiment C of the present disclosure described above, a second insulating material layer may be provided in contact with at least part of the portion of the charge storage electrode not facing the first electrode, and the material forming the second insulating material layer may have the same polarity as the polarity of carriers to be generated in the photoelectric conversion layer and be sent to the first electrode. That is, such a mode is a combination of an imaging device or the like according to the first embodiment of the present disclosure and an imaging device or the like according to the third embodiment of the present disclosure. Furthermore, it is possible to combine, as appropriate, an imaging device or the like according to the first embodiment of the present disclosure, an imaging device or the like according to the second embodiment of the present disclosure, and an imaging device or the like according to the third embodiment of the present disclosure.

In an imaging device or the like according to the second embodiment of the present disclosure, the insulating layer may extend at least along a portion between the photoelectric conversion layer and the insulating material layer. Further, in an imaging device or the like according to the second embodiment of the present disclosure including such a mode, a second insulating material layer may be provided in contact with at least part of the portion of the charge storage electrode not facing the first electrode, and the material forming the second insulating material layer may have the same polarity as the polarity of carriers to be generated in the photoelectric conversion layer and be sent to the first electrode.

Furthermore, the carriers to be sent to the first electrode may be electrons, the insulating material layer may be formed with silicon oxynitride or silicon nitride, and the second insulating material layer may be formed with at least one material selected from the group including aluminum oxide, hafnium oxide, zirconium oxide, tantalum oxide, and titanium oxide. Note that, in a case where the carriers to be sent to the first electrode are holes, the insulating material layer may be formed with at least one material selected from the group including aluminum oxide, hafnium oxide, zirconium oxide, tantalum oxide, and titanium oxide, and the second insulating material layer may be formed with silicon oxynitride or silicon nitride.

In an imaging device or the like according to the third embodiment of the present disclosure, the carriers to be sent to the first electrode may be electrons, and the insulating material layer may be formed with at least one material selected from the group including aluminum oxide, hafnium oxide, zirconium oxide, tantalum oxide, and titanium oxide. Note that, in a case where the carriers to be sent to the first electrode are holes, the insulating material layer may be formed with silicon oxynitride or silicon nitride.

In imaging devices according to the first to third embodiments of the present disclosure including the various preferred modes described above, imaging devices according to the first to third embodiments of the present disclosure forming stacked imaging devices, and imaging devices according to the first to third embodiments of the present disclosure forming solid-state imaging apparatuses according to the first and second embodiments of the present disclosure (these imaging devices will be hereinafter collectively referred to as "imaging devices or the like of the present disclosure" in some cases), the at least one material selected from the group including aluminum oxide ($Al_2O_3$), hafnium oxide ($HfO_2$), zirconium oxide ($ZrO_2$), tantalum oxide ($Ta_2O_5$), and titanium oxide ($TiO_2$) may be replaced with lanthanum oxide ($La_2O_3$), praseodymium oxide ($Pr_2O_3$), cerium oxide ($CeO_2$), a neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), hafnium nitride, aluminum nitride, hafnium oxynitride, or aluminum oxynitride.

Further, in an imaging device or the like of the present disclosure including the various preferred modes described above, a silicon oxide material in a broad term may be used, instead of silicon oxide. Here, examples of silicon oxide materials include not only silicon oxide ($SiO_X$), but also BPSG, PSG, BSG, AsSG, PbSG, spin-on glass (SOG), and low-dielectric-constant materials (polyarylethers, cycloperfluorocarbon polymers, benzocyclobutene, cyclic fluorine resin, polytetrafluoroethylene, fluorinated aryl ether, fluorinated polyimide, amorphous carbon, and organic SOG, for example). Alternatively, instead of silicon oxide, it is possible to use any of organic insulating materials (organic polymers) that are typically straight-chain hydrocarbons having a functional group capable of binding to a control electrode at one end, such as: polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); novolac-type phenolic resins; fluorocarbon resins; octadecanethiol; and dodecylisocyanate, for example. Combinations of these materials may also be used.

Examples of methods for forming the insulating layer, the first insulating layer, the second insulating layer, and the third insulating layer include various CVD methods, various PVD methods, and ALD methods.

In an imaging device or the like of the present disclosure including the preferred modes described above, a control unit that is disposed in the semiconductor substrate, and includes a drive circuit may be further provided, the first electrode and the charge storage electrode may be connected to the drive circuit, in a charge accumulation period, the drive circuit may apply a potential $V_{11}$ to the first electrode, and a potential $V_{12}$ to the charge storage electrode, to accumulate electric charges in the photoelectric conversion layer, and, in a charge transfer period, the drive circuit may apply a potential $V_{21}$ to the first electrode, and a potential $V_{22}$ to the charge storage electrode, to read the electric charges accumulated in the photoelectric conversion layer into the control unit via the first electrode. However, in a case where the potential of the first electrode is higher than the potential of the second electrode, $V_{12} \geq V_{11}$, and $V_{22} < V_{21}$, and, in a case where the potential of the first electrode is lower than the potential of the second electrode, $$V_{12} \leq V_{11}, \text{ and } V_{22} > V_{21}.$$

Further, in an imaging device or the like of the present disclosure including the various preferred modes described above, a charge transfer control electrode (a lower charge transfer control electrode) may be formed in a region that faces, via the insulating layer, the region of the photoelectric conversion layer located between the imaging device and an adjacent imaging device. Furthermore, in this case, a control unit that is disposed in the semiconductor substrate and includes a drive circuit may be further provided, the first electrode, the second electrode, the charge storage electrode, and the charge transfer control electrode may be connected to the drive circuit, in a charge accumulation period, the drive circuit may apply a potential $V_{11}$ to the first electrode, a potential $V_{12}$ to the charge storage electrode, and a potential $V_{13}$ to the charge transfer control electrode, to accumulate electric charges in the photoelectric conversion layer, and, in a charge transfer period, the drive circuit may apply a potential $V_{21}$ to the first electrode, a potential $V_{22}$ to the charge storage electrode, and a potential $V_{23}$ to the charge transfer control electrode, to read the electric charges accumulated in the photoelectric conversion layer into the control unit via the first electrode. However, in a case where the potential of the first electrode is higher than the potential of the second electrode, $V_{12} \geq V_{11}$, $V_{12} > V_{13}$, and $V_{21} > V_{22} > V_{23}$, and, in a case where the potential of the first electrode is lower than the potential of the second electrode, $V_{12} \leq V_{11}$, $V_{12} < V_{13}$, and $V_{21} < V_{22} < V_{23}$. The charge transfer control electrode may be formed at the same level as the first electrode or the charge storage electrodes, or may be formed at a different level from the first electrode or the charge storage electrode.

Furthermore, or alternatively, a charge transfer control electrode (an upper charge transfer control electrode), instead of the second electrode, may be formed above the photoelectric conversion layer region located between the imaging device and an adjacent imaging device. Further, in this case, a control unit that is disposed in the semiconductor substrate and includes a drive circuit may be further provided, the first electrode, the second electrode, the charge storage electrode, and the charge transfer control electrode may be connected to the drive circuit, in a charge accumulation period, the drive circuit may apply a potential $V_{2'}$ to the second electrode, and a potential $V_{13'}$ to the charge transfer control electrode, to accumulate electric charges in the photoelectric conversion layer, and, in a charge transfer period, the drive circuit may apply a potential $V_{2''}$ to the second electrode, and a potential $V_{23''}$ to the charge transfer control electrode, to read the electric charges accumulated in the photoelectric conversion layer into the control unit via the first electrode. However, in a case where the potential of the first electrode is higher than the potential of the second electrode, $V_{2'} \geq V_{13'}$ and $V_{2''} \geq V_{23'''}$, and, in a case where the potential of the first electrode is lower than the potential of the second electrode, $V_{2'} \leq V_{13'}$ and $V_{2''} \leq V_{23'''}$. The charge transfer control electrode is formed at the same level as the second electrode.

An imaging device or the like of the present disclosure including the preferred modes described above may further include a semiconductor substrate, and the photoelectric conversion unit may be disposed above the semiconductor substrate. Note that the first electrode, the charge storage electrode, the second electrode, and various electrodes are connected to the drive circuit that will be described later.

Furthermore, an imaging device or the like of the present disclosure including the various preferred modes described above may further include a transfer control electrode (a charge transfer electrode) that is provided between the first electrode and the charge storage electrode, is disposed at a distance from the first electrode and the charge storage electrode, and is positioned to face the photoelectric conversion layer via the insulating layer of an imaging device or the like according to the first embodiment of the present disclosure or the insulating material layer of an imaging device or the like according to the second embodiment of the present disclosure. Note that an imaging device or the like of the present disclosure in such a mode may also be referred to as an "imaging device or the like of the present disclosure including a transfer control electrode" in some cases, for the sake of convenience. Further, in an imaging device or the like of the present disclosure including a transfer control electrode, a control unit that is disposed in the semiconductor substrate and includes a drive circuit may be further provided, the first electrode, the charge storage electrode, and the transfer control electrode may be connected to the drive circuit, in a charge accumulation period, the drive circuit may apply a potential $V_{11}$ to the first electrode, a potential $V_{12}$ to the charge storage electrode, and a potential $V_{14}$ to the transfer control electrode, to accumulate electric charges in the photoelectric conversion layer, and, in a charge transfer period, the drive circuit may apply a potential $V_{21}$ to the first electrode, a potential $V_{22}$ to the charge storage electrode, and a potential $V_{24}$ to the transfer control electrode, to read the electric charges accumulated in the photoelectric conversion layer into the control unit via the first electrode. However, in a case where the potential of the first electrode is higher than the potential of the second electrode, $V_{12} > V_{14}$, and $V_{22} \leq V_{24} \leq V_{21}$, and, in a case where the potential of the first electrode is lower than the potential of the second electrode, $V_{12} < V_{14}$ and $V_{22} \geq V_{24} \geq V_{21}$.

Moreover, an imaging device or the like of the present disclosure including the various preferred modes described above may further include a charge emission electrode that is connected to the photoelectric conversion layer, and is disposed at a distance from the first electrode and the charge storage electrode. Note that an imaging device or the like of the present disclosure in such a mode is also referred to as an "imaging device or the like of the present disclosure including a charge emission electrode", for the sake of convenience. Further, in an imaging device or the like of the present disclosure including a charge emission electrode, the charge emission electrode may be disposed to surround the first electrode and the charge storage electrode (in other words, like a frame). The charge emission electrode may be shared (made common) by a plurality of imaging devices. Further, in this case, the photoelectric conversion layer may extend in a second opening formed in the insulating layer, and be connected to the charge emission electrode, the edge portion of the top surface of the charge emission electrode may be covered with the insulating layer, the charge emission electrode may be exposed through the bottom surface of the second opening, and, where the surface of the insulating layer in contact with the top surface of the charge emission electrode is a third surface, and the surface of the insulating layer in contact with the portion of the photoelectric conversion layer facing the charge storage electrode is a second surface, a side surface of the second opening may be a slope spreading from the third surface toward the second surface.

Furthermore, in an imaging device or the like of the present disclosure including a charge emission electrode, a control unit that is disposed in the semiconductor substrate and includes a drive circuit may be further provided, the first electrode, the charge storage electrode, and the charge emission electrode may be connected to the drive circuit, in a charge accumulation period, the drive circuit may apply a potential $V_{11}$ to the first electrode, a potential $V_{12}$ to the charge storage electrode, and a potential $V_{15}$ to the charge emission electrode, to accumulate electric charges in the photoelectric conversion layer, and, in a charge transfer period, the drive circuit may apply a potential $V_{21}$ to the first electrode, a potential $V_{22}$ to the charge storage electrode, and a potential $V_{25}$ to the charge emission electrode, to read the electric charges accumulated in the photoelectric conversion layer into the control unit via the first electrode. However, in a case where the potential of the first electrode is higher than the potential of the second electrode, $V_{15} > V_{11}$, and $V_{25} < V_{21}$, and, in a case where the potential of the first electrode is lower than the potential of the second electrode, $V_{15} < V_{11}$, and $V_{25} > V_{21}$.

Furthermore, in an imaging device or the like of the present disclosure including the various preferred modes described above, the charge storage electrode may be formed with a plurality of charge storage electrode segments. Note that an imaging device or the like of the present disclosure in such a mode may also be referred to as an "imaging device or the like of the present disclosure including a plurality of charge storage electrode segments" in some cases, for the sake of convenience. The number of charge storage electrode segments is only required to be two or larger. Further, in an imaging device or the like of the present disclosure including a plurality of charge storage electrode segments, in a case where a different potential is applied to each of N charge storage electrode segments, in a case where the potential of the first electrode is higher than the potential of the second electrode, the potential to be applied to the charge storage electrode segment (the first photoelectric conversion unit segment) located closest to the first electrode may be higher than the potential to be applied to the charge storage electrode segment (the Nth photoelectric conversion unit segment) located farthest from the first electrode in a charge transfer period, and, in a case where the potential of the first electrode is lower than the potential of the second electrode, the potential to be applied to the charge storage electrode segment (the first photoelectric conversion unit segment) located closest to the first electrode may be lower than the potential to be applied to the charge storage electrode segment (the Nth photoelectric conversion unit segment) located farthest from the first electrode in a charge transfer period.

Further, in an imaging device or the like of the present disclosure including the various preferred modes described above, the size of the charge storage electrode may be larger than that of the first electrode. Where the area of the charge storage electrode is represented by $s_{1'}$, and the area of the first electrode is represented by $s_1$, it is preferable, but is not necessary, to satisfy
$4 \le s_{1'}/s_1$.

The second electrode located on the light incident side may be shared by a plurality of imaging devices, except in cases where an upper charge transfer control electrode is formed. That is, the second electrode can be a so-called solid electrode. In an imaging device or the like of the present disclosure, the photoelectric conversion layer may be shared by a plurality of imaging devices. That is, one photoelectric conversion layer may be formed for a plurality of imaging devices.

Furthermore, in an imaging device or the like of the present disclosure including the various preferred modes described above, the first electrode may extend in an opening formed in the insulating layer (in part of the insulating material layer and the insulating layer in some cases in an imaging device or the like according to the second embodiment of the present disclosure), and be connected to the photoelectric conversion layer. Alternatively, the photoelectric conversion layer may extend in an opening formed in the insulating layer and be connected to the first electrode.

In this case, the edge portion of the top surface of the first electrode may be covered with the insulating layer, the first electrode may be exposed through the bottom surface of the opening, and, where the surface of the insulating layer in contact with the top surface of the first electrode is a first surface, and the surface of the insulating layer in contact with the portion of the photoelectric conversion layer facing the charge storage electrode is a second surface, a side surface of the opening may be a slope spreading from the first surface toward the second surface, and further, the side surface of the opening having the slope spreading from the first surface toward the second surface may be located on the charge storage electrode side. Note that this includes a mode in which another layer is formed between the photoelectric conversion layer and the first electrode (for example, a mode in which a material layer suitable for charge accumulation is formed between the photoelectric conversion layer and the first electrode).

Further, in an imaging device or the like of the present disclosure including the various preferred modes described above, at least a floating diffusion layer and an amplification transistor that constitute the control unit may be disposed in the semiconductor substrate, and the first electrode may be connected to the floating diffusion layer and the gate portion of the amplification transistor. Furthermore, in this case, a reset transistor and a selection transistor that constitute the control unit may be further disposed in the semiconductor substrate, the floating diffusion layer may be connected to one source/drain region of the reset transistor, and one source/drain region of the amplification transistor may be connected to one source/drain region of the selection transistor, and the other source/drain region of the selection transistor may be connected to a signal line.

Alternatively, modifications of an imaging device or the like of the present disclosure including the various preferred modes described above may include imaging devices of first to sixth configurations described below. Specifically, in imaging devices of the first to sixth configurations in imaging devices or the like of the present disclosure including the various preferred modes described above, the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments in imaging devices of the first to third configurations, the charge storage electrode is formed with N charge storage electrode segments that are disposed at a distance from one another in imaging devices of the fourth and fifth configurations, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode.

Further, in an imaging device of the first configuration, the thicknesses of the insulating layer segments gradually vary from the first photoelectric conversion unit segment to the Nth photoelectric conversion unit segment. Further, in an imaging device of the second configuration, the thicknesses of the photoelectric conversion layer segments gradually vary from the first photoelectric conversion unit segment to the Nth photoelectric conversion unit segment. Further, in an imaging device of the third configuration, the material forming the insulating layer segment differs between adjacent photoelectric conversion unit segments. Also, in an imaging device of the fourth configuration, the material forming the charge storage electrode segment differs between adjacent photoelectric conversion unit segments. Further, in an imaging device of the fifth configuration, the areas of the charge storage electrode segments become gradually smaller from the first photoelectric conversion unit segment to the Nth photoelectric conversion unit segment. Note that the areas may become smaller continuously or in a stepwise manner.

Alternatively, in an imaging device of the sixth configuration in an imaging device or the like of the present disclosure including the various preferred modes described above, the cross-sectional area of the stacked portion of the charge storage electrode, the insulating layer, and the photoelectric conversion layer taken along a Y-Z virtual plane varies depending on the distance from the first electrode, where the stacking direction of the charge storage electrode, the insulating layer, and the photoelectric conversion layer is the Z direction, and the direction away from the first electrode is the X direction. Note that the change in the cross-sectional area may be continuous or stepwise.

In imaging devices of the first and second configurations, the N photoelectric conversion layer segments are continuously arranged, the N insulating layer segments are also continuously arranged, and the N charge storage electrode segments are also continuously arranged. In imaging devices of the third to fifth configurations, the N photoelectric conversion layer segments are continuously arranged. Further, in imaging devices of the fourth and fifth configurations, the N insulating layer segments are continuously arranged. In an imaging device of the third configuration, on the other hand, the N insulating layer segments are provided for the respective photoelectric conversion unit segments in one-to-one correspondence. Further, in imaging devices of the fourth and fifth configurations, and in an imaging device of the third configuration in some cases, N charge storage electrode segments are provided for the respective photoelectric conversion unit segments in one-to-one correspondence. Furthermore, in imaging devices of the first to sixth configurations, the same potential is applied to all of the charge storage electrode segments. Alternatively, in imaging devices of the fourth and fifth configurations, and in an imaging device of the third configuration in some cases, a different potential may be applied to each of the N charge storage electrode segments.

In imaging devices of the first to sixth configurations, and stacked imaging devices and solid-state imaging apparatuses of the present disclosure in which the imaging devices are used, the thickness of each insulating layer segment is specified, the thickness of each photoelectric conversion layer segment is specified, the materials forming the insulating layer segments vary, the materials forming the charge storage electrode segments vary, the area of each charge storage electrode segment is specified, or the cross-sectional area of each stacked portion is specified. Accordingly, a kind of charge transfer gradient is formed, and thus, the electric charges generated through photoelectric conversion can be more easily and reliably transferred to the first electrode. As a result, it is possible to further prevent generation of a residual image and generation of a charge transfer residue.

A modification of a stacked imaging device of the present disclosure may be a stacked imaging device including at least one of imaging devices of the first to sixth configurations described above. Further, a modification of a solid-state imaging apparatus according to the first embodiment of the present disclosure may be a solid-state imaging apparatus including a plurality of the imaging device of the first to sixth configurations described above, and a modification of a solid-state imaging apparatus according to the second embodiment of the present disclosure may be a solid-state imaging apparatus including a plurality of stacked imaging devices including at least one of imaging devices of the first to sixth configurations described above.

In imaging devices of the first to fifth configurations, a photoelectric conversion unit segment having a greater value as n is located farther away from the first electrode, and whether or not a photoelectric conversion unit segment is located far from the first electrode is determined on the basis of the X direction. Further, in an imaging device of the sixth configuration, the direction away from the first electrode is the X direction. However, the "X direction" is defined as follows. Specifically, a pixel region in which a plurality of imaging devices or stacked imaging devices is arranged is formed with a plurality of pixels arranged regularly in a two-dimensional array, or in the X direction and the Y direction. In a case where the planar shape of each pixel is a rectangular shape, the direction in which the side closest to the first electrode extends is set as the Y direction, and a direction orthogonal to the Y direction is set as the X direction. Alternatively, in a case where the planar shape of each pixel is a desired shape, a general direction including the line segment or the curved line closest to the first electrode is set as the Y direction, and a direction orthogonal to the Y direction is set as the X direction.

In the cases described below, the potential of the first electrode is higher than the potential of the second electrode in imaging devices of the first to sixth configurations. However, in a case where the potential of the first electrode is lower than the potential of the second electrode, the levels of the potentials are only required to be switched.

In an imaging device of the first configuration, the thicknesses of the insulating layer segments gradually vary from the first photoelectric conversion unit segment to the Nth photoelectric conversion unit segment. However, the thicknesses of the insulating layer segments may gradually become greater or smaller. A kind of charge transfer gradient is formed by this variation.

In a case where the electric charges to be accumulated are electrons, a configuration in which the thicknesses of the insulating layer segments become gradually greater is only required to be adopted. In a case where the electric charges to be accumulated are holes, a configuration in which the thicknesses of the insulating layer segments become gradually smaller is only required to be adopted. Further, in these cases, when $|V_{12}| \geq |V_{11}|$ in a charge accumulation period, the nth photoelectric conversion unit segment can store more electric charges than the (n+1)th photoelectric conversion unit segment, and a strong electric field is applied so that electric charges can be reliably prevented from flowing from the first photoelectric conversion unit segment toward the first electrode. Meanwhile, when $|V_{22}| < |V_{21}|$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the second configuration, the thicknesses of the photoelectric conversion layer segments gradually vary from the first photoelectric conversion unit segment to the Nth photoelectric conversion unit segment. However, the thicknesses of the photoelectric conversion layer segments may gradually become greater or smaller. A kind of charge transfer gradient is formed by this variation.

In a case where the electric charges to be accumulated are electrons, a configuration in which the thicknesses of the photoelectric conversion layer segments become gradually greater is only required to be adopted. In a case where the electric charges to be accumulated are holes, a configuration in which the thicknesses of the photoelectric conversion layer segments become gradually smaller is only required to be adopted. Further, when $V_{12} \geq V_{11}$ in a charge accumulation period in a case where the thicknesses of the photoelectric conversion layer segments become gradually greater, or when $V_{12} \leq V_{11}$ in a charge accumulation period in a case where the thicknesses of the photoelectric conversion layer segments become gradually smaller, a stronger electric field is applied to the nth photoelectric conversion unit segment than to the (n+1)th photoelectric conversion unit segment, so that the flow of electric charges from the first photoelectric conversion unit segment toward the first electrode can be prevented without fail. Meanwhile, when $V_{22} < V_{21}$ in a charge transfer period in a case where the thicknesses of the photoelectric conversion layer segments become gradually greater, or when $V_{22} > V_{21}$ in a charge transfer period in a case where the thicknesses of the photoelectric conversion layer segments become gradually smaller, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the third configuration, the material forming the insulating layer segment differ between adjacent photoelectric conversion unit segments, and because of this, a kind of charge transfer gradient is formed. However, the values of the relative dielectric constants of the materials forming the insulating layer segments preferably become gradually smaller from the first photoelectric conversion unit segment to the Nth photoelectric conversion unit segment. Further, as such a configuration is adopted, when $V_{12} \geq V_{11}$ in a charge accumulation period, the nth photoelectric conversion unit segment can store more electric charges than the (n+1)th photoelectric conversion unit segment. Meanwhile, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the fourth configuration, the material forming the charge storage electrode segment differ between adjacent photoelectric conversion unit segments, and because of this, a kind of charge transfer gradient is formed. However, the values of the work functions of the materials forming the insulating layer segments preferably become gradually greater from the first photoelectric conversion unit segment to the Nth photoelectric conversion unit segment. As such a configuration is adopted, it then becomes possible to form a potential gradient that is advantageous for signal charge transfer, regardless of whether the voltage is positive or negative.

In an imaging device of the fifth configuration, the areas of the charge storage electrode segments become gradually smaller from the first photoelectric conversion unit segment to the Nth photoelectric conversion unit segment, and because of this, a kind of charge transfer gradient is formed. Accordingly, when $V_{12} \geq V_{11}$ in a charge accumulation period, the nth photoelectric conversion unit segment can store more electric charges than the (n+1)th photoelectric conversion unit segment. Meanwhile, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

In an imaging device of the sixth configuration, the cross-sectional areas of the stacked portion vary depending on the distance from the first electrode, and because of this, a kind of charge transfer gradient is formed. Specifically, in a configuration in which the thicknesses of cross-sections of the stacked portion are made uniform while the width of a cross-section of the stacked portion is smaller at a position farther away from the first electrode, when $V_{12} \geq V_{11}$ in a charge accumulation period, a region closer to the first electrode can accumulate more electric charges than a region farther away from the first electrode, as in the above described imaging device of the fifth configuration. Accordingly, when $V_{22} < V_{21}$ in a charge transfer period, it is possible to reliably secure the flow of electric charges from a region closer to the first electrode toward the first electrode, and the flow of electric charges from a farther region toward a closer region. On the other hand, in a configuration in which the widths of cross-sections of the stacked portion are made uniform while the thicknesses of cross-sections of the stacked portion, or specifically, the thicknesses of the insulating layer segments, are gradually increased, when $V_{12} \geq V_{11}$ in a charge accumulation period, a region closer to the first electrode can accumulate more electric charges than a region farther away from the first electrode, and a stronger electric field is applied to the closer region. Thus, it is possible to reliably prevent the flow of electric charges from the region closer to the first electrode toward the first electrode, as in the above described imaging device of the first configuration. When $V_{22} < V_{21}$ in a charge transfer period, it then becomes possible to reliably secure the flow of electric charges from a region closer to the first electrode toward the first electrode, and the flow of electric charges from a farther region toward a closer region. Further, in a configuration in which the thicknesses of the photoelectric conversion layer segments are gradually increased, when $V_{12} \geq V_{11}$ in a charge accumulation period, a stronger electric field is applied to a region closer to the first electrode than to a region farther away from the first electrode, and it is possible to reliably prevent the flow of electric charges from the region closer to the first electrode toward the first electrode, as in the above described imaging device of the second configuration. When $V_{22} < V_{21}$ in a charge transfer period, it then becomes possible to reliably secure the flow of electric charges from a region closer to the first electrode toward the first electrode, and the flow of electric charges from a farther region toward a closer region.

Another modification of a solid-state imaging apparatus according to the first embodiment of the present disclosure may be a solid-state imaging apparatus that includes a plurality of imaging devices of the first to sixth configurations, an imaging device block is formed with a plurality of imaging devices, and a first electrode is shared by the plurality of imaging devices constituting the imaging device block. Note that a solid-state imaging apparatus having such a configuration is referred to as a "solid-state imaging apparatus of the first configuration", for the sake of convenience. Alternatively, another modification of a solid-state imaging apparatus according to the second embodiment of the present disclosure may be a solid-state imaging apparatus that includes a plurality of stacked imaging devices including at least one imaging device of the first to sixth configurations, an imaging device block is formed with a plurality of stacked imaging devices, and a first electrode is shared by the plurality of stacked imaging devices constituting the imaging device block. Note that a solid-state imaging apparatus having such a configuration is referred to as a "solid-state imaging apparatus of the second configuration", for the sake of convenience. Further, in a case where a first electrode is shared by the plurality of imaging devices constituting an imaging device block as above, the configuration and the structure in the pixel region in which a plurality of imaging devices is arranged can be simplified and miniaturized.

In solid-state imaging apparatuses of the first and second configurations, one floating diffusion layer is provided for a plurality of imaging devices (or one imaging device block). Here, the plurality of imaging devices provided for one floating diffusion layer may be formed with a plurality of first-type imaging devices described later, or may be formed with at least one first-type imaging device and one or more second-type imaging devices described later. The timing of a charge transfer period is then appropriately controlled, so that the plurality of imaging devices can share the one floating diffusion layer. The plurality of imaging devices is operated in conjunction with one another, and is connected as an imaging device block to a drive circuit described later. In other words, a plurality of imaging devices constituting an imaging device block is connected to one drive circuit. However, charge storage electrode control is performed for each imaging device. Further, a plurality of imaging devices can share one contact hole portion. As for the positional relationship between the first electrode being shared by a plurality of imaging devices and the charge storage electrodes of the respective imaging devices, the first electrode may be disposed adjacent to the charge storage electrodes of the respective imaging devices in some cases. Alternatively, the first electrode is disposed adjacent to the charge storage electrode of one imaging device of the plurality of imaging devices, and is not adjacent to the charge storage electrodes of the plurality of remaining imaging devices. In such a case, electric charges are transferred from the plurality of remaining imaging devices to the first electrode via the one imaging device of the plurality of imaging devices. To ensure electric charge transfer from each imaging device to the first electrode, the distance (called the "distance A", for the sake of convenience) between a charge storage electrode of an imaging device and a charge storage electrode of another imaging device is preferably longer than the distance (called the "distance B", for the sake of convenience) between the first electrode and the charge storage electrode in the imaging device adjacent to the first electrode. Further, the value of the distance A is preferably greater for an imaging device located farther away from the first electrode.

Furthermore, in an imaging device or the like of the present disclosure including the various preferred modes described above, light may enter from the second electrode side, and a light blocking layer may be formed on a light incident side closer to the second electrode. Alternatively, light may enter from the second electrode side, while light does not enter the first electrode (or the first electrode and the transfer control electrode in some cases). Further, in this case, a light blocking layer may be formed on a light incident side closer to the second electrode and above the first electrode (or above the first electrode and the transfer control electrode in some cases). Alternatively, an on-chip microlens may be provided above the charge storage electrode and the second electrode, and light that enters the on-chip microlens may be gathered to the charge storage electrode. Here, the light blocking layer may be disposed above the surface of the second electrode on the light incident side, or may be disposed on the surface of the second electrode on the light incident side. In some cases, the light blocking layer may be formed in the second electrode. Examples of the material that forms the light blocking layer include chromium (Cr), copper (Cu), aluminum (Al), tungsten (W), and resin (polyimide resin, for example) that does not transmit light.

Specific examples of imaging devices of the present disclosure include: an imaging device (referred to as a "blue-light imaging device of the first type", for convenience) that includes a photoelectric conversion layer (referred to as a "blue-light photoelectric conversion layer of the first type", for convenience) that absorbs blue light (light of 425 nm to 495 nm), and has sensitivity to blue light; an imaging device (referred to as a "green-light imaging device of the first type", for convenience) that includes a photoelectric conversion layer (referred to as a "green-light photoelectric conversion layer of the first type", for convenience) that absorbs green light (light of 495 nm to 570 nm), and has sensitivity to green light; and an imaging device (referred to as a "red-light imaging device of the first type", for convenience) that includes a photoelectric conversion layer (referred to as a "red-light photoelectric conversion layer of the first type", for convenience) that absorbs red light (light of 620 nm to 750 nm), and has sensitivity to red light. Further, of conventional imaging devices not including any charge storage electrode, an imaging device having sensitivity to blue light is referred to as a "blue-light imaging device of the second type", for convenience, an imaging device having sensitivity to green light is referred to as a "green-light imaging device of the second type", for convenience, an imaging device having sensitivity to red light is referred to as a "red-light imaging device of the second type", for convenience, a photoelectric conversion layer forming a blue-light imaging device of the second type is referred to as a "blue-light photoelectric conversion layer of the second type", for convenience, a photoelectric conversion layer forming a green-light imaging device of the second type is referred to as a "green-light photoelectric conversion layer of the second type", for convenience, and a photoelectric conversion layer forming a red-light imaging device of the second type is referred to as a "red-light photoelectric conversion layer of the second type", for convenience.

A stacked imaging device of the present disclosure includes at least one imaging device (a photoelectric conversion element) of the present disclosure. Specific examples of such stacked imaging devices include:

[A] a configuration and a structure in which a blue-light photoelectric conversion unit of the first type, a green-light photoelectric conversion unit of the first type, and a red-light photoelectric conversion unit of the first type are stacked in a vertical direction, and the respective control units of a blue-light imaging device of the first type, a green-light imaging device of the first type, and a red-light imaging device of the first type are disposed in a semiconductor substrate;

[B] a configuration and a structure in which a blue-light photoelectric conversion unit of the first type and a green-light photoelectric conversion unit of the first type are stacked in a vertical direction, a red-light photoelectric conversion unit of the second type is disposed below these two first-type photoelectric conversion units, and the respective control units of a blue-light imaging device of the first type, a green-light imaging device of the first type, and a red-light imaging device of the second type are disposed in a semiconductor substrate;

[C] a configuration and a structure in which a blue-light photoelectric conversion unit of the second type and a red-light photoelectric conversion unit of the second type are disposed below a green-light photoelectric conversion unit of the first type, and the respective control units of a green-light imaging device of the first type, a blue-light imaging device of the second type, and a red-light imaging device of the second type are disposed in a semiconductor substrate; and

[D] a configuration and a structure in which a green-light photoelectric conversion unit of the second type and a red-light photoelectric conversion unit of the second type are disposed below a blue-light photoelectric conversion unit of the first type, and the respective control units of a blue-light imaging device of the first type, a green-light imaging device of the second type, and a red-light imaging device of the second type are disposed in a semiconductor substrate, for example. Note that the arrangement sequence of the photoelectric conversion units of these imaging devices in a vertical direction is preferably as follows: a blue-light photoelectric conversion unit, a green-light photoelectric conversion unit, and a red-light photoelectric conversion unit from the light incident direction, or a green-light photoelectric conversion unit, a blue-light photoelectric conversion unit, and a red-light photoelectric conversion unit from the light incident direction. This is because light of a shorter wavelength is more efficiently absorbed on the incident surface side. Since red has the longest wavelength among the three colors, it is preferable to dispose a red-light photoelectric conversion unit in the lowermost layer when viewed from the light incidence face. A stack structure formed with these imaging devices forms one pixel. An infrared photoelectric conversion unit of the first type may also be included. Here, the photoelectric conversion layer of the infrared photoelectric conversion unit of the first type is formed with an organic material, for example, and is preferably disposed in the lowermost layer of a stack structure of first-type imaging devices, and above second-type imaging devices. Alternatively, an infrared photoelectric conversion unit of the second type may be provided below a first-type photoelectric conversion unit.

In a first-type imaging device, the first electrode is formed on an interlayer insulating layer provided on the semiconductor substrate, for example. An imaging device formed on the semiconductor substrate may be of a back-illuminated type or of a front-illuminated type.

In a case where a photoelectric conversion layer includes an organic material, the photoelectric conversion layer may have one of the following four forms:

(1) formed with a p-type organic semiconductor;
(2) formed with an n-type organic semiconductor;
(3) formed with a stack structure of a p-type organic semiconductor layer and an n-type organic semiconductor layer, a stack structure of a p-type organic semiconductor layer, a mixed layer (a bulk heterostructure) of a p-type organic semiconductor and an n-type organic semiconductor, and an n-type organic semiconductor layer, a stack structure of a p-type organic semiconductor layer and a mixed layer (a bulk heterostructure) of a p-type organic semiconductor and an n-type organic semiconductor, or a stack structure of an n-type organic semiconductor layer and a mixed layer (a bulk heterostructure) of a p-type organic semiconductor and an n-type organic semiconductor; and (4) formed with a mixed structure (a bulk heterostructure) of a p-type organic semiconductor and an n-type organic semiconductor. However, the stacking order may be changed as appropriate in each configuration.

Examples of p-type organic semiconductors include naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes having a heterocyclic compound as a ligand, polythiophene derivatives, polybenzothiadiazole derivatives, polyfluorene derivatives, and the like. Examples of n-type organic semiconductors include fullerenes, fullerene derivatives (fullerenes (higher-order fullerenes) such as C60, C70, and C74, and endohedral fullerenes, for example) or fullerene derivatives (fullerene fluorides, PCBM fullerene compounds, and fullerene multimers, for example), organic semiconductors with greater (deeper) HOMO and LUMO than p-type organic semiconductors, and transparent inorganic metallic oxides. Specific examples of n-type organic semiconductors include heterocyclic compounds containing nitrogen atom, oxygen atom, and sulfur atom, such as pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, imidazole derivatives, benzoimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylene vinylene derivatives, polybenzothiadiazole derivatives, organic molecules containing polyfluorene derivatives or the like as part of the molecular backbone, organometallic complexes, and subphthalocyanine derivatives. Examples of groups or the like contained in fullerene derivatives include: halogen atom; a linear, branched, or cyclic alkyl group or phenyl group; a group containing a linear or fused aromatic compound; a group containing a halide; a partial fluoroalkyl group; a perfluoroalkyl group; a silyl alkyl group; a silyl alkoxy group; an aryl silyl group; an aryl sulfanyl group; an alkyl sulfanyl group; an aryl sulfonyl group; an alkyl sulfonyl group; an aryl sulfide group: an alkyl sulfide group; an amino group; an alkylamino group; an arylamino group; a hydroxy group; an alkoxy group; an acylamino group: an acyloxy group; a carbonyl group; a carboxy group; a carboxoamide group; a carboalkoxy group; an acyl group; a sulfonyl group; a cyano group; a nitro group; a group containing chalcogenide; a phosphine group; a phosphonate group; and derivatives of these materials. The thickness of a photoelectric conversion layer formed with an organic material (also referred to as an "organic photoelectric conversion layer" in some cases) is not limited to any particular value, but may be $1\times10^{-8}$ m to $5\times10^{-7}$ m, preferably $2.5\times10^{-8}$ m to $3\times10^{-7}$ m, more preferably $2.5\times10^{-8}$ m to $2\times10^{-7}$ m, or even more preferably $1\times10^{-7}$ m to $1.8\times10^{-7}$ m, for example. Note that organic semiconductors are often classified into the p-type and the n-type. The p-type means that holes can be easily transported, and the n-type means that electrons can be easily transported. Unlike an inorganic semiconductor, an organic semiconductor is not interpreted as containing holes or electrons as majority carriers for thermal excitation.

Alternatively, examples of the material forming an organic photoelectric conversion layer that photoelectrically converts green light include rhodamine dyes, merocyanine dyes, quinacridone derivatives, subphthalocyanine dyes (subphthalocyanine derivatives), and the like. Examples of the material forming an organic photoelectric conversion layer that photoelectrically converts blue light include coumaric acid dyes, tris-8-hydroxyquinolyl aluminum (Alq3), merocyanine dyes, and the like. Examples of the material forming an organic photoelectric conversion layer that photoelectrically converts red light include phthalocyanine dyes and a subphthalocyanine pigments (subphthalocyanine derivatives).

Alternatively, examples of an inorganic material forming a photoelectric conversion layer include crystalline silicon, amorphous silicon, microcrystalline silicon, crystalline selenium, amorphous selenium, and compound semiconductors such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, which are chalcopyrite compounds, GaAs, InP, AlGaAs, InGaP, AlGaInP, and InGaAsP, which are III-V compounds, and further, CdSe, CdS, In$_2$Se$_3$, In$_2$S$_2$, Bi$_2$Se$_3$, Bi$_2$S$_3$, ZnSe, ZnS, PbSe, and PbS. In addition to that, it is also possible to use quantum dots including these materials for a photoelectric conversion layer.

Alternatively, a photoelectric conversion layer may have a stack structure formed with a lower semiconductor layer and an upper photoelectric conversion layer. As a lower semiconductor layer is included in this manner, it is possible to prevent recombination during charge accumulation, for example. It is also possible to increase efficiency in transfer of electric charges accumulated in the photoelectric conversion layer to the first electrode. Further, electric charges generated in the photoelectric conversion layer can be temporarily stored, and the transfer timing or the like can be controlled. Furthermore, generation of dark current can be reduced or prevented. The material forming the upper photoelectric conversion layer is only required to be selected as appropriate from the above various materials that can form the photoelectric conversion layer. On the other hand, the material forming the lower semiconductor layer is preferably a material that has a great value of bandgap energy (3.0 eV or greater as the value of bandgap energy, for example), and also has a higher mobility than the material forming the photoelectric conversion layer. Specific examples thereof include oxide semiconductor materials such as IGZO; transition metal dichalcogenides; silicon carbide; diamond; graphene; carbon nanotubes; and organic semiconductor materials such as condensed polycyclic hydrocarbon compounds and condensed heterocyclic compounds. Alternatively, in a case where the electric charges to be accumulated are electrons, the material forming the lower semiconductor layer may be a material having a higher ionization potential than the ionization potential of the material forming the photoelectric conversion layer. In a case where the electric charges to be accumulated are holes, the material forming the lower semiconductor layer may be a material having a lower electron affinity than the electron affinity of the material forming the photoelectric conversion layer. Alternatively, the impurity concentration in the material forming the lower semiconductor layer is preferably equal to or lower than $1 \times 10^{18}$ cm$^{-3}$. The lower semiconductor layer may have a single-layer configuration or a multilayer configuration. Further, the material forming the lower semiconductor layer located above the charge storage electrode may differ from the material forming the lower semiconductor layer located above the first electrode.

A single-panel color solid-state imaging apparatus can be formed with a solid-state imaging apparatus according to the first or second embodiment of the present disclosure, or with a solid-state imaging apparatus of the first or second configuration.

A solid-state imaging apparatus according to the second embodiment of the present disclosure including stacked imaging devices, or a solid-state imaging apparatus of the second configuration differs from a solid-state imaging apparatus including Bayer-array imaging devices (in other words, blue, green, and red color separation is not performed with color filters). In such a solid-state imaging apparatus, imaging devices having sensitivity to light of a plurality of kinds of wavelengths are stacked in the light incident direction in the same pixel, to form one pixel. Thus, sensitivity can be increased, and the pixel density per unit volume can also be increased. Further, an organic material has a high absorption coefficient. Accordingly, the thickness of an organic photoelectric conversion layer can be made smaller than that of a conventional Si-based photoelectric conversion layer. Thus, light leakage from adjacent pixels, and restrictions on light incident angle are reduced. Furthermore, in a conventional Si-based imaging device, false color occurs because an interpolation process is performed among pixels of three colors to create color signals. In a solid-state imaging apparatus according to the second embodiment of the present disclosure including stacked imaging devices, or in a solid-state imaging apparatus of the second configuration, on the other hand, generation of false color is reduced or prevented. Since an organic photoelectric conversion layer also functions as a color filter, color separation is possible without any color filter.

Meanwhile, in a solid-state imaging apparatus according to the first embodiment of the present disclosure, or in a solid-state imaging apparatus of the first configuration, the use of color filters can alleviate the requirement for the spectral characteristics of blue, green, and red, and achieves a high mass productivity. Examples of the array of imaging devices in a solid-state imaging apparatus according to the first embodiment of the present disclosure or in a solid-state imaging apparatus of the first configuration include not only a Bayer array but also an interlined array, a G-striped RB-checkered array, a G-striped RB-completely-checkered array, a checkered complementary color array, a striped array, an obliquely striped array, a primary color difference array, a field color difference sequence array, a frame color difference sequence array, a MOS-type array, an improved MOS-type array, a frame interleaved array, and a field interleaved array. Here, one pixel (or a subpixel) is formed with one imaging device.

A pixel region in which a plurality of imaging devices of the present disclosure or stacked imaging devices of the present disclosure is arranged is formed with a plurality of pixels arranged regularly in a two-dimensional array. The pixel region includes an effective pixel region that actually receives light, amplifies signal charges generated through photoelectric conversion, and reads the signal charges into the drive circuit, and a black reference pixel region for outputting optical black that serves as the reference for black levels. The black reference pixel region is normally located in the outer periphery of the effective pixel region.

In an imaging device or the like of the present disclosure including the various preferred modes and configurations described above, light is emitted, photoelectric conversion occurs in the photoelectric conversion layer, and carriers are separated into holes and electrons. The electrode from which holes are extracted is then set as the anode, and the electrode from which electrons are extracted is set as the cathode. The first electrode may form the anode while the second electrode forms the cathode in some modes, and conversely, the first electrode may form the cathode while the second electrode forms the anode in some modes.

In a case where a stacked imaging device is formed, the first electrode, the charge storage electrode, the charge transfer control electrode, the transfer control electrode, and the second electrode may be formed with a transparent conductive material. Note that the first electrode, the charge storage electrode, the charge transfer control electrode, and the transfer control electrode may be collectively referred to as the "first electrode and the like" in some cases. Alternatively, in a case where imaging devices or the like of the present disclosure are arranged in a plane like a Bayer array, for example, the second electrode may be formed with a transparent conductive material, and the first electrode and the like may be formed with a metallic material. In this case, specifically, the second electrode located on the light incident side may be formed with a transparent conductive material, and the first electrode and the like may be formed with, for example, Al—Nd (an alloy of aluminum and neodymium) or ASC (an alloy of aluminum, samarium, and copper). Note that an electrode formed with a transparent conductive material may be referred to as a "transparent electrode" in some cases. Here, the bandgap energy of the transparent conductive material is preferably 2.5 eV or higher, or more preferably, 3.1 eV or higher. Examples of the transparent conductive material forming the transparent electrode include conductive metallic oxides. Specifically, these examples include indium oxide, indium-tin oxides (including ITO, indium tin oxide, Sn-doped $In_2O_3$, crystalline ITO, and amorphous ITO), indium-zinc oxides (IZO, indium zinc oxide) in which indium is added as a dopant to zinc oxide, indium gallium oxides (IGO) in which indium is added as a dopant to gallium oxide, indium-gallium-zinc oxides (IGZO, In—$GaZnO_4$) in which indium and gallium are added as a dopant to zinc oxide, indium-tin-zinc oxides (ITZO) in which indium and tin are added as a dopant to zinc oxide, IFO (F-doped $In_2O_3$), tin oxide ($SnO_2$), ATO (Sb-doped $SnO_2$), FTO (F-doped $SnO_2$), zinc oxides (including ZnO doped with other elements), aluminum-zinc oxides (AZO) in which aluminum is added as a dopant to zinc oxide, gallium-zinc oxides (GZO) in which gallium is added as a dopant to zinc oxide, titanium oxide ($TiO_2$), niobium-titanium oxide (TNO) in which niobium is added as a dopant to titanium oxide, antimony oxide, spinel-type oxides, and oxides each having a $YbFe_2O_4$ structure. Alternatively, the transparent electrode may have a base layer including gallium oxide, titanium oxide, niobium oxide, nickel oxide, or the like. The thickness of the transparent electrode may be $2\times10^{-8}$ m to $2\times10^{-7}$ m, or preferably, $3\times10^{-8}$ m to $1\times10^{-7}$ m. In a case where the first electrode is required to be transparent, the other electrodes are preferably also formed with a transparent conductive material, from the viewpoint of simplification of the manufacturing process.

Alternatively, in a case where transparency is not required, the conductive material forming the anode having a function as the electrode for extracting holes is preferably a conductive material having a high work function ($\varphi=4.5$ eV to 5.5 eV, for example), and specific examples of the conductive material include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, the conductive material forming the cathode having a function as the electrode for extracting electrons is preferably a conductive material having a low work function ($\varphi=3.5$ eV to 4.5 eV, for example), and specific examples of the conductive material include alkali metals (such as Li, Na, and K, for example) and fluorides or oxides thereof, alkaline-earth metals (such as Mg and Ca, for example) and fluorides or oxides thereof, aluminum (Al), zinc (Zn), tin (Sn), thallium (Tl), sodium-potassium alloys, aluminum-lithium alloys, magnesium-silver alloys, and rare earth metals such as indium and ytterbium or alloys thereof. Alternatively, examples of the material forming the anode or the cathode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), molybdenum (Mo), alloys containing these metallic elements, conductive particles including these metals, conductive particles containing an alloy of these metals, polysilicon containing impurities, carbon-based materials, oxide semiconductors, carbon nanotubes, and conductive materials such as graphene. The anode or the cathode may also be formed with a stack structure containing these elements. Further, the material forming the anode or the cathode may be an organic material (conductive polymer) such as poly(3,4-ethylenedioxythiophene)/polystyrene sulfonate (PEDOT/PSS). Alternatively, any of these conductive materials may be mixed with a binder (polymer), to form a paste or ink, and the paste or ink may be then cured to be used as an electrode.

The film formation method for forming the first electrode and the like, and the second electrode (the anode and the cathode) may be a dry method or a wet method. Examples of dry methods include physical vapor deposition methods (PVD methods) and chemical vapor deposition methods (CVD methods). Examples of film formation methods using the principles of PVD methods include a vacuum vapor deposition method using resistance heating or high frequency heating, an EB (electron beam) vapor deposition method, various sputtering methods (a magnetron sputtering method, an RF-DC coupled bias sputtering method, an ECR sputtering method, a facing target sputtering method, and a radio-frequency sputtering method), an ion plating method, a laser ablation method, a molecular beam epitaxy method, and a laser transfer method. Further, examples of CVD methods include a plasma CVD method, a thermal CVD method, a metalorganic (MO) CVD method, and an optical CVD method. Meanwhile, examples of wet methods include an electrolytic plating method, an electroless plating method, a spin coating method, an inkjet method, a spray coating method, a stamp method, a microcontact printing method, a flexographic printing method, an offset printing method, a gravure printing method, a dip method, and the like. Examples of patterning methods include a shadow mask technique, laser transfer, chemical etching such as photolithography, and physical etching using ultraviolet light, laser, and the like. The planarization technique for the first electrode and the like, and the second electrode may be a laser planarization method, a reflow method, a chemical mechanical polishing (CMP) method, or the like.

Examples of materials forming the various interlayer insulating layers and insulating films include not only inorganic materials that are typically metallic oxide high-dielectric insulating materials such as: silicon oxide materials; silicon nitride ($SiN_Y$); and aluminum oxide ($Al_2O_3$), but also organic insulating materials (organic polymers) that are typically straight-chain hydrocarbons having a functional group capable of binding to a control electrode at one end, such as: polymethyl methacrylate (PMMA); polyvinyl phenol (PVP); polyvinyl alcohol (PVA); polyimide; polycarbonate (PC); polyethylene terephthalate (PET); polystyrene; silanol derivatives (silane coupling agents) such as N-2 (aminoethyl) 3-aminopropyltrimethoxysilane (AEAPTMS), 3-mercaptopropyltrimethoxysilane (MPTMS), and octadecyltrichlorosilane (OTS); novolac-type phenolic resins; fluorocarbon resins; octadecanethiol; and dodecylisocyanate. Combinations of these materials may also be used. Note that examples of silicon oxide materials include silicon oxide ($SiO_X$), BPSG, PSG, BSG, AsSG, PbSG, silicon oxynitride (SiON), spin-on glass (SOG), and low-dielectric-constant materials (polyarylethers, cycloperfluorocarbon polymers, benzocyclobutene, cyclic fluorine resin, polytetrafluoroethylene, fluorinated aryl ether, fluorinated polyimide, amorphous carbon, and organic SOG, for example).

The configurations and the structures of the floating diffusion layer, the amplification transistor, the reset transistor, and the selection transistor that constitute the control unit may be similar to the configurations and the structures of a conventional floating diffusion layer, a conventional amplification transistor, a conventional reset transistor, and a conventional selection transistor. The drive circuit may also have a known configuration and structure.

The first electrode is connected to the floating diffusion layer and the gate portion of the amplification transistor, but a contact hole portion is only required to be formed to connect the first electrode to the floating diffusion layer and the gate portion of the amplification transistor. Examples of the material forming the contact hole portion include polysilicon doped with impurities, high-melting-point metals such as tungsten, Ti, Pt, Pd, Cu, TiW, TiN, TiNW, $WSi_2$, $MoSi_2$, metal silicides, and stack structures formed with these materials (Ti/TiN/W, for example).

A first carrier blocking layer may be provided between the organic photoelectric conversion layer and the first electrode, or a second carrier blocking layer may be provided between the organic photoelectric conversion layer and the second electrode. Further, a first charge injection layer may be provided between the first carrier blocking layer and the first electrode, or a second charge injection layer may be provided between the second carrier blocking layer and the second electrode. For example, the material forming an electron injection layer may be an alkali metal such as lithium (Li), sodium (Na), or potassium (K), a fluoride or oxide of such an alkali metal, an alkaline-earth metal such as magnesium (Mg) or calcium (Ca), or a fluoride or oxide of such an alkaline-earth metal.

Examples of film formation methods for forming the various organic layers include dry film formation methods and wet film formation methods. Examples of dry film formation methods include resistance heating or radio-frequency heating, a vacuum vapor deposition method using electron beam heating, a flash vapor deposition method, a plasma vapor deposition method, an EB vapor deposition method, various sputtering methods (a bipolar sputtering method, a direct-current sputtering method, a direct-current magnetron sputtering method, a radio-frequency sputtering method, a magnetron sputtering method, an RF-DC coupled bias sputtering method, an ECR sputtering method, a facing target sputtering method, a radio-frequency sputtering method, and an ion beam sputtering method), a direct current (DC) method, an RF method, a multiple cathode method, an activation reaction method, an electric field deposition method, various ion plating methods such as a radio-frequency ion plating method and a reactive ion plating method, a laser ablation method, a molecular beam epitaxy method, a laser transfer method, and a molecular beam epitaxy method (MBE method). Further, examples of CVD methods include a plasma CVD method, a thermal CVD method, a MOCVD method, and an optical CVD method. Meanwhile, specific examples of wet methods include various printing methods such as: a spin coating method; an immersion method; a casting method; a microcontact printing method; a drop casting method; a screen printing method; an inkjet printing method; an offset printing method; a gravure printing method; and a flexographic printing method, and various coating methods such as: a stamp method; a spray method; an air doctor coating method; a blade coating method; a rod coating method; a knife coating method; a squeeze coating method; a reverse roll coating method; a transfer roll coating method; a gravure coating method; a kiss coating method; a cast coating method; a spray coating method; a slit orifice coating method; and a calendar coating method. Note that, in a coating method, non-polar or low-polarity organic solvent such as toluene, chloroform, hexane, or ethanol may be used as the solvent, for example. Examples of patterning methods include a shadow mask technique, laser transfer, chemical etching such as photolithography, and physical etching using ultraviolet light, laser, and the like. The planarization technique for the various organic layers may be a laser planarization method, a reflow method, or the like.

Two types or more of the imaging devices and the like of the first to third embodiments of the present disclosure including the preferred modes and configurations described above, and the imaging devices of the first to sixth configurations described above may be combined as desired.

As described above, in imaging devices or a solid-state imaging apparatus, on-chip microlenses and light blocking layers may be provided as needed, and drive circuits and wiring lines for driving the imaging devices are provided. If necessary, a shutter for controlling light entering the imaging devices may be provided, and the solid-state imaging apparatus may include an optical cut filter, depending on its purpose.

Further, in solid-state imaging apparatuses of the first and second configurations, one on-chip microlens may be disposed above one imaging device. Alternatively, an imaging device block may be formed with two imaging devices, and one on-chip microlens may be disposed above the imaging device block.

For example, in a case where a solid-state imaging apparatus and a readout integrated circuit (ROIC) are stacked, a drive substrate on which the readout integrated circuit and a connecting portion including copper (Cu) are formed, and an imaging device on which a connecting portion is formed are stacked on each other so that the connecting portions are brought into contact with each other, and the connecting portions are joined to each other. In this manner, the solid-state imaging apparatus and the readout integrated circuit can be stacked, and the connecting portions can be joined to each other with solder bumps or the like.

Meanwhile, in a drive method for driving a solid-state imaging apparatus according to the first or second embodiment of the present disclosure may be a method for driving a solid-state imaging apparatus by repeating the following steps:

in all the imaging devices, electric charges in the first electrodes are simultaneously released out of the system, while electric charges are accumulated in the photoelectric conversion layers; after that, in all the imaging devices, the electric charges accumulated in the photoelectric conversion layers are simultaneously transferred to the first electrodes; and, after the transfer is completed, the electric charges transferred to the first electrode are sequentially read out in each of the imaging devices.

In such a method for driving a solid-state imaging apparatus, each imaging device has a structure in which light that has entered from the second electrode side does not enter the first electrode, and the electric charges in the first electrodes are released out of the system while electric charges are accumulated in the photoelectric conversion layers in all the imaging devices. Thus, the first electrodes can be reliably reset at the same time in all the imaging devices. After that, the electric charges accumulated in the photoelectric conversion layers are simultaneously transferred to the first electrodes in all the imaging devices, and, after the transfer is completed, the electric charges transferred to the first electrode are sequentially read out in each imaging device. Thus, a so-called global shutter function can be easily achieved.

Example 1

Figure 2:
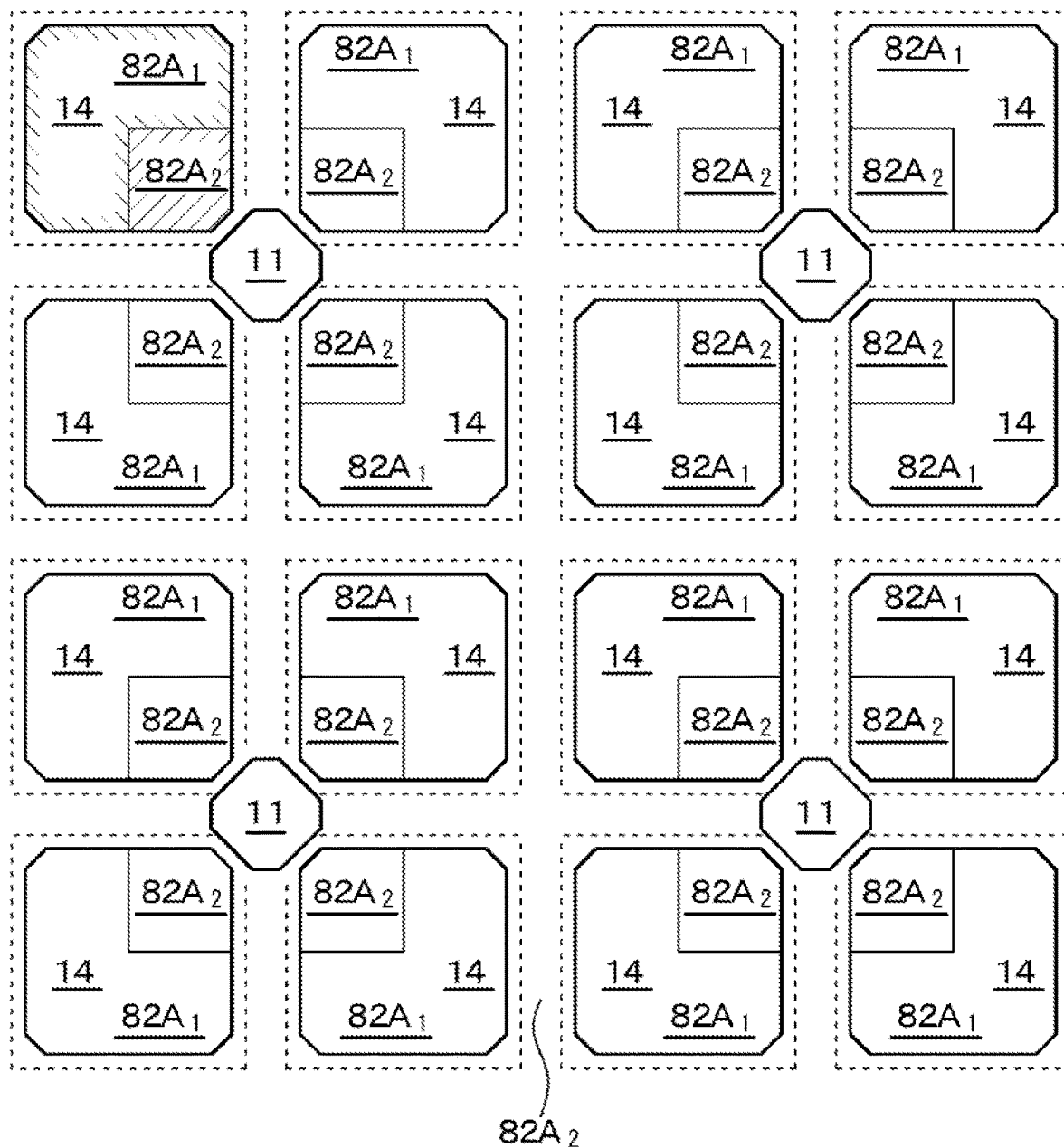
FIG. 2 is a diagram schematically showing the positional relationship among a first electrode, an insulating layer, and the like in an imaging device of Example 1.

Example 1 relates to an imaging device according to the first embodiment of the present disclosure. Note that imaging devices will be described in detail in Example 6 and Examples that follow. FIG. 1A shows a schematic partial cross-sectional view of an imaging device of Example 1. FIG. 2 schematically shows the positional relationship of first electrodes, insulating layers, and the like in imaging devices of Example 1. Note that, to simplify the drawings, the various imaging device components located below the interlayer insulating layer, which will be described later, will be collectively denoted by reference numeral 91 in some cases, for the sake of convenience. Reference numbers 63, 64, 65, 66, and 81 will also be described in Example 6.

An imaging device of Example 1 includes:

a first electrode 11;

a charge storage electrode 14 disposed at a distance from the first electrode 11;

a photoelectric conversion layer 13 that is in contact with the first electrode 11 and is formed above the charge storage electrode 14 via an insulating layer 82; and a second electrode 12 formed on the photoelectric conversion layer 13.

Further, the portion of the insulating layer 82 located between the charge storage electrode 14 and the photoelectric conversion layer 13 includes a first region $82a_1$ and a second region $82a_2$, the portion of the insulating layer that occupies the first region $82a_1$ is formed with a first insulating layer $82A_1$, the portion of the insulating layer that occupies the second region $82a_2$ is formed with a second insulating layer $82A_2$, and the absolute value of the fixed charge of the material forming the second insulating layer $82A_2$ is smaller than the absolute value of the fixed charge of the material forming the first insulating layer $82A_1$.

Here, in the imaging device of Example 1, the second region $82a_2$ is located to face the first electrode 11, and the first region $82a_1$ is located adjacent to the second region $82a_2$. That is, the first region $82a_1$ and the second region $82a_2$ are located at the same level. Only in one of the imaging devices shown in FIG. 2, the first insulating layer $82A_1$ is indicated by diagonal lines extending from upper right to lower left, and the second insulating layer $82A_2$ is indicated by diagonal lines extending from upper left to lower right. The first electrodes 11 and the charge storage electrodes 14 are also shown in the drawing. In the example shown in FIG. 2, one common first electrode 11 is provided for the four charge storage electrodes 14 in four imaging devices. However, such a mode is not necessarily adopted. One first electrode 11 may be provided for one charge storage electrode 14, or one common first electrode 11 may be provided for two charge storage electrodes 14, for example. That is, one (common) first electrode 11 is only required to be provided for one charge storage electrode 14 or two or more charge storage electrodes 14. The same applies in the description below. The second insulating layer $82A_2$ is provided between the imaging devices. The second insulating layer $82A_2$ is also provided between the first electrodes 11 and the charge storage electrodes 14.

The material forming the first insulating layer $82A_1$ has the same polarity as that of carriers to be generated in the photoelectric conversion layer 13 and be sent to the first electrode 11. Specifically, the carriers to be sent to the first electrode 11 are electrons, the first insulating layer $82A_1$ is formed with at least one material (more specifically, aluminum oxide, $Al_2O_3$, for example) selected from the group including aluminum oxide, hafnium oxide, zirconium oxide, tantalum oxide, and titanium oxide, and the second insulating layer $82A_2$ is formed with silicon oxide ($SiO_2$).

Where the area of the first region $82a_1$ is represented by $S_1$, and the area of the second region $82a_2$ is represented by $S_2$, an imaging device of Example 1 preferably satisfy $$0.1 \leq S_2/(S_1+S_2) \leq 0.9,$$

or specifically, may satisfy the following, for example: $S_2/(S_1+S_2)=0.5$ Further, the values of fixed charges of aluminum oxide ($Al_2O_3$) and the like are as follows.

In an imaging apparatus of Example 1, the absolute value of the fixed charge of the material forming the second insulating layer is smaller than the absolute value of the fixed charge of the material forming the first insulating layer. Accordingly, during charge transfer, a difference is caused between the transfer state of the electric charges accumulated in the portion of the photoelectric conversion layer located on the first insulating layer and the transfer state of the electric charges accumulated in the portion of the photoelectric conversion layer located on the second insulating layer. As a result, the electric charges accumulated in the photoelectric conversion layer can be more reliably transferred to the first electrode during charge transfer.

That is, in an imaging device of Example 1, during charge accumulation, carriers (electrons) generated in the photoelectric conversion layer 13 are attracted to the charge storage electrode 14, but the first region $82a_1$ (the first insulating layer $82A_1$) has the same polarity (specifically, the negative polarity) as the polarity (specifically, the negative polarity) of the carriers to be generated in the photoelectric conversion layer 13 and be sent to the first electrode 11. Accordingly, the carriers (electrons) in the portion of the photoelectric conversion layer 13 located on the first region $82a_1$ easily move to the portion of the photoelectric conversion layer 13 located on the second region $82a_2$ (the first insulating layer $82A_2$), and most of them are accumulated in the portion of the photoelectric conversion layer 13 located on the second region $82a_2$ (or the portion closer to the first electrode 11). As a result, during charge transfer, the electric charges accumulated in the photoelectric conversion layer 13 can be more reliably transferred to the first electrode 11.

Furthermore, each imaging device of Example 1 or Examples 2 to 5 described later includes a charge storage electrode that is disposed at a distance from the first electrode, and is positioned to face the photoelectric conversion layer via an insulating layer. Accordingly, when light is emitted onto the photoelectric conversion unit, and photoelectric conversion is performed in the photoelectric conversion unit, electric charges can be stored into the photoelectric conversion layer. Thus, at the start of exposure, the charge storage portion can be fully depleted, and the electric charges can be erased. As a result, it is possible to reduce or prevent the occurrence of a phenomenon in which the kTC noise becomes larger, the random noise is aggravated, and the imaging quality is lowered.

Figure 1B:
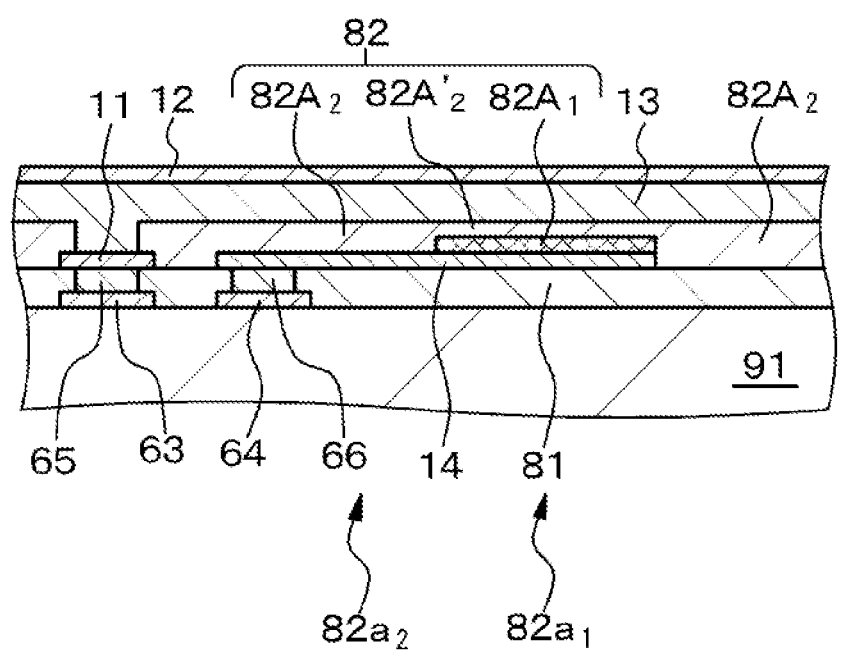

FIG. 1B shows a schematic partial cross-sectional view of a modification of an imaging device of Example 1. In this modification, a second insulating layer extension portion $82A_2'$ extending from the second insulating layer $82A_2$ is formed between the first insulating layer $82A_1$ and the photoelectric conversion layer 13. The first region $82a_1$ and the second region $82a_2$ are located at the same level. That is, the portion located immediately under the photoelectric conversion layer 13 is occupied by the second insulating layer $82A_2$ (specifically, $SiO_2$) whose fixed charge has a smaller absolute value than the absolute value of the fixed charge of the material forming the first insulating layer $82A_1$. Accordingly, the space between the photoelectric conversion layer 13 and the charge storage electrode 14 can be occupied by an insulating layer having excellent characteristics as a whole.

Example 2

Figure 3A:
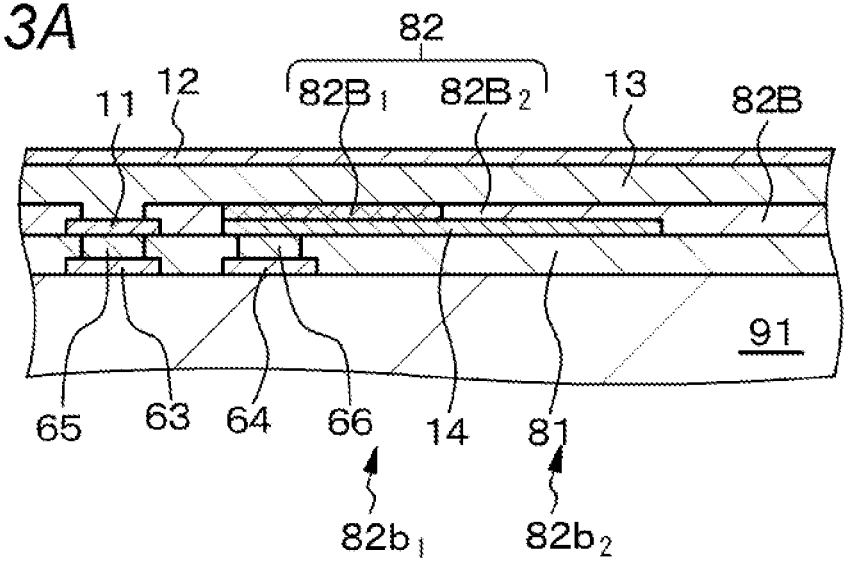
FIGS. 3A and 3B are schematic partial cross-sectional views of an imaging device of Example 2 and a modification thereof.
Figure 4:
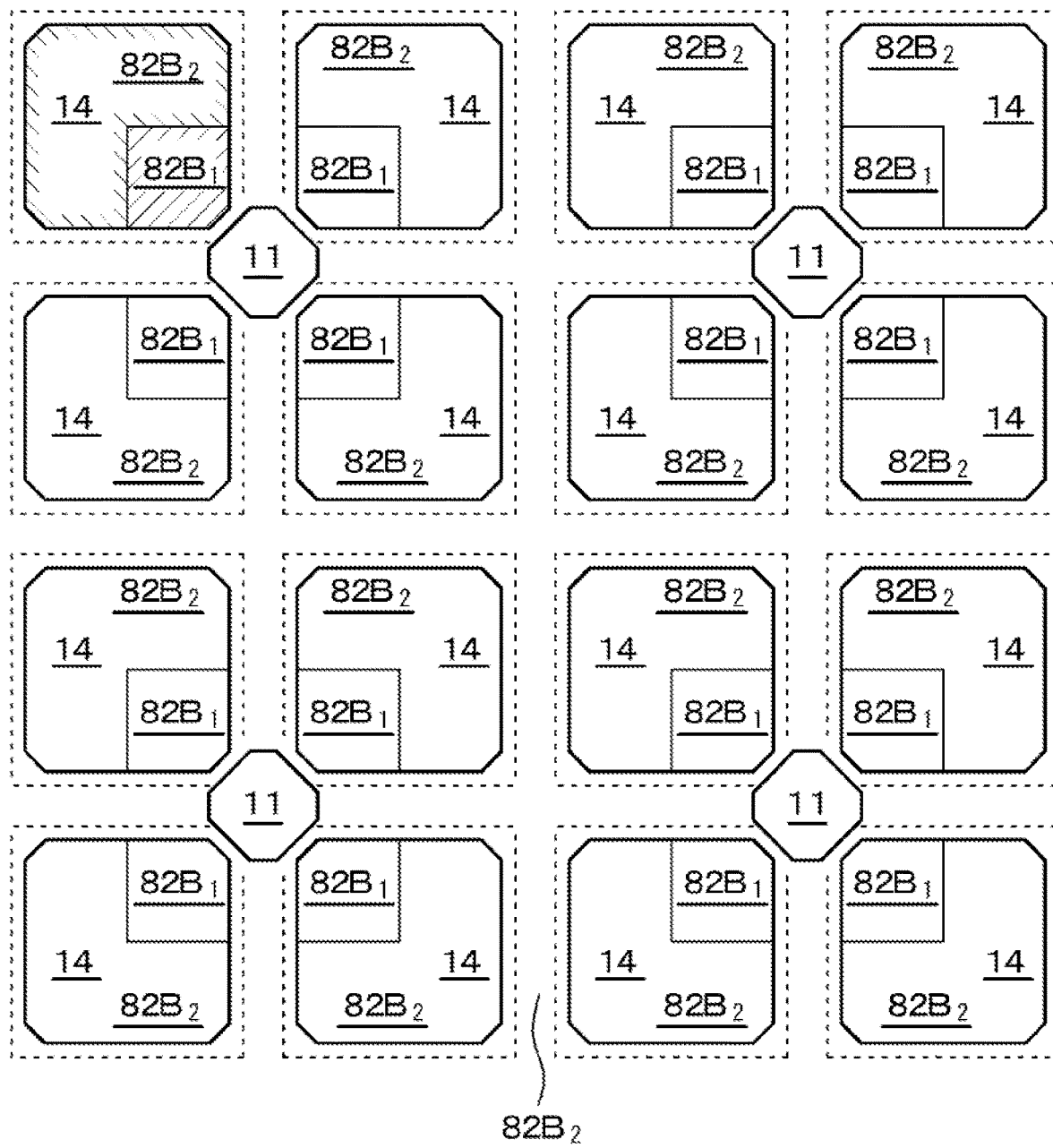
FIG. 4 is a diagram schematically showing the positional relationship among a first electrode, an insulating layer, and the like in an imaging device of Example 2.

Example 2 is a modification of Example 1, and relates to an imaging device according to the first embodiment B of the present disclosure. FIG. 3A shows a schematic partial cross-sectional view of an imaging device of Example 2. Further, FIG. 4 schematically shows the positional relationship among first electrodes, insulating layers, and the like in imaging devices of Example 2.

In an imaging device of Example 2, a first region $82b_1$ is located to face the first electrode 11, and a second region $82b_2$ is located adjacent to the first region $82b_1$. The first region $82b_1$ and the second region $82b_2$ are located at the same level. Only in one of the imaging devices shown in FIG. 4, a first insulating layer $82B_1$ is indicated by diagonal lines extending from upper right to lower left, and a second insulating layer $82B_2$ is indicated by diagonal lines extending from upper left to lower right. The second insulating layer $82B_2$ is provided between the imaging devices. The second insulating layer $82B_2$ is also provided between the first electrodes 11 and the charge storage electrodes 14. Further, the material forming the first insulating layer $82B_1$ has a polarity (specifically, the positive polarity) that is different from the polarity (specifically, the negative polarity) of carriers to be generated in the photoelectric conversion layer 13 and be sent to the first electrode 11. Specifically, the carriers to be sent to the first electrode 11 are electrons, the first insulating layer $82B_1$ is formed with silicon oxynitride or silicon nitride (or more specifically, silicon nitride, SiN), and the second insulating layer $82B_2$ is formed with silicon oxide ($SiO_2$).

Where the area of the first region $82b_1$ is represented by $S_1$, and the area of the second region $82b_2$ is represented by $S_2$, an imaging device of Example 2 preferably satisfy $0.1 \leq S_2/(S_1+S_2) \leq 0.9$, or specifically, may satisfy the following, for example:

$S_2/(S_1+S_2)=0.5$.

In an imaging device of Example 2, during charge accumulation, carriers (electrons) generated in the photoelectric conversion layer 13 are attracted to the charge storage electrode 14, but the first region $82b_1$ (the first insulating layer $82B_1$) has a different polarity from the polarity of the carriers to be generated in the photoelectric conversion layer 13 and be sent to the first electrode 11. Accordingly, the carriers (electrons) in the portion of the photoelectric conversion layer 13 located on the first region $82b_1$ (the first insulating layer $82B_1$) easily move to the portion of the photoelectric conversion layer 13 located on the second region $82b_2$, and most of the carriers are accumulated in the portion of the photoelectric conversion layer 13 located on the first region $82b_1$ (the first insulating layer $82B_1$) (or the portion closer to the first electrode 11). As a result, during charge transfer, the electric charges accumulated in the photoelectric conversion layer 13 can be more reliably transferred to the first electrode 11.

Figure 3B:
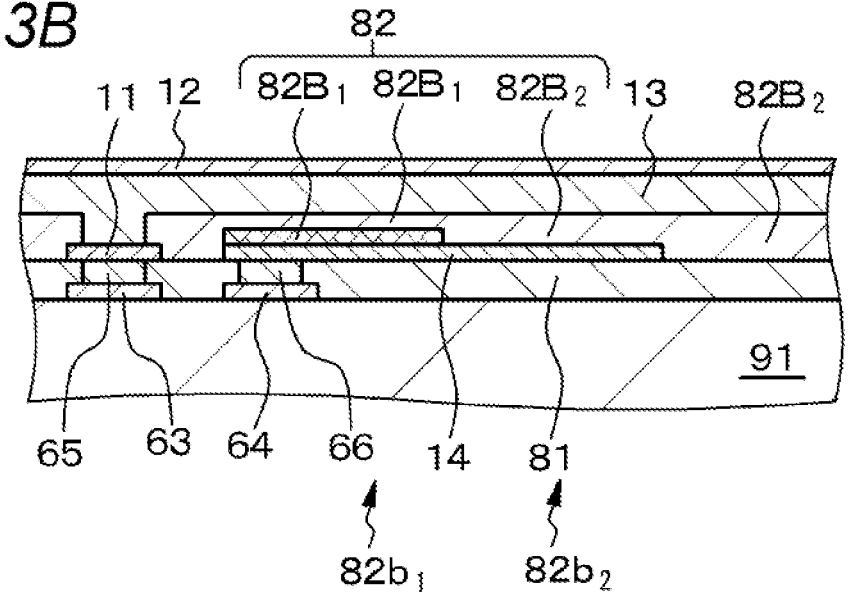

FIG. 3B shows a schematic partial cross-sectional view of a modification of an imaging device of Example 2. In this modification, a second insulating layer extension portion $82B_2'$ extending from the second insulating layer $82B_2$ is formed between the first insulating layer $82B_1$ and the photoelectric conversion layer 13. The first region $82b_1$ and the second region $82b_2$ are located at the same level. That is, the portion located immediately under the photoelectric conversion layer 13 is occupied by the second insulating layer $82B_2$ (specifically, $SiO_2$) whose fixed charge has a smaller absolute value than the absolute value of the fixed charge of the material forming the first insulating layer $82B_1$. Accordingly, the space between the photoelectric conversion layer 13 and the charge storage electrode 14 can be occupied by an insulating layer having excellent characteristics as a whole.

Example 3

Figure 3C:
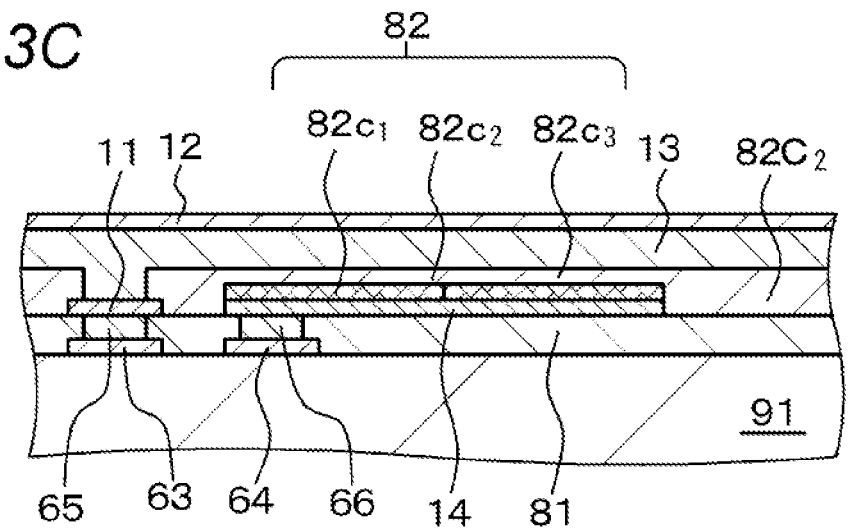
FIG. 3C is a schematic partial cross-sectional view of an imaging device of Example 3.
Figure 5:
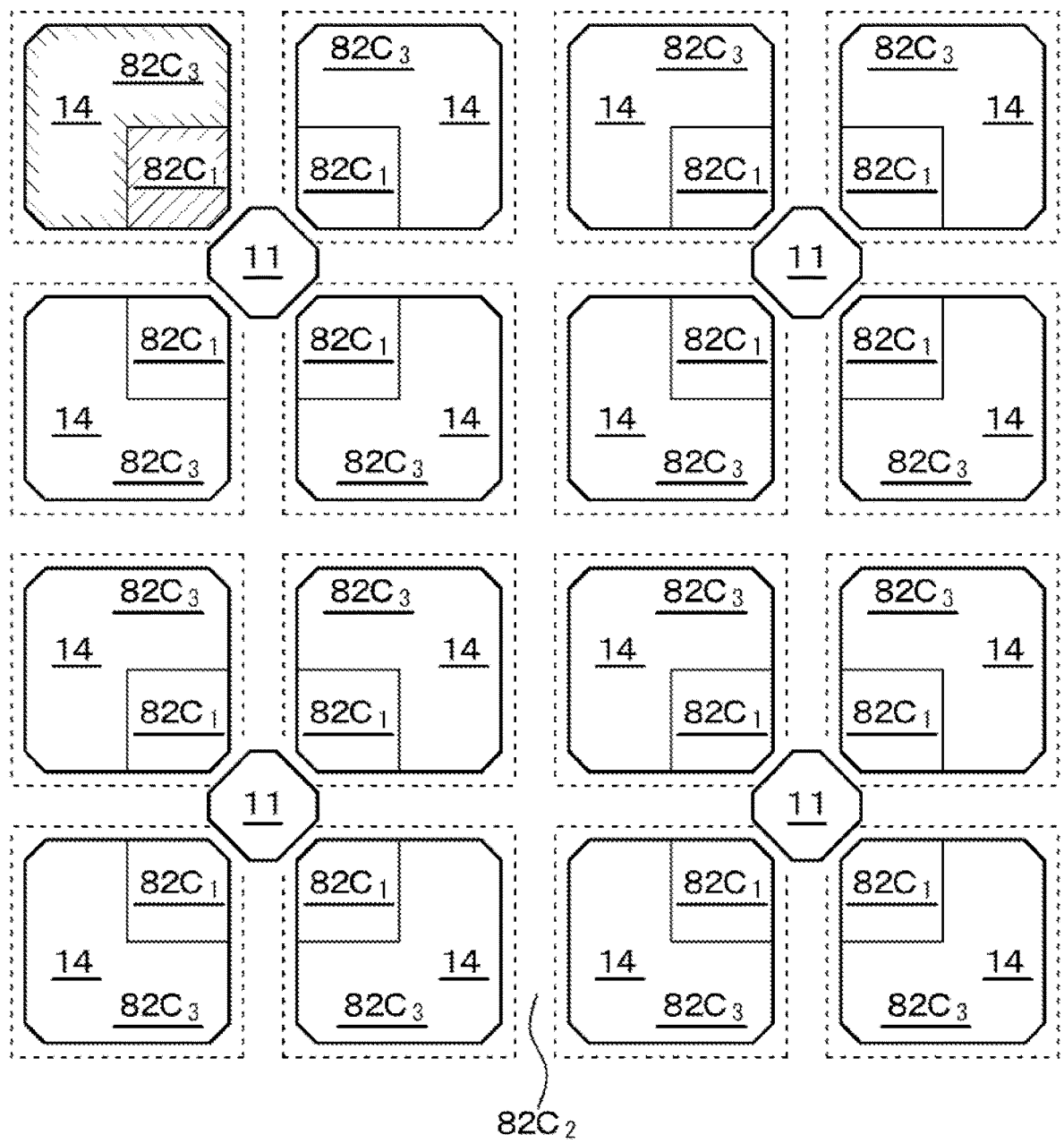
FIG. 5 is a diagram schematically showing the positional relationship among a first electrode, an insulating layer, and the like in an imaging device of Example 3.

Example 3 is also a modification of Example 1, and relates to an imaging device according to the first embodiment C of the present disclosure. FIG. 3C shows a schematic partial cross-sectional view of an imaging device of Example 3. Further, FIG. 5 schematically shows the positional relationship among first electrodes, insulating layers, and the like in imaging devices of Example 3.

In an imaging device of Example 3, the portion of the insulating layer located between the charge storage electrode 14 and the photoelectric conversion layer 13 further includes a third region $82c_3$, the first region $82c_1$ is located facing the first electrode 11, the third region $82c_3$ is located adjacent to the first region $82c_1$, the second region $82c_2$ is located between the first region $82c_1$ and the photoelectric conversion layer 13, and between the third region $82c_3$ and the photoelectric conversion layer 13, the portion of the insulating layer that occupies the third region $82c_3$ is formed with a third insulating layer $82C_3$, and the absolute value of the fixed charge of the material forming the second insulating layer $82C_2$ is smaller than the absolute value of the fixed charge of the material forming the third insulating layer $82C_3$.

The first region $82c_1$ and the third region $82c_3$ are located at the same level. Only in one of the imaging devices shown in FIG. 5, the first insulating layer $82C_1$ is indicated by diagonal lines extending from upper right to lower left, and the third insulating layer $82C_3$ is indicated by diagonal lines extending from upper left to lower right. The second insulating layer 82C₂ is provided between the imaging devices. The second insulating layer 82C₂ is also provided between the first electrodes 11 and the charge storage electrodes 14. Further, the material forming the first insulating layer 82C₁ has a polarity (specifically, the positive polarity) that is different from the polarity (specifically, the negative polarity) of carriers to be generated in the photoelectric conversion layer 13 and be sent to the first electrode 11, and the material forming the third insulating layer 82C₃ has the same polarity (specifically, the negative polarity) as the polarity of the carriers to be generated in the photoelectric conversion layer 13 and be sent to the first electrode 11. Specifically, the carriers to be sent to the first electrode 11 are electrons, the first insulating layer 82C₁ is formed with silicon oxynitride or silicon nitride (specifically, silicon nitride, SiN), the third insulating layer 82C3 is formed with at least one material (specifically, aluminum oxide, Al₂O₃, for example) selected from the group including aluminum oxide, hafnium oxide, zirconium oxide, tantalum oxide, and titanium oxide, and the second insulating layer 82C₂ is formed with silicon oxide (SiO₂).

Where the area of the first region $82c_1$ is represented by $S_1$, and the area of the third region $82c_3$ is represented by $S_3$, an imaging device of Example 3 preferably satisfy $$0.1 \leq S_1/(S_1+S_3) \leq 0.9,$$

or specifically, may satisfy the following, for example:

$$S_1/(S_1+S_3)=0.5$$

In an imaging device of Example 3, during charge accumulation, carriers (electrons) generated in the photoelectric conversion layer 13 are attracted to the charge storage electrode 14. However, the first region $82c_1$ (the first insulating layer 82C₁) has a different polarity from the polarity of the carriers to be generated in the photoelectric conversion layer 13 and be sent to the first electrode 11, and the third region $82c_3$ (the first insulating layer 82C₃) has the same polarity as the polarity of the carriers to be generated in the photoelectric conversion layer 13 and be sent to the first electrode 11. Accordingly, the carriers (electrons) in the portion of the photoelectric conversion layer 13 located on the third region $82c_3$ (the third insulating layer 82C₃) easily move to the portion of the photoelectric conversion layer 13 located on the first region $82c_1$ (the first insulating layer 82C₁), and most of the carriers are accumulated in the portion of the photoelectric conversion layer 13 located on the first region $82c_1$ (the first insulating layer 82C₁) (or the portion closer to the first electrode 11). As a result, during charge transfer, the electric charges accumulated in the photoelectric conversion layer 13 can be more reliably transferred to the first electrode 11.

Example 4

Figure 6A:
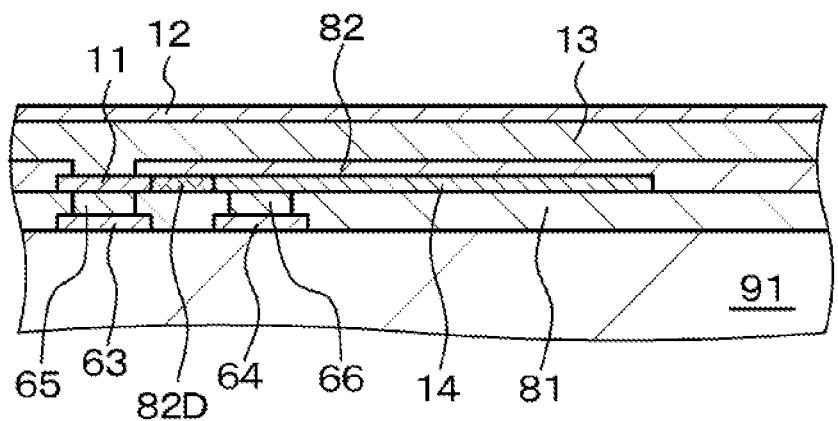
FIGS. 6A and 6B are schematic partial cross-sectional views of an imaging device of Example 4 and a modification thereof.
Figure 7:
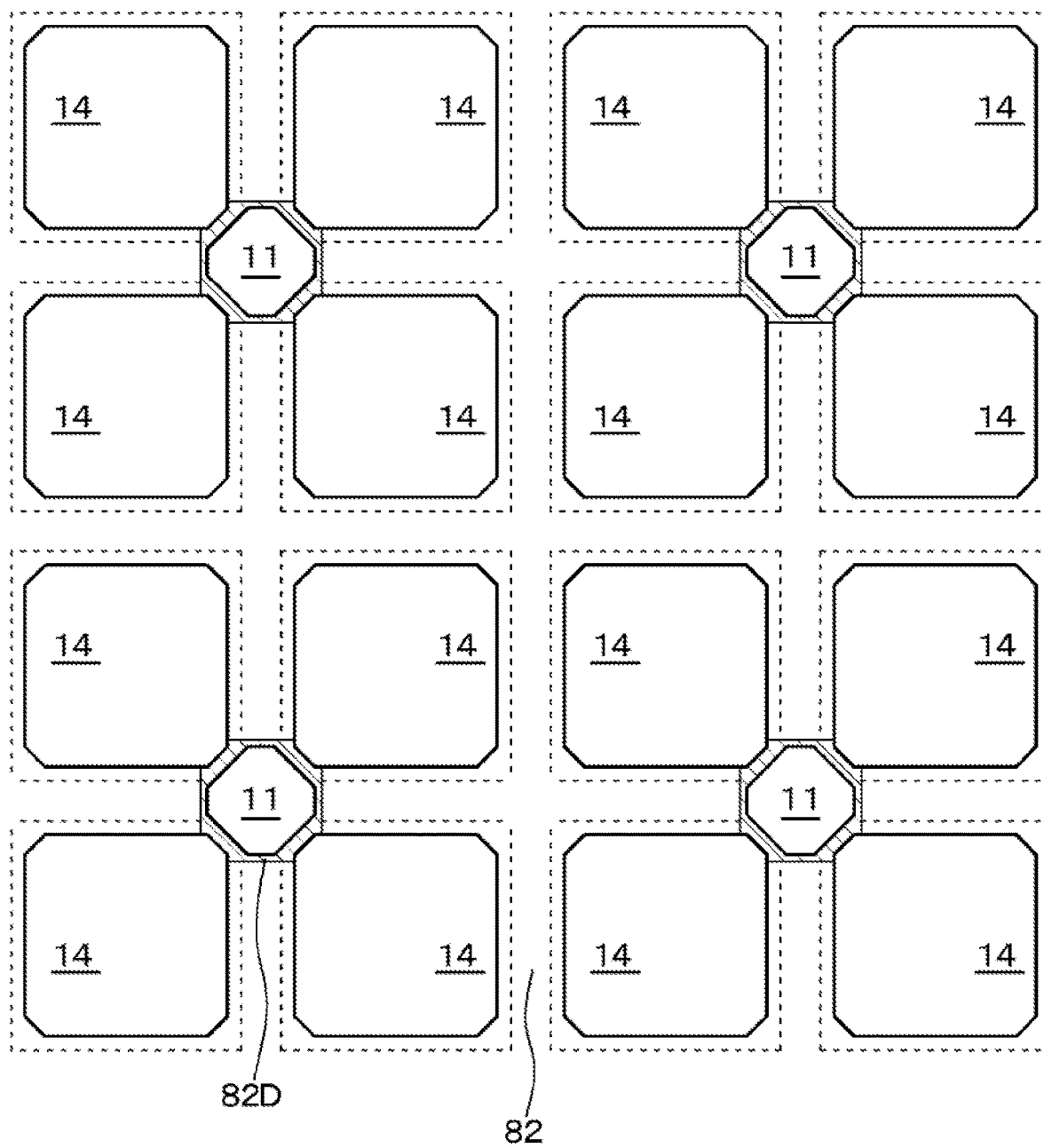
FIG. 7 is a diagram schematically showing the positional relationship among a first electrode, an insulating layer, and the like in an imaging device of Example 4.

Example 4 relates to an imaging device according to the second embodiment of the present disclosure. FIG. 6A shows a schematic partial cross-sectional view of an imaging device of Example 4. Further, FIG. 7 schematically shows the positional relationship among first electrodes, insulating layers, and the like in imaging devices of Example 4. Note that, in FIG. 7, the insulating material layer is indicated by diagonal lines, so that the insulating material layer is clearly shown.

An imaging device of Example 4 includes:
a first electrode 11;
a charge storage electrode 14 disposed at a distance from the first electrode 11;
a photoelectric conversion layer 13 that is formed in contact with the first electrode 11 and is located above the charge storage electrode 14 via an insulating layer 82; and
a second electrode 12 formed on the photoelectric conversion layer 13.

An insulating material layer (a first insulating material layer) 82D is provided between the first electrode 11 and the charge storage electrode 14, and the material forming the insulating material layer (the first insulating material layer) 82D has a polarity (specifically, the positive polarity) that is different from the polarity (specifically, the negative polarity) of carriers to be generated in the photoelectric conversion layer 13 and be sent to the first electrode 11. Here, in Example 4, the carriers to be sent to the first electrode 11 are electrons, the insulating material layer 82D is formed with silicon oxynitride or silicon nitride (or more specifically, silicon nitride, SiN), and the insulating layer 82 is formed with silicon oxide (SiO₂).

In the example shown in the drawing, the insulating material layer 82D has the same thickness as the charge storage electrode 14, but may be thinner or thicker than the charge storage electrode 14. The insulating layer 82 is preferably formed on the insulating material layer 82D. That is, the insulating layer 82 is provided between the imaging devices, and between the first electrodes 11 and the charge storage electrodes 14.

In an imaging device of Example 4, the material forming the insulating material layer has a different polarity from that of carriers to be generated in the photoelectric conversion layer and be sent to the first electrode. Accordingly, during charge transfer, the electric charges accumulated in the photoelectric conversion layer are transferred to the first electrode via the photoelectric conversion layer located on or above the insulating material layer, but this transfer can be more reliably performed.

Figure 6B:
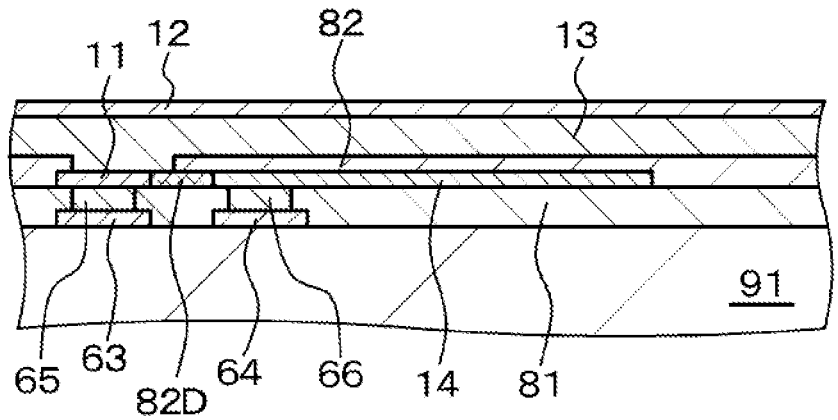

The insulating layer 82 extends along at least a portion between the photoelectric conversion layer 13 and the insulating material layer 82D. In the example shown in FIG. 6A, the insulating layer 82 is provided between the first electrode 11 and the charge storage electrode 14. In a modification of an imaging device of Example 4 whose schematic partial cross-sectional view is shown in FIG. 6B, on the other hand, the insulating layer 82 is provided at a portion between the first electrode 11 and the charge storage electrode 14. That is, the photoelectric conversion layer 13 is in contact with not only the first electrode 11 but also part of the insulating material layer 82D. Accordingly, during charge transfer, the electric charges accumulated in the photoelectric conversion layer 13 are transferred to the first electrode 11 via the photoelectric conversion layer 13 located above the insulating material layer 82D, and via the insulating material layer 82D. Thus, this transfer can be more reliably performed.

Alternatively, the insulating material layer 82D may be provided adjacent to at least part of the portion of the charge storage electrode 14 that does not face the first electrode 11. In other words, between the imaging devices, the insulating material layer 82D and the insulating layer 82 may be stacked.

An imaging device of any of Examples 1 to 3 or modifications thereof can be combined with an imaging device of Example 4 or a modification thereof. That is, in an imaging device of any of Examples 1 to 3 or modifications thereof, the insulating material layer 82D may be provided between the first electrode 11 and the charge storage electrode 14, and the material forming the insulating material layer 82D may have a different polarity from that of the carriers to be generated in the photoelectric conversion layer 13 and be sent to the first electrode 11.

Example 5

Figure 8A:
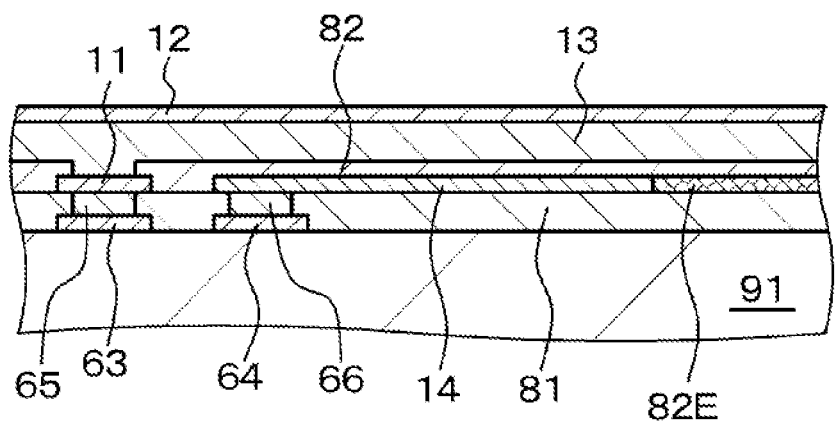
FIGS. 8A and 8B are schematic partial cross-sectional views of an imaging device of Example 5 and a modification thereof.
Figure 9:
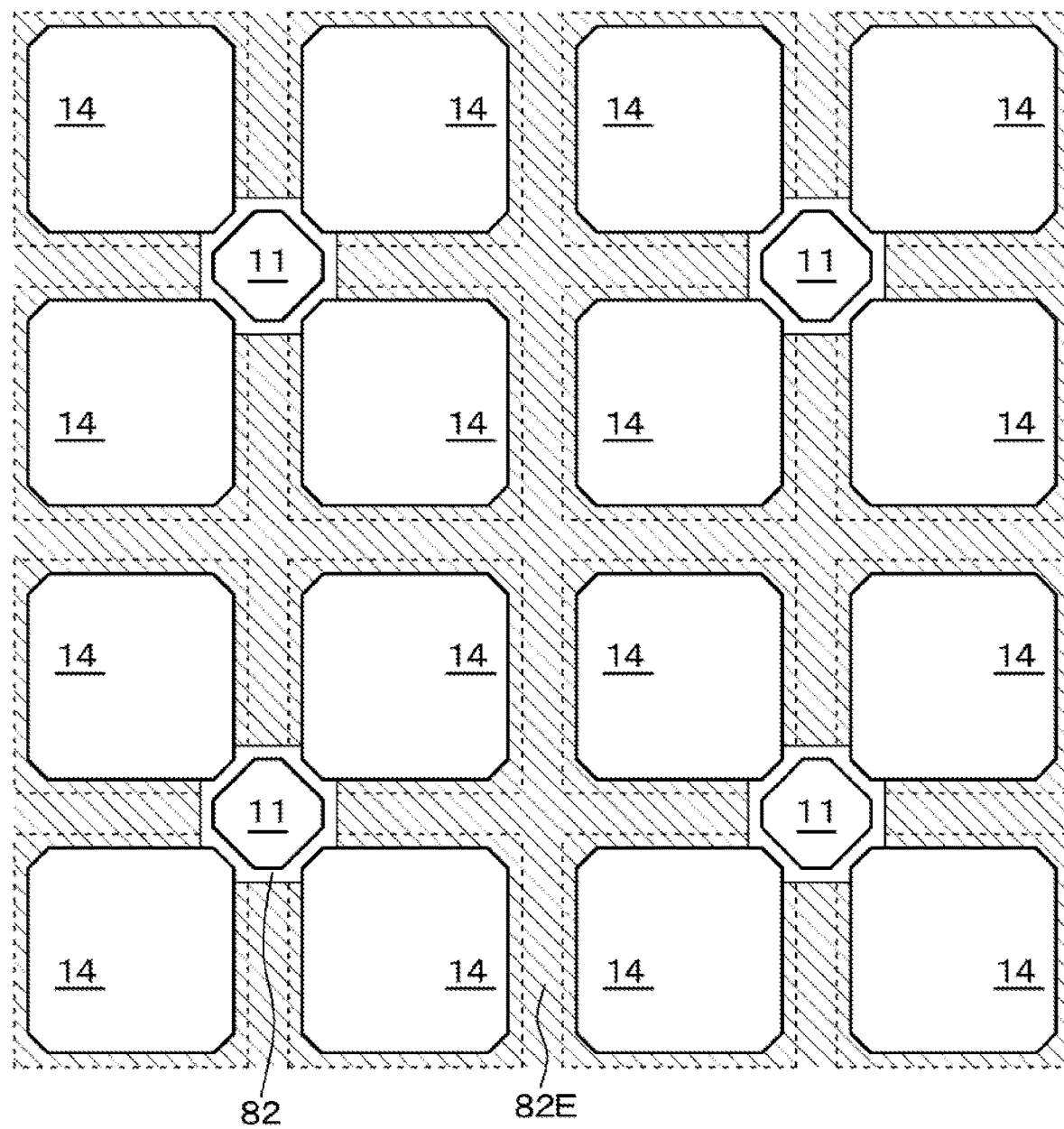
FIG. 9 is a diagram schematically showing the positional relationship among a first electrode, an insulating layer, and the like in the imaging device of Example 5 shown in FIG. 8A.

Example 5 relates to an imaging device according to the third embodiment of the present disclosure. FIG. 8A shows a schematic partial cross-sectional view of an imaging device of Example 4. Further, FIG. 9 schematically shows the positional relationship among first electrodes, insulating layers, and the like in imaging devices of Example 4. In FIG. 9, the insulating material layer is indicated by diagonal lines, so that the insulating material layer is clearly shown.

An imaging device of Example 5 includes:

a first electrode 11;

a charge storage electrode 14 disposed at a distance from the first electrode 11;

a photoelectric conversion layer 13 that is formed in contact with the first electrode 11 and is located above the charge storage electrode 14 via an insulating layer 82; and a second electrode 12 formed on the photoelectric conversion layer 13.

An insulating material layer (for the sake of convenience, sometimes referred to as the "second insulating material layer", to be distinguished from the insulating material layer (the first insulating material layer) 82D of Example 4) 82E is provided in contact with at least part of the portion of the charge storage electrode 14, the portion not facing the first electrode 11, and the material forming the second insulating material layer 82E has the same polarity (specifically, the negative polarity) as the polarity (specifically, the negative polarity) of carriers to be generated in the photoelectric conversion layer 13 and be sent to the first electrode 11. Further, the carriers to be sent to the first electrode 11 are electrons, and the second insulating material layer 82E is formed with at least one material (more specifically, aluminum oxide, $Al_2O_3$) selected from the group including aluminum oxide, hafnium oxide, zirconium oxide, tantalum oxide, and titanium oxide.

In an imaging device of Example 5, the material forming the insulating material layer (the second insulating material layer) has the same polarity as the polarity of carriers to be generated in the photoelectric conversion layer and be sent to the first electrode. Accordingly, it is possible to reduce or prevent flow of electric charges toward the insulating material layer (the second insulating material layer) during charge accumulation and charge transfer, and the electric charges accumulated in the photoelectric conversion layer can be more reliably transferred to the first electrode during charge transfer.

An imaging device of any of Examples 1 to 3 or modifications thereof can be combined with an imaging device of Example 5 or a modification thereof. That is, in an imaging device of any of Examples 1 to 3 or modifications thereof, the insulating material layer 82E (the second insulating material layer 82E) may be provided in contact with at least part of the portion of the charge storage electrode 14 not facing the first electrode 11, and the material forming the insulating material layer 82E (the second insulating material layer 82E) may have the same polarity as the polarity of the carriers to be generated in the photoelectric conversion layer 13 and be sent to the first electrode 11.

Figure 8B:
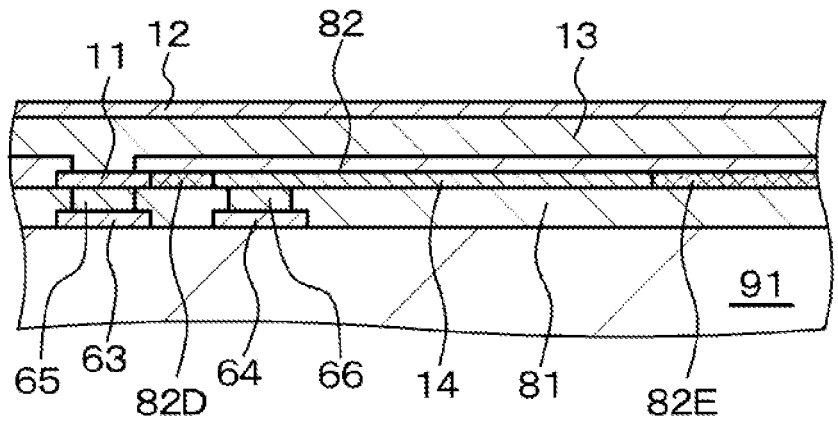
Figure 10:
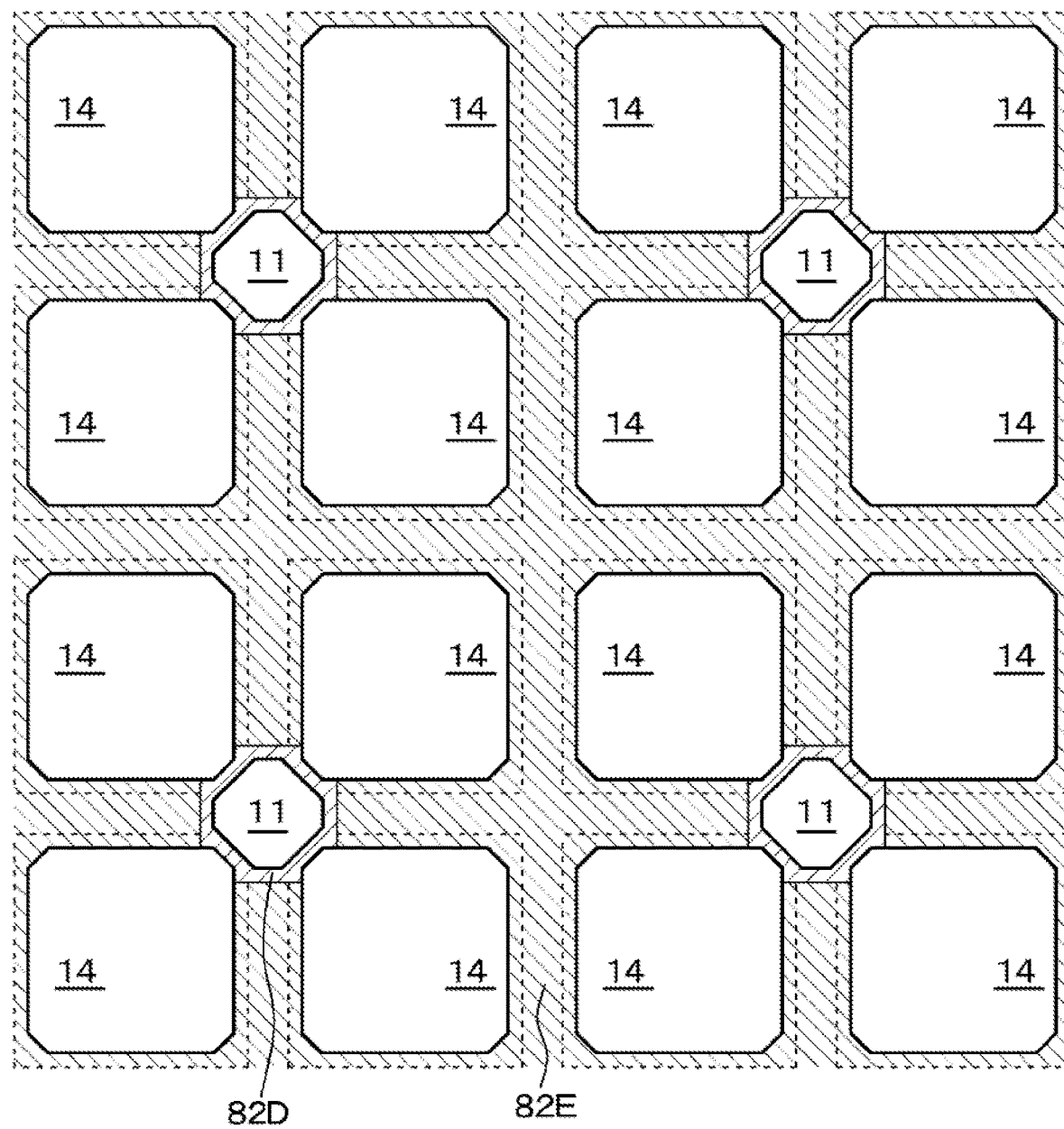
FIG. 10 is a diagram schematically showing the positional relationship among a first electrode, an insulating layer, and the like in the modification of the imaging device of Example 5 shown in FIG. 8B (a combination of an imaging device of Example 4 and an imaging device of Example 5).

Alternatively, an imaging device of Example 4 or a modification thereof can be combined with an imaging device of Example 5 or a modification thereof. That is, as shown in a schematic partial cross-sectional view in FIG. 8B, and as shown in FIG. 10 schematically showing the positional relationship among first electrodes, insulating layers, and the like, in an imaging device of Example 4 or a modification thereof, the second insulating material layer 82E may be provided in contact with at least part of the portion of the charge storage electrode 14 not facing the first electrode 11, and the material forming the second insulating material layer 82E may have the same polarity as the polarity of the carriers to be generated in the photoelectric conversion layer 13 and be sent to the first electrode 11. Note that, in FIG. 10, the insulating material layer 82D and the second insulating material layer 82E are indicated by diagonal lines, so that the insulating material layer 82D and the second insulating material layer 82E are clearly distinguished. Further, the carriers to be sent to the first electrode 11 may be electrons, the insulating material layer 82D may be formed with silicon oxynitride or silicon nitride, and the second insulating material layer 82E may be formed with at least one material selected from the group including aluminum oxide, hafnium oxide, zirconium oxide, tantalum oxide, and titanium oxide.

Example 6

Example 6 relates to a stacked imaging device of the present disclosure, and to a solid-state imaging apparatus according to the second embodiment of the present disclosure. That is, a stacked imaging device of Example 6 includes at least one of imaging devices of Examples 1 to 5 or modifications thereof, and a solid-state imaging apparatus of Example 6 includes a plurality of stacked imaging devices of Example 6.

Figure 11:
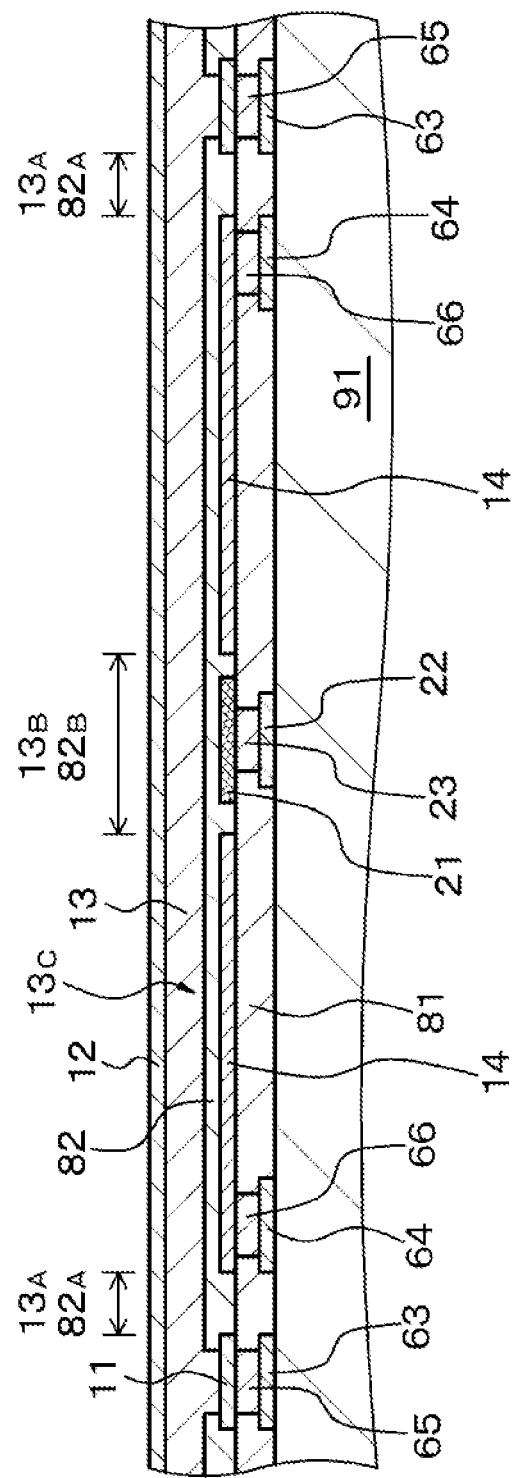
FIG. 11 is a schematic cross-sectional view of part of an imaging device (two imaging devices arranged side by side) of Example 6.
Figure 12:
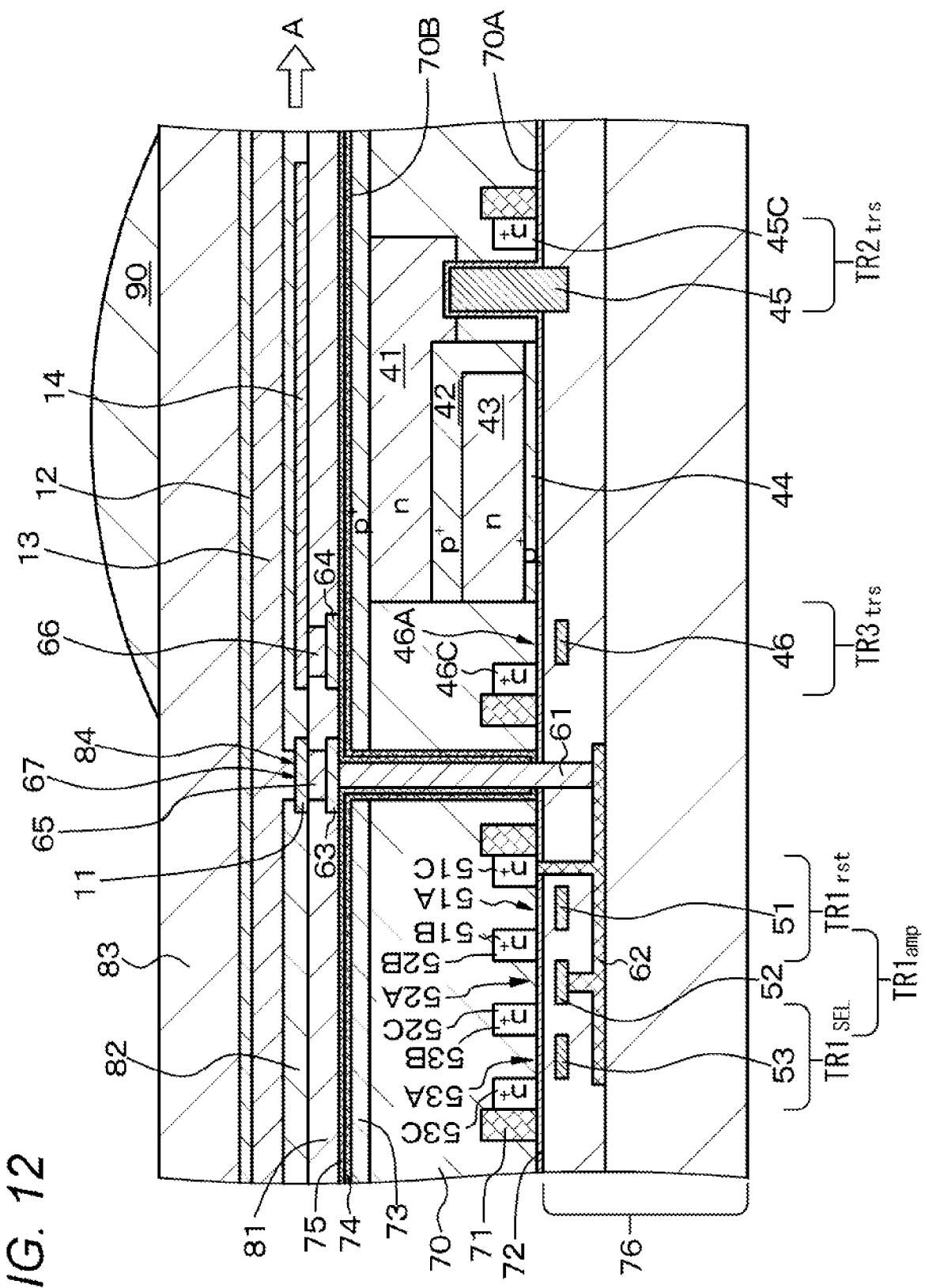
FIG. 12 is a schematic partial cross-sectional view of an imaging device and a stacked imaging device of Example 6.
Figure 13:
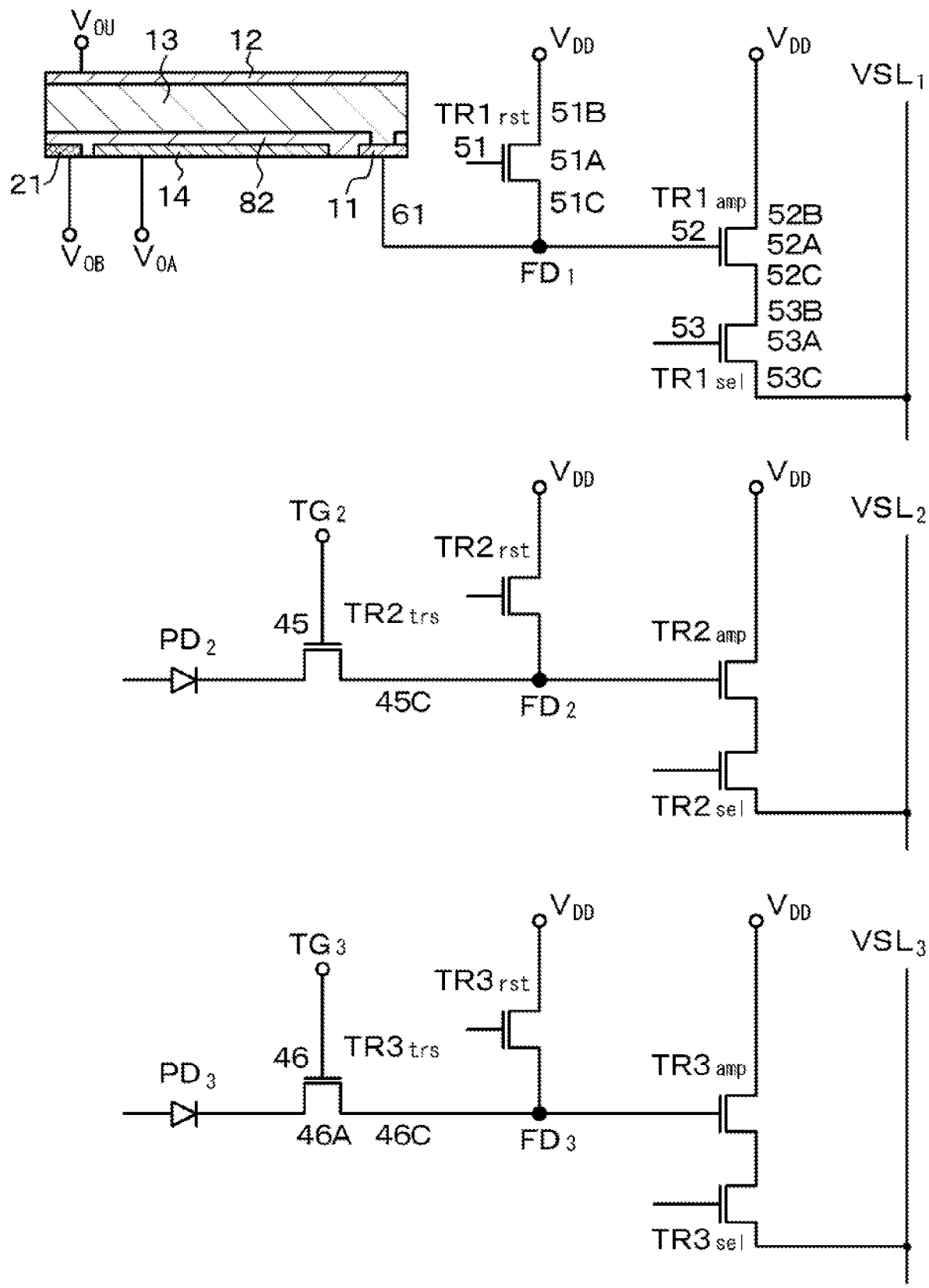
FIG. 13 is an equivalent circuit diagram of an imaging device and a stacked imaging device of Example 6.
Figure 14:
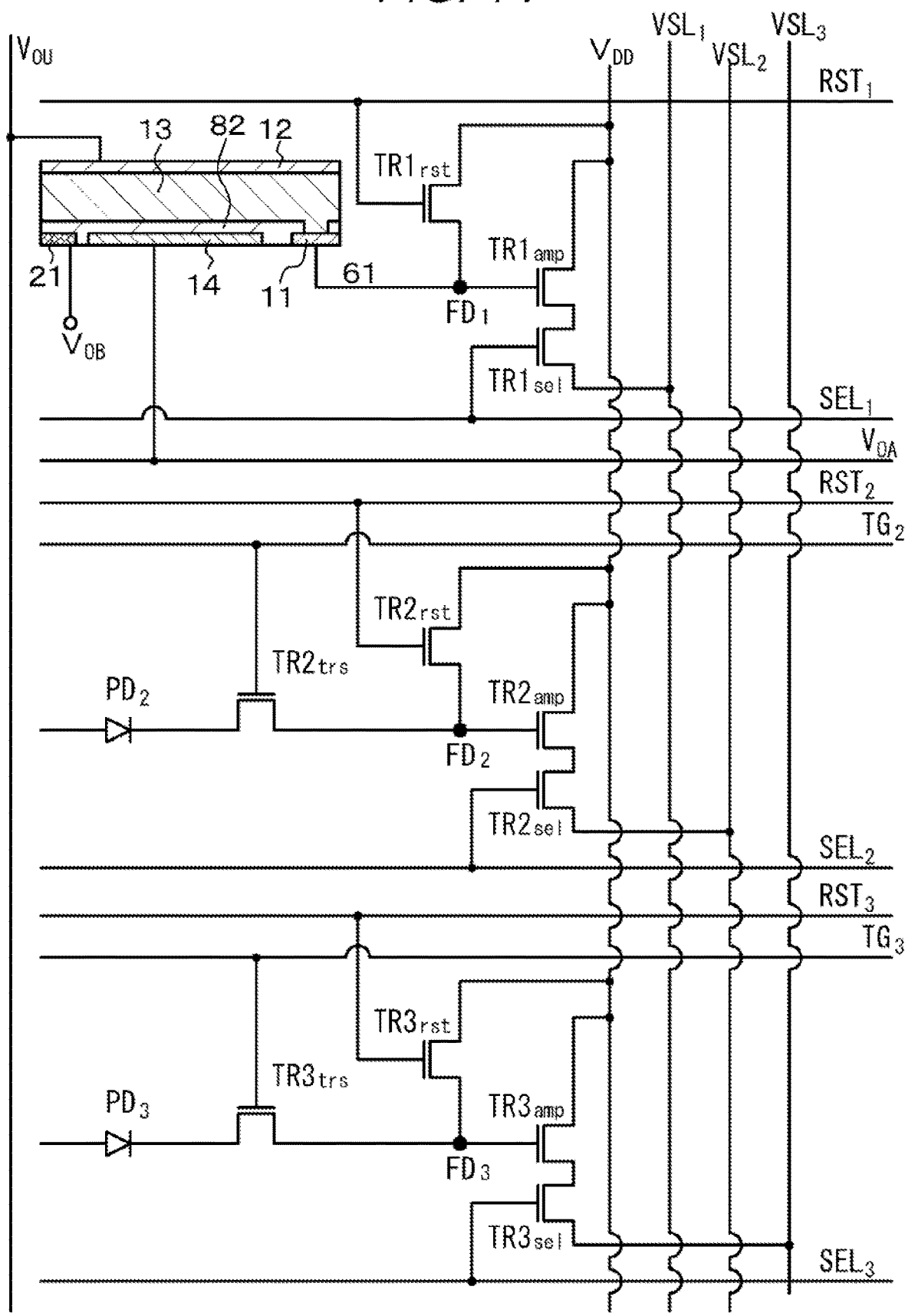
FIG. 14 is an equivalent circuit diagram of an imaging device and a stacked imaging device of Example 6.
Figure 15:
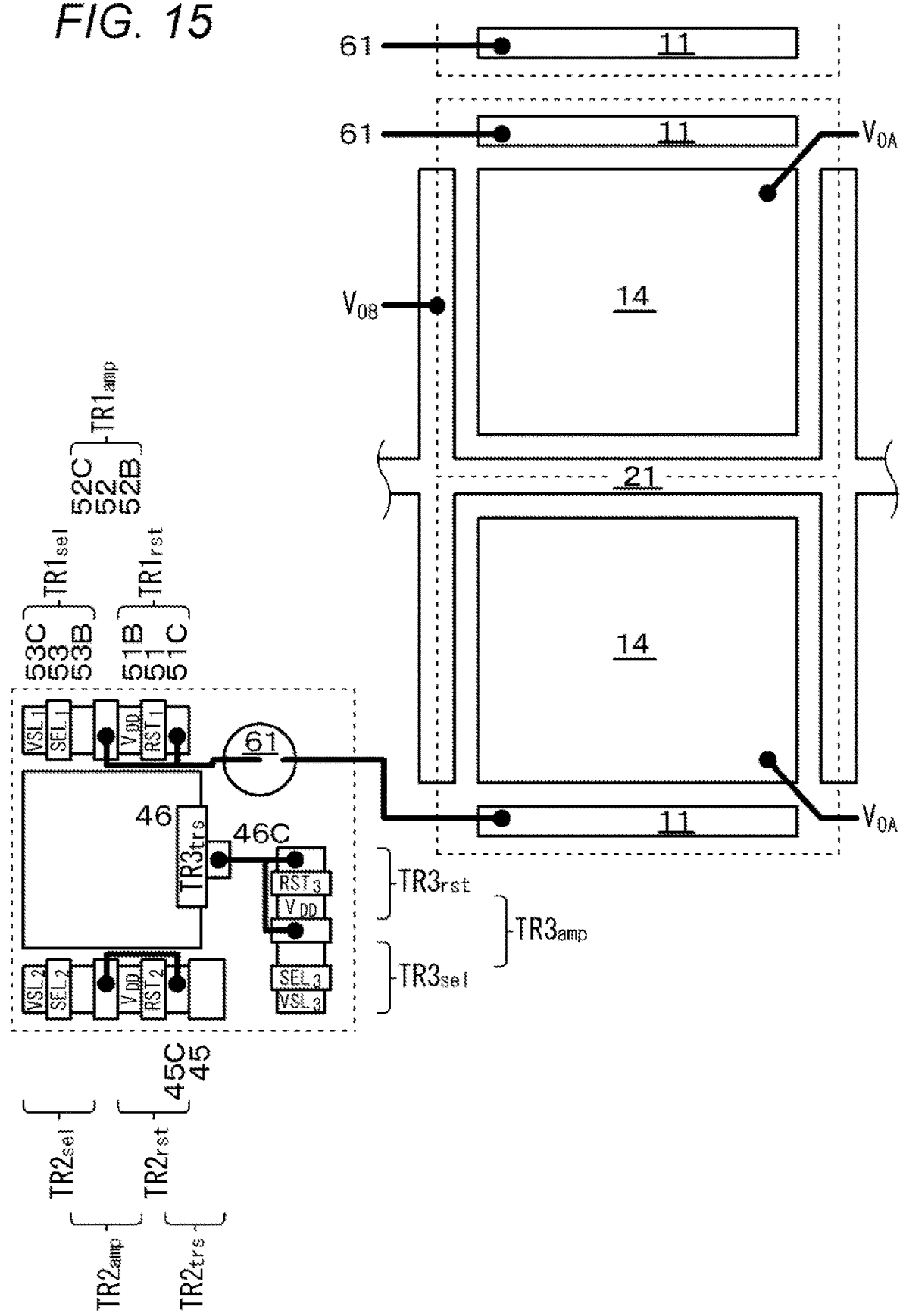
FIG. 15 is a schematic layout diagram of first electrodes, charge storage electrodes, and the transistors constituting a control unit of an imaging device of Example 6.
Figure 16:
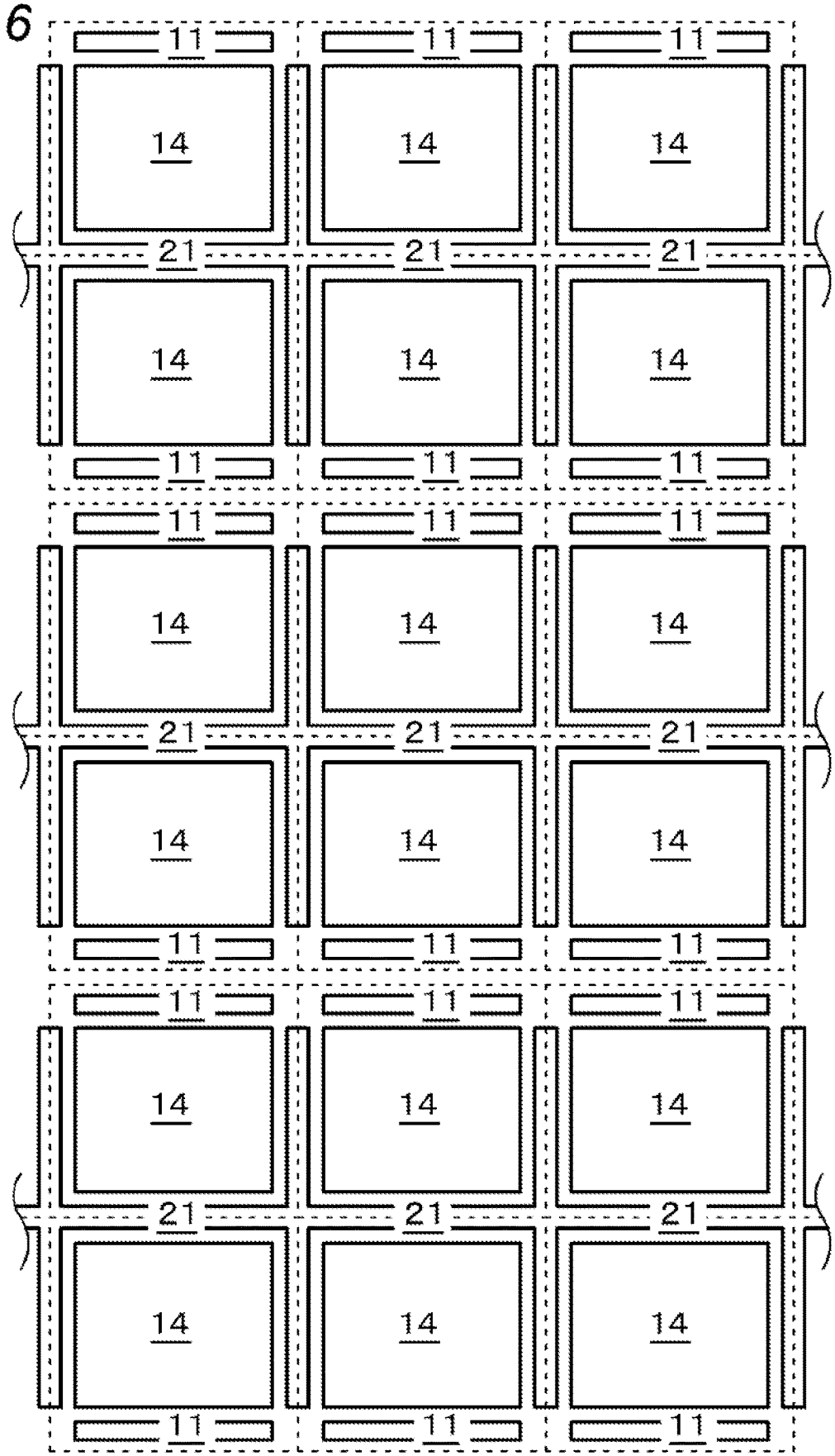
FIG. 16 is a schematic layout diagram of a first electrode and a charge storage electrode that constitute an imaging device of Example 6.
Figure 17:
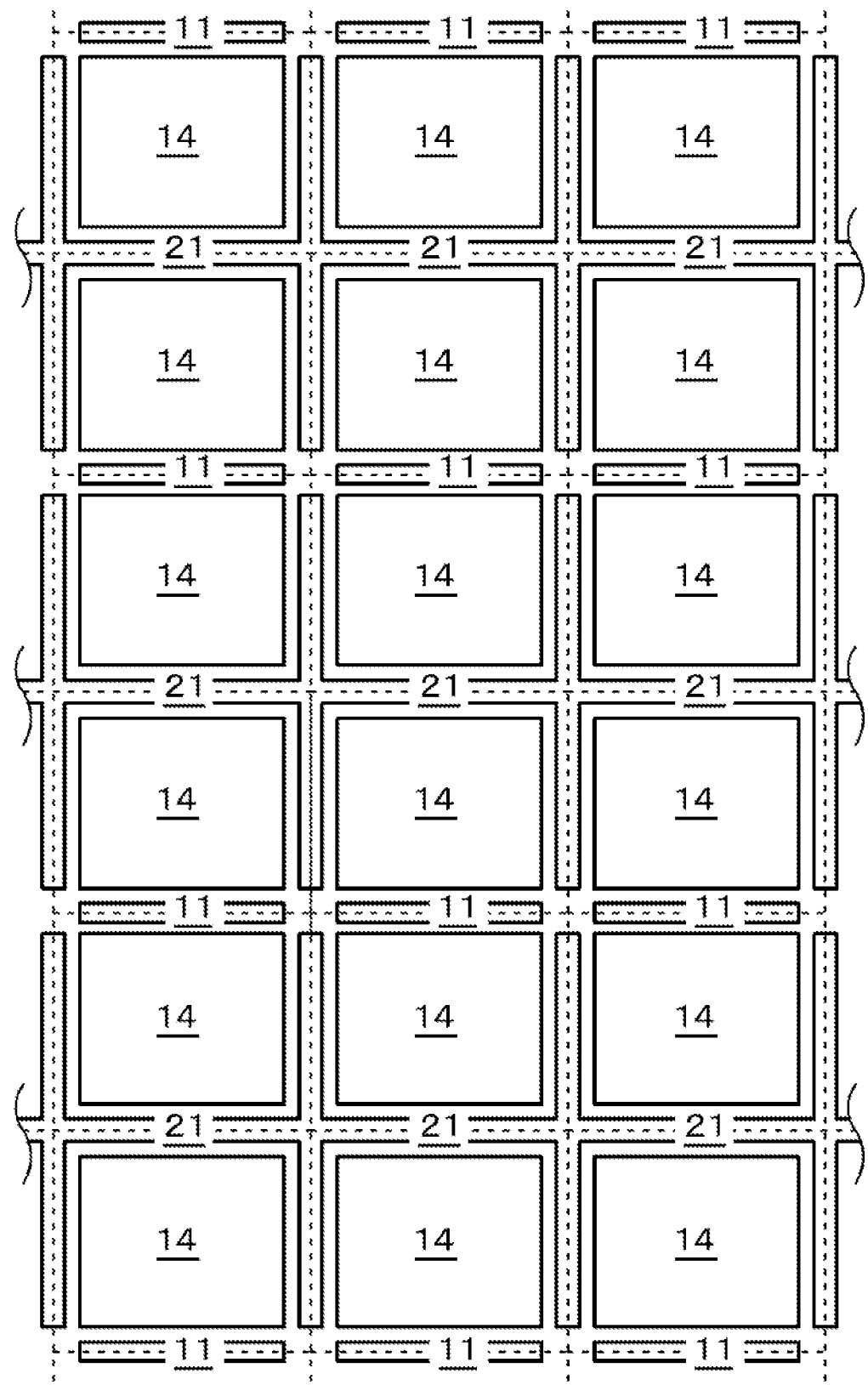
FIG. 17 is a schematic layout diagram of a modification of a first electrode and a charge storage electrode that constitute an imaging device of Example 6 (Modification 1 of Example 6).
Figure 19A:
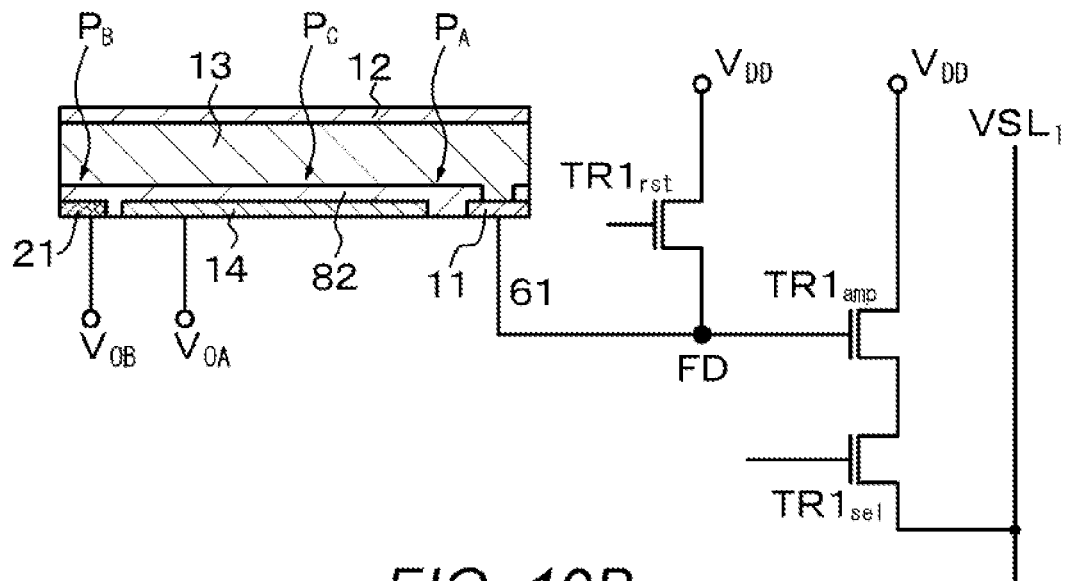
FIGS. 19A, 19B, and 19C are equivalent circuit diagrams of imaging devices and stacked imaging devices of Example 6, Example 10, and Example 11, for explaining respective portions shown in FIG. 18 (Example 6), FIG. 46 (Example 10), and FIG. 53 (Example 11).
Figure 20:
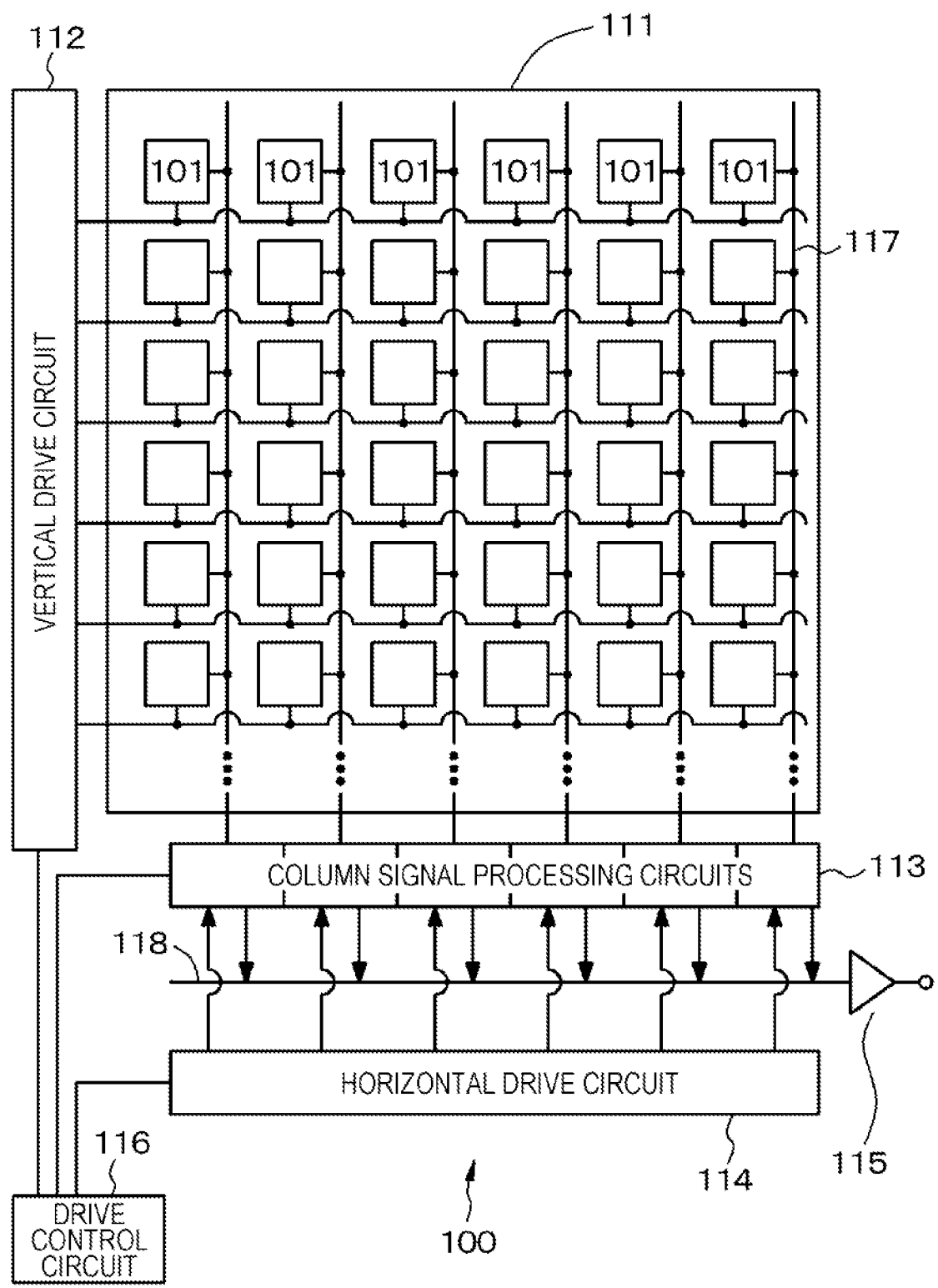
FIG. 20 is a conceptual diagram of a solid-state imaging apparatus of Example 6.

FIG. 11 shows a schematic cross-sectional view of part of an imaging device (two imaging devices arranged side by side) of Example 6. Further, FIG. 12 shows a schematic partial cross-sectional view of an imaging device and a stacked imaging device of Example 6. FIGS. 13 and 14 show equivalent circuit diagrams of an imaging device and a stacked imaging device of Example 6. FIG. 15 shows a schematic layout diagram of first electrodes, charge storage electrodes, and the transistors constituting a control unit of an imaging device of Example 6. Furthermore, FIGS. 16 and 17 show schematic layout diagrams of the first electrodes and the charge storage electrodes constituting imaging devices of Example 6. FIG. 18 schematically shows the states of potentials at respective portions during an operation of an imaging device of Example 6. FIG. 19A shows an equivalent circuit diagram of an imaging device and a stacked imaging device of Example 6 for explaining the respective portions shown in FIG. 18. FIG. 20 shows a conceptual diagram of a solid-state imaging apparatus of Example 6.

As described above in Examples 1 to 5, an imaging device (a green-light imaging device described later, for example) of Example 6, or an imaging device of Example 7 described later includes a photoelectric conversion unit in which a first electrode 11, a photoelectric conversion layer 13, and a second electrode 12 are stacked. The photoelectric conversion unit further includes a charge storage electrode 14 that is disposed at a distance from the first electrode 11, and is positioned to face the photoelectric conversion layer 13 via an insulating layer 82.

Note that, in the example shown in FIG. 16, one charge storage electrode 14 is provided for one first electrode 11 in one imaging device. In an example shown in FIG. 17 (Modification 1 of Example 6), on the other hand, one common first electrode 11 is provided for two charge storage electrodes 14 in two imaging devices. The schematic cross-sectional view of part of an imaging device (two imaging devices arranged side by side) of Example 6 shown in FIG. 11 corresponds to FIG. 17.

The second electrode 12 located on the light incident side is shared by a plurality of imaging devices, except for imaging devices or the like of Example 7 described later. That is, the second electrode 12 is a so-called solid electrode. The photoelectric conversion layer 13 is shared by a plurality of imaging devices. That is, one photoelectric conversion layer 13 is formed for a plurality of imaging devices.

A stacked imaging device of Example 6 includes at least one imaging device of Example 6 or one imaging device of Example 7 described later. In Example 6, a stacked imaging device includes one imaging device of Example 6 or one imaging device of Example 7 described later.

Further, a solid-state imaging apparatus of Example 6 includes a plurality of stacked imaging devices of imaging devices of Example 6 or Example 7 described later.

Alternatively, in an imaging device of Example 6, a charge transfer control electrode 21 is formed in a region facing a region $13_B$ (a region-B of the photoelectric conversion layer) of the photoelectric conversion layer 13, the region $13_B$ being located between the imaging device and an adjacent imaging device via the insulating layer 82. In other words, the charge transfer control electrode 21 is formed under a portion (a region-B of the insulating layer 82) $82_B$ of the insulating layer 82 in a region (a region-b) sandwiched between the charge storage electrode 14 and the charge storage electrode 14 forming the respective adjacent imaging devices. The charge transfer control electrode 21 is disposed at a distance from the charge storage electrodes 14. Alternatively, in other words, the charge transfer control electrode 21 is provided so as to surround the charge storage electrodes 14 and be at a distance from the charge storage electrodes 14, and the charge transfer control electrode 21 is positioned to face the region-B ($13_B$) of the photoelectric conversion layer via the insulating layer 82. Although the charge transfer control electrode 21 is not shown in FIG. 12, the charge transfer control electrode 21 is formed in the direction of an arrow "A". The charge transfer control electrode 21 is shared by the imaging devices arranged in the transverse direction on the paper surface of FIG. 15, and is also shared by a pair of imaging devices arranged in the vertical direction on the paper surface of FIG. 15.

An imaging device that does not include any of the first regions $82a_1$, $82b_1$, and $82c_1$, the second regions $82a_2$, $82b_2$, and $82c_2$, the third region $82c_3$, the first insulating layers $82A_1$, $82B_1$, and $82C_1$, the second insulating layers $82A_2$, $82B_2$, and $82C_2$, the second insulating layer extension portions $82A_2'$ and $82B_2'$, the third insulating layer $82C_3$, the insulating material layer (the first insulating material layer) 82D, the insulating material layer (the second insulating material layer) 82E, the charge transfer control electrode 21, and the connecting holes 23, the pad portions 22, and the wiring lines $V_{OB}$ described later is called an "imaging device having the basic structure of the present disclosure", for the sake of convenience. FIG. 12 is a schematic partial cross-sectional view of an imaging device having the basic structure of the present disclosure. FIGS. 37, 38, 39, 40, 41, 42, 49, 56, 57, 59, 60, 61, 66, 83, 84, 86, 87, 88, 89, 90, 91, 92, and 93 are schematic partial cross-sectional views of various modifications of an imaging device having the basic structure of the present disclosure shown in FIG. 12, in which the first regions $82a_1$, $82b_1$, and $82c_1$, the second regions $82a_2$, $82b_2$, and $82c_2$, the third region $82c_3$, the first insulating layers $82A_1$, $82B_1$, and $82C_1$, the second insulating layers $82A_2$, $82B_2$, and $82C_2$, the second insulating layer extension portions $82A_2'$ and $82B_2'$, the third insulating layer $82C_3$, the insulating material layer (the first insulating material layer) 82D, the insulating material layer (the second insulating material layer) 82E, the charge transfer control electrode 21, and the like are not shown, but are collectively denoted by reference numeral 82.

Moreover, a semiconductor substrate (more specifically, a silicon semiconductor layer) 70 is further included, and the photoelectric conversion unit is disposed above the semiconductor substrate 70. Also, a control unit is further provided in the semiconductor substrate 70, and the control unit includes a drive circuit to which the first electrode 11 and the second electrode 12 are connected. Here, the light incidence face of the semiconductor substrate 70 is the upper side, and the opposite side of the semiconductor substrate 70 is the lower side. A wiring layer 62 formed with a plurality of wiring lines is provided below the semiconductor substrate 70.

The semiconductor substrate 70 is provided with at least a floating diffusion layer $FD_1$ and an amplification transistor $TR1_{amp}$ that form the control unit, and the first electrode 11 is connected to the floating diffusion layer $FD_1$ and the gate portion of the amplification transistor $TR1_{amp}$. The semiconductor substrate 70 is further provided with a reset transistor $TR1_{rst}$ and a selection transistor $TR1_{sel}$ that form the control unit. The floating diffusion layer $FD_1$ is connected to one of the source/drain regions of the reset transistor $TR1_{rst}$, and the other one of the source/drain regions of the amplification transistor $TR1_{amp}$ is connected to one of the source/drain regions of the selection transistor $TR1_{sel}$, and the other one of the source/drain regions of the selection transistor $TR1_{sel}$ is connected to a signal line $VSL_1$. The amplification transistor $TR1_{amp}$, the reset transistor $TR1_{rst}$, and the selection transistor $TR1_{sel}$ constitute a drive circuit.

Specifically, an imaging device and a stacked imaging device of Example 6 is a back-illuminated imaging device and a back-illuminated stacked imaging device, and have a structure in which three imaging devices are stacked. The three imaging devices are: a green-light imaging device of a first type of Example 6 that includes a green-light photoelectric conversion layer of the first type that absorbs green light, and has sensitivity to green light (this imaging device will be hereinafter referred to as the "first imaging device"); a conventional blue-light imaging device of a second type that includes a blue-light photoelectric conversion layer of the second type that absorbs blue light, and has sensitivity to blue light (this imaging device will be hereinafter referred to as the "second imaging device"); and a conventional red-light imaging device of the second type that includes a red-light photoelectric conversion layer of the second type that absorbs red light, and has sensitivity to red light (this imaging device will be hereinafter referred to as the "third imaging device"). Here, the red-light imaging device (the third imaging device) and the blue-light imaging device (the second imaging device) are disposed in the semiconductor substrate 70, and the second imaging device is located closer to the light incident side than the third imaging device is. Further, the green-light imaging device (the first imaging device) is disposed above the blue-light imaging device (the second imaging device). One pixel is formed with the stack structure of the first imaging device, the second imaging device, and the third imaging device. Any color filter is not provided.

In the first imaging device, the first electrode 11 and the charge storage electrode 14 are formed at a distance from each other on an interlayer insulating layer 81. Further, the charge transfer control electrode 21 is formed on the interlayer insulating layer 81 so as to be separated from the charge storage electrode 14. The interlayer insulating layer 81, the charge storage electrode 14, and the charge transfer control electrode 21 are covered with the insulating layer 82. The photoelectric conversion layer 13 is formed on the insulating layer 82, and the second electrode 12 is formed on the photoelectric conversion layer 13. A protective layer 83 is formed on the entire surface including the second electrode 12, and an on-chip microlens 90 is provided on the protective layer 83. The first electrode 11, the charge storage electrode 14, the charge transfer control electrode 21, and the second electrode 12 are formed with transparent electrodes formed with ITO (work function: about 4.4 eV), for example. The photoelectric conversion layer 13 is formed with a layer containing a known organic photoelectric conversion material (an organic material such as a rhodamine dye, a merocyanine dye, or quinacridone, for example) having sensitivity to at least green light. The photoelectric conversion layer 13 may further include a material layer suitable for charge accumulation. In other words, a material layer suitable for charge accumulation may be further formed between the photoelectric conversion layer 13 and the first electrode 11 (or in a connecting portion 67, for example). The interlayer insulating layer 81, the insulating layer 82, and the protective layer 83 are formed with a known insulating material ($SiO_2$ or SiN, for example). The photoelectric conversion layer 13 and the first electrode 11 are connected by the connecting portion 67 formed in the insulating layer 82. The photoelectric conversion layer 13 extends in the connecting portion 67. In other words, the photoelectric conversion layer 13 extends in an opening 84 formed in the insulating layer 82, and is connected to the first electrode 11.

The charge storage electrode 14 is connected to the drive circuit. Specifically, the charge storage electrode 14 is connected to a vertical drive circuit 112 forming the drive circuit, via a connecting hole 66, a pad portion 64, and a wiring line $V_{OA}$ provided in the interlayer insulating layer 81.

The charge transfer control electrode 21 is also connected to the drive circuit. Specifically, the charge transfer control electrode 21 is connected to the vertical drive circuit 112 forming the drive circuit, via a connecting hole 23, a pad portion 22, and a wiring line $V_{OB}$ provided in the interlayer insulating layer 81. More specifically, the charge transfer control electrode 21 is formed in the region (the region-B ($82_B$) of the insulating layer) facing the region-B ($13_B$) of the photoelectric conversion layer 13 via the insulating layer 82. In other words, the charge transfer control electrode 21 is formed under the portion $82_B$ of the insulating layer 82 in the region (the region-b) sandwiched between the charge storage electrode 14 and the charge storage electrode 14 forming the respective adjacent imaging devices. The charge transfer control electrode 21 is disposed at a distance from the charge storage electrodes 14. Alternatively, in other words, the charge transfer control electrode 21 is provided so as to surround the charge storage electrodes 14 and be at a distance from the charge storage electrodes 14, and the charge transfer control electrode 21 is positioned to face the region-B ($13a$) of the photoelectric conversion layer 13 via the insulating layer 82.

The size of the charge storage electrode 14 is larger than that of the first electrode 11. Where the area of the charge storage electrode 14 is represented by $s_1'$, and the area of the first electrode 11 is represented by $s_1$, it is preferable to satisfy $4 \leq s_1'/s_1$, which is not restrictive though.

In an imaging device of Example 6 or Example 7 described later, $s_1'/s = 8$, for example, which is not restrictive though. Note that, in Examples 12 to 15 described later, three photoelectric conversion unit segments $10_1$, $10_2$, and $10_3$ have the same size, and also have the same planar shape.

A device separation region 71 is formed on the side of a first surface (front surface) 70A of the semiconductor substrate 70, and an oxide film 72 is formed on the first surface 70A of the semiconductor substrate 70. Further, on the first surface side of the semiconductor substrate 70, the reset transistor $TR1_{rst}$, the amplification transistor $TR1_{amp}$, and the selection transistor $TR1_{sel}$ constituting the control unit of the first imaging device are provided, and the first floating diffusion layer $FD_1$ is also provided.

The reset transistor $TR1_{rst}$ includes a gate portion 51, a channel formation region 51A, and source/drain regions 51B and 51C. The gate portion 51 of the reset transistor $TR1_{rst}$ is connected to a reset line $RST_1$, one source/drain region 51C of the reset transistor $TR1_{rst}$ also serves as the first floating diffusion layer $FD_1$, and the other source/drain region 51B is connected to a power supply $V_{DD}$.

The first electrode 11 is connected to one source/drain region 51C (the first floating diffusion layer $FD_1$) of the reset transistor $TR1_{rst}$, via a connecting hole 65 and a pad portion 63 provided in the interlayer insulating layer 81, a contact hole portion 61 formed in the semiconductor substrate 70 and the interlayer insulating layer 76, and the wiring layer 62 formed in the interlayer insulating layer 76.

The amplification transistor $TR1_{amp}$ includes a gate portion 52, a channel formation region 52A, and source/drain regions 52B and 52C. The gate portion 52 is connected to the first electrode 11 and one source/drain region 51C (the first floating diffusion layer $FD_1$) of the reset transistor $TR1_{rst}$, via the wiring layer 62. Further, one source/drain region 52B is connected to the power supply $V_{DD}$.

The selection transistor $TR1_{sel}$ includes a gate portion 53, a channel formation region 53A, and source/drain regions 53B and 53C. The gate portion 53 is connected to a selection line $SEL_1$. Further, one source/drain region 53B shares a region with the other source/drain region 52C forming the amplification transistor $TR1_{amp}$, and the other source/drain region 53C is connected to a signal line (a data output line) $VSL_1$ (117).

The second imaging device includes a photoelectric conversion layer that is an n-type semiconductor region 41 provided in the semiconductor substrate 70. The gate portion 45 of a transfer transistor $TR2_{trs}$ formed with a vertical transistor extends to the n-type semiconductor region 41, and is connected to a transfer gate line $TG_2$. Further, a second floating diffusion layer $FD_2$ is disposed in a region 45C near the gate portion 45 of the transfer transistor $TR2_{trs}$ in the semiconductor substrate 70. The electric charges stored in the n-type semiconductor region 41 are read into the second floating diffusion layer $FD_2$ via a transfer channel formed along the gate portion 45.

In the second imaging device, a reset transistor $TR2_{rst}$, an amplification transistor $TR2_{amp}$, and a selection transistor $TR2_{sel}$ that constitute the control unit of the second imaging device are further disposed on the first surface side of the semiconductor substrate 70.

The reset transistor $TR2_{rst}$ includes a gate portion, a channel formation region, and source/drain regions. The gate portion of the reset transistor $TR2_{rst}$ is connected to a reset line $RST_2$, one of the source/drain regions of the reset transistor $TR2_{rst}$ is connected to the power supply $V_{DD}$, and the other one of the source/drain regions also serves as the second floating diffusion layer $FD_2$.

The amplification transistor $TR2_{amp}$ includes a gate portion, a channel formation region, and source/drain regions. The gate portion is connected to the other one of the source/drain regions (the second floating diffusion layer $FD_2$) of the reset transistor $TR2_{rst}$. Further, one of the source/drain regions is connected to the power supply $V_{DD}$.

The selection transistor $TR2_{sel}$ includes a gate portion, a channel formation region, and source/drain regions. The gate portion is connected to a selection line $SEL_2$. Further, one of the source/drain regions shares a region with the other one of the source/drain regions forming the amplification transistor $TR2_{amp}$, and the other one of the source/drain regions is connected to a signal line (a data output line) $VSL_2$.

The third imaging device includes a photoelectric conversion layer that is an n-type semiconductor region 43 provided in the semiconductor substrate 70. The gate portion 46 of a transfer transistor $TR3_{trs}$ is connected to a transfer gate line $TG_3$. Further, a third floating diffusion layer $FD_3$ is disposed in a region 46C near the gate portion 46 of the transfer transistor $TR3_{trs}$ in the semiconductor substrate 70. The electric charges stored in the n-type semiconductor region 43 are read into the third floating diffusion layer $FD_3$ via a transfer channel 46A formed along the gate portion 46.

In the third imaging device, a reset transistor $TR3_{rst}$, an amplification transistor $TR3_{amp}$, and a selection transistor $TR3_{sel}$ that constitute the control unit of the third imaging device are further disposed on the first surface side of the semiconductor substrate 70.

The reset transistor $TR3_{rst}$ includes a gate portion, a channel formation region, and source/drain regions. The gate portion of the reset transistor $TR3_{rst}$ is connected to a reset line $RST_3$, one of the source/drain regions of the reset transistor $TR3_{rst}$ is connected to the power supply $V_{DD}$, and the other one of the source/drain regions also serves as the third floating diffusion layer $FD_3$.

The amplification transistor $TR3_{amp}$ includes a gate portion, a channel formation region, and source/drain regions. The gate portion is connected to the other one of the source/drain regions (the third floating diffusion layer $FD_3$) of the reset transistor $TR3_{rst}$. Further, one of the source/drain regions is connected to the power supply $V_{DD}$.

The selection transistor $TR3_{sel}$ includes a gate portion, a channel formation region, and source/drain regions. The gate portion is connected to a selection line $SEL_3$. Further, one of the source/drain regions shares a region with the other one of the source/drain regions forming the amplification transistor $TR3_{amp}$, and the other one of the source/drain regions is connected to a signal line (a data output line) $VSL_3$.

The reset lines $RST_1$, $RST_2$, and $RST_3$, the selection lines $SEL_1$, $SEL_2$, and $SEL_3$, and the transfer gate lines $TG_2$ and $TG_3$ are connected to the vertical drive circuit 112 that forms a drive circuit, and the signal lines (data output lines) $VSL_1$, $VSL_2$, and $VSL_3$ are connected to a column signal processing circuit 113 that forms the drive circuit.

A $p^+$-layer 44 is provided between the n-type semiconductor region 43 and the front surface 70A of the semiconductor substrate 70, to reduce generation of dark current. A $p^+$-layer 42 is formed between the n-type semiconductor region 41 and the n-type semiconductor region 43, and, further, part of a side surface of the n-type semiconductor region 43 is surrounded by the $p^+$-layer 42. A $p^+$-layer 73 is formed on the side of the back surface 70B of the semiconductor substrate 70, and a $HfO_2$ film 74 and an insulating film 75 are formed in the portion extending from the $p^+$-layer 73 to the formation region of the contact hole portion 61 in the semiconductor substrate 70. In the interlayer insulating layer 76, wiring lines are formed across a plurality of layers, but are not shown in the drawings.

The $HfO_2$ film 74 is a film having a negative fixed charge. As such a film is included, generation of dark current can be reduced or prevented. Note that, instead of a $HfO_2$ film, it is possible to use an aluminum oxide ($Al_2O_3$) film, a zirconium oxide ($ZrO_2$) film, a tantalum oxide ($Ta_2O_5$) film, a titanium oxide ($TiO_2$) film, a lanthanum oxide ($La_2O_3$) film, a praseodymium oxide ($Pr_2O_3$) film, a cerium oxide ($CeO_2$) film, a neodymium oxide ($Nd_2O_3$) film, a promethium oxide ($Pm_2O_3$) film, a samarium oxide ($Sm_2O_3$) film, an europium oxide ($Eu_2O_3$) film, a gadolinium oxide ($Gd_2O_3$) film, a terbium oxide ($Tb_2O_3$) film, a dysprosium oxide ($Dy_2O_3$) film, a holmium oxide ($Ho_2O_3$) film, a thulium oxide ($Tm_2O_3$) film, a ytterbium oxide ($Yb_2O_3$) film, a lutetium oxide ($Lu_2O_3$) film, a yttrium oxide ($Y_2O_3$) film, a hafnium nitride film, an aluminum nitride film, a hafnium oxynitride film, or an aluminum oxynitride film. These films may be formed by a CVD method, a PVD method, or an ALD method, for example.

In the description below, operation of an imaging device (the first imaging device) of Example 6 is described, with reference to FIGS. 18 and 19A. An imaging device of Example 6 is provided on the semiconductor substrate 70, and further includes a control unit having a drive circuit. The first electrode 11, the second electrode 12, the charge storage electrode 14, and the charge transfer control electrode 21 are connected to the drive circuit. Here, the potential of the first electrode 11 is higher than the potential of the second electrode 12. Specifically, the first electrode 11 has a positive potential, the second electrode 12 has a negative potential, and electrons generated through photoelectric conversion in the photoelectric conversion layer 13 are read into the floating diffusion layer, for example. The same applies to the other Examples. Note that, in a mode where the first electrode 11 has a negative potential, the second electrode 12 has a positive potential, and holes generated through photoelectric conversion in the photoelectric conversion layer 13 are read into the floating diffusion layer, the levels of the potentials described below are only required to be switched.

Figure 19B:
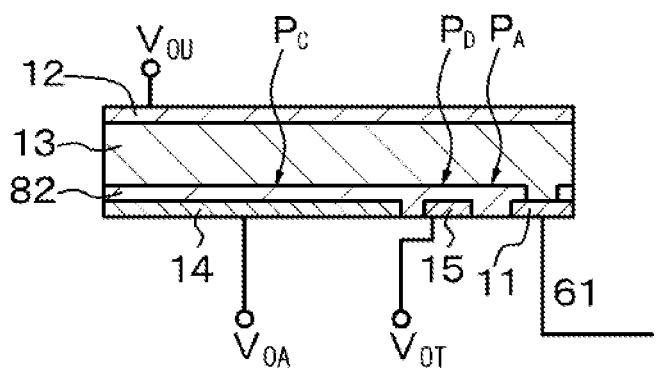
Figure 19C:
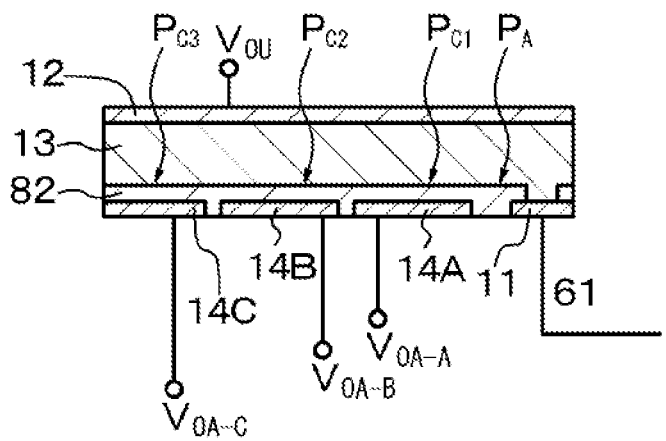
Figure 46:
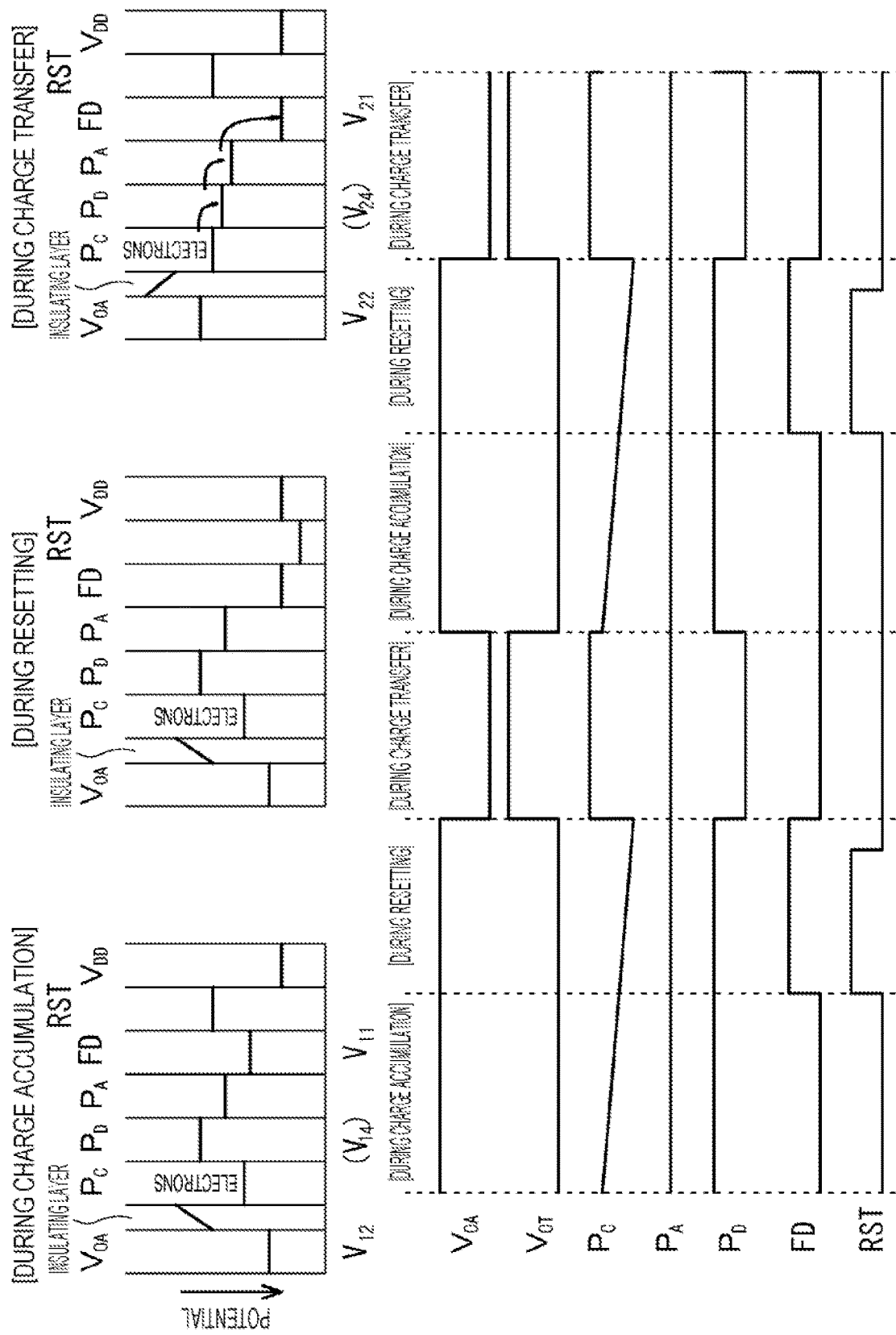
FIG. 46 is a diagram schematically showing the states of the potentials at respective portions during an operation of an imaging device of Example 10.
Figure 47:
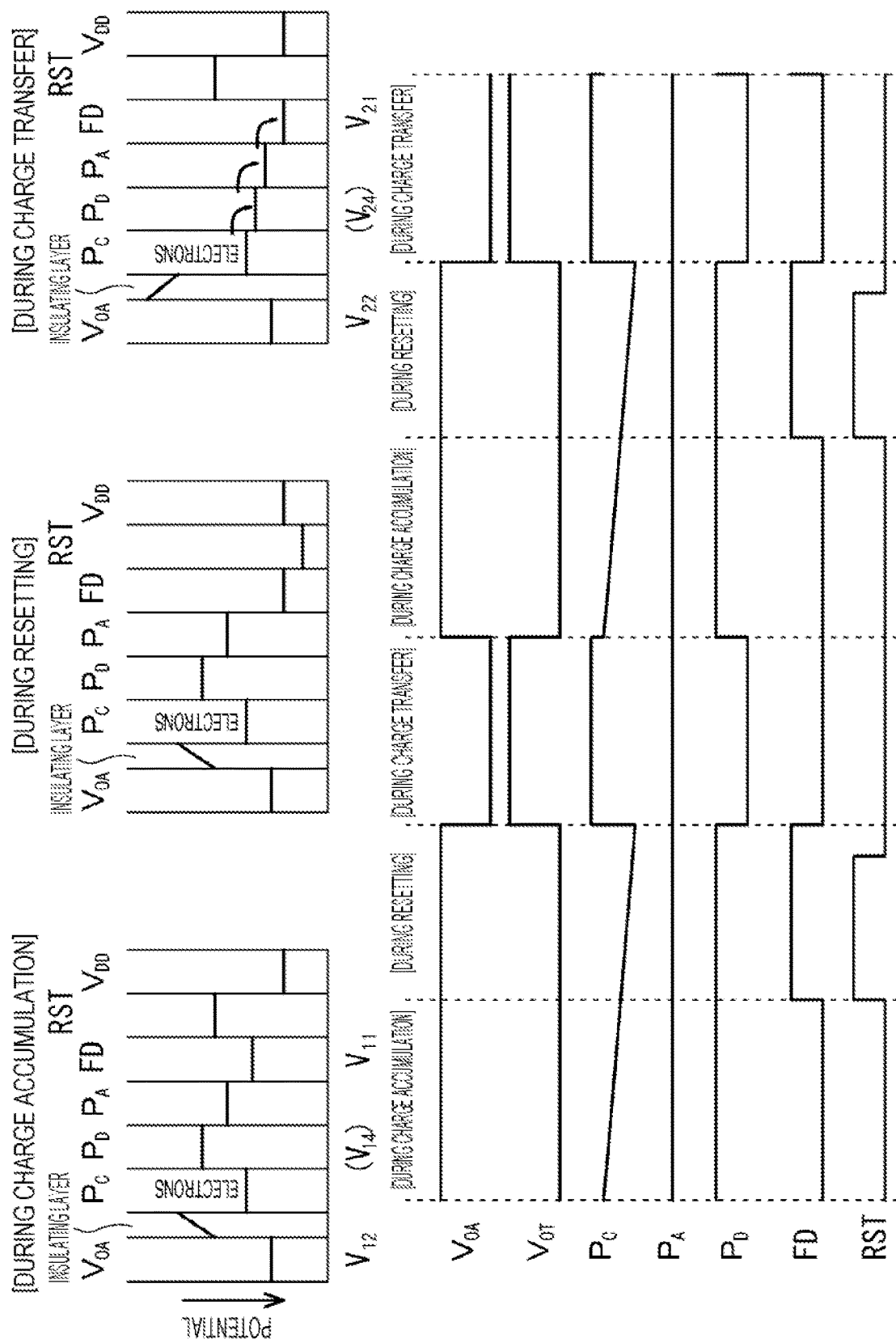
FIG. 47 is a diagram schematically showing the states of the potentials at respective portions during another operation of an imaging device of Example 10.

The symbols used in FIG. 18, in FIGS. 46 and 47 for Example 10 described later, and in FIGS. 53 and 54 for Example 11 described later are as follows. Note that FIGS. 19A, 19B, and 19C are equivalent circuit diagrams of imaging devices and stacked imaging devices of Example 6, Example 10, and Example 11, for explaining respective portions shown in FIG. 18 (Example 6), FIG. 46 (Example 10), and FIG. 53 (Example 11).

$P_A$: the potential at a point $P_A$ in a region of the photoelectric conversion layer 13 facing a region located between the charge storage electrode 14 or a transfer control electrode (charge transfer electrode) 15 and the first electrode 11

$P_B$: the potential at a point $P_B$ in a region of the photoelectric conversion layer 13 facing the charge transfer control electrode 21

$P_C$: the potential at a point $P_C$ in a region of the photoelectric conversion layer 13 facing the charge storage electrode 14

$P_{C1}$: the potential at a point $P_{C1}$ in a region of the photoelectric conversion layer 13 facing a charge storage electrode segment 14A $P_{C2}$: the potential at a point $P_{C2}$ in a region of the photoelectric conversion layer 13 facing a charge storage electrode segment 14B $P_{C3}$: the potential at a point $P_{C3}$ in a region of the photoelectric conversion layer 13 facing a charge storage electrode segment 14C $P_D$: the potential at a point $P_D$ in a region of the photoelectric conversion layer 13 facing the transfer control electrode (the charge transfer electrode) 15

FD: the potential in the first floating diffusion layer $FD_1$ $V_{OA}$: the potential at the charge storage electrode 14

$V_{OA-A}$: the potential at the charge storage electrode segment 14A $V_{OA-B}$: the potential at the charge storage electrode segment 14B $V_{OA-C}$: the potential at the charge storage electrode segment 14C $V_{OT}$: the potential at the transfer control electrode (the charge transfer electrode) 15

RST: the potential at the gate portion 51 of the reset transistor $TR1_{rst}$ $V_{DD}$: the potential of the power supply $VSL_1$: the signal line (data output line) $VSL_1$ $TR1_{rst}$: the reset transistor $TR1_{rst}$ $TR1_{amp}$: the amplification transistor $TR1_{amp}$ $TR1_{sel}$: the selection transistor $TR1_{sel}$ In a charge accumulation period, the drive circuit applies a potential $V_{11}$ to the first electrode 11, a potential $V_{12}$ to the charge storage electrode 14, and a potential $V_{13}$ to the charge transfer control electrode 21. Light that has entered the photoelectric conversion layer 13 causes photoelectric conversion in the photoelectric conversion layer 13. Holes generated by the photoelectric conversion are sent from the second electrode 12 to the drive circuit via a wiring line $V_{OU}$. Meanwhile, since the potential of the first electrode 11 is higher than the potential of the second electrode 12, or a positive potential is applied to the first electrode 11 while a negative potential is applied to the second electrode 12, for example, $V_{12} \geq V_{11}$, or preferably, $V_{12} > V_{11}$ and $V_{12} > V_{13}$. As a result, electrons generated by the photoelectric conversion are attracted to the charge storage electrode 14, and stay in the region $13_C$ of the photoelectric conversion layer 13 facing the charge storage electrode 14. In other words, electric charges are accumulated in the photoelectric conversion layer 13. Since $V_{12} > V_{11}$, electrons generated in the photoelectric conversion layer 13 will not move toward the first electrode 11. Further, since $V_{12} > V_{13}$, electrons generated in the photoelectric conversion layer 13 will not move toward the charge transfer control electrode 21, either. In other words, it is possible to reduce or prevent flow of the electric charges generated by photoelectric conversion into adjacent imaging devices. With the passage of time for photoelectric conversion, the potential in the region of the photoelectric conversion layer 13 facing the charge storage electrode 14 becomes a more negative value.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 11, a potential $V_{22}$ to the charge storage electrode 14, and a potential $V_{23}$ to the charge transfer control electrode 21. Here, $V_{21} > V_{22} > V_{23}$. As a result, the electrons remaining in the region of the photoelectric conversion layer 13 facing the charge storage electrode 14 are read into the first electrode 11 and further into the first floating diffusion layer $FD_1$. In other words, the electric charges accumulated in the photoelectric conversion layer 13 are read into the control unit. Further, since $V_{22} > V_{23}$, electrons generated in the photoelectric conversion layer 13 will not move toward the charge transfer control electrode 21. In other words, it is possible to reduce or prevent flow of the electric charges generated by photoelectric conversion into adjacent imaging devices.

In the above manner, a series of operations including charge accumulation, reset operation, and charge transfer is completed.

The operations of the amplification transistor $TR1_{amp}$ and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging device and the third imaging device is similar to a series of conventional operations including charge accumulation, reset operation, and charge transfer. Further, the reset noise in the first floating diffusion layer $FD_1$ can be eliminated by a correlated double sampling (CDS) process as in conventional operations.

As described above, in an imaging device of Example 6 or Example 7 described later, the charge storage electrode is disposed at a distance from the first electrode, and is positioned to face the photoelectric conversion layer via the insulating layer. Accordingly, when light is emitted onto the photoelectric conversion unit, and photoelectric conversion is performed in the photoelectric conversion unit, a kind of capacitor is formed by the photoelectric conversion layer, the insulating layer, and the charge storage electrode, and electric charges can be stored in the photoelectric conversion layer. Thus, at the start of exposure, the charge storage portion can be fully depleted, and the electric charges can be erased. As a result, it is possible to reduce or prevent the occurrence of a phenomenon in which the kTC noise becomes larger, the random noise is aggravated, and the imaging quality is lowered. Further, all the pixels can be reset simultaneously, and thus, a so-called global shutter function can be achieved.

Moreover, in an imaging device of Example 6, when light enters the photoelectric conversion layer and photoelectric conversion occurs in the photoelectric conversion layer, the absolute value of the potential applied to the portion of the photoelectric conversion layer facing the charge storage electrode is greater than the absolute value of the potential applied to the region-B of the photoelectric conversion layer. Therefore, electric charges generated by the photoelectric conversion are strongly attracted to the portion of the photoelectric conversion layer facing the charge storage electrode. As a result, it is possible to reduce or prevent flow of the electric charges generated by the photoelectric conversion into the adjacent imaging devices, and thus, the quality of a captured video image (an image) is not degraded. Alternatively, as the charge transfer control electrode is formed in the region facing the region-B of the photoelectric conversion layer via the insulating layer, it is possible to control the electric field and the potential in the region-B of the photoelectric conversion layer located above the charge transfer control electrode. As a result, the charge transfer control electrode can reduce or prevent flow of the electric charges generated by the photoelectric conversion into the adjacent imaging devices, and thus, the quality of a captured video image (an image) is not degraded.

FIG. 20 is a conceptual diagram of a solid-state imaging apparatus of Example 6. A solid-state imaging apparatus 100 of Example 6 includes an imaging region 111 in which stacked imaging devices 101 are arranged in a two-dimensional array, the vertical drive circuit 112 as the drive circuit (a peripheral circuit) for the stacked imaging devices 101, the column signal processing circuits 113, a horizontal drive circuit 114, an output circuit 115, a drive control circuit 116, and the like. Note that these circuits may be formed with known circuits, or may of course be formed with other circuit components (various circuits that are used in conventional CCD solid-state imaging apparatuses or CMOS solid-state imaging apparatuses, for example). Note that, in FIG. 20, reference numeral "101" for the stacked imaging devices 101 is only shown in one row.

On the basis of a vertical synchronization signal, a horizontal synchronization signal, and a master clock, the drive control circuit 116 generates a clock signal and a control signal that serve as the references for operations of the vertical drive circuit 112, the column signal processing circuits 113, and the horizontal drive circuit 114. The generated clock signal and control signal are then input to the vertical drive circuit 112, the column signal processing circuits 113, and the horizontal drive circuit 114.

The vertical drive circuit 112 is formed with a shift register, for example, and selectively scans the respective stacked imaging devices 101 in the imaging region 111 sequentially in the vertical direction row by row. A pixel signal (an image signal) based on the current (signal) generated in accordance with the amount of light received in each stacked imaging device 101 is then sent to the column signal processing circuit 113 via a signal line (a data output line) 117 and a VSL.

The column signal processing circuits 113 are provided for the respective columns of the stacked imaging devices 101, for example, and perform signal processing such as noise removal and signal amplification on the image signals output from the stacked imaging devices 101 of one row in accordance with a signal from a black reference pixel (formed around an effective pixel region, though not shown) for each imaging device. Horizontal select switches (not shown) are provided between and connected to the output stages of the column signal processing circuits 113 and a horizontal signal line 118.

The horizontal drive circuit 114 is formed with a shift register, for example. The horizontal drive circuit 114 sequentially selects the respective column signal processing circuits 113 by sequentially outputting horizontal scan pulses, and causes the respective column signal processing circuits 113 to output signals to the horizontal signal line 118.

The output circuit 115 performs signal processing on signals sequentially supplied from the respective column signal processing circuits 113 through the horizontal signal line 118, and outputs the processed signals.

Figure 21:
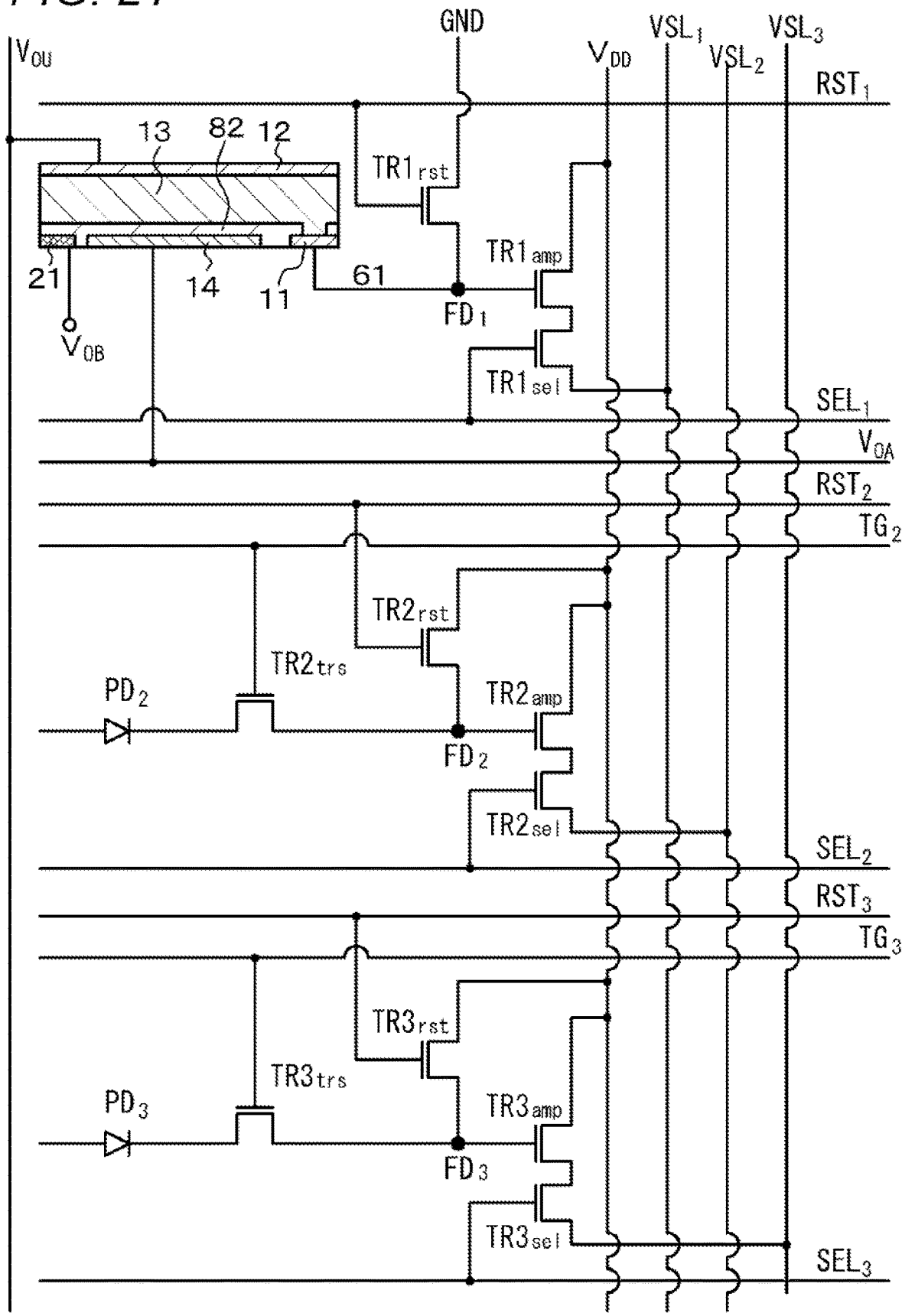
FIG. 21 is an equivalent circuit diagram of a modification of an imaging device and a stacked imaging device of Example 6 (Modification 2 of Example 6).
Figure 22:
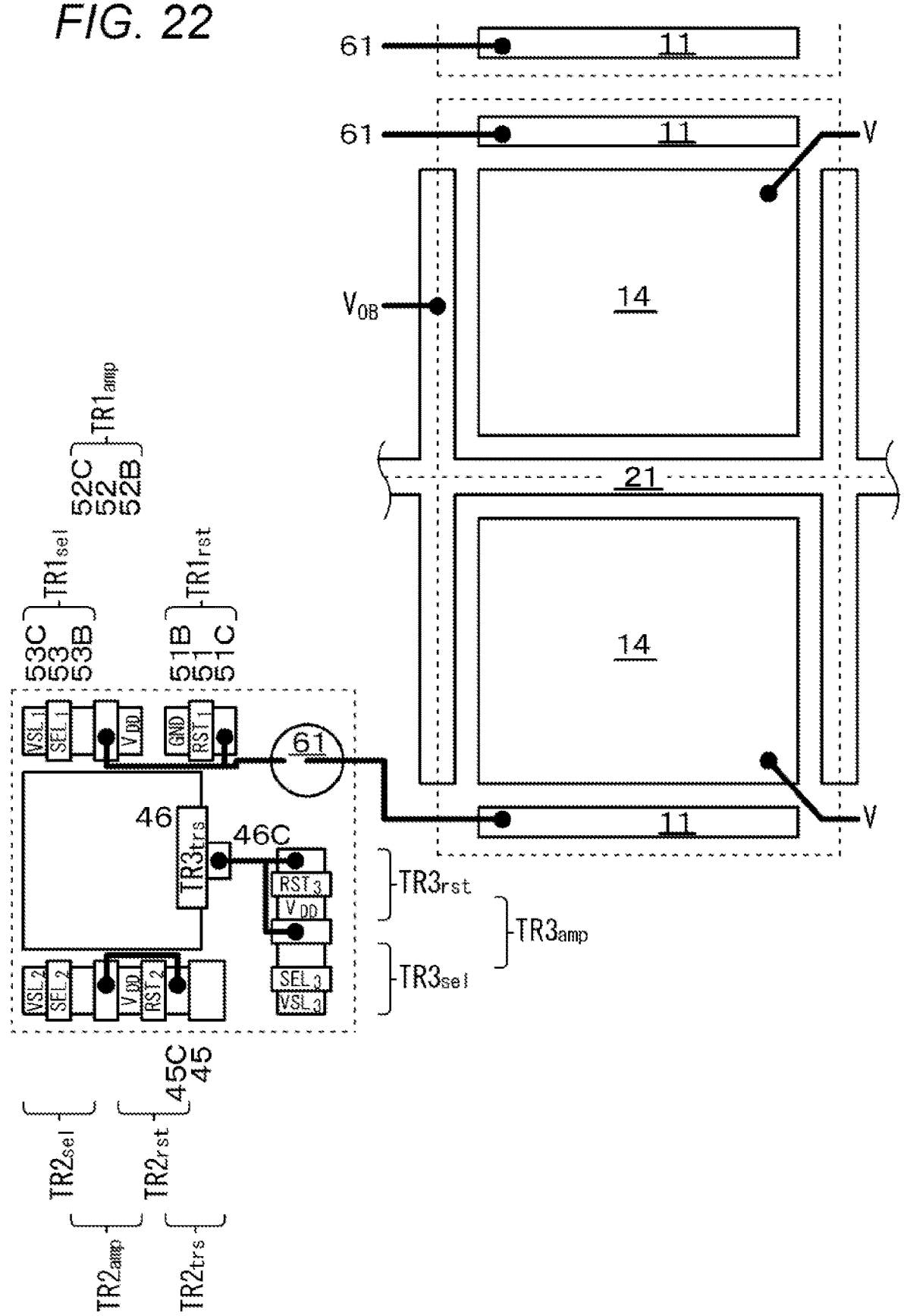
FIG. 22 is a schematic layout diagram of a first electrode, a charge storage electrode, and the transistors constituting a control unit of the modification of an imaging device of Example 6 shown in FIG. 21 (Modification 2 of Example 6).

FIG. 21 shows an equivalent circuit diagram of a modification of an imaging device and a stacked imaging device of Example 6 (Modification 2 of Example 6). FIG. 22 shows a schematic layout diagram of the first electrodes, the charge storage electrodes, and the transistors constituting the control unit of the modification of imaging devices of Example 6 (Modification 2 of Example 6). As shown in FIG. 22, the other source/drain region 51B of the reset transistor $TR1_{rst}$ may be grounded, instead of being connected to the power supply $V_{DD}$.

An imaging device and a stacked imaging device of Example 6 can be manufactured by the method described below, for example. Specifically, an SOI substrate is first prepared. A first silicon layer is then formed on the surface of the SOI substrate by an epitaxial growth method, and the $p^+$-layer 73 and the n-type semiconductor region 41 are formed in the first silicon layer. A second silicon layer is then formed on the first silicon layer by an epitaxial growth method, and the device separation region 71, the oxide film 72, the $p^+$-layer 42, the n-type semiconductor region 43, and the $p^+$-layer 44 are formed in the second silicon layer. Further, various transistors and the like that constitute the control unit of the imaging device are formed in the second silicon layer, and the wiring layer 62, the interlayer insulating layer 76, and various wiring lines are formed thereon. After that, the interlayer insulating layer 76 and a support substrate (not shown) are bonded to each other. After that, the SOI substrate is removed, to expose the first silicon layer. Note that the surface of the second silicon layer corresponds to the front surface 70A of the semiconductor substrate 70, and the surface of the first silicon layer corresponds to the back surface 70B of the semiconductor substrate 70. Further, the first silicon layer and the second silicon layer are collectively referred to as the semiconductor substrate 70. Next, an opening for forming the contact hole portion 61 is formed in the semiconductor substrate 70 on the side of the back surface 70B, and the $HfO_2$ film 74, the insulating film 75, and the contact hole portion 61 are formed. Further, the pad portions 63, 64, and 22, the interlayer insulating layer 81, the connecting holes 65, 66, and 23, the first electrodes 11, the charge storage electrodes 14, the charge transfer control electrode 21, and the insulating layer 82 (including the first regions $82a_1$, $82b_1$, and $82c_1$, the second regions $82a_2$, $82b_2$, and $82c_2$, the third region $82c_3$, the first insulating layers $82A_1$, $82B_1$, and $82C_1$, the second insulating layers $82A_2$, $82B_2$, and $82C_2$, the second insulating layer extension portions $82A_2'$ and $82B_2'$, the third insulating layer $82C_3$, the insulating material layer (the first insulating material layer) 82D, and the insulating material layer (the second insulating material layer) 82E are formed. The connecting portion 67 is then opened, and the photoelectric conversion layer 13, the second electrode 12, the protective layer 83, and the on-chip microlens 90 are formed. In this manner, it is possible to obtain an imaging device and a stacked imaging device of Example 6.

Figure 23:
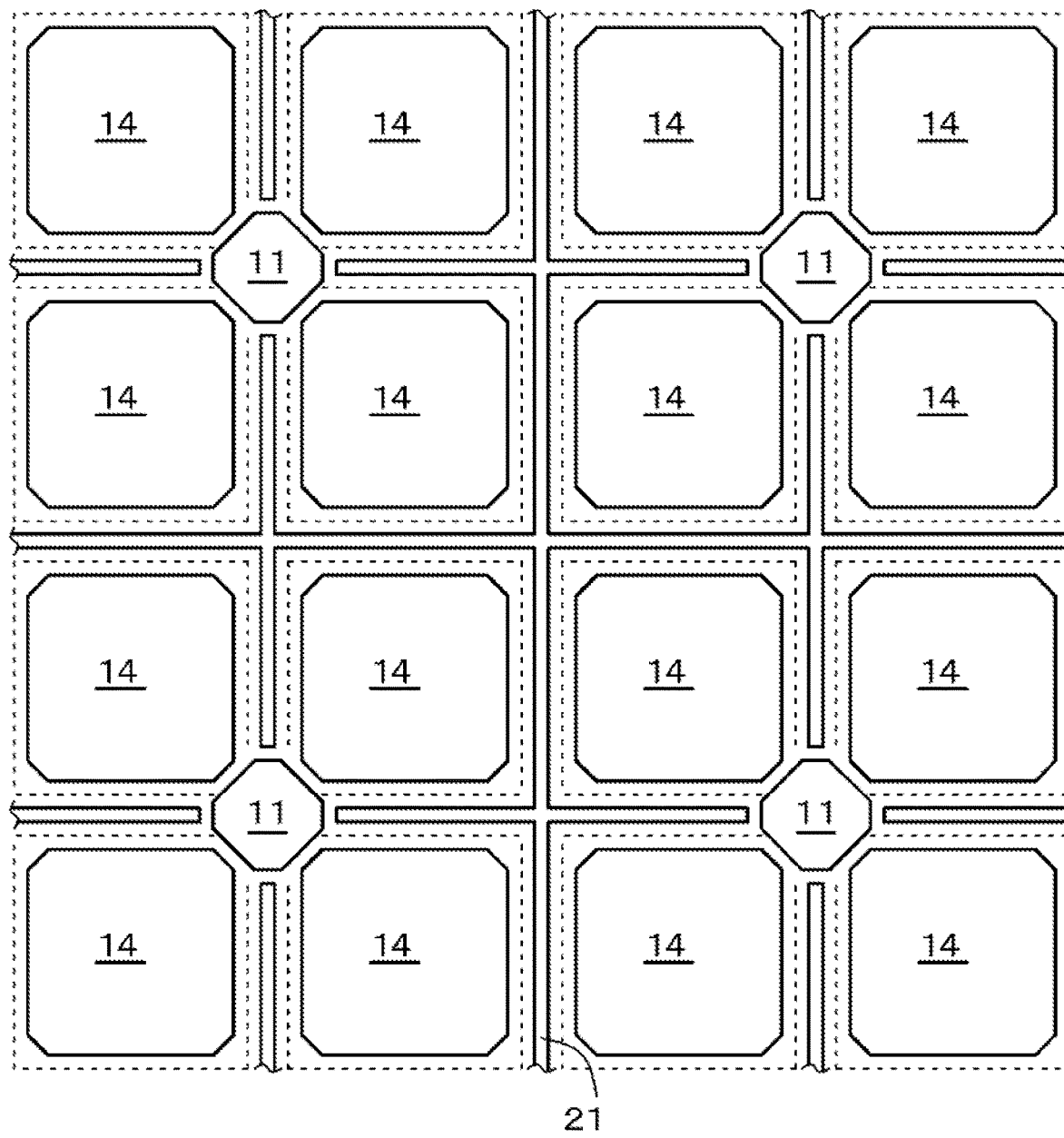
FIG. 23 is a schematic layout diagram of a modification of a first electrode and a charge storage electrode that constitute an imaging device of Example 6 (Modification 3 of Example 6).
Figure 24:
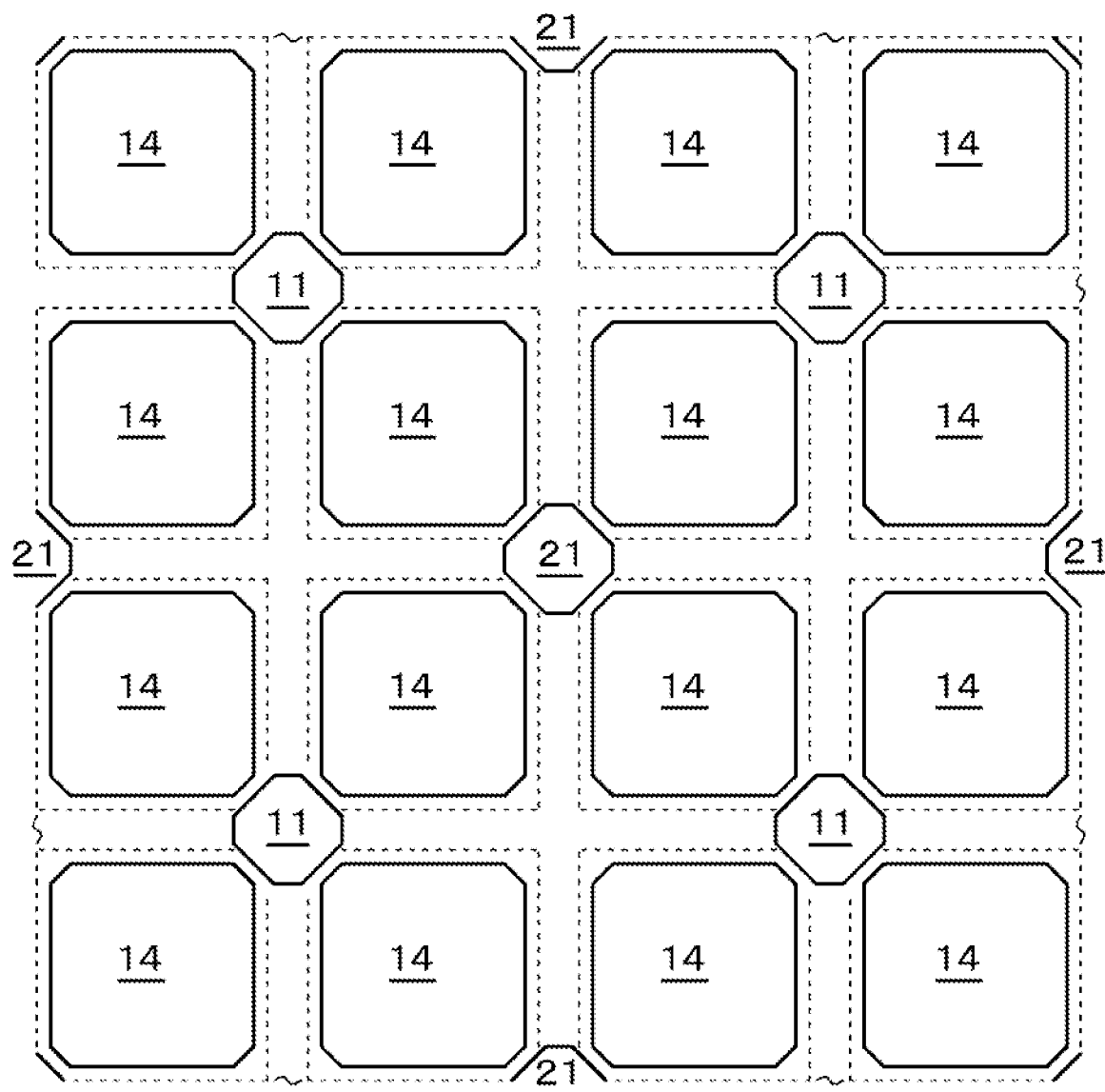
FIG. 24 is a schematic layout diagram of a modification of a first electrode and a charge storage electrode that constitute an imaging device of Example 6 (Modification 4 of Example 6).
Figure 25:
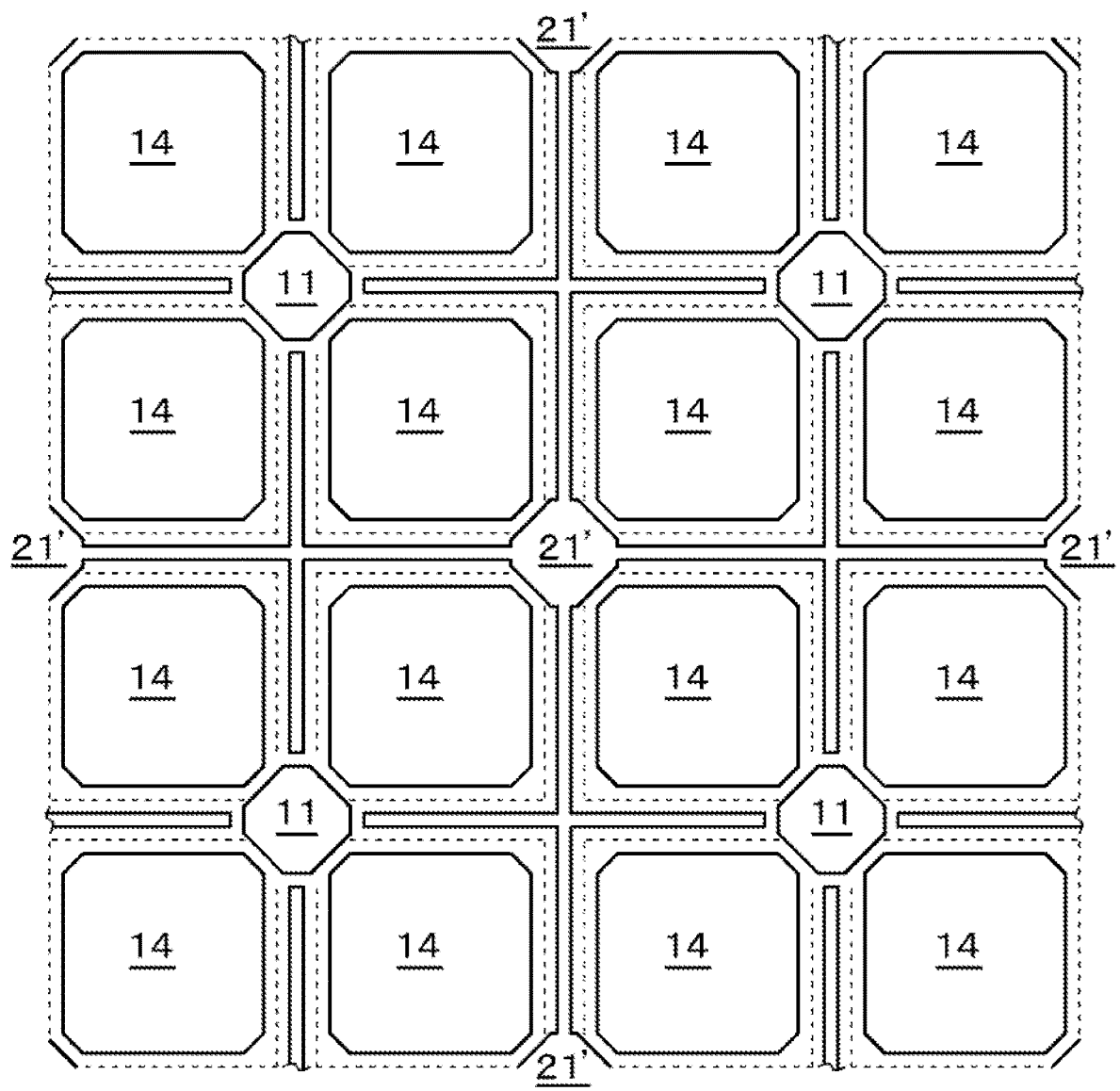
FIG. 25 is a schematic layout diagram of a modification of a first electrode and a charge storage electrode that constitute an imaging device of Example 6 (Modification 5 of Example 6).

Schematic layout diagrams of other modifications of the first electrodes and the charge storage electrodes constituting imaging devices of Example 6 are shown in FIG. 23 (Modification 3 of Example 6), FIG. 24 (Modification 4 of Example 6), and FIG. 25 (Modification 5 of Example 6). In the examples shown in these drawings, one common first electrode 11 is provided for the four charge storage electrodes 14 in four imaging devices. In the example shown in FIG. 23, the charge transfer control electrode 21 is further formed under the portion $82_B$ of the insulating layer 82 located in the region (the region-b) sandwiched between a charge storage electrode 14 and a charge storage electrode 14. In the example shown in FIG. 24, on the other hand, the charge transfer control electrode 21 is formed under the portion of the insulating layer 82 located in each region surrounded by four charge storage electrodes 14. The example shown in FIG. 25 is a combination of the examples shown in FIGS. 23 and 24. Note that the examples shown in FIGS. 23, 24, and 25 are also solid-state imaging apparatuses of the first configuration and the second configuration.

Figure 26:
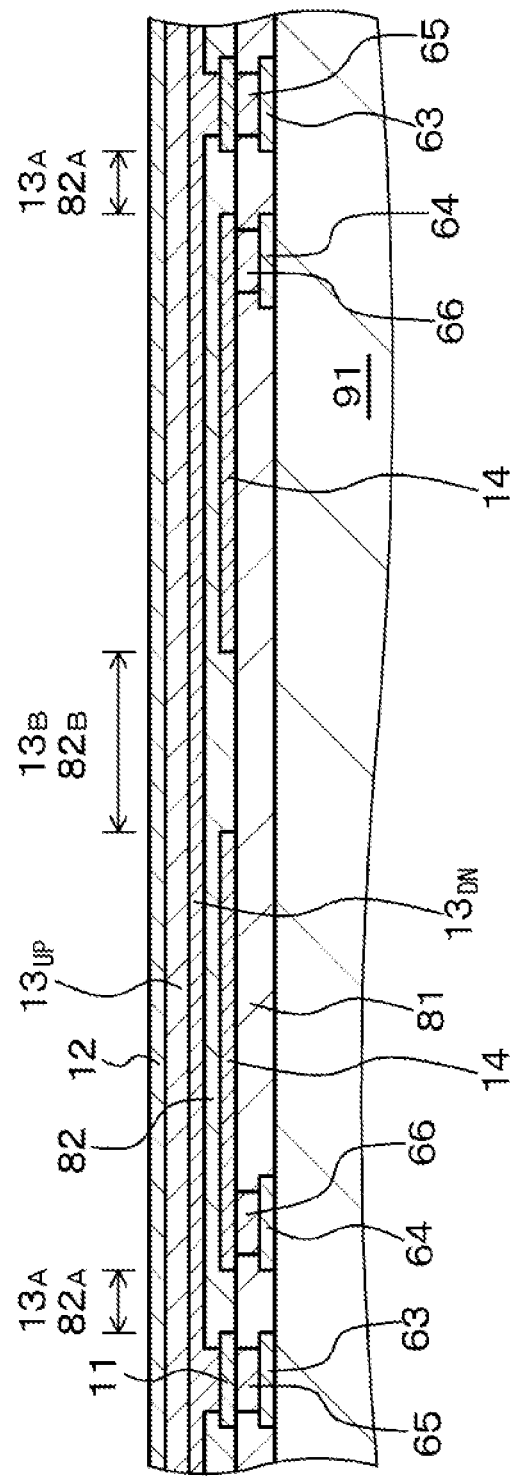
FIG. 26 is a schematic cross-sectional view of a modification of an imaging device (two imaging devices arranged side by side) of Example 6 (Modification 6 of Example 6).

Alternatively, a schematic cross-sectional view of part of a modification (Modification 6 of Example 6) of an imaging device of Example 6 (two imaging devices arranged side by side) is shown in FIG. 26, in which the photoelectric conversion layer may be a stack structure formed with a lower semiconductor layer 13$_{DN}$ and an upper photoelectric conversion layer 13$_{UP}$. The upper photoelectric conversion layer 13$_{UP}$ and the lower semiconductor layer 13$_{DN}$ are shared by a plurality of imaging devices. That is, one upper photoelectric conversion layer 13$_{UP}$ and one lower semiconductor layer 13$_{DN}$ are formed for a plurality of imaging devices. As the lower semiconductor layer 13$_{DN}$ is included in this manner, it is possible to prevent recombination during charge accumulation, for example. It is also possible to increase efficiency in transfer of electric charges accumulated in the photoelectric conversion layer 13 to the first electrode 11. Further, electric charges generated in the photoelectric conversion layer 13 can be temporarily stored, and the transfer timing or the like can be controlled. Furthermore, generation of dark current can be reduced or prevented. The material forming the upper photoelectric conversion layer 13$_{UP}$ is only required to be selected as appropriate from the various materials that can form the photoelectric conversion layer 13. On the other hand, the material forming the lower semiconductor layer 13$_{DN}$ is preferably a material that has a great value of bandgap energy (3.0 eV or greater as the value of bandgap energy, for example), and also has a higher mobility than the material forming the photoelectric conversion layer. Specifically, an oxide semiconductor material such as IGZO can be used. Alternatively, in a case where the electric charges to be accumulated are electrons, the material forming the lower semiconductor layer 13$_{DN}$ may be a material having a higher ionization potential than the ionization potential of the material forming the photoelectric conversion layer. Alternatively, the impurity concentration in the material forming the lower semiconductor layer is preferably equal to or lower than $1 \times 10^{18}$ cm$^{-3}$. Note that the configuration and the structure of Modification 6 of Example 6 can be applied to other examples.

The above description of Example 6 is based on the mode in which the charge transfer control electrode 21 is formed. However, the charge transfer control electrode 21 is not necessarily formed, and, in some cases, the formation of the charge transfer control electrode 21 can be skipped.

Example 7

Example 7 also relates to a stacked imaging device of the present disclosure, and to a solid-state imaging apparatus according to the second embodiment of the present disclosure. That is, a stacked imaging device of Example 7 includes at least one of imaging devices of Examples 1 to 5 or modifications thereof, and a solid-state imaging apparatus of Example 7 includes a plurality of stacked imaging devices of Example 6.

Figure 27:
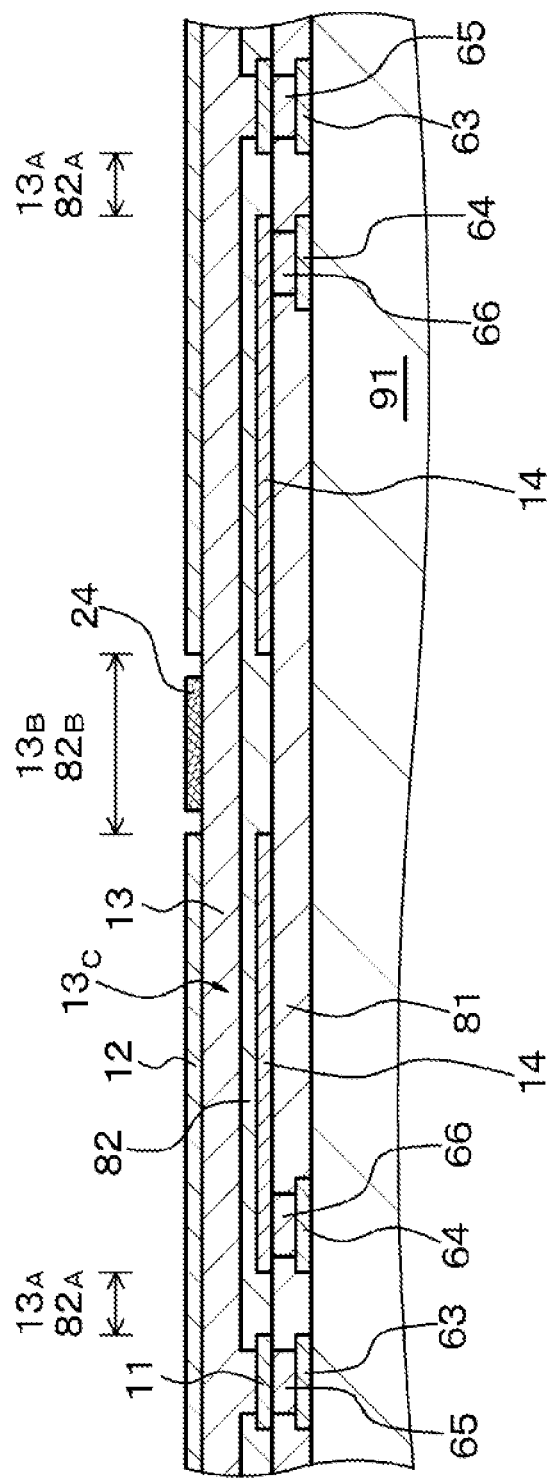
FIG. 27 is a schematic cross-sectional view of part of an imaging device (two imaging devices arranged side by side) of Example 7.
Figure 28:
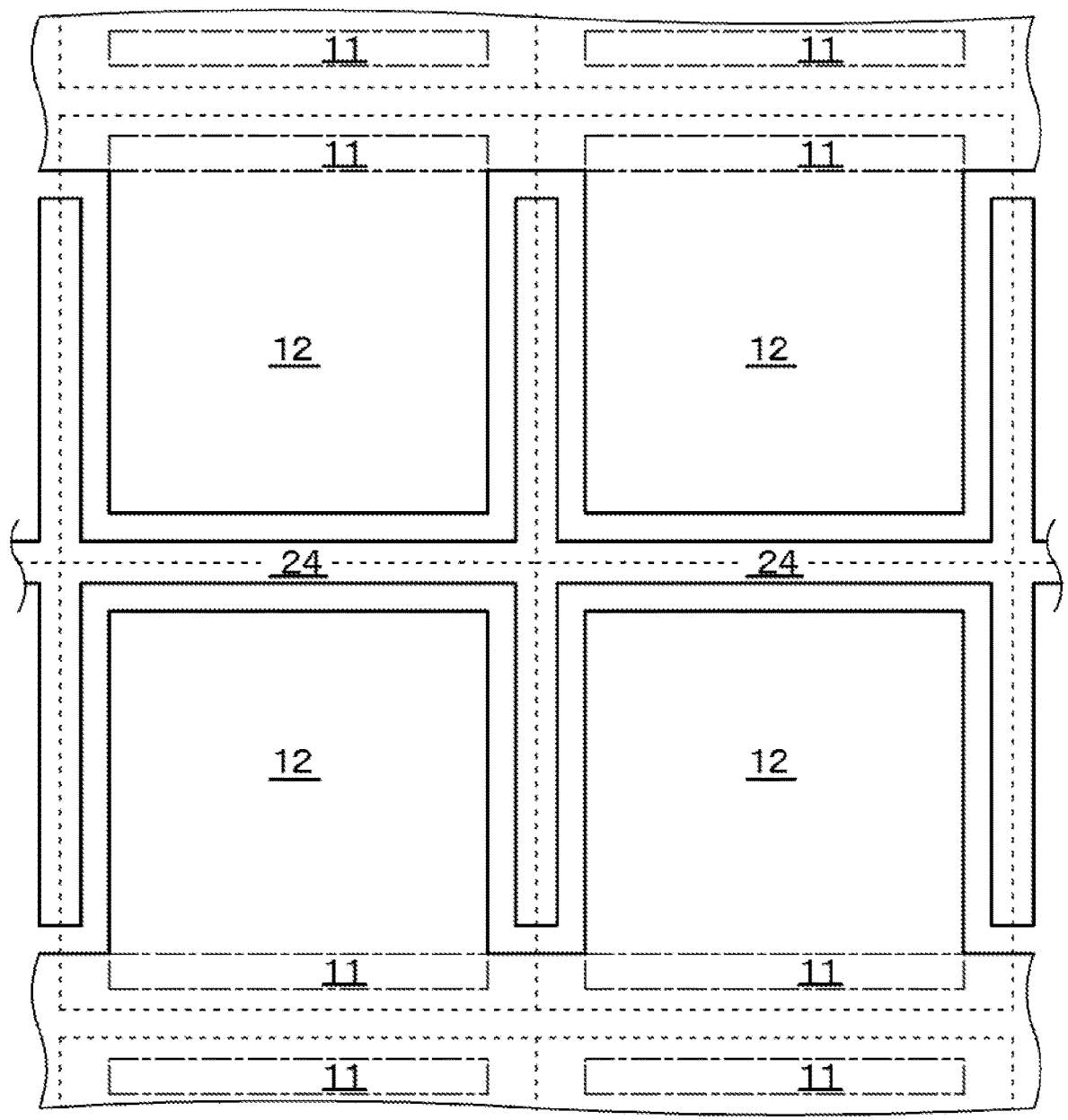
FIG. 28 is a schematic plan view of part of an imaging device (2×2 imaging devices arranged side by side) of Example 7.
Figure 29:
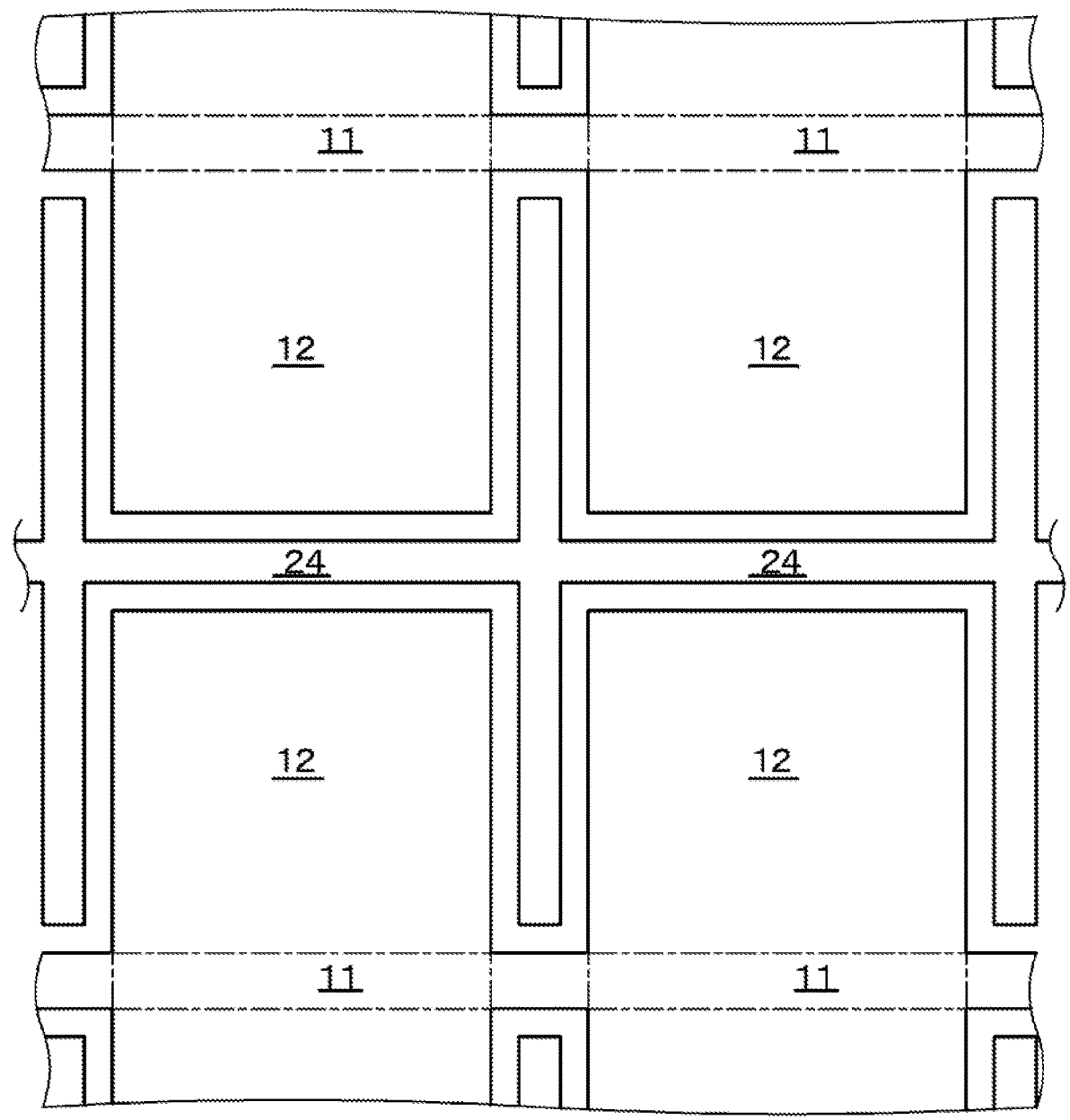
FIG. 29 is a schematic plan view of part of a modification of an imaging device (2×2 imaging devices arranged side by side) of Example 7 (Modification 1 of Example 7).

FIG. 27 shows a schematic cross-sectional view of part of an imaging device of Example 7 (two imaging devices arranged side by side). FIGS. 28 and 29 show schematic plan views of part of an imaging device of Example 7 (2×2 imaging devices arranged side by side). In an imaging device of Example 7, a charge transfer control electrode 24, instead of the second electrode 12, is formed on the region 13$_B$ of the photoelectric conversion layer 13 located between the imaging device and an adjacent imaging device. The charge transfer control electrode 24 is located at a distance from the second electrodes 12. In other words, a second electrode 12 is provided for each imaging device, and the charge transfer control electrode 24 is provided on the region-B of the photoelectric conversion layer 13 so as to surround at least part of the second electrodes 12 and is at a distance from the second electrodes 12. The charge transfer control electrode 24 is formed at the same level as the second electrodes 12.

Note that, in the example shown in FIG. 28, one charge storage electrode 14 is provided for one first electrode 11 in one imaging device. In an example shown in FIG. 29 (Modification 1 of Example 7), on the other hand, one common first electrode 11 is provided for two charge storage electrodes 14 in two imaging devices. The schematic cross-sectional view of part of an imaging device (two imaging devices arranged side by side) of Example 7 shown in FIG. 27 corresponds to FIG. 29.

In Example 7, a second electrode 12 located on the light incident side is shared by imaging devices arranged in the transverse direction on the paper surface of FIG. 28, and is also shared by a pair of imaging devices arranged in the vertical direction on the paper surface of FIG. 28. The charge transfer control electrode 24 is also shared by imaging devices arranged in the transverse direction on the paper surface of FIG. 28, and is further shared by a pair of imaging devices arranged in the vertical direction on the paper surface of FIG. 28. The material layer forming the second electrodes 12 and the charge transfer control electrode 24 is formed on the photoelectric conversion layer 13, and patterning is then performed on this material layer, so that the second electrodes 12 and the charge transfer control electrode 24 can be obtained. Each of the second electrodes 12 and the charge transfer control electrode 24 is individually connected to a wiring line (not shown), and these wiring lines are connected to the drive circuit. A wiring line connected to a second electrode 12 is shared by a plurality of imaging devices. A wiring line connected to the charge transfer control electrode 24 is also shared by a plurality of imaging devices.

In an imaging device of Example 7, the drive circuit applies a potential $V_2'$ to the second electrode 12 and a potential $V_{13}'$ to the charge transfer control electrode 24 during a charge accumulation period, to accumulate electric charges in the photoelectric conversion layer 13, and the drive circuit applies a potential $V_2''$ to the second electrode 12 and a potential $V_{23}''$ to the charge transfer control electrode 24 during a charge transfer period, to read the electric charges accumulated in the photoelectric conversion layer 13 into the control unit via the first electrode 11. Here, the potential of the first electrode 11 is higher than the potential of the second electrode 12, and therefore, the following is satisfied:

$$V_2' \geq V_{13}' \text{ and } V_2'' \geq V_{22}''$$

As described above, in an imaging device of Example 7, a charge transfer control electrode, instead of the second electrode, is formed on the region of the photoelectric conversion layer located between the imaging device and an adjacent imaging device. Accordingly, the charge transfer control electrode can reduce or prevent flow of electric charges generated by photoelectric conversion into adjacent imaging devices, and thus, the quality of a captured video image (an image) is not degraded.

Figure 30A:
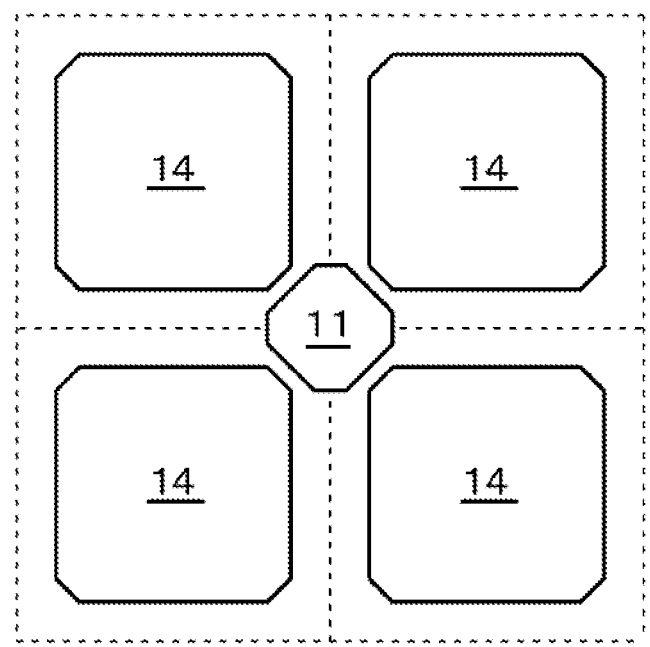
FIGS. 30A and 30B are schematic plan views of part of a modification of an imaging device of Example 7 (Modification 2 of Example 7).
Figure 30B:
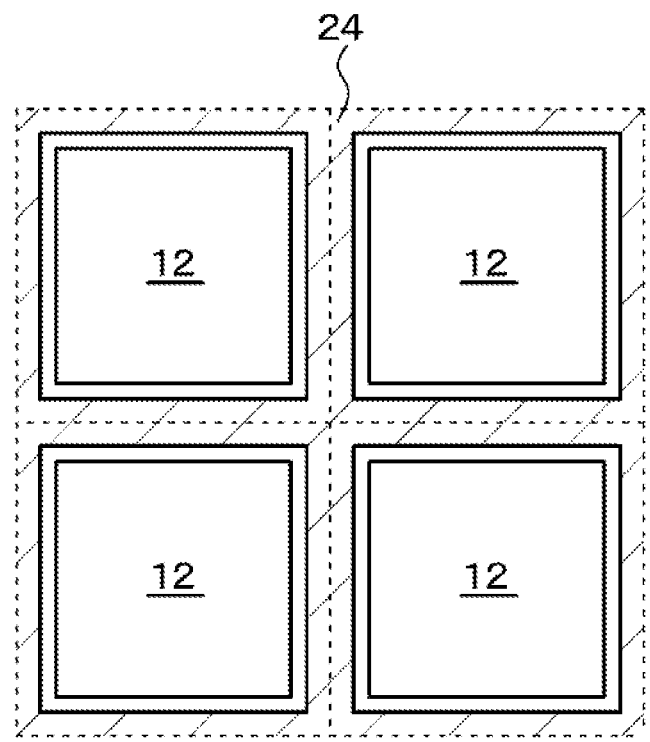

FIGS. 30A and 30B show schematic plan views of part of a modification (Modification 2 of Example 7) of an imaging device of Example 7. Note that, in the examples shown in FIGS. 30A, 31A, 33A, 34A, 35A, and 36A, one common first electrode 11 is provided for the four charge storage electrodes 14 in four imaging devices. Further, as shown in FIG. 30B, the second electrodes 12 are provided above the charge storage electrodes 14, and have substantially the same size as the charge storage electrodes 14. The second electrodes 12 are surrounded by the charge transfer control electrode 24. The charge transfer control electrode 24 is shared by the respective imaging devices. An insulating film (not shown) is formed on the photoelectric conversion layer 13 including the second electrodes 12 and the charge transfer control electrode 24, contact holes (not shown) connected to the second electrodes 12 are formed in the insulating film above the second electrodes 12, and wiring lines $V_{OU}$ (not shown) connected to the contact holes are provided on the insulating film. Note that the configurations and the structures of the second electrodes 12, the insulating film, the contact holes, and the wiring lines $V_{OU}$ are similar to those in the modifications described below. Further, the examples shown in FIGS. 30A, 30B, 31A, 31B, 33A, 33B, 34A, 34B, 35A, 35B, 36A, and 36 are also solid-state imaging apparatuses of the first configuration and the second configuration.

Figure 31A:
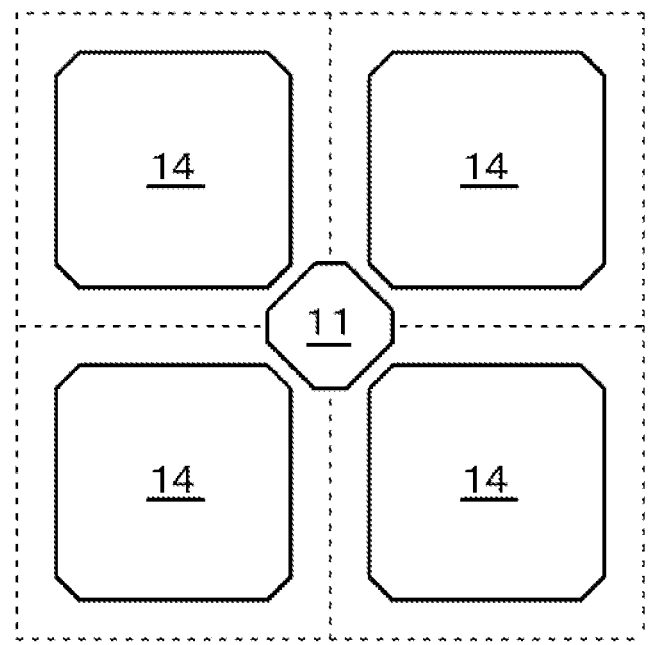
FIGS. 31A and 31B are schematic plan views of part of a modification of an imaging device of Example 7 (Modification 3 of Example 7).
Figure 31B:
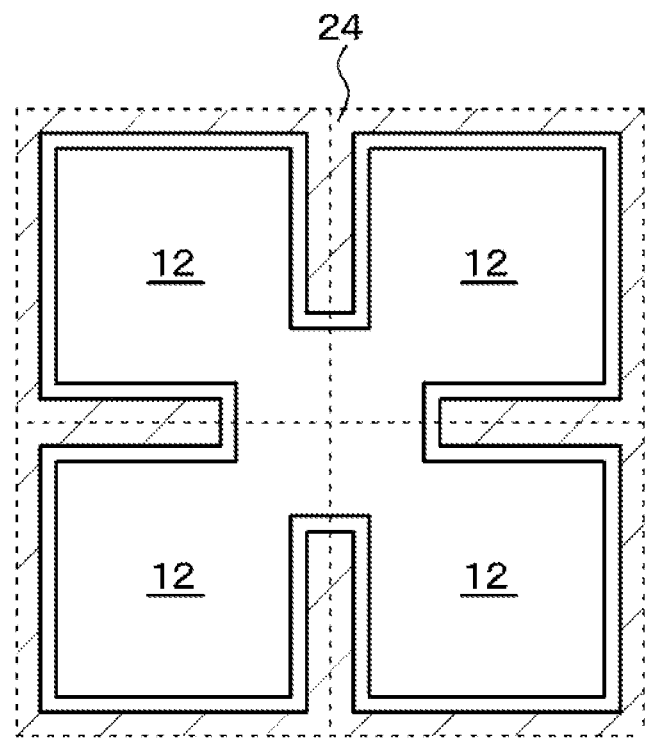

FIGS. 31A and 31B show schematic plan views of part of Modification 3 of Example 7. As shown in FIG. 31B, the second electrodes 12 are provided above the charge storage electrodes 14, and have substantially the same size as the charge storage electrodes 14. The second electrodes 12 are surrounded by the charge transfer control electrode 24. The charge transfer control electrode 24 is shared by four imaging devices. The shared component is formed on the photoelectric conversion layer 13.

Figure 33A:
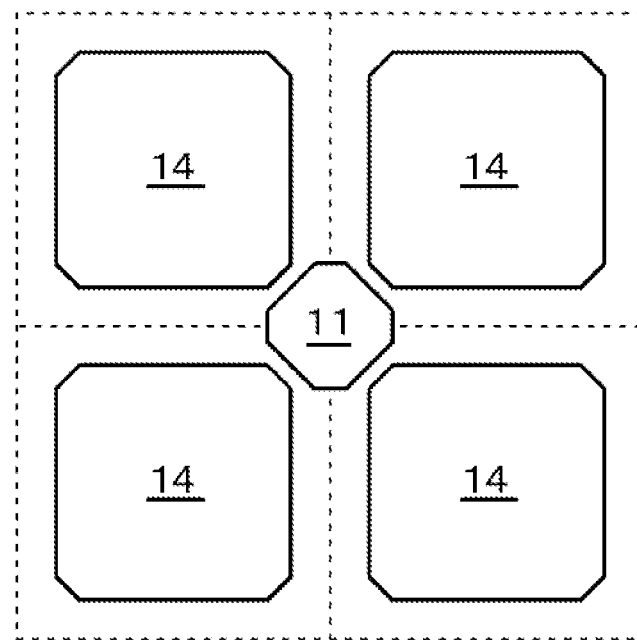
FIGS. 33A and 33B are schematic plan views of part of a modification of an imaging device of Example 7 (Modification 4A of Example 7).
Figure 33B:
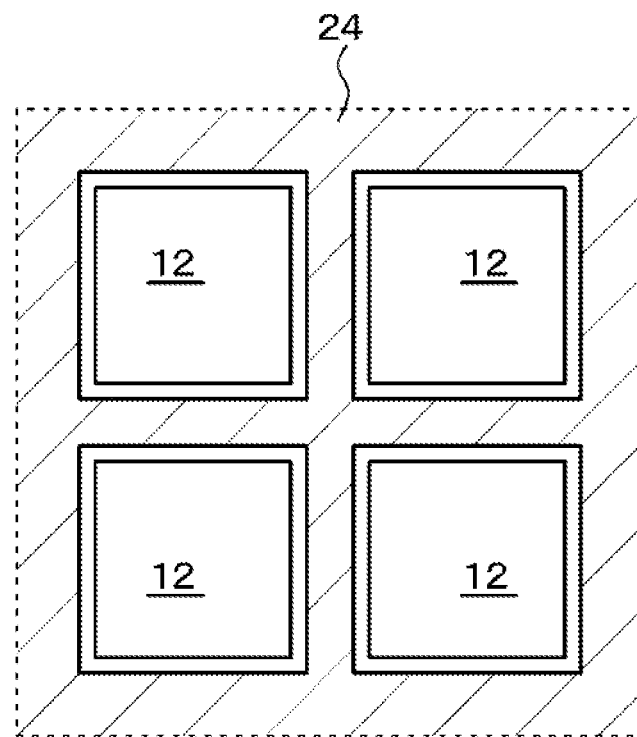

FIG. 32A shows a schematic cross-sectional view of part of a modification (Modification 4A of Example 7) of an imaging device (two imaging devices arranged side by side) of Example 7. FIGS. 33A and 33B shows schematic plan views of the part. In Modification 4A of Example 7, a second electrode 12 is provided for each imaging device, the charge transfer control electrode 24 is provided to surround at least part of the second electrodes 12, and is at a distance from the second electrodes 12, and part of the charge storage electrodes 14 exists below the charge transfer control electrode 24. The second electrodes 12 are provided above the charge storage electrodes 14, and have a smaller size than that of the charge storage electrodes 14.

Figure 34A:
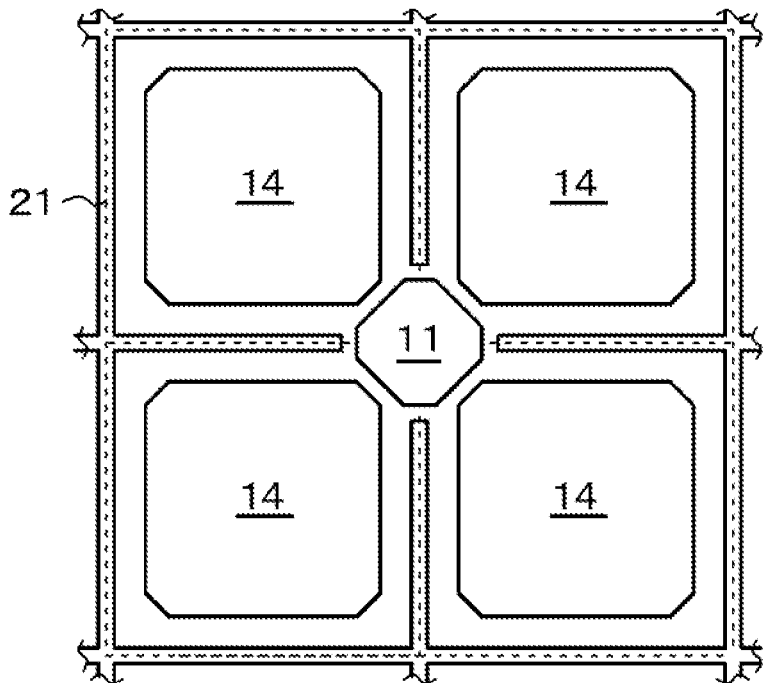
FIGS. 34A and 34B are schematic plan views of part of a modification of an imaging device of Example 7 (Modification 4B of Example 7).
Figure 34B:
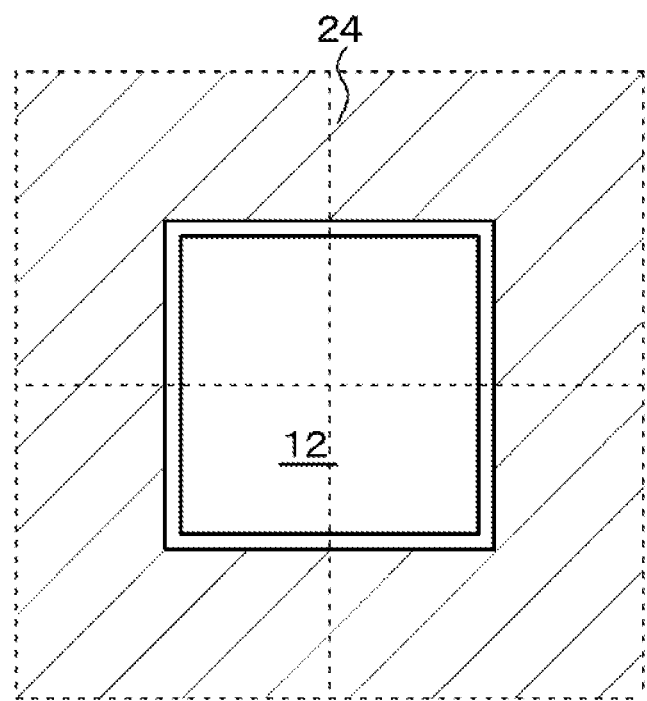

FIG. 32B shows a schematic cross-sectional view of part of a modification (Modification 4B of Example 7) of an imaging device (two imaging devices arranged side by side) of Example 7. FIGS. 34A and 34B shows schematic plan views of the part. In Modification 4B of Example 7, a second electrode 12 is provided for each imaging device, the charge transfer control electrode 24 is provided to surround at least part of the second electrodes 12 and is at a distance from the second electrodes 12, and part of the charge storage electrodes 14 exists below the charge transfer control electrode 24. Further, a charge transfer control electrode (a lower charge transfer control electrode) 21 is disposed below the charge transfer control electrode (an upper charge transfer control electrode) 24. The size of the second electrodes 12 is smaller than that in Modification 4A. That is, the region of a second electrode 12 facing the charge transfer control electrode 24 is located closer to the first electrode 11 than the region of the second electrode 12 facing the charge transfer control electrode 24 in Modification 4A. The charge storage electrodes 14 are surrounded by the charge transfer control electrode 21.

Figure 35A:
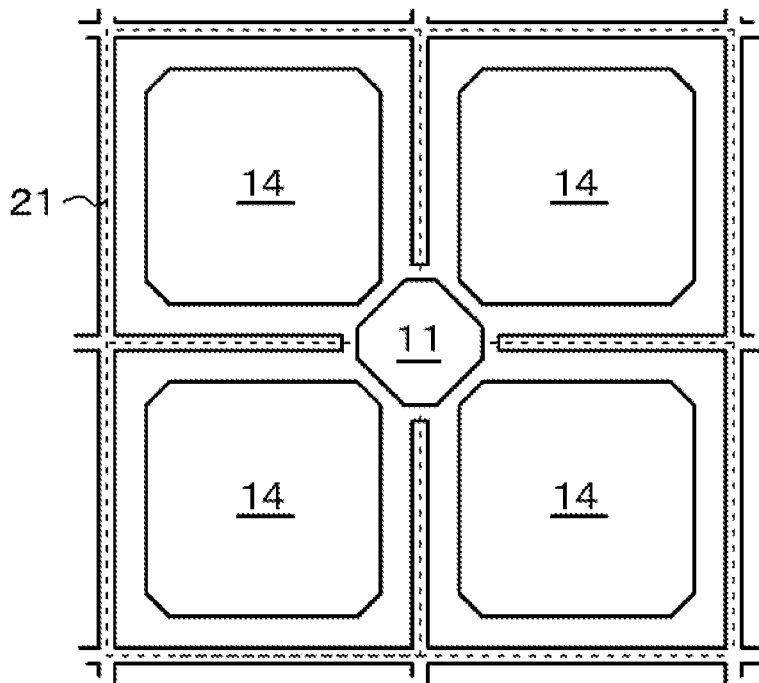
FIGS. 35A and 35B are schematic plan views of part of a modification of an imaging device of Example 7 (Modification 4C of Example 7).
Figure 35B:
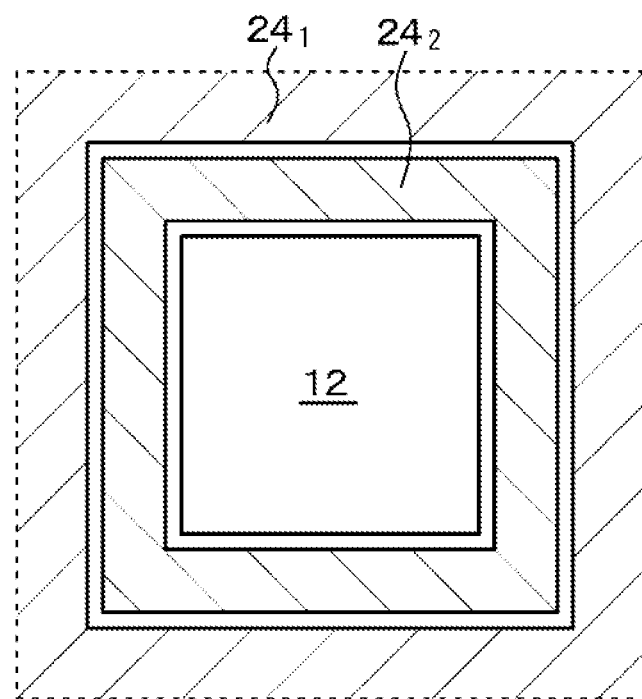

FIGS. 35A and 35B show schematic plan views of part of a modification (Modification 4C of Example 7) of an imaging device of Example 7. In Modification 4C, part of the charge storage electrodes 14 exists below the charge transfer control electrode 24, as in Modification 4B of Example 7. The size of the second electrodes 12 is smaller than that in Modification 4A. That is, the region of a second electrode 12 facing the charge transfer control electrode 24 is located closer to the first electrode 11 than the region of the second electrode 12 facing the charge transfer control electrode 24 in Modification 4A. Further, the charge transfer control electrode 24 includes an outer charge transfer control electrode $24_1$, and an inner charge transfer control electrode $24_2$ located between the outer charge transfer control electrode $24_1$ and each second electrode 12. The charge storage electrodes 14 are surrounded by the charge transfer control electrode 21. In a charge transfer period, it is possible to perform more effective charge transfer by satisfying the following relationship: (the potential to be applied to the outer charge transfer control electrode $24_1$)<(the potential to be applied to the inner charge transfer control electrode $24_2$)<(the potential to be applied to the second electrodes 11).

Figure 36A:
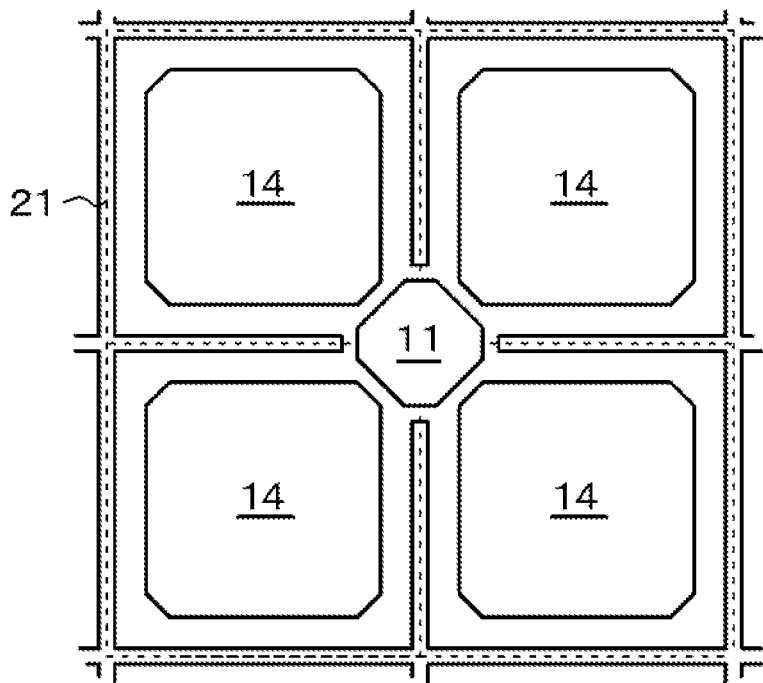
FIGS. 36A and 36B are schematic plan views of part of a modification of an imaging device of Example 7 (Modification 4D of Example 7).
Figure 36B:
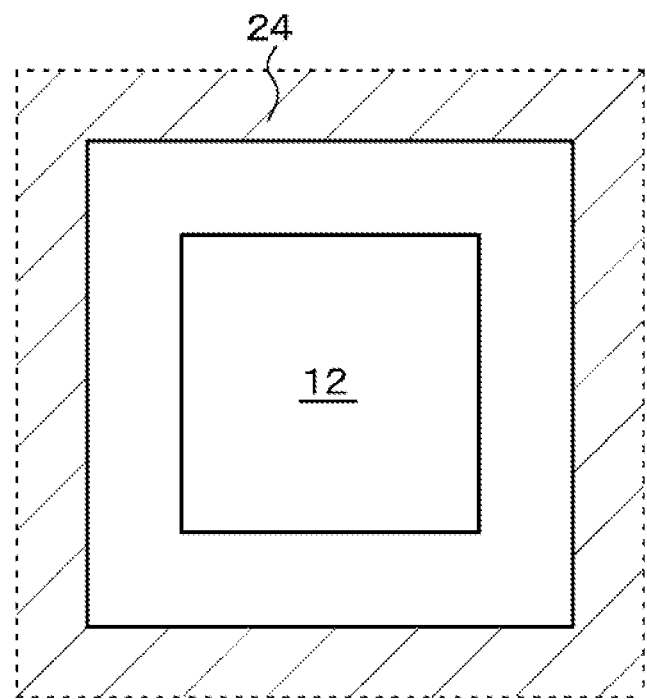

FIGS. 36A and 36B show schematic plan views of part of a modification (Modification 4D of Example 7) of an imaging device of Example 7. In Modification 4D, the charge transfer control electrode (the lower charge transfer control electrode) 21 is disposed below the charge transfer control electrode (the upper charge transfer control electrode) 24, as in Modification 4B of Example 7. The size of the second electrodes 12 is smaller than that in Modification 4B. That is, the region of a second electrode 12 facing the charge transfer control electrode 24 is located closer to the first electrode 11 than the region of the second electrode 12 facing the charge transfer control electrode 24 in Modification 4B. Further, the distance between the charge transfer control electrode 24 and each second electrode 12 is longer than that in the modification 4B. The charge storage electrodes 14 are surrounded by the charge transfer control electrode 21. A potential generated by the coupling between the charge transfer control electrode 24 and the second electrodes 12 is applied to the region of the photoelectric conversion layer 13 located under the region between the charge transfer control electrode 24 and the second electrodes 12.

Example 8

Figure 37:
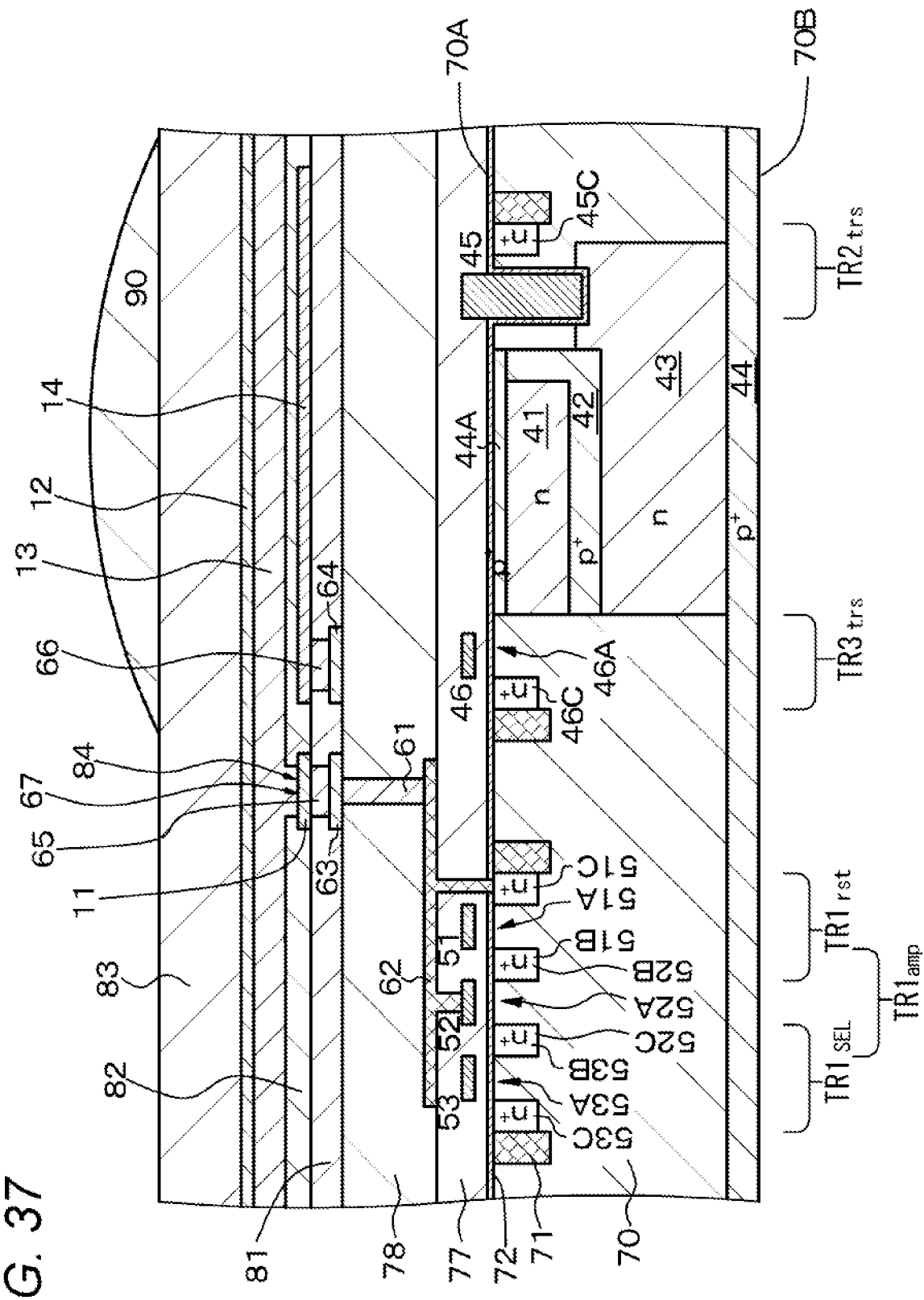
FIG. 37 is a schematic partial cross-sectional view of an imaging device and a stacked imaging device of Example 8.

Example 8 is modifications of Examples 6 and 7. FIG. 37 shows schematic partial cross-sectional view of an imaging device and a stacked imaging device of Example 8. The imaging device and the stacked imaging device are a front-illuminated imaging device and a front-illuminated stacked imaging device, and have a structure in which three imaging devices are stacked. The three imaging devices are: a green-light imaging device of a first type of Example 6 (a first imaging device) that includes a green-light photoelectric conversion layer of the first type that absorbs green light, and has sensitivity to green light; a conventional blue-light imaging device of a second type (a second imaging device) that includes a blue-light photoelectric conversion layer of the second type that absorbs blue light, and has sensitivity to blue light; and a conventional red-light imaging device of the second type (a third imaging device) that includes a red-light photoelectric conversion layer of the second type that absorbs red light, and has sensitivity to red light. Here, the red-light imaging device (the third imaging device) and the blue-light imaging device (the second imaging device) are disposed in the semiconductor substrate 70, and the second imaging device is located closer to the light incident side than the third imaging device is. Further, the green-light imaging device (the first imaging device) is disposed above the blue-light imaging device (the second imaging device).

On the side of the front surface 70A of the semiconductor substrate 70, various transistors that constitute the control unit are provided, as in Example 6. These transistors may have configurations and structures substantially similar to those of the transistors described in Example 6. Further, the second imaging device and the third imaging device are provided in the semiconductor substrate 70, and these imaging devices may have configurations and structures substantially similar to those of the second imaging device and the third imaging device described in Example 6.

Interlayer insulating layers 77 and 78 are formed on the front surface 70A of the semiconductor substrate 70, and the photoelectric conversion unit (the first electrode 11, the photoelectric conversion layer 13, and the second electrode 12), the charge storage electrode 14, and the like that constitute an imaging device of Example 6 are disposed on the interlayer insulating layer 78.

As described above, except for being of a front-illuminated type, the configurations and the structures of an imaging device and a stacked imaging device of Example 8 can be similar to the configurations and the structures of an imaging device and a stacked imaging device of Example 6, and therefore, detailed explanation thereof is not made herein.

Example 9

Example 9 is modifications of Examples 6 to 8.

Figure 38:
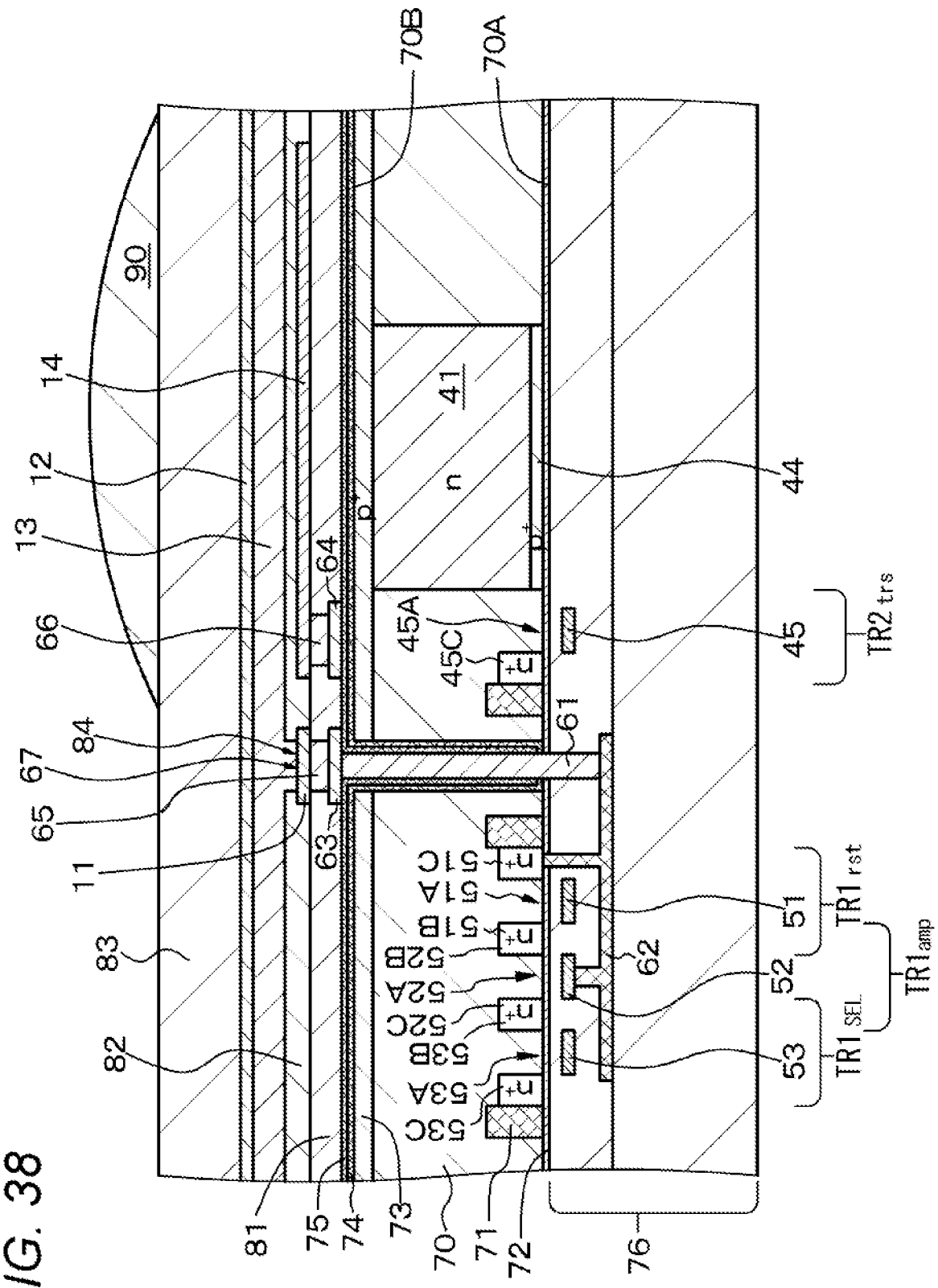
FIG. 38 is a schematic partial cross-sectional view of an imaging device and a stacked imaging device of Example 9.
Figure 39:
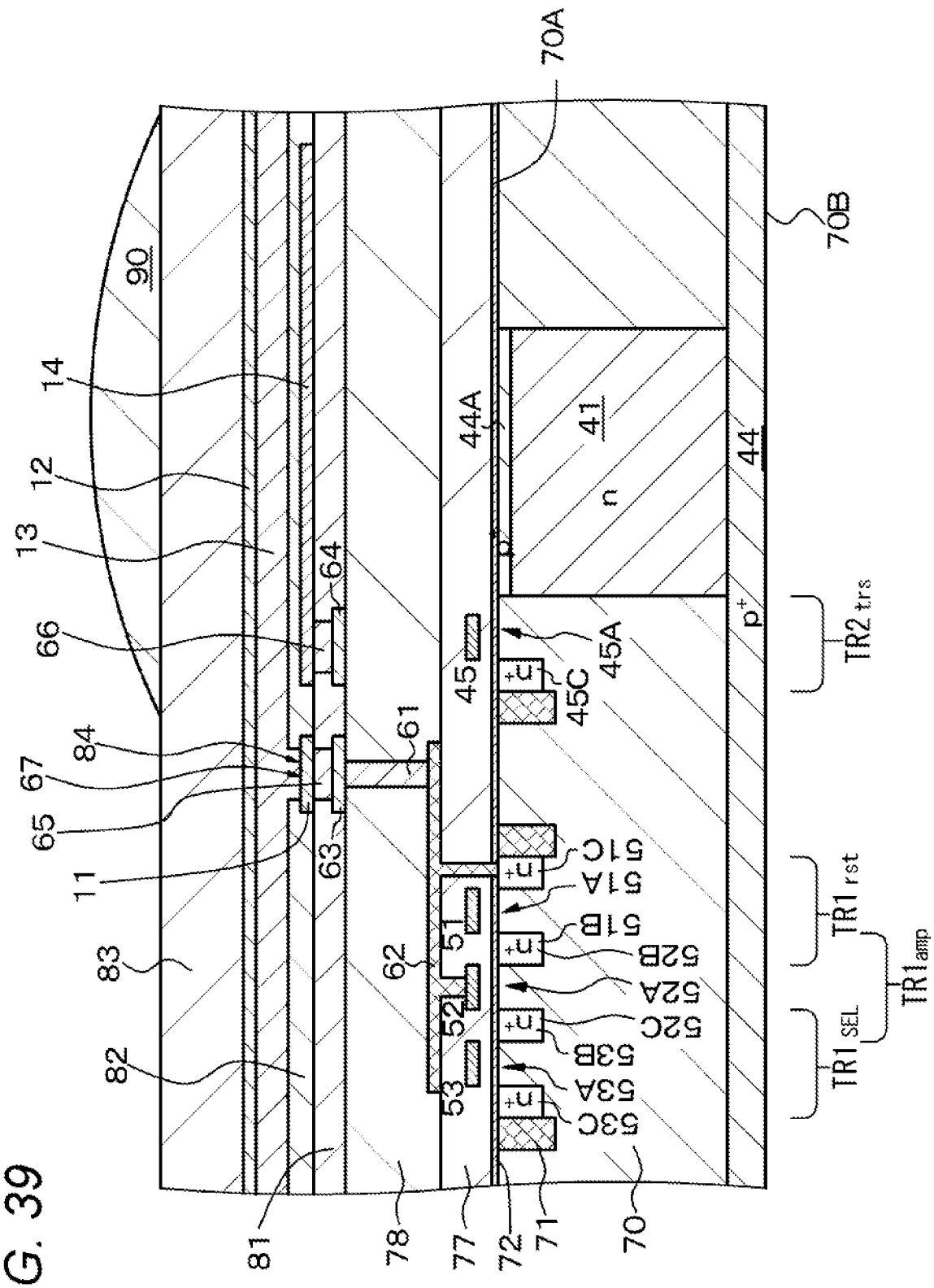
FIG. 39 is a schematic partial cross-sectional view of a modification of an imaging device and a stacked imaging device of Example 9.

FIG. 38 shows a schematic partial cross-sectional view of an imaging device and a stacked imaging device of Example 9. The imaging device and the stacked imaging device are a back-illuminated imaging device and a back-illuminated stacked imaging device, and have a structure in which two imaging devices that are the first imaging device of the first type and the second imaging device of the second type of Example 6 are stacked. Also, FIG. 39 shows a schematic partial cross-sectional view of a modification of an imaging device and a stacked imaging device of Example 9. The imaging device and the stacked imaging device are a front-illuminated imaging device and a front-illuminated stacked imaging device, and have a structure in which two imaging devices that are the first imaging device of the first type and the second imaging device of the second type of Example 6 are stacked. Here, the first imaging device absorbs primary color light, and the second imaging device absorbs complementary color light. Alternatively, the first imaging device absorbs white light, and the second imaging device absorbs infrared rays.

Figure 40:
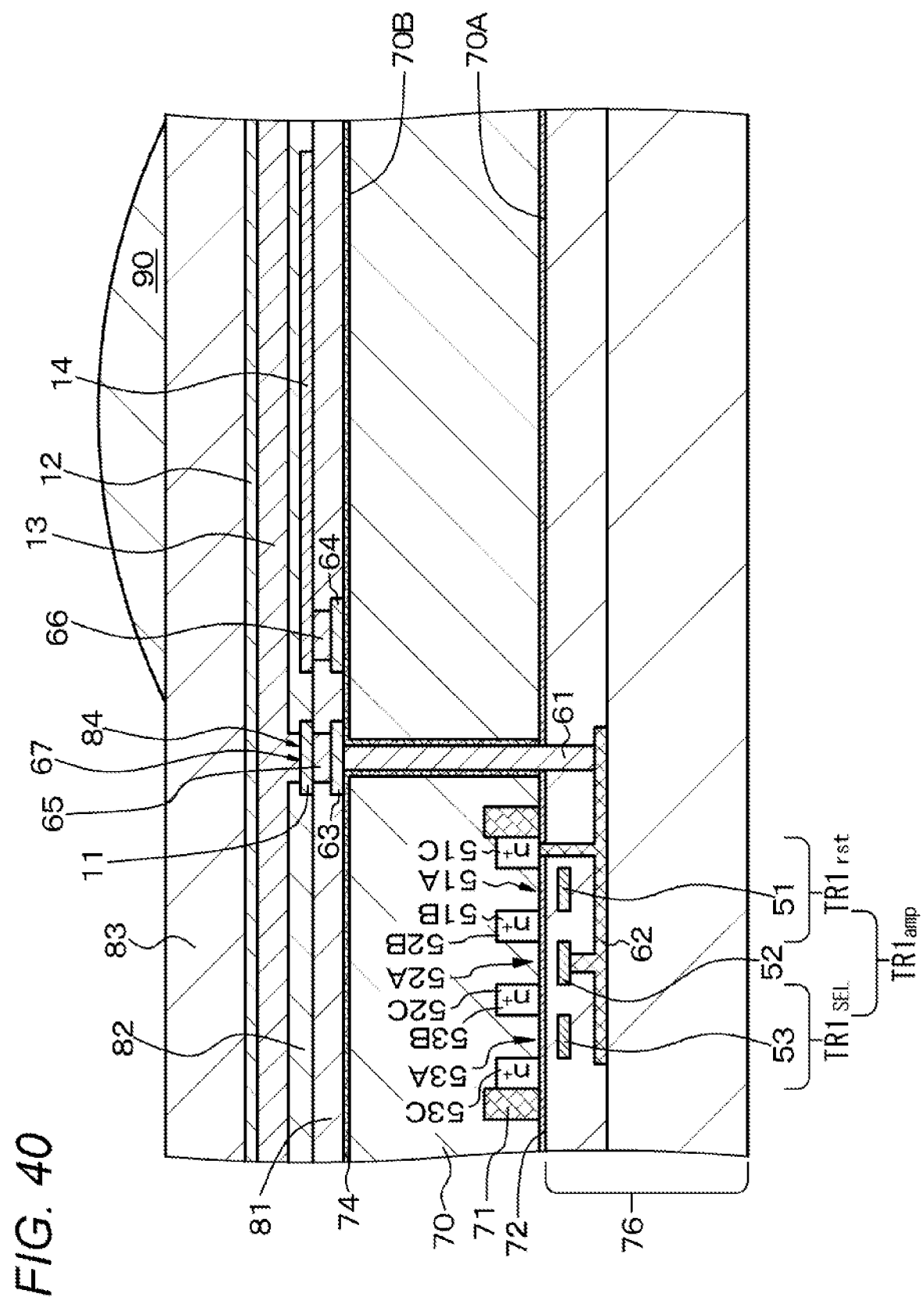
FIG. 40 is a schematic partial cross-sectional view of another modification of an imaging device of Example 9.
Figure 41:
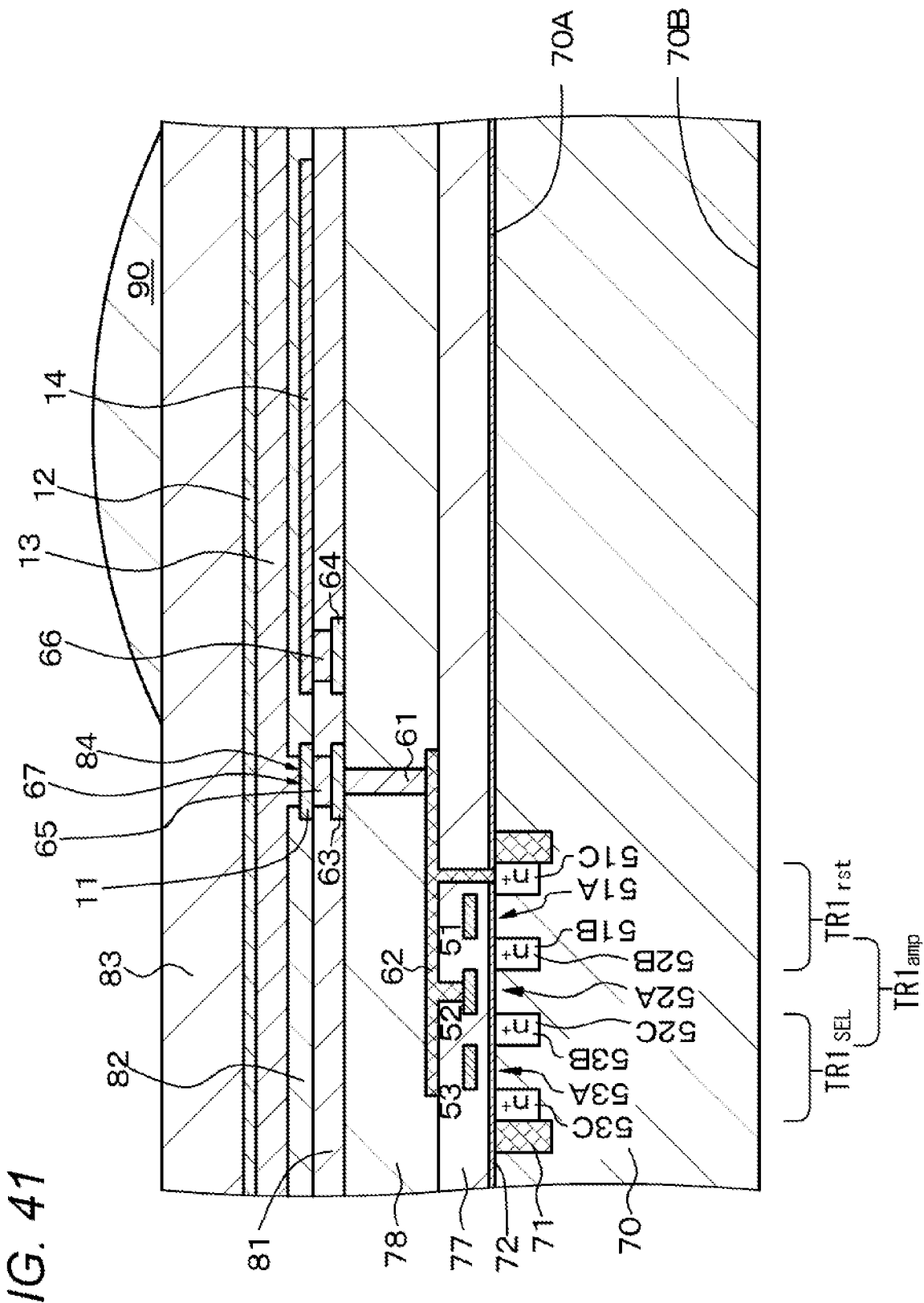
FIG. 41 is a schematic partial cross-sectional view of yet another modification of an imaging device of Example 9.

FIG. 40 shows a schematic partial cross-sectional view of a modification of an imaging device of Example 9. This modification is a back-illuminated imaging device, and is formed with the first imaging device of the first type of Example 6. Also, FIG. 41 shows a schematic partial cross-sectional view of a modification of an imaging device of Example 9. This modification is a front-illuminated imaging device, and is formed with the first imaging device of the first type of Example 6. Here, the first imaging device is formed with three kinds of imaging devices that are an imaging device that absorbs red light, an imaging device that absorbs green light, and an imaging device that absorbs blue light.

Further, a plurality of these imaging devices constitutes a solid-state imaging apparatus according to the first embodiment of the present disclosure. The plurality of these imaging devices may be arranged in a Bayer array. On the light incident side of each imaging device, a color filter for performing blue, green, or red spectral separation is disposed as necessary.

Note that, instead of one imaging device of the first type of Example 6, two imaging devices may be stacked (in other words, two photoelectric conversion units are stacked, and the control unit for the two imaging devices is provided in the semiconductor substrate). Alternatively, three imaging devices may be stacked (in other words, three photoelectric conversion units are stacked, and the control unit for the three imaging devices is provided in the semiconductor substrate). Examples of stack structures formed with first-type imaging devices and second-type imaging devices are shown in the table below.

| First type | Second type |
|---|---|
| 1 | 2 |
| Green | Blue + red |
| 1 | 1 |
| Primary color | Complementary color |
| 1 | 1 |
| White | Infrared rays |
| 1 | 0 |
| Blue, green, or red | |
| 2 | 2 |
| Green + infrared light | Blue + red |
| 2 | 1 |
| Green + blue | Red |
| 2 | 0 |
| White + infrared light | |
| 3 | 2 |
| Green + blue + red | Blue-green (emerald) + infrared light |
| 3 | 1 |
| Green + blue + red | Infrared light |
| 3 | 0 |
| Blue + green + red | |

(Back-illuminated type and front-illuminated type)

Figure 42:
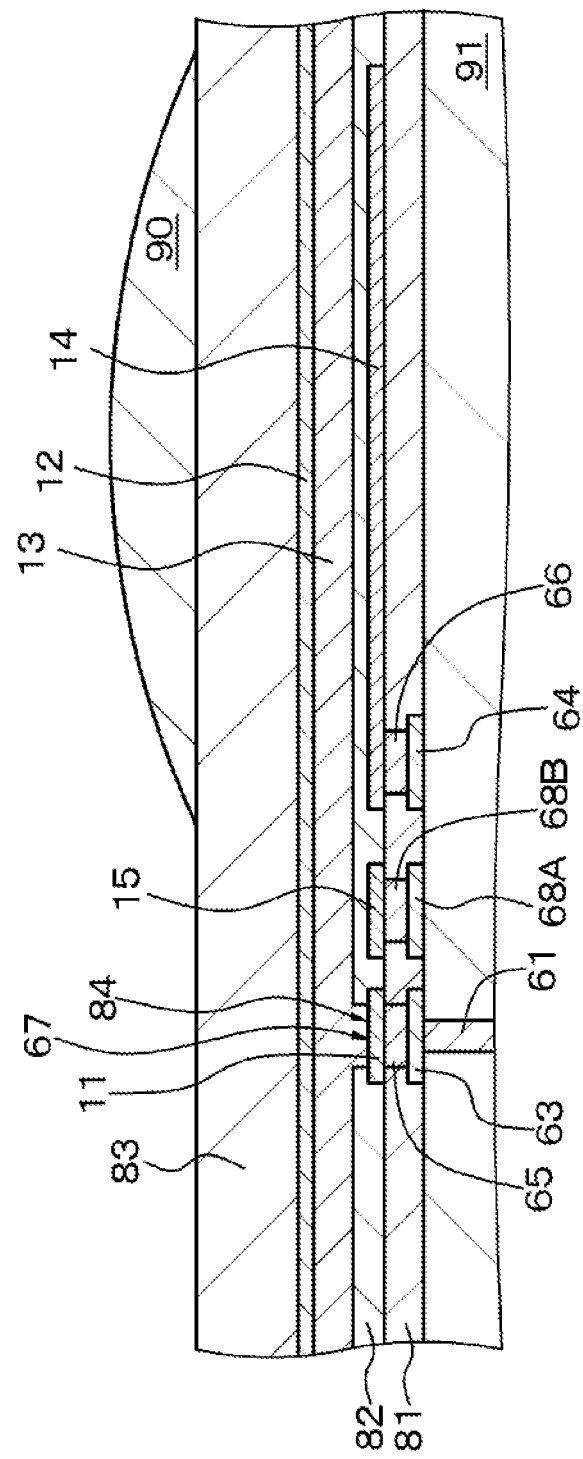
FIG. 42 is a schematic partial cross-sectional view of part of an imaging device and a stacked imaging device of Example 10.
Figure 43:
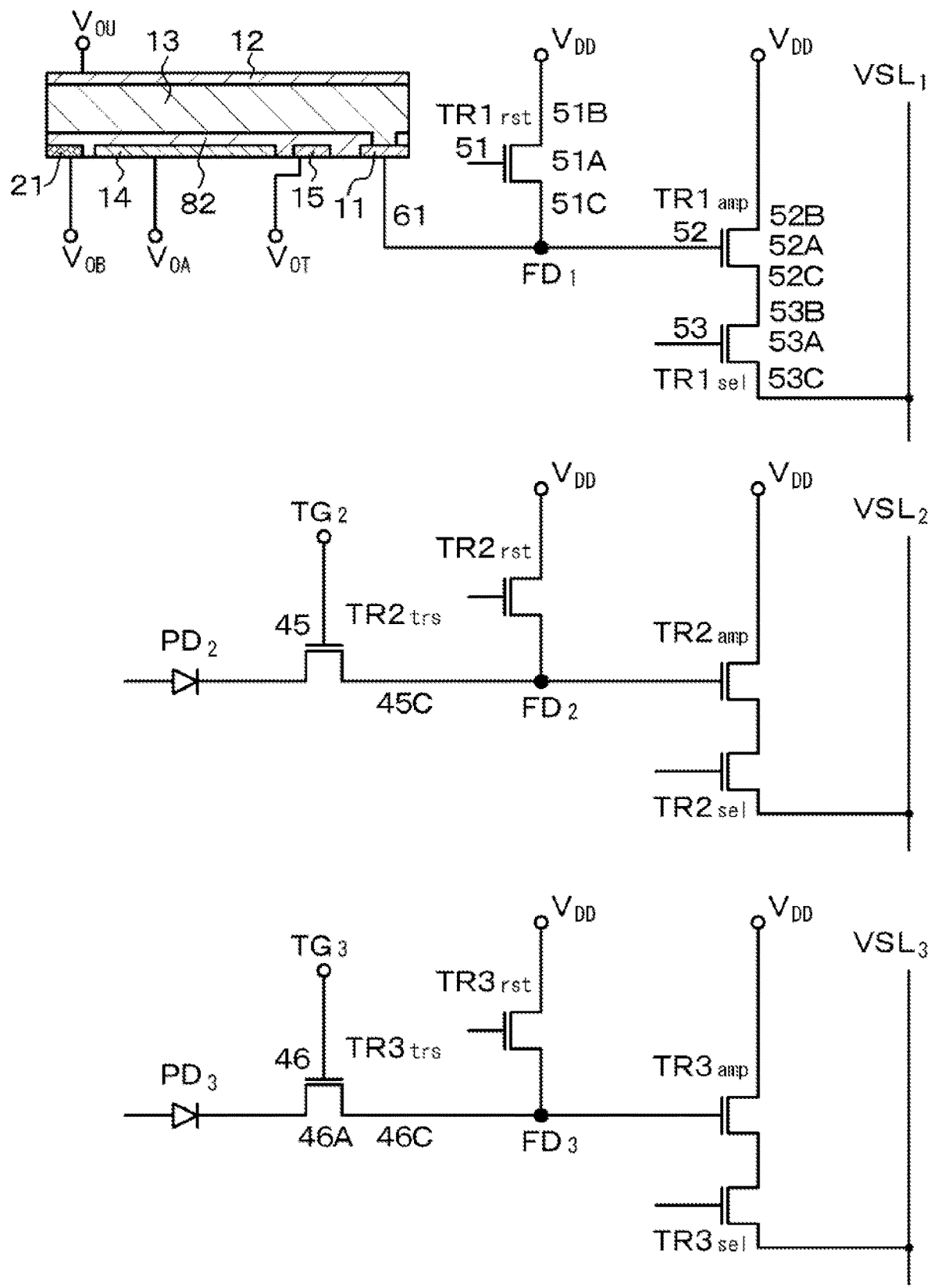
FIG. 43 is an equivalent circuit diagram of an imaging device and a stacked imaging device of Example 10.
Figure 44:
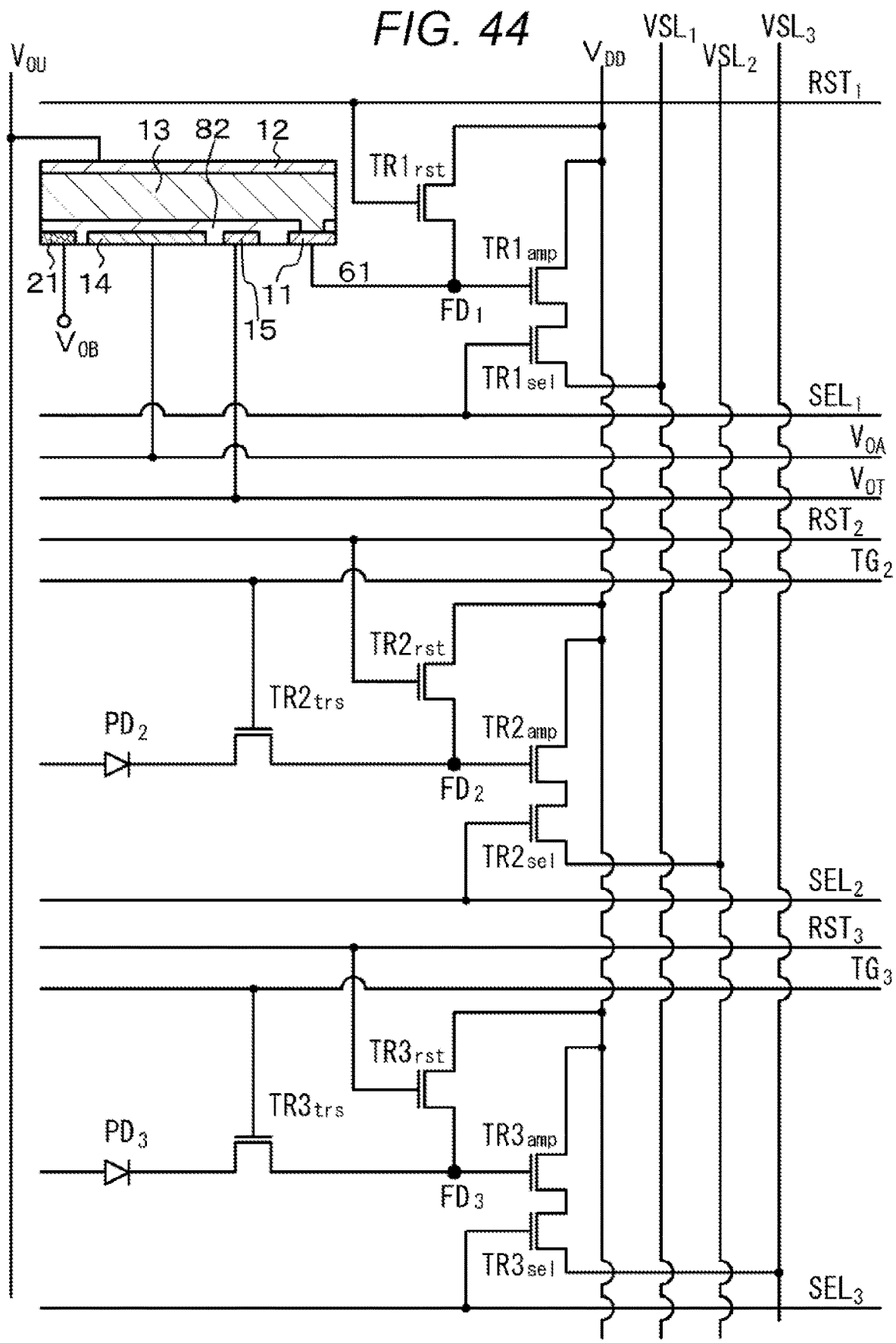
FIG. 44 is an equivalent circuit diagram of an imaging device and a stacked imaging device of Example 10.
Figure 45:
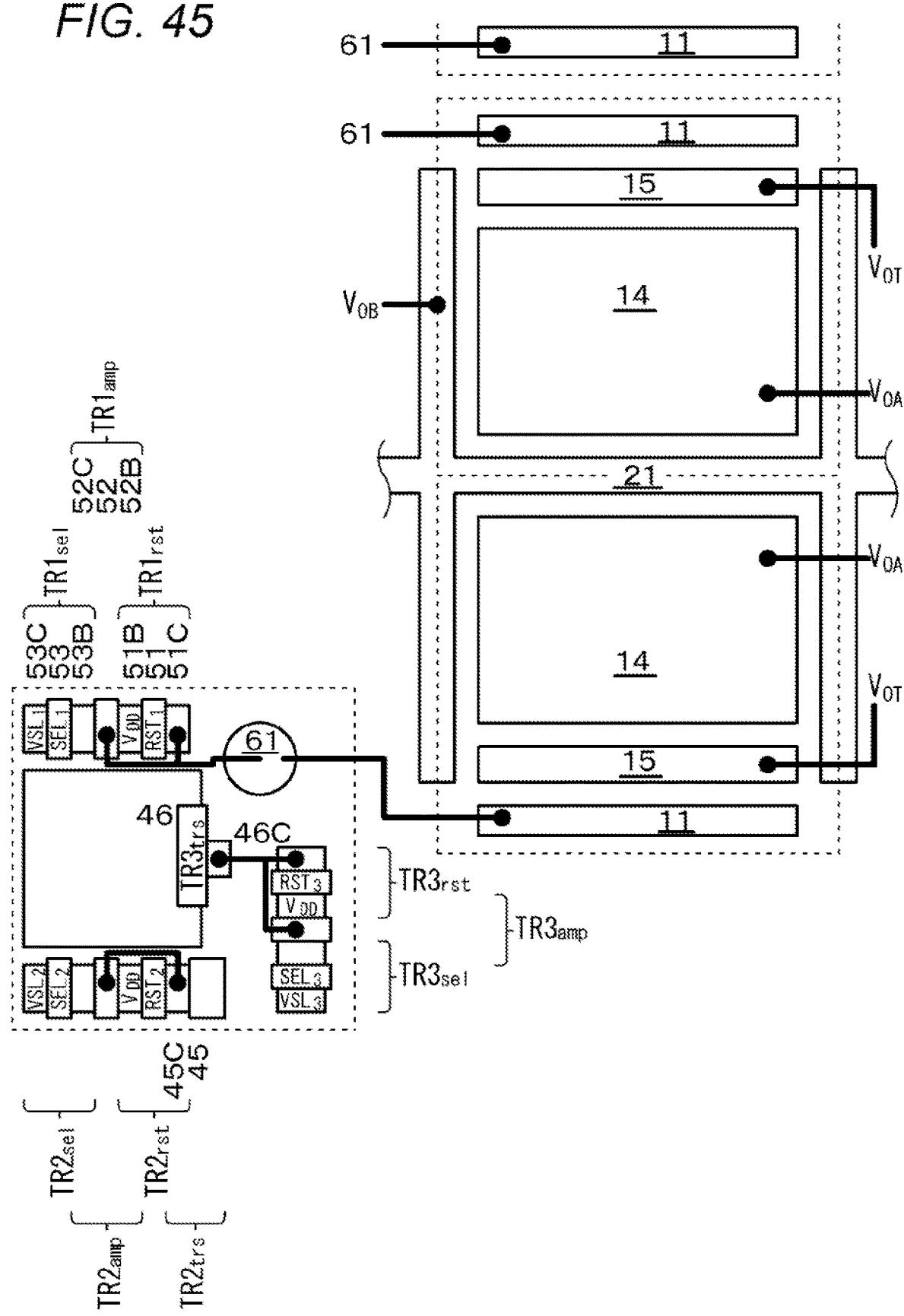
FIG. 45 is a schematic layout diagram of a first electrode, a transfer control electrode, a charge storage electrode, and the transistors constituting a control unit of an imaging device of Example 10.
Figure 48:
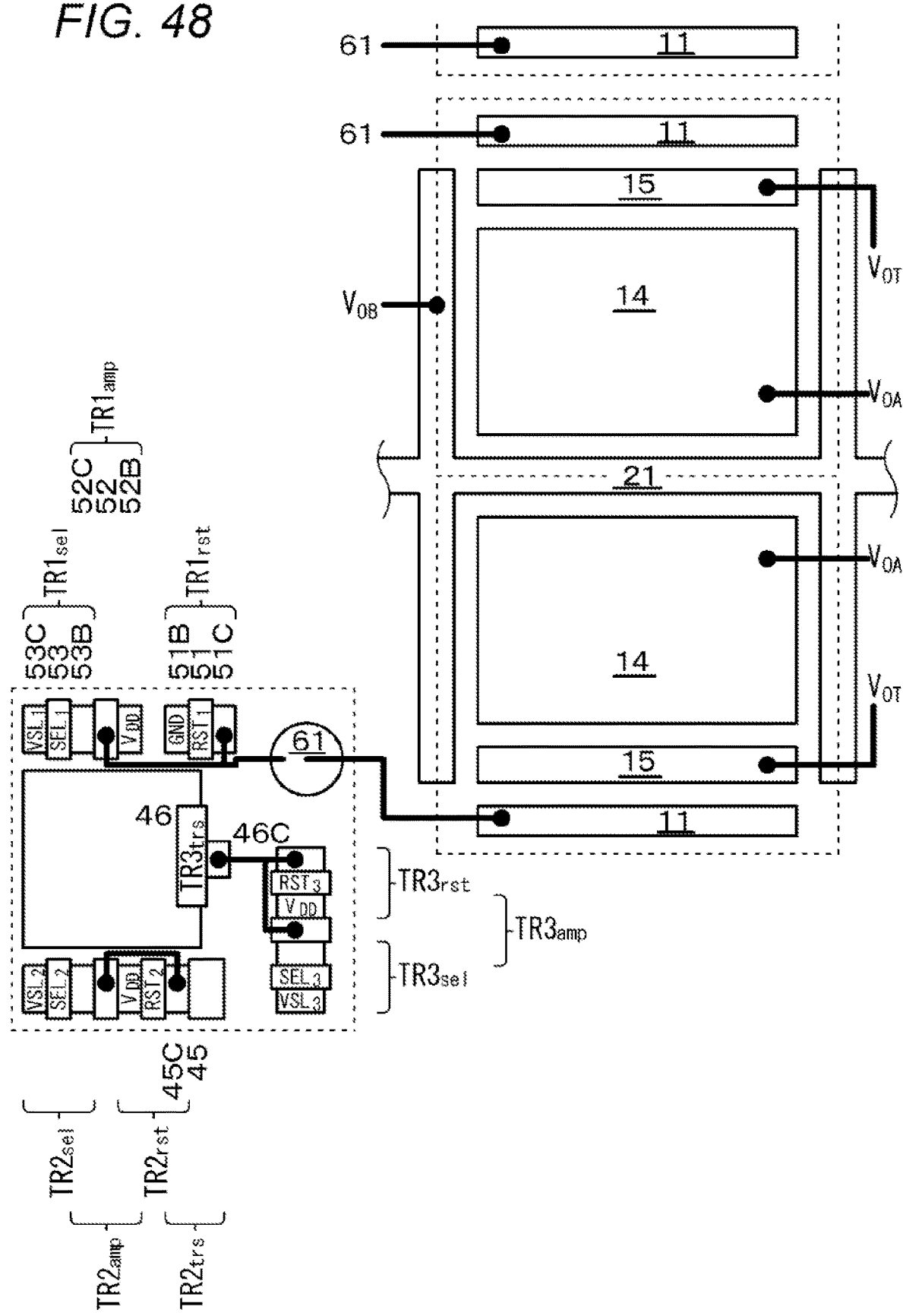
FIG. 48 is a schematic layout diagram of a first electrode, a transfer control electrode, a charge storage electrode, and the transistors constituting a control unit of a modification of an imaging device of Example 10.

Example 10 is modifications of Examples 6 to 9, and relates to imaging devices and the like of the present disclosure including a transfer control electrode (a charge transfer electrode). FIG. 42 shows a schematic partial cross-sectional view of part of an imaging device and a stacked imaging device of Example 10. FIGS. 43 and 44 show equivalent circuit diagrams of an imaging device and a stacked imaging device of Example 10. FIG. 45 shows a schematic layout diagram of first electrodes, transfer control electrodes, and charge storage electrodes that constitute imaging devices of Example 10, and the transistors that constitute a control unit. FIGS. 46 and 47 schematically show the states of the potentials at respective portions during an operation of an imaging device of Example 10. Further, FIG. 48 shows a schematic layout diagram of first electrodes, transfer control electrodes, and charge storage electrodes that constitute imaging devices of Example 10. FIG. 19B shows an equivalent circuit diagram of an imaging device and a stacked imaging device of Example 10 for explaining the respective portions shown in FIGS. 46 and 47.

In an imaging device and a stacked imaging device of Example 10, a transfer control electrode (a charge transfer electrode) 15 is further provided between the first electrode 11 and the charge storage electrode 14. The transfer control electrode 15 is disposed at a distance from the first electrode 11 and the charge storage electrode 14, and is positioned to face the photoelectric conversion layer 13 via the insulating layer 82. The transfer control electrode 15 is connected to the pixel drive circuit that forms the drive circuit, via a connecting hole 68B, a pad portion 68A, and a wiring line $V_{OT}$ that are formed in the interlayer insulating layer 81.

In the description below, operation of an imaging device (a first imaging device) of Example 10 is described, with reference to FIGS. 46 and 47. Note that the value of the potential to be applied to the charge storage electrode 14 and the value of the potential at point $P_D$ are particularly different between FIGS. 46 and 47.

In a charge accumulation period, the drive circuit applies a potential $V_{11}$ to the first electrode 11, a potential $V_{12}$ to the charge storage electrode 14, and a potential $V_{14}$ to the transfer control electrode 15. Light that has entered the photoelectric conversion layer 13 causes photoelectric conversion in the photoelectric conversion layer 13. Holes generated by the photoelectric conversion are sent from the second electrode 12 to the drive circuit via a wiring line $V_{OU}$. Meanwhile, since the potential of the first electrode 11 is higher than the potential of the second electrode 12, or a positive potential is applied to the first electrode 11 while a negative potential is applied to the second electrode 12, for example, $V_{12} > V_{14}$ ($V_{12} > V_{11} > V_{14}$, or $V_{11} > V_{12} > V_{14}$, for example). As a result, electrons generated by the photoelectric conversion are attracted to the charge storage electrode 14, and stay in the region of the photoelectric conversion layer 13 facing the charge storage electrode 14. In other words, electric charges are accumulated in the photoelectric conversion layer 13. Since $V_{12} > V_{14}$, the electrons generated in the photoelectric conversion layer 13 can be reliably prevented from moving toward the first electrode 11. With the passage of time for photoelectric conversion, the potential in the region of the photoelectric conversion layer 13 facing the charge storage electrode 14 becomes a more negative value.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 11, a potential $V_{22}$ to the charge storage electrode 14, and a potential $V_{24}$ to the transfer control electrode 15. Here, $V_{22} \leq V_{24} \leq V_{21}$. As a result, the electrons remaining in the region of the photoelectric conversion layer 13 facing the charge storage electrode 14 are read into the first electrode 11 and further into the first floating diffusion layer $FD_1$ without fail. In other words, the electric charges accumulated in the photoelectric conversion layer 13 are read into the control unit.

In the above manner, a series of operations including charge accumulation, reset operation, and charge transfer is completed.

The operations of the amplification transistor $TR1_{amp}$ and the selection transistor $TR1_{sel}$ after the electrons are read into the first floating diffusion layer $FD_1$ are the same as the operations of conventional amplification and selection transistors. Further, a series of operations including charge accumulation, reset operation, and charge transfer to be performed in the second imaging device and the third imaging device is similar to a series of conventional operations including charge accumulation, reset operation, and charge transfer, for example.

FIG. 48 shows a schematic layout diagram of first electrodes, charge storage electrodes, and the transistors constituting the control unit of a modification of an imaging device of Example 10. As shown in FIG. 48, the other source/drain region 51B of the reset transistor $TR1_{rst}$ may be grounded, instead of being connected to the power supply $V_{DD}$.

Example 11

Example 11 is modifications of Examples 6 to 10, and relates to imaging devices and the like of the present disclosure including a plurality of charge storage electrode segments.

Figure 49:
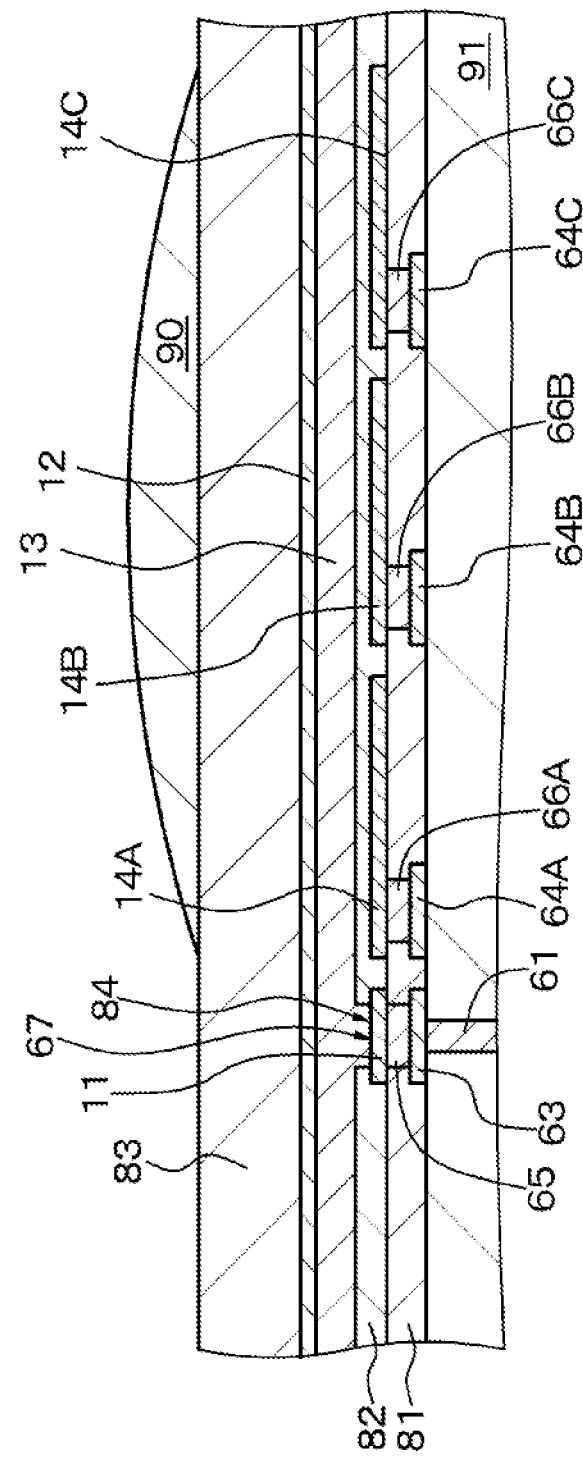
FIG. 49 is a schematic partial cross-sectional view of part of an imaging device and a stacked imaging device of Example 11.
Figure 50:
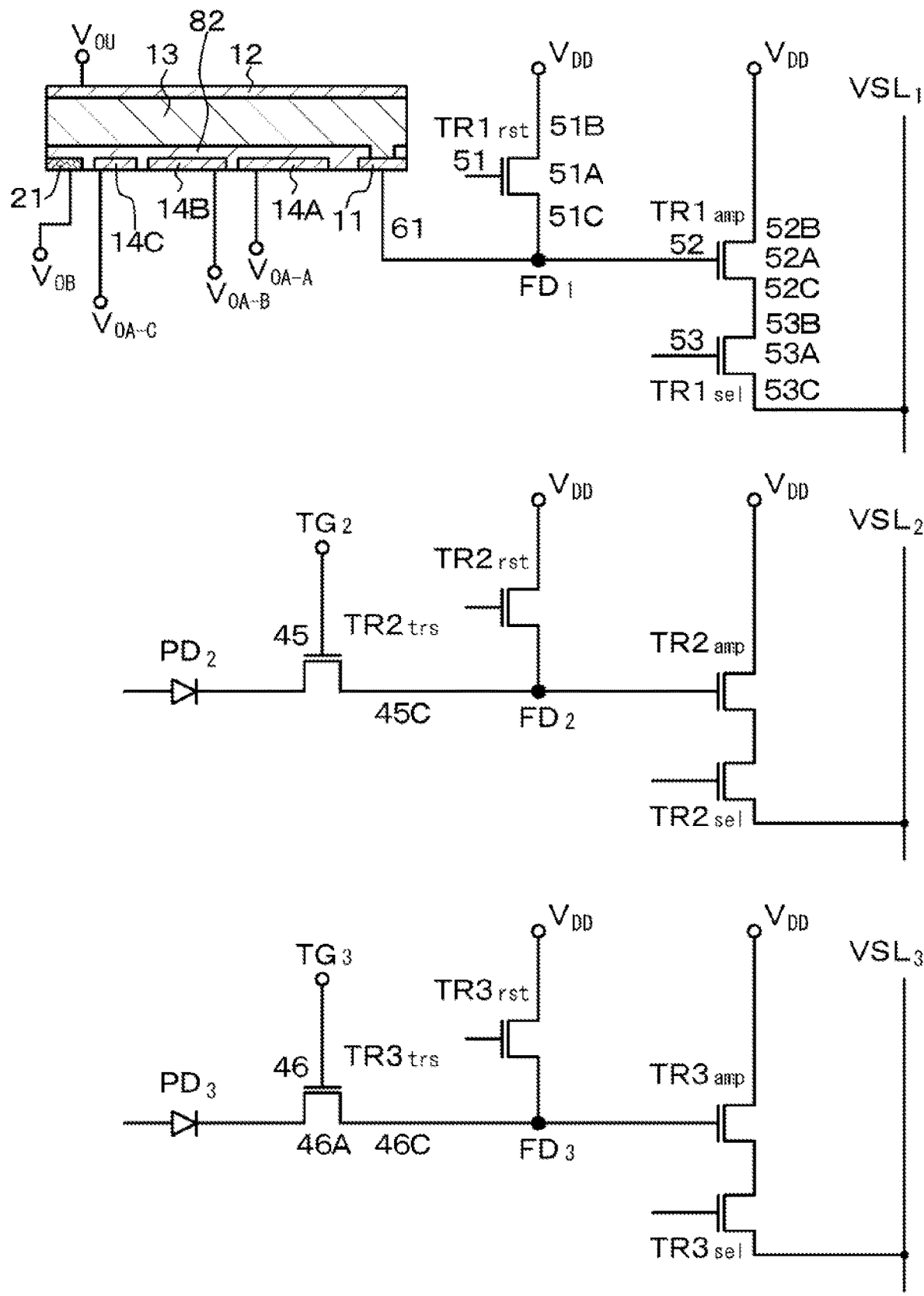
FIG. 50 is an equivalent circuit diagram of an imaging device and a stacked imaging device of Example 11.
Figure 51:
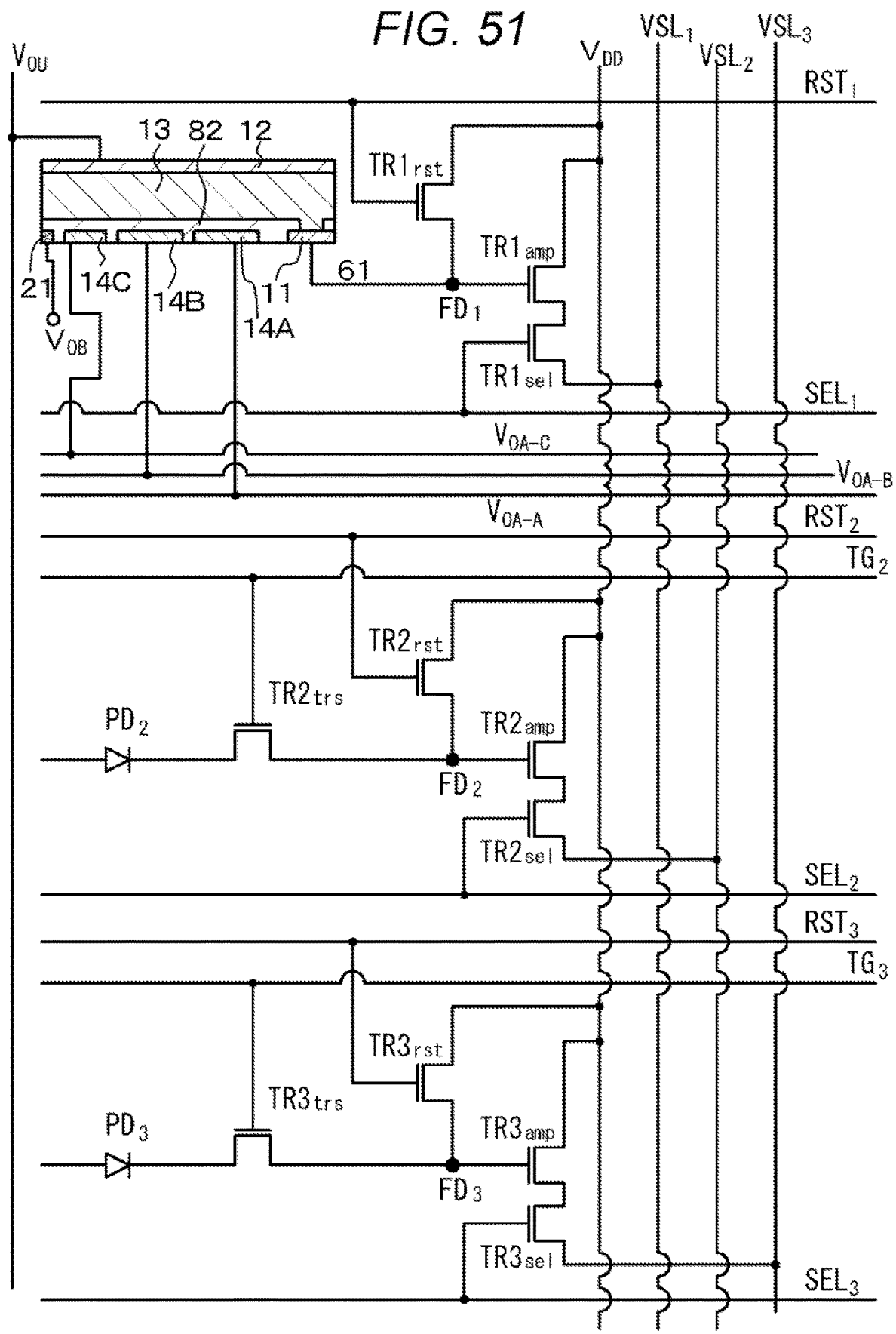
FIG. 51 is an equivalent circuit diagram of an imaging device and a stacked imaging device of Example 11.
Figure 52:
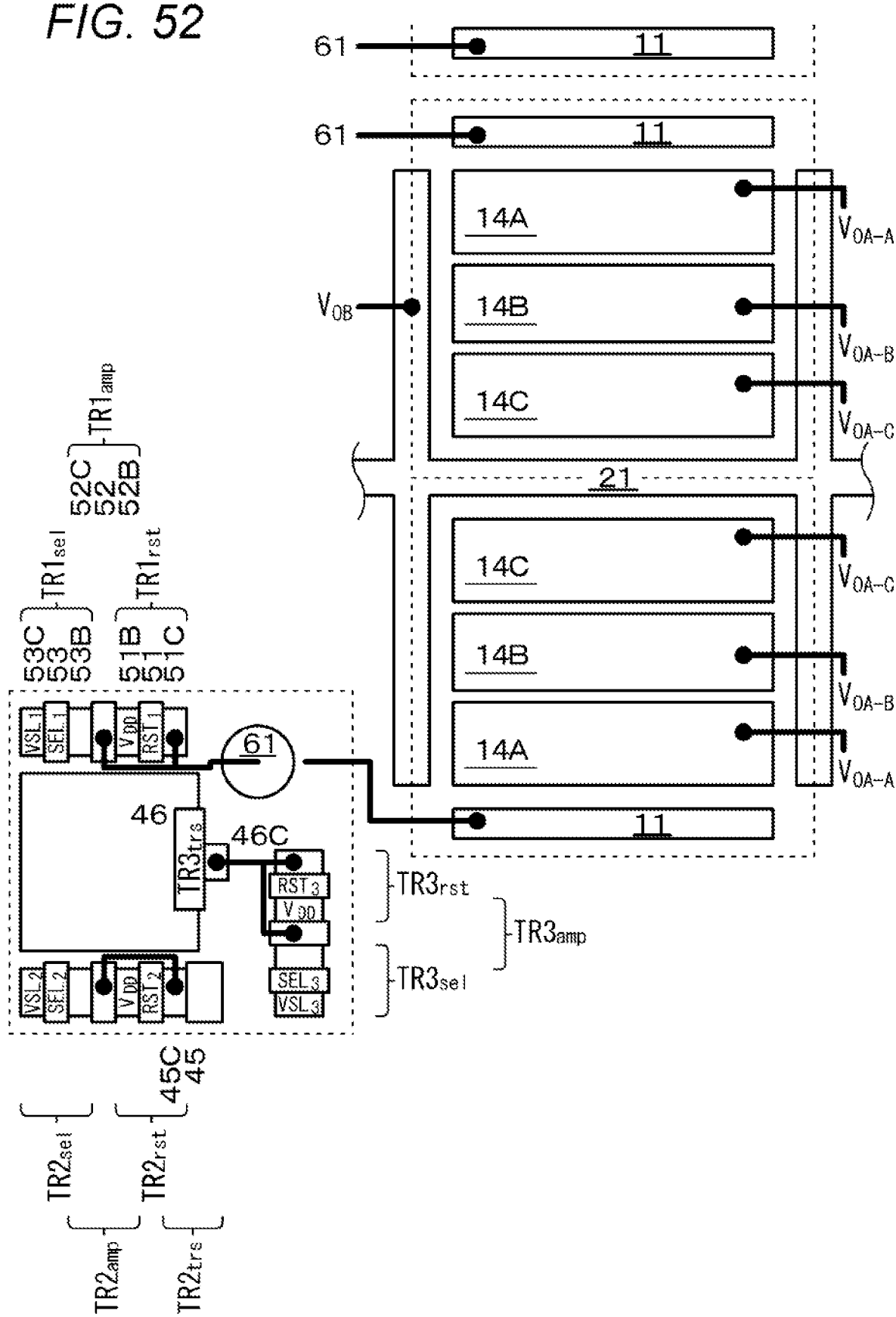
FIG. 52 is a schematic layout diagram of a first electrode, a charge storage electrode, and the transistors constituting a control unit of an imaging device of Example 11.

FIG. 49 shows a schematic partial cross-sectional view of part of an imaging device of Example 11. FIGS. 50 and 51 show equivalent circuit diagrams of an imaging device and a stacked imaging device of Example 11. FIG. 52 shows a schematic layout diagram of first electrodes and charge storage electrodes that constitute imaging devices of Example 11, and the transistors that constitute a control unit. FIGS. 53 and 54 schematically show the states of the potentials at respective portions during an operation of an imaging device of Example 11. Further, FIG. 19C shows an equivalent circuit diagram of an imaging device and a stacked imaging device of Example 11 for explaining the respective portions shown in FIG. 53.

In Example 11, the charge storage electrode 14 is formed with a plurality of charge storage electrode segments 14A, 14B, and 14C. The number of charge storage electrode segments is two or larger, and is "3" in Example 11. Further, in an imaging device and a stacked imaging device of Example 11, a different potential is applied to each of N charge storage electrode segments. The potential of the first electrode 11 is higher than the potential of the second electrode 12, or a positive potential is applied to the first electrode 11 while a negative potential is applied to the second electrode 12, for example. Therefore, in a charge transfer period, the potential to be applied to the charge storage electrode segment (the first photoelectric conversion unit segment) 14A located closest to the first electrode 11 is higher than the potential to be applied to the charge storage electrode segment (the Nth photoelectric conversion unit segment) 14C located farthest from the first electrode 11. As such a potential gradient is formed in the charge storage electrode 14, electrons remaining in the region of the photoelectric conversion layer 13 facing the charge storage electrode 14 are read into the first electrode 11 and further into the first floating diffusion layer $FD_1$ with higher reliability. In other words, the electric charges accumulated in the photoelectric conversion layer 13 are read into the control unit.

Figure 53:
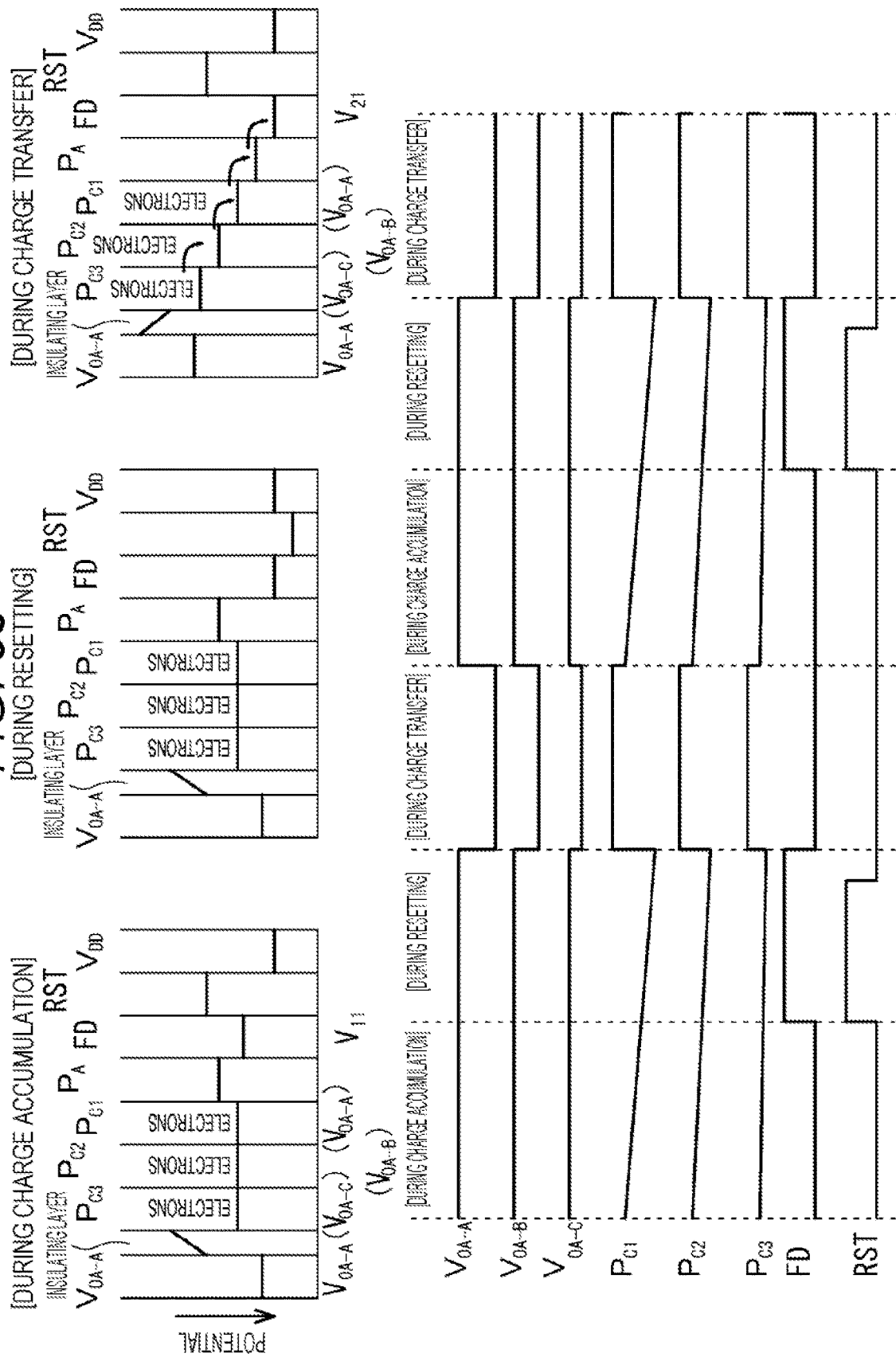
FIG. 53 is a diagram schematically showing the states of the potentials at respective portions during an operation of an imaging device of Example 11.
Figure 54:
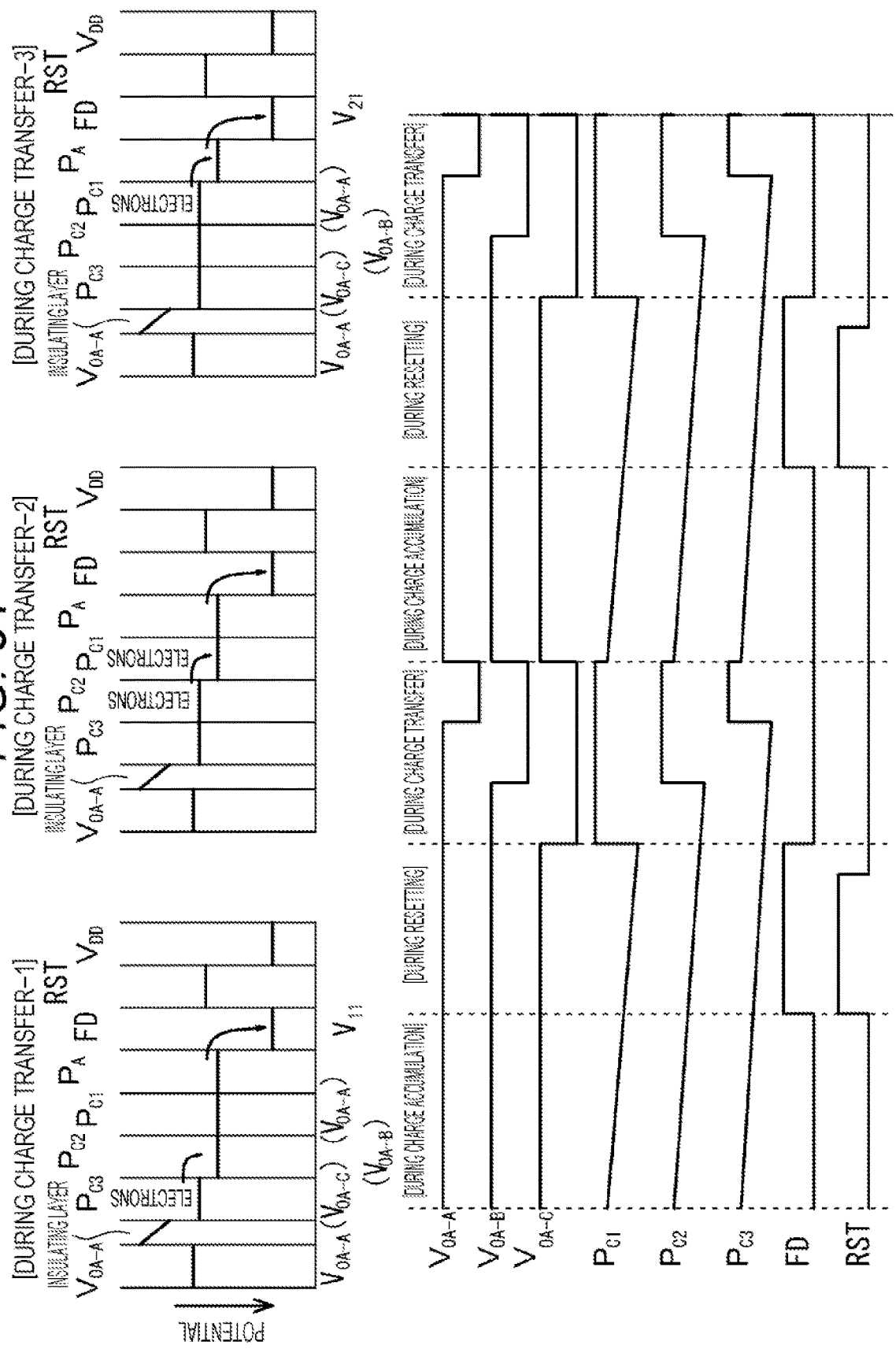
FIG. 54 is a diagram schematically showing the states of the potentials at respective portions during another operation (during charge transfer) of an imaging device of Example 11.

In an example shown in FIG. 53, in a charge transfer period, the potential of the charge storage electrode segment 14C < the potential of the charge storage electrode segment 14B < the potential of the charge storage electrode segment 14A. With this arrangement, the electrons remaining in the region of the photoelectric conversion layer 13 are simultaneously read into the first floating diffusion layer $FD_1$. In an example shown in FIG. 54, on the other hand, in a charge transfer period, the potential of the charge storage electrode segment 14C, the potential of the charge storage electrode segment 14B, and the potential of the charge storage electrode segment 14A are gradually varied (in other words, varied in a stepwise or slope-like manner). With this arrangement, the electrons remaining in the region of the photoelectric conversion layer 13 facing the charge storage electrode segment 14C are moved to the region of the photoelectric conversion layer 13 facing the charge storage electrode segment 14B, the electrons remaining in the region of the photoelectric conversion layer 13 facing the charge storage electrode segment 14B are then moved to the region of the photoelectric conversion layer 13 facing the charge storage electrode segment 14A, and the electrons remaining in the region of the photoelectric conversion layer 13 facing the charge storage electrode segment 14A are then read into the first floating diffusion layer $FD_1$ without fail.

Figure 55:
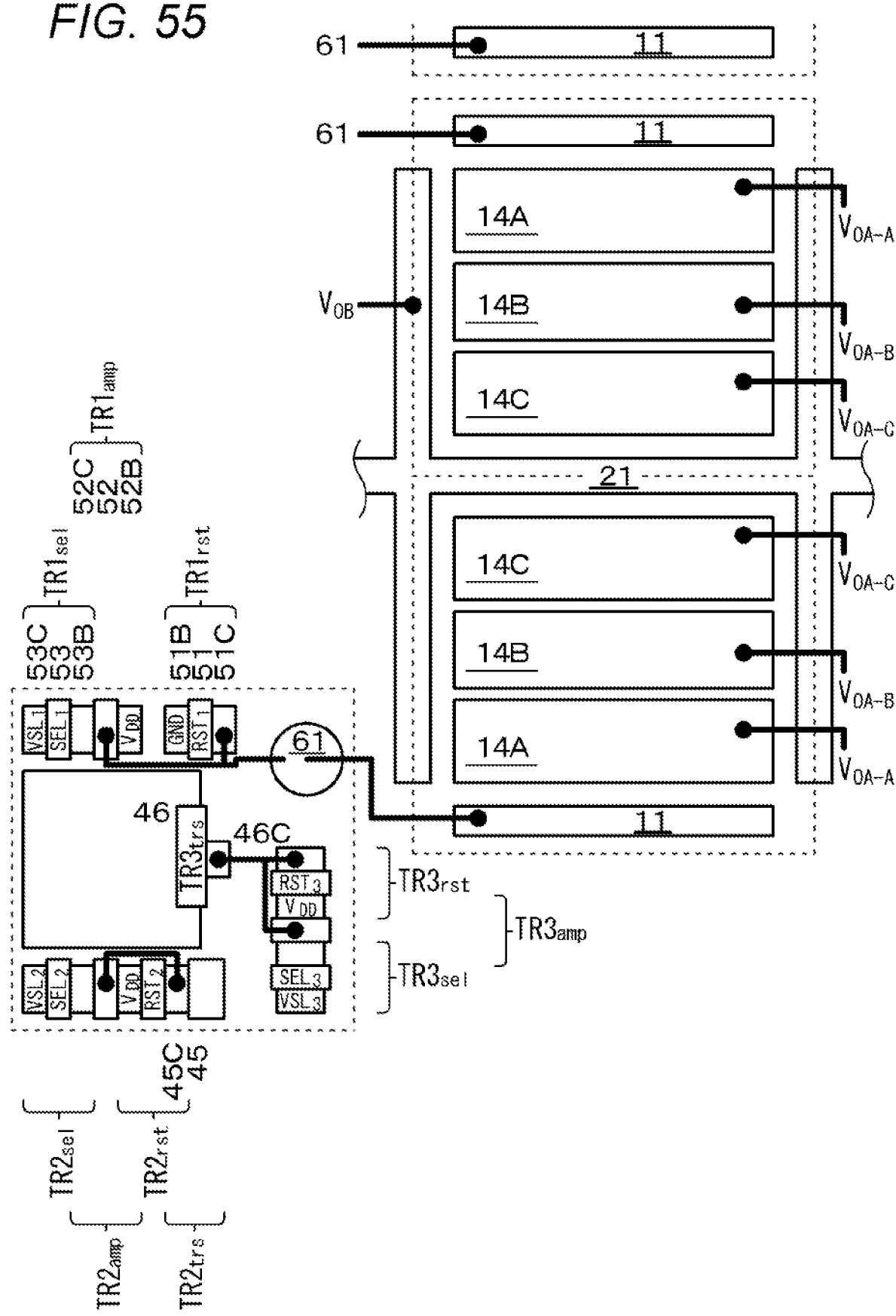
FIG. 55 is a schematic layout diagram of a first electrode and a charge storage electrode that constitute a modification of an imaging device of Example 11.

FIG. 55 shows a schematic layout diagram of first electrodes, charge storage electrodes, and the transistors constituting the control unit of a modification of an imaging device of Example 11. As shown in FIG. 55, the other source/drain region 51B of the reset transistor $TR1_{rst}$ may be grounded, instead of being connected to the power supply $V_{DD}$.

Example 12

Example 12 is modifications of Examples 6 to 11, and relates to imaging devices of the first configuration and the sixth configuration.

Figure 56:
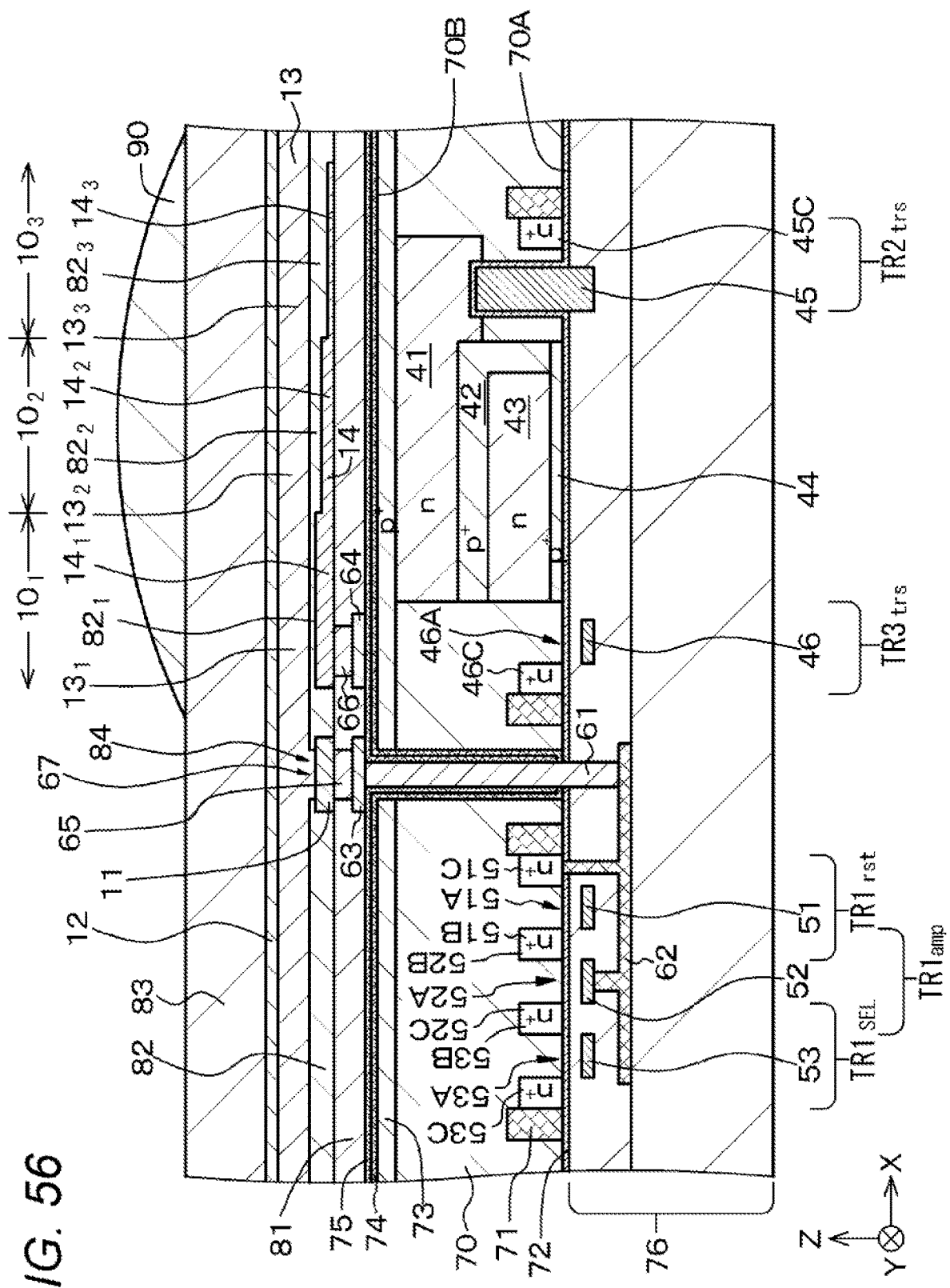
FIG. 56 is a schematic partial cross-sectional view of an imaging device and a stacked imaging device of Example 12.
Figure 57:
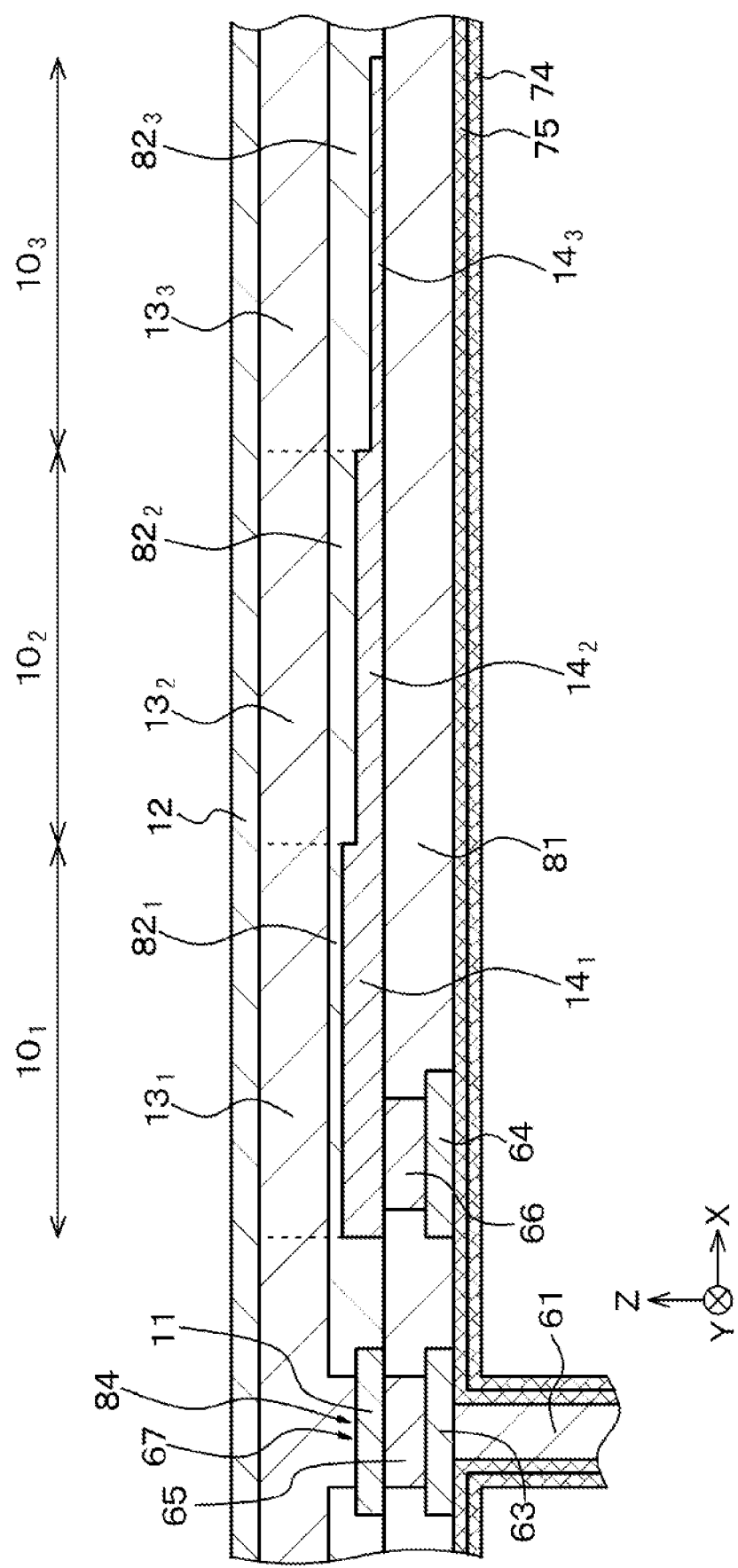
FIG. 57 is a schematic partial cross-sectional view showing an enlarged view of the portion in which a charge storage electrode, a photoelectric conversion layer, and a second electrode are stacked in an imaging device of Example 12.

FIG. 56 shows a schematic partial cross-sectional view of an imaging device and a stacked imaging device of Example 12. FIG. 57 shows a schematic partial cross-sectional view with an enlarged view of a portion in which a charge storage electrode, a photoelectric conversion layer, and a second electrode are stacked. An equivalent circuit diagram of an imaging device and a stacked imaging device of Example 12 are similar to the equivalent circuit diagrams of an imaging device of Example 6 described with reference to FIGS. 13 and 14. A schematic layout diagram of first electrodes and charge storage electrodes constituting an imaging device of Example 12, and the transistors constituting a control unit is similar to that of an imaging device of Example 6 described with reference to FIG. 15. Further, operation of an imaging device (a first imaging device) of Example 12 is substantially similar to operation of an imaging device of Example 6.

Here, in an imaging device of Example 12 or in an imaging device of any of Examples 13 to 17 described later, photoelectric conversion unit is formed with N (N≥2) photoelectric conversion unit segments (specifically, three photoelectric conversion unit segments $10_1$, $10_2$, and $10_3$), the photoelectric conversion layer 13 is formed with N photoelectric conversion layer segments (specifically, three photoelectric conversion layer segments $13_1$, $13_2$, and $13_3$), and the insulating layer 82 is formed with N insulating layer segments (specifically, three insulating layer segments $82_1$, $82_2$, and $82_3$).

In Examples 12 to 14, the charge storage electrode 14 is formed with N charge storage electrode segments (specifically, three charge storage electrode segments $14_1$, $14_2$, and $14_3$ in each of these Example).

In Examples 15 and 16, and in Example 14 in some cases, the charge storage electrode 14 is formed with N charge storage electrode segments (specifically, three charge storage electrode segments $14_1$, $14_2$, and $14_3$) that are disposed at a distance from one another, the nth (n=1, 2, 3, . . . N) photoelectric conversion unit segment $10_n$ is formed with the nth charge storage electrode segment $14_n$, the nth insulating layer segment $82_n$, and the nth photoelectric conversion layer segment $13_n$, and a photoelectric conversion unit segment having a greater value for n is located farther away from the first electrode 11.

Alternatively, an imaging device of Example 12, or an imaging device of Example 13 or 16 described later further includes a photoelectric conversion unit in which the first electrode 11, the photoelectric conversion layer 13, and the second electrode 12 are stacked.

the photoelectric conversion unit further includes the charge storage electrode 14 that is disposed at a distance from the first electrode 11, and is positioned to face the photoelectric conversion layer 13 via the insulating layer 82.

Where the stacking direction of the charge storage electrode 14, the insulating layer 82, and the photoelectric conversion layer 13 is the Z direction, and the direction away from the first electrode 11 is the X direction, cross-sectional areas of the stacked portions of the charge storage electrode 14, the insulating layer 82, and the photoelectric conversion layer 13 taken along a Y-Z virtual plane vary depending on the distance from the first electrode.

Further, in an imaging device of Example 12, the thicknesses of the insulating layer segments gradually vary from the first photoelectric conversion unit segment $10_1$ to the Nth photoelectric conversion unit segment $10_N$. Specifically, the thicknesses of the insulating layer segments are made gradually greater. Alternatively, in an imaging device of Example 12, the widths of cross-sections of the stacked portions are constant, and the thickness of a cross-section of a stacked portion, or specifically, the thickness of an insulating layer segment gradually increases depending on the distance from the first electrode 11. Note that the thicknesses of the insulating layer segments are increased stepwise. The thickness of the insulating layer segment $82_n$ in the nth photoelectric conversion unit segment $10_n$ is constant. Where the thickness of the insulating layer segment $82_n$ in the nth photoelectric conversion unit segment $10_n$ is "1", the thickness of the insulating layer segment $82_{(n+1)}$ in the (n+1)th photoelectric conversion unit segment $10_{(n+1)}$ may be 2 to 10, for example, but is not limited to such values. In Example 12, the thicknesses of the charge storage electrode segments $14_1$, $14_2$, and $14_3$ are made to become gradually smaller, so that the thicknesses of the insulating layer segments $82_1$, $82_2$, and $82_3$ become gradually greater. The thicknesses of the photoelectric conversion layer segments $13_1$, $13_2$, and $13_3$ are uniform.

In the description below, operation of an imaging device of Example 12 is described.

In a charge accumulation period, the drive circuit applies a potential $V_{11}$ to the first electrode 11, and a potential $V_{12}$ to the charge storage electrode 14. Light that has entered the photoelectric conversion layer 13 causes photoelectric conversion in the photoelectric conversion layer 13. Holes generated by the photoelectric conversion are sent from the second electrode 12 to the drive circuit via a wiring line $V_{OU}$. Meanwhile, since the potential of the first electrode 11 is higher than the potential of the second electrode 12, or a positive potential is applied to the first electrode 11 while a negative potential is applied to the second electrode 12, for example, $V_{22} \geq V_{11}$, or preferably, $V_{12} > V_{11}$. As a result, electrons generated by the photoelectric conversion are attracted to the charge storage electrode 14, and stay in the region of the photoelectric conversion layer 13 facing the charge storage electrode 14. In other words, electric charges are accumulated in the photoelectric conversion layer 13. Since $V_2 > V_{11}$, electrons generated in the photoelectric conversion layer 13 will not move toward the first electrode 11. With the passage of time for photoelectric conversion, the potential in the region of the photoelectric conversion layer 13 facing the charge storage electrode 14 becomes a more negative value.

An imaging device of Example 12 has a configuration in which the thicknesses of the insulating layer segments gradually increase. Accordingly, in a charge accumulation period, when $V_{12} \geq V_{11}$, the nth photoelectric conversion unit segment $10n$ can store more electric charges than the (n+1)th photoelectric conversion unit segment $10_{(n+1)}$, and a strong electric field is applied so that electric charges can be reliably prevented from flowing from the first photoelectric conversion unit segment $10_1$ toward the first electrode 11.

A reset operation is performed in the latter period in the charge accumulation period. As a result, the potential of the first floating diffusion layer $FD_1$ is reset, and the potential of the first floating diffusion layer $FD_1$ becomes equal to the potential $V_{DD}$ of the power supply.

After completion of the reset operation, the electric charges are read out. In other words, in a charge transfer period, the drive circuit applies a potential $V_{21}$ to the first electrode 11, and a potential $V_{22}$ to the charge storage electrode 14. Here, $V_{21} > V_{22}$. As a result, the electrons remaining in the region of the photoelectric conversion layer 13 facing the charge storage electrode 14 are read into the first electrode 11 and further into the first floating diffusion layer $FD_1$. In other words, the electric charges accumulated in the photoelectric conversion layer 13 are read into the control unit.

More specifically, when $V_{21} > V_{22}$ in a charge transfer period, it is possible to reliably secure the flow of electric charges from the first photoelectric conversion unit segment $10_1$ toward the first electrode 11, and the flow of electric charges from the (n+1)th photoelectric conversion unit segment $10_{(n+1)}$ toward the nth photoelectric conversion unit segment $10_n$.

In the above manner, a series of operations including charge accumulation, reset operation, and charge transfer is completed.

In an imaging device of Example 12, a kind of charge transfer gradient is formed, and the electric charges generated through photoelectric conversion can be transferred more easily and reliably, because the thicknesses of the insulating layer segments gradually vary from the first photoelectric conversion unit segment to the Nth photoelectric conversion unit segment, or because cross-sectional areas of the stacked portions of the charge storage electrode, the insulating layer, and the photoelectric conversion layer taken along a Y-Z virtual plane vary depending on the distance from the first electrode.

An imaging device and a stacked imaging device of Example 12 can be manufactured by a method substantially similar to the method for manufacturing an imaging device of Example 6, and therefore, detailed explanation thereof is not made herein.

Note that, in an imaging device of Example 12, to form the first electrode 11, the charge storage electrode 14, and the insulating layer 82, a conductive material layer for forming the charge storage electrode 143 is first formed on the interlayer insulating layer 81, and patterning is performed on the conductive material layer, to leave the conductive material layer in the regions in which the photoelectric conversion unit segments $10_1$, $10_2$, and $10_3$ and the first electrode 11 are to be formed. In this manner, part of the first electrode 11 and the charge storage electrode $14_3$ can be obtained. An insulating layer for forming the insulating layer segment $82_3$ is then formed on the entire surface, patterning is performed on the insulating layer, and a planarization process is performed, to obtain the insulating layer segment $82_3$. A conductive material layer for forming the charge storage electrode $14_2$ is then formed on the entire surface, and patterning is performed on the conductive material layer, to leave the conductive material layer in the regions in which the photoelectric conversion unit segments $10_1$ and $10_2$ and the first electrode 11 are to be formed. In this manner, part of the first electrode 11 and the charge storage electrode $14_2$ can be obtained. An insulating layer for forming the insulating layer segment $82_2$ is then formed on the entire surface, patterning is performed on the insulating layer, and a planarization process is performed, to obtain the insulating layer segment $82_2$. A conductive material layer for forming the charge storage electrode $14_1$ is then formed on the entire surface, and patterning is performed on the conductive material layer, to leave the conductive material layer in the regions in which the photoelectric conversion unit segment $10_1$ and the first electrode 11 are to be formed. In this manner, part of the first electrode 11 and the charge storage electrode $14_1$ can be obtained. An insulating layer is then formed on the entire surface, and a planarization process is performed, to obtain the insulating layer segment $82_1$ (the insulating layer 82). The photoelectric conversion layer 13 is then formed on the insulating layer 82. Thus, the photoelectric conversion unit segments $10_1$, $10_2$, and $10_3$ can be obtained.

Figure 58:
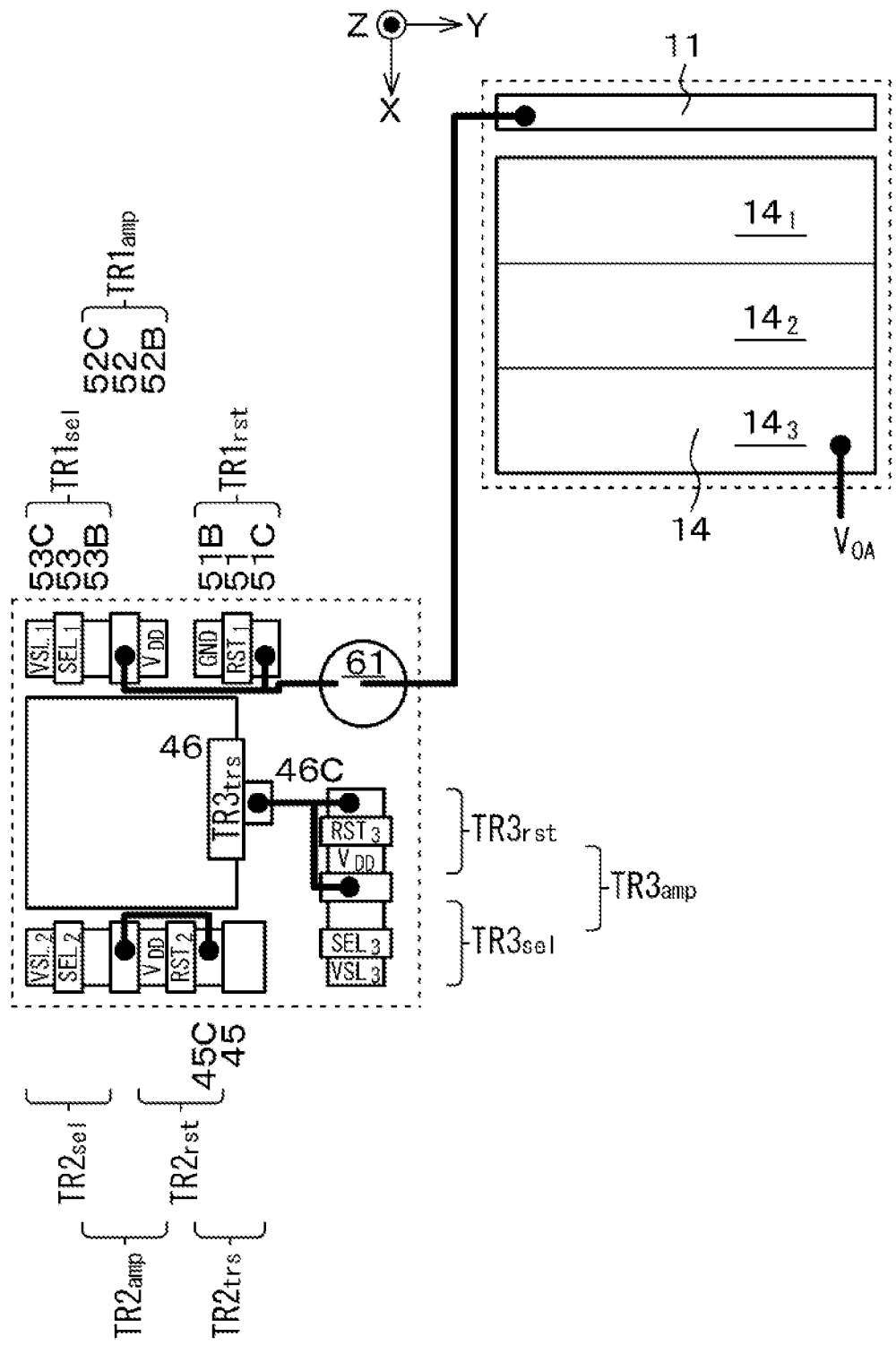
FIG. 58 is a schematic layout diagram of a first electrode, a charge storage electrode, and the transistors constituting a control unit of a modification of an imaging device of Example 12.

FIG. 58 shows a schematic layout diagram of the first electrode, the charge storage electrode, and the transistors constituting the control unit of a modification of an imaging device of Example 12. As shown in FIG. 58, the other source/drain region 51B of the reset transistor $TR1_{rst}$ may be grounded, instead of being connected to the power supply $V_{DD}$.

Example 13

Figure 59:
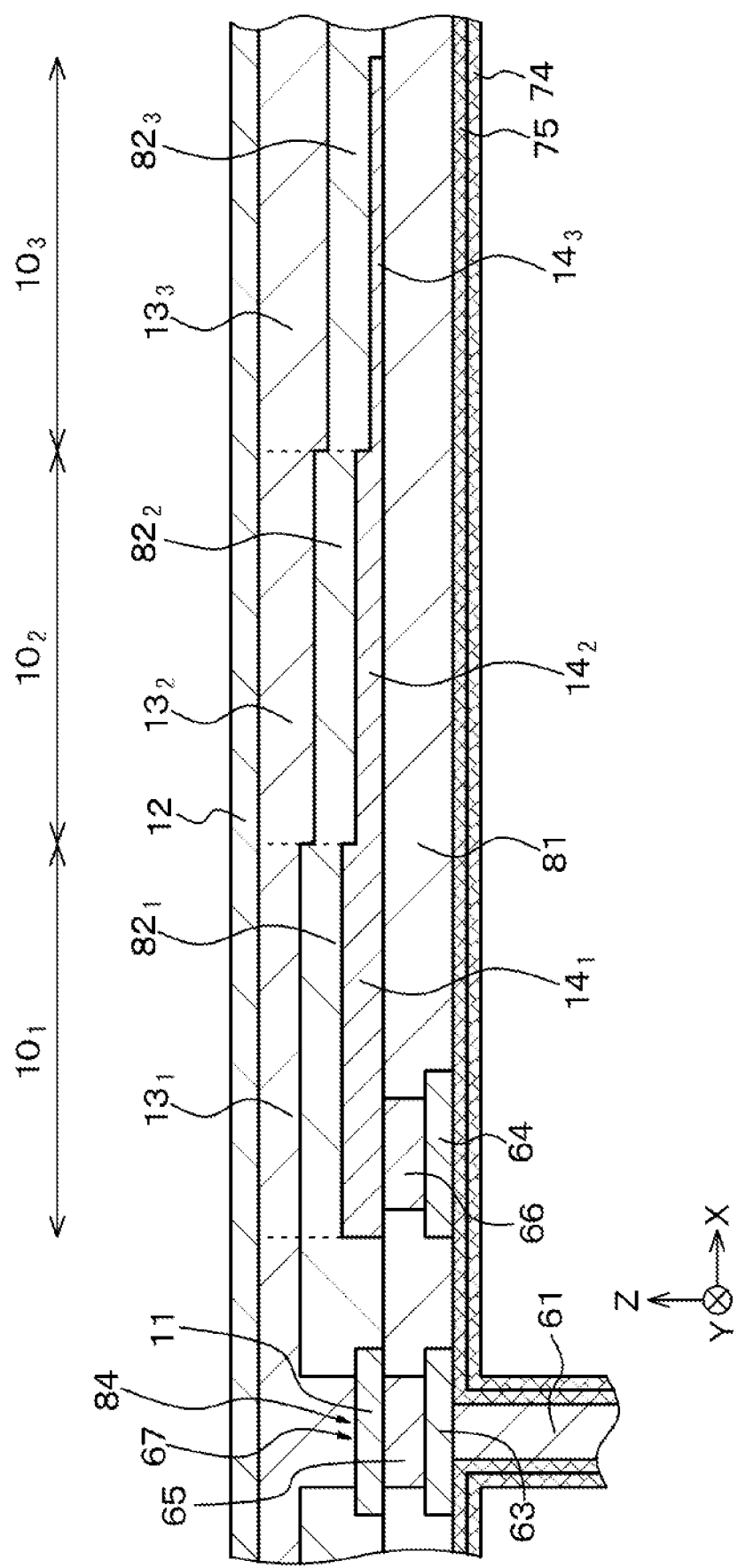
FIG. 59 is a schematic partial cross-sectional view showing an enlarged view of the portion in which a charge storage electrode, a photoelectric conversion layer, and a second electrode are stacked in an imaging device of Example 13.

Imaging devices of Example 13 relate to imaging devices of the second configuration and the sixth configuration of the present disclosure. FIG. 59 is a schematic partial cross-sectional view with an enlarged view of the portion in which the charge storage electrode, the photoelectric conversion layer, and the second electrode are stacked. As shown in FIG. 59, in an imaging device of Example 13, the thicknesses of the photoelectric conversion layer segments gradually vary from the first photoelectric conversion unit segment $10_1$ to the Nth photoelectric conversion unit segment $10_N$. Alternatively, in an imaging device of Example 13, the widths of cross-sections of the stacked portions are constant, and the thickness of a cross-section of a stacked portion, or specifically, the thickness of a photoelectric conversion layer segment, gradually increases depending on the distance from the first electrode 11. More specifically, the thicknesses of the photoelectric conversion layer segments are gradually increased. Note that the thicknesses of the photoelectric conversion layer segments are increased stepwise. The thickness of the photoelectric conversion layer segment $13_n$ in the nth photoelectric conversion unit segment $10_n$ is constant. Where the thickness of the photoelectric conversion layer segment $13_n$ in the nth photoelectric conversion unit segment $10_n$ is "1", the thickness of the photoelectric conversion layer segment $13_{(n+1)}$ in the (n+1)th photoelectric conversion unit segment $10_{(n+1)}$ may be 2 to 10, for example, but is not limited to such values. In Example 13, the thicknesses of the charge storage electrode segments $14_1$, $14_2$, and $14_3$ are made to become gradually smaller, so that the thicknesses of the photoelectric conversion layer segments $13_1$, $13_2$, and $13_3$ become gradually greater. The thicknesses of the insulating layer segments $82_1$, $82_2$, and $82_3$ are uniform.

In an imaging device of Example 13, the thicknesses of the photoelectric conversion layer segments gradually increase. Accordingly, in a charge accumulation period, when $V_{12} \geq V_{11}$, a stronger electric field is applied to the nth photoelectric conversion unit segment $10_n$ than to the (n+1) th photoelectric conversion unit segment $10_{(n+1)}$, and electric charges can be reliably prevented from flowing from the first photoelectric conversion unit segment $10_1$ toward the first electrode 11. Further, when $V_{22} < V_{21}$ in a charge transfer period, it is possible to reliably secure the flow of electric charges from the first photoelectric conversion unit segment $10_1$ toward the first electrode 11, and the flow of electric charges from the (n+1)th photoelectric conversion unit segment $10_{(n+1)}$, toward the nth photoelectric conversion unit segment $10_n$.

As described above, in an imaging device of Example 13, a kind of charge transfer gradient is formed, and the electric charges generated through photoelectric conversion can be transferred more easily and reliably, because the thicknesses of the photoelectric conversion layer segments gradually vary from the first photoelectric conversion unit segment to the Nth photoelectric conversion unit segment, or because cross-sectional areas of the stacked portions of the charge storage electrode, the insulating layer, and the photoelectric conversion layer taken along a Y-Z virtual plane vary depending on the distance from the first electrode.

Note that, in an imaging device of Example 13, to form the first electrode 11, the charge storage electrode 14, the insulating layer 82, and the photoelectric conversion layer 13, a conductive material layer for forming the charge storage electrode $14_3$ is first formed on the interlayer insulating layer 81, and patterning is performed on the conductive material layer, to leave the conductive material layer in the regions in which the photoelectric conversion unit segments $10_1$, $10_2$, and $10_3$ and the first electrode 11 are to be formed. In this manner, part of the first electrode 11 and the charge storage electrode $14_3$ can be obtained. A conductive material layer for forming the charge storage electrode $14_2$ is then formed on the entire surface, and patterning is performed on the conductive material layer, to leave the conductive material layer in the regions in which the photoelectric conversion unit segments $10_1$ and $10_2$ and the first electrode 11 are to be formed. In this manner, part of the first electrode 11 and the charge storage electrode $14_2$ can be obtained. A conductive material layer for forming the charge storage electrode $14_1$ is then formed on the entire surface, and patterning is performed on the conductive material layer, to leave the conductive material layer in the regions in which the photoelectric conversion unit segment $10_1$ and the first electrode 11 are to be formed. In this manner, part of the first electrode 11 and the charge storage electrode $14_1$ can be obtained. The insulating layer 82 is then formed conformally on the entire surface. The photoelectric conversion layer 13 is then formed on the insulating layer 82, and a planarization process is performed on the photoelectric conversion layer 13. Thus, the photoelectric conversion unit segments $10_1$, $10_2$, and $10_3$ can be obtained.

Example 14

Figure 60:
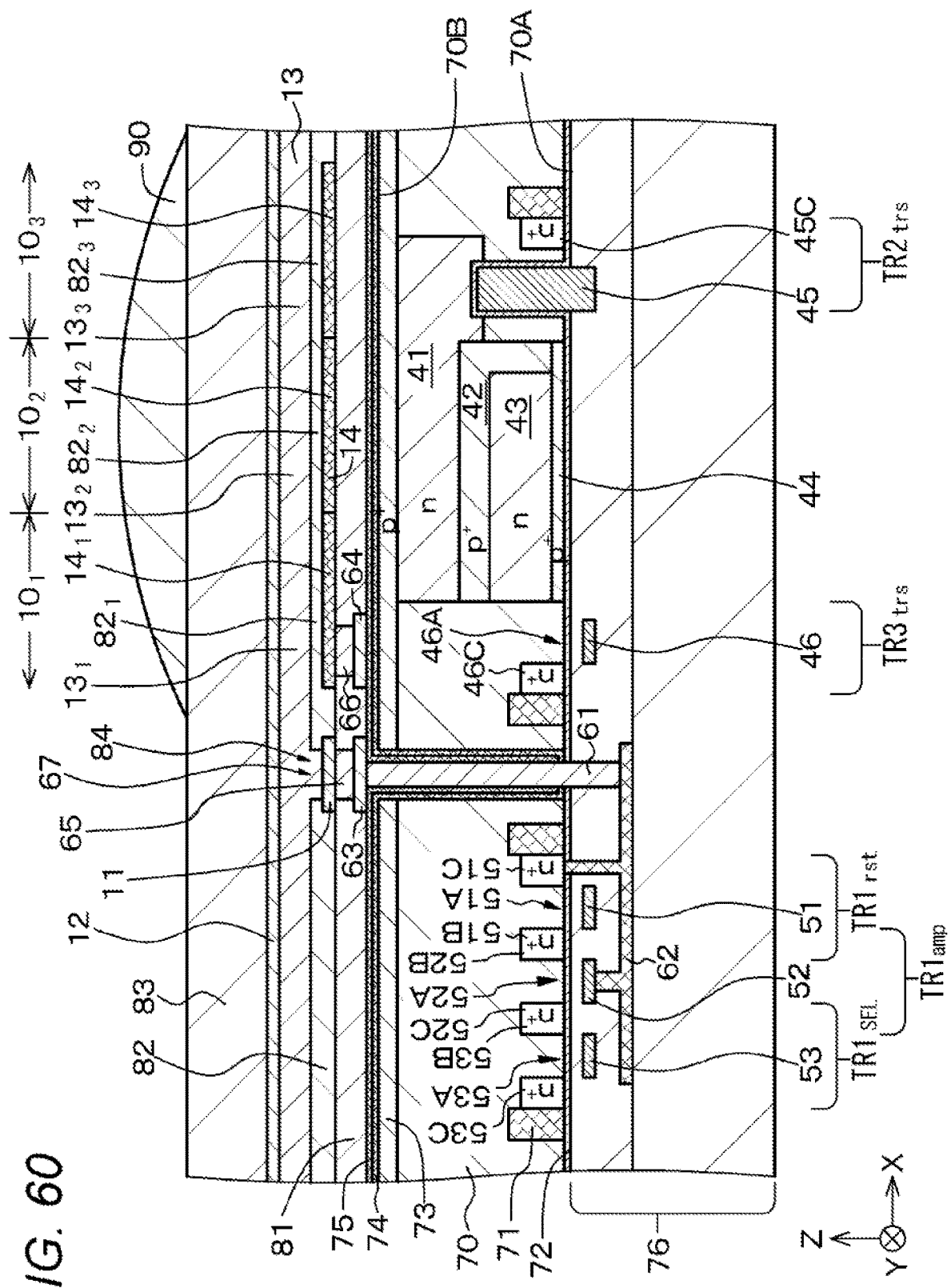
FIG. 60 is a schematic partial cross-sectional view of an imaging device and a stacked imaging device of Example 14.

Example 14 relates to an imaging device of the third configuration. FIG. 60 shows a schematic partial cross-sectional view of an imaging device and a stacked imaging device of Example 14. In an imaging device of Example 14, the material forming the insulating layer segment is different between adjacent photoelectric conversion unit segments. Here, the values of the relative dielectric constants of the materials forming the insulating layer segments are gradually reduced from the first photoelectric conversion unit segment $10_1$ to the Nth photoelectric conversion unit segment $10_N$. In an imaging device of Example 14, the same potential may be applied to all of the N charge storage electrode segments, or different potentials may be applied to the respective N charge storage electrode segments. In the latter case, the charge storage electrode segments $14_1$, $14_2$, and $14_3$ that are disposed at a distance from one another are only required to be connected to the vertical drive circuit 112 forming the drive circuit, via pad portions $64_1$, $64_2$, and $64_3$, as in a manner similar to that described later in Example 15.

As such a configuration is adopted, a kind of charge transfer gradient is then formed, and, when $V_{12} \geq V_{11}$ in a charge accumulation period, the nth photoelectric conversion unit segment can store more electric charges than the (n+1)th photoelectric conversion unit segment. Meanwhile, when $V_{22} < V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

Example 15

Figure 61:
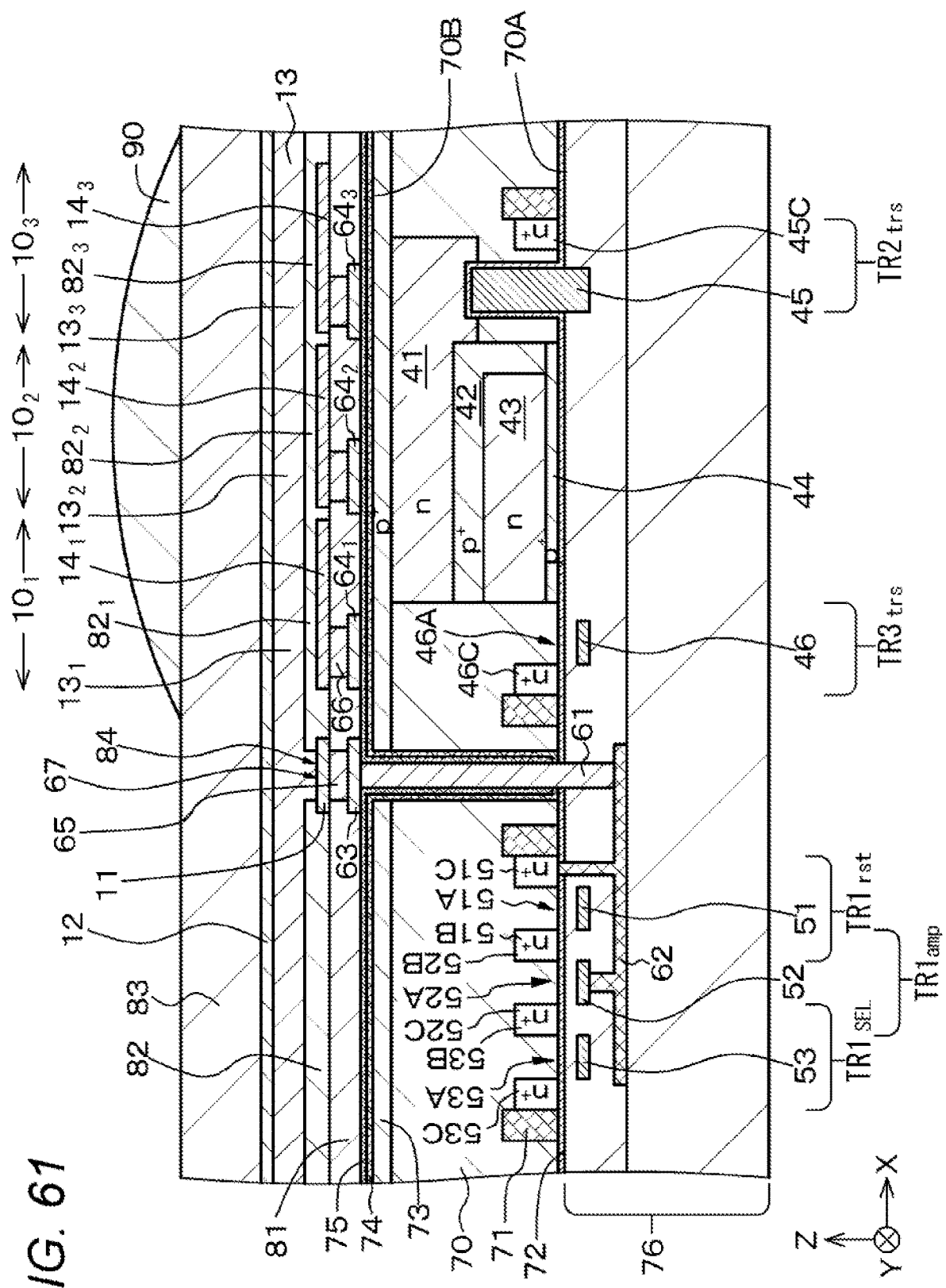
FIG. 61 is a schematic partial cross-sectional view of an imaging device and a stacked imaging device of Example 15 and Example 16.
Figure 62A:
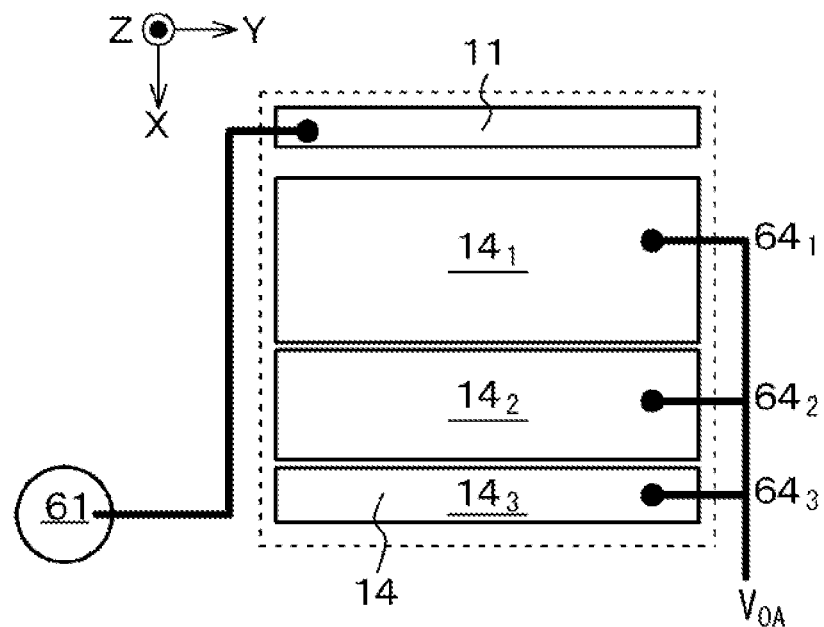
FIGS. 62A and 62B are schematic plan views of a charge storage electrode segment in Example 16.
Figure 62B:
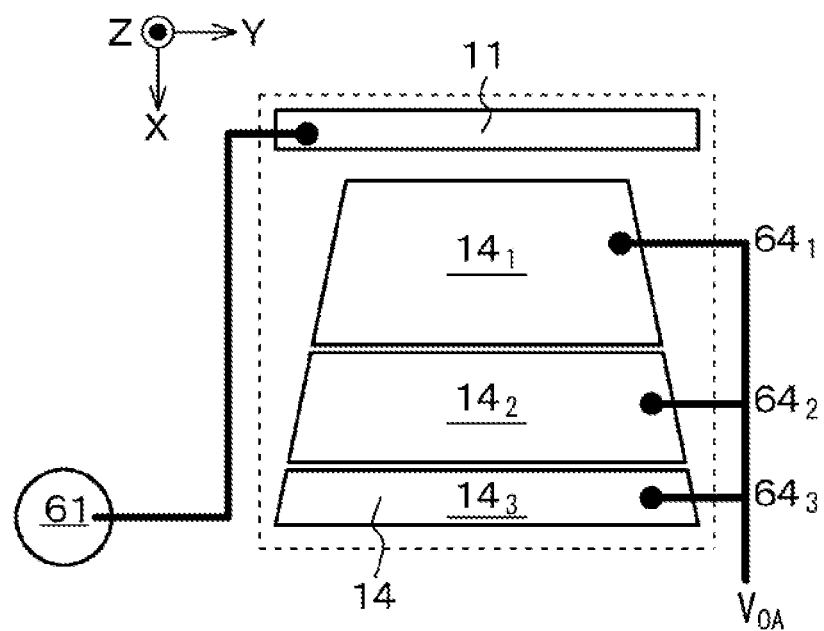
Figure 63A:
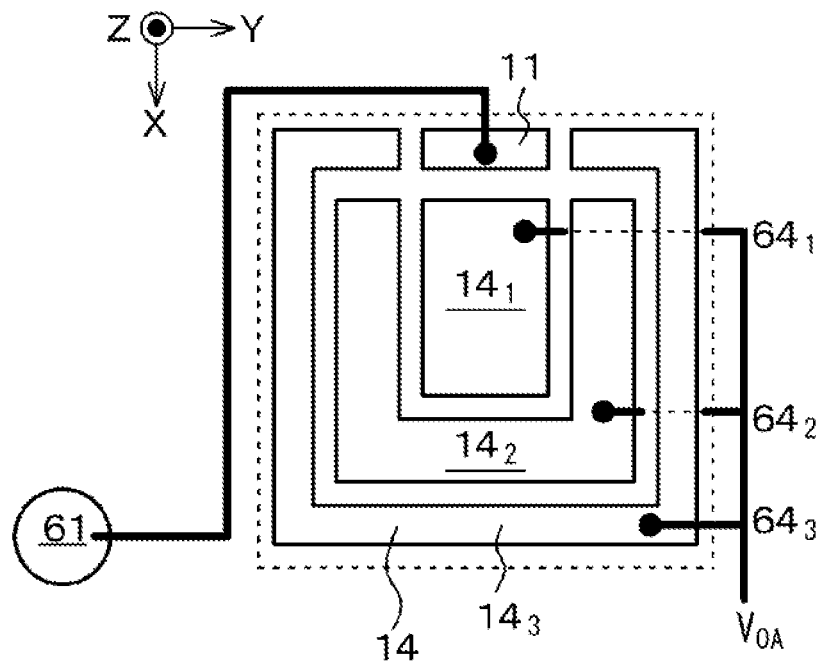
FIGS. 63A and 63B are schematic plan views of a charge storage electrode segment in Example 16.
Figure 63B:
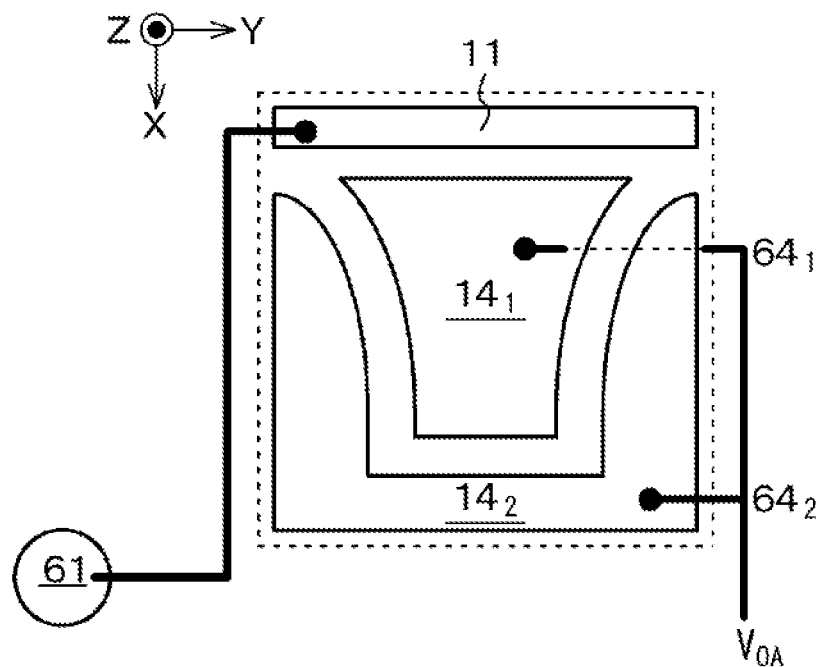

Example 15 relates to an imaging device of the fourth configuration. FIG. 61 shows a schematic partial cross-sectional view of an imaging device and a stacked imaging device of Example 15. In an imaging device of Example 15, the material forming the charge storage electrode segment is different between adjacent photoelectric conversion unit segments. Here, the values of the work functions of the materials forming the insulating layer segments are gradually increased from the first photoelectric conversion unit segment $10_1$ to the Nth photoelectric conversion unit segment $10_N$. In an imaging device of Example 15, the same potential may be applied to all of the N charge storage electrode segments, or different potentials may be applied to the respective N charge storage electrode segments. In the latter case, the charge storage electrode segments $14_1$, $14_2$, and $14_3$ are connected to the vertical drive circuit 112 forming the drive circuit, via pad portions $64_1$, $64_2$, and $64_3$.

Example 16

Figure 64:
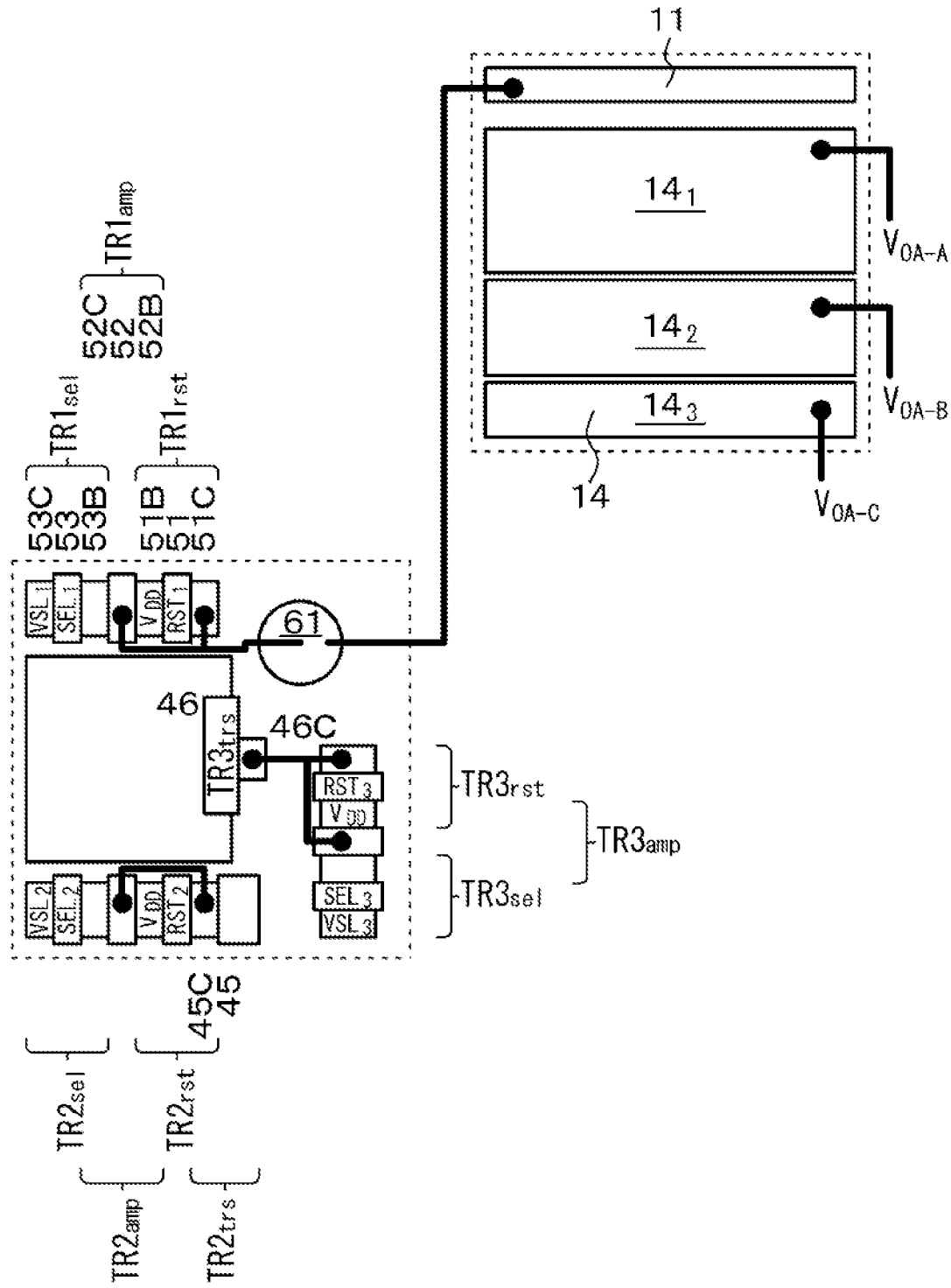
FIG. 64 is a schematic layout diagram of a first electrode, a charge storage electrode, and the transistors constituting a control unit of an imaging device of Example 16.

An imaging device of Example 16 relate to an imaging device of the fifth configuration. FIGS. 62A, 62B, 63A, and 63B show schematic plan views of charge storage electrode segments in Example 16. FIG. 64 shows a schematic layout diagram of the first electrode and the charge storage electrode that constitute an imaging device of Example 16, and the transistors that constitute a control unit. A schematic partial cross-sectional view of an imaging device and a stacked imaging device of Example 16 is similar to that shown in FIG. 61 or 66. In an imaging device of Example 16, the areas of the charge storage electrode segments are gradually reduced from the first photoelectric conversion unit segment $10_1$ to the Nth photoelectric conversion unit segment $10_N$. In an imaging device of Example 16, the same potential may be applied to all of the N charge storage electrode segments, or different potentials may be applied to the respective N charge storage electrode segments. Specifically, the charge storage electrode segments $14_1$, $14_2$, and $14_3$ that are disposed at a distance from one another are only required to be connected to the vertical drive circuit 112 forming the drive circuit, via pad portions $64_1$, $64_2$, and $64_3$, as in a manner similar to that described in Example 15.

In Example 16, the charge storage electrode 14 is formed with a plurality of charge storage electrode segments $14_1$, $14_2$, and $14_3$. The number of charge storage electrode segments is two or larger, and is "3" in Example 16. Further, in an imaging device and a stacked imaging device of Example 16, the potential of the first electrode 11 is higher than the potential of the second electrode 12, or a positive potential is applied to the first electrode 11 while a negative potential is applied to the second electrode 12, for example. Therefore, in a charge transfer period, the potential to be applied to the charge storage electrode segment $14_1$ located closest to the first electrode 11 is higher than the potential to be applied to the charge storage electrode segment $14_3$ located farthest from the first electrode 11. As such a potential gradient is formed in the charge storage electrode 14, electrons remaining in the region of the photoelectric conversion layer 13 facing the charge storage electrode 14 are read into the first electrode 11 and further into the first floating diffusion layer $FD_1$ with higher reliability. In other words, the electric charges accumulated in the photoelectric conversion layer 13 are read into the control unit.

Further, in a charge transfer period, the potential of the charge storage electrode segment $14_3$<the potential of the charge storage electrode segment $14_2$<the potential of the charge storage electrode segment $14_1$. With this arrangement, the electrons remaining in the region of the photoelectric conversion layer 13 can be simultaneously read into the first floating diffusion layer $FD_1$. Alternatively, in a charge transfer period, the potential of the charge storage electrode segment $14_3$, the potential of the charge storage electrode segment $14_2$, and the potential of the charge storage electrode segment $14_1$ are gradually varied (in other words, varied in a stepwise or slope-like manner). With this arrangement, the electrons remaining in the region of the photoelectric conversion layer 13 facing the charge storage electrode segment $14_3$ are moved to the region of the photoelectric conversion layer 13 facing the charge storage electrode segment $14_2$, the electrons remaining in the region of the photoelectric conversion layer 13 facing the charge storage electrode segment $14_2$ are then moved to the region of the photoelectric conversion layer 13 facing the charge storage electrode segment $14_1$, and the electrons remaining in the region of the photoelectric conversion layer 13 facing the charge storage electrode segment $14_1$ are then read into the first floating diffusion layer $FD_1$ without fail.

Figure 65:
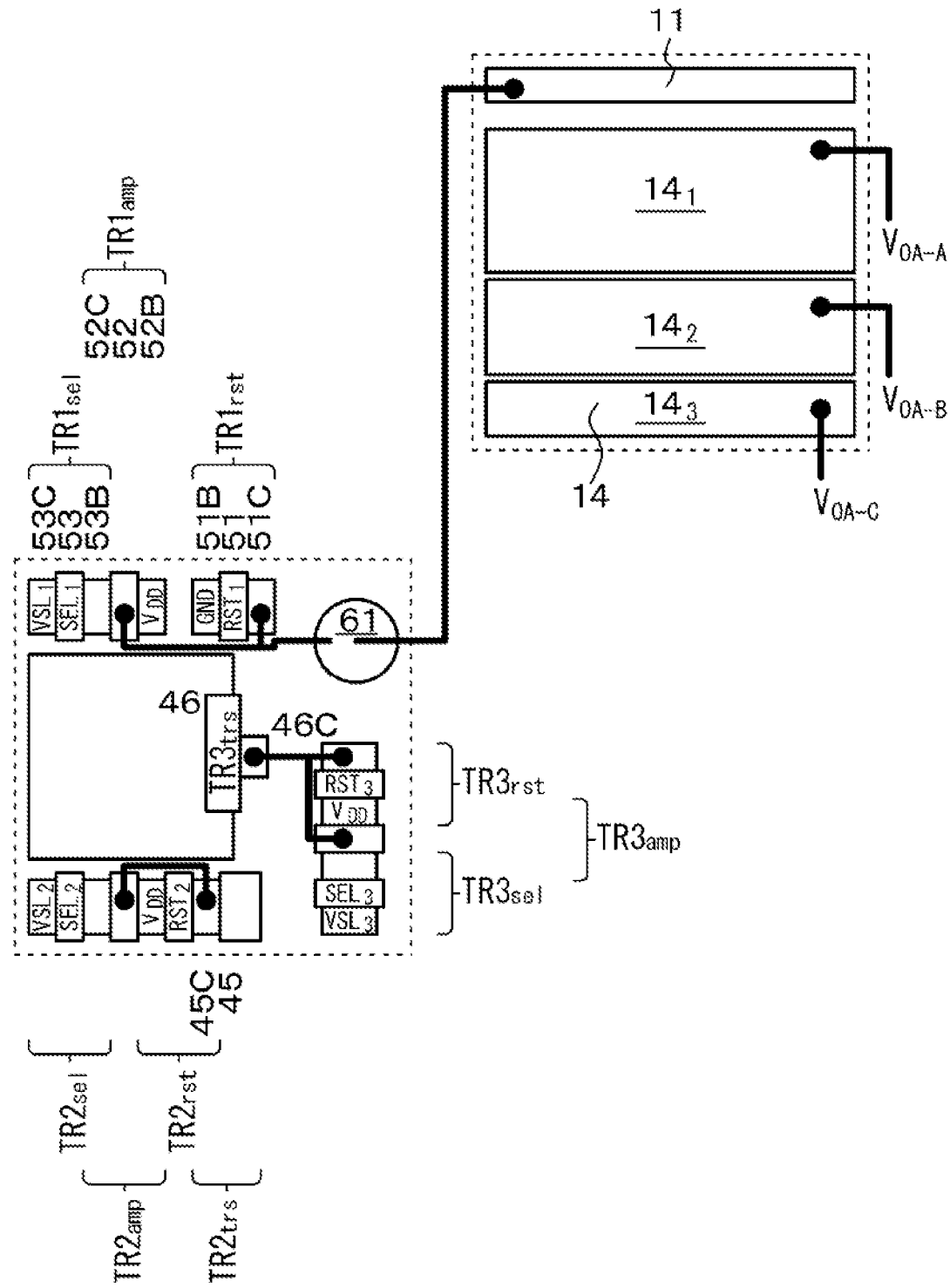
FIG. 65 is a schematic layout diagram of a first electrode and a charge storage electrode that constitute a modification of an imaging device of Example 16.

FIG. 65 shows a schematic layout diagram of the first electrode, the charge storage electrode, and the transistors constituting the control unit of a modification of an imaging device of Example 16. As shown in FIG. 65, the other source/drain region 51B of the reset transistor $TR3_{rst}$ may be grounded, instead of being connected to the power supply $V_{DD}$.

In an imaging device of Example 16, such a configuration is adopted, so that a kind of charge transfer gradient is formed. In other words, the areas of the charge storage electrode segments gradually decrease from the first photoelectric conversion unit segment $10_1$ to the Nth photoelectric conversion unit segment $10_N$. Accordingly, when $V_{12} \geq V_{11}$ in a charge accumulation period, the nth photoelectric conversion unit segment can store more electric charges than the (n+1)th photoelectric conversion unit segment. Meanwhile, when $V_{22}<V_{21}$ in a charge transfer period, it is possible to reliably secure the flow of electric charges from the first photoelectric conversion unit segment toward the first electrode, and the flow of electric charges from the (n+1)th photoelectric conversion unit segment toward the nth photoelectric conversion unit segment.

Example 17

Figure 66:
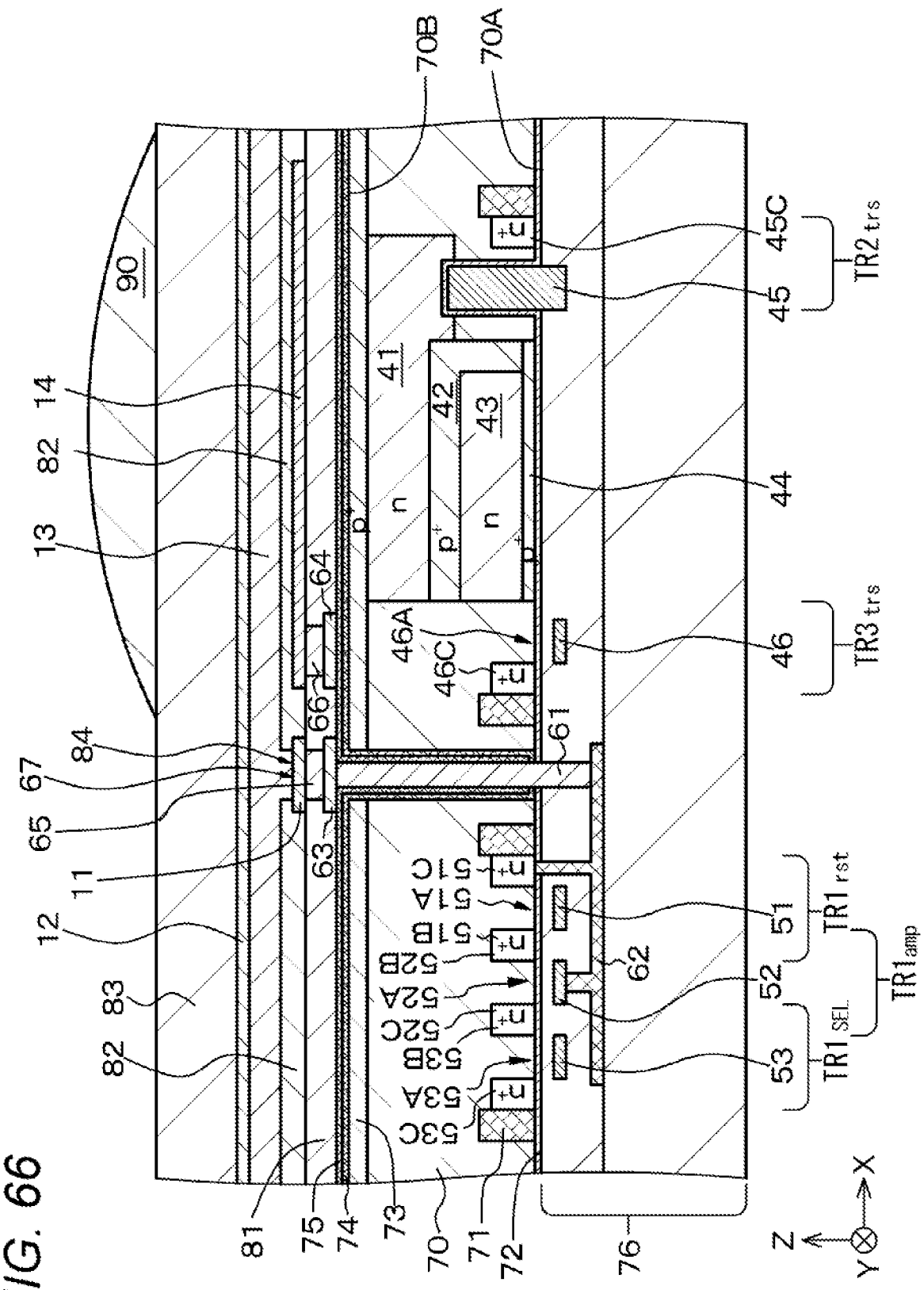
FIG. 66 is a schematic partial cross-sectional view of an imaging device and a stacked imaging device of Example 17 and Example 16.
Figure 67A:
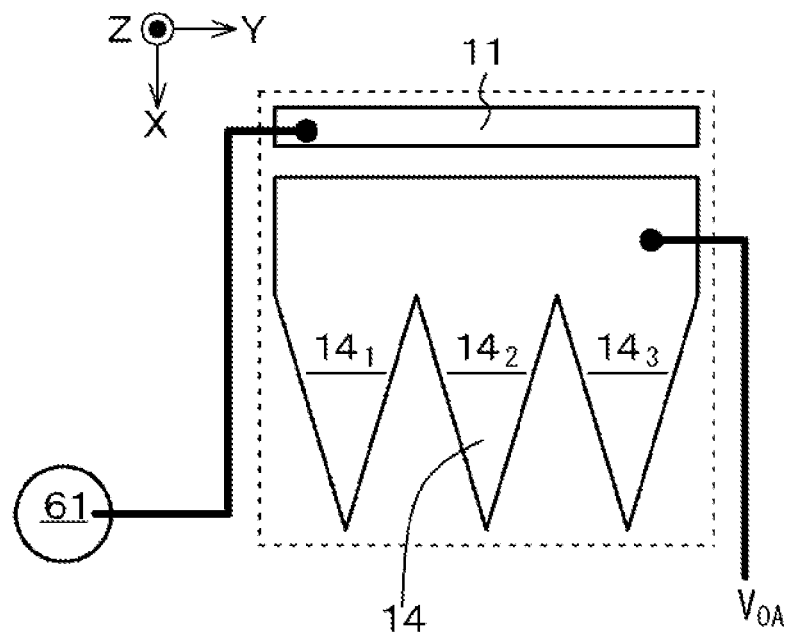
FIGS. 67A and 67B are schematic plan views of a charge storage electrode segment in Example 17.
Figure 67B:
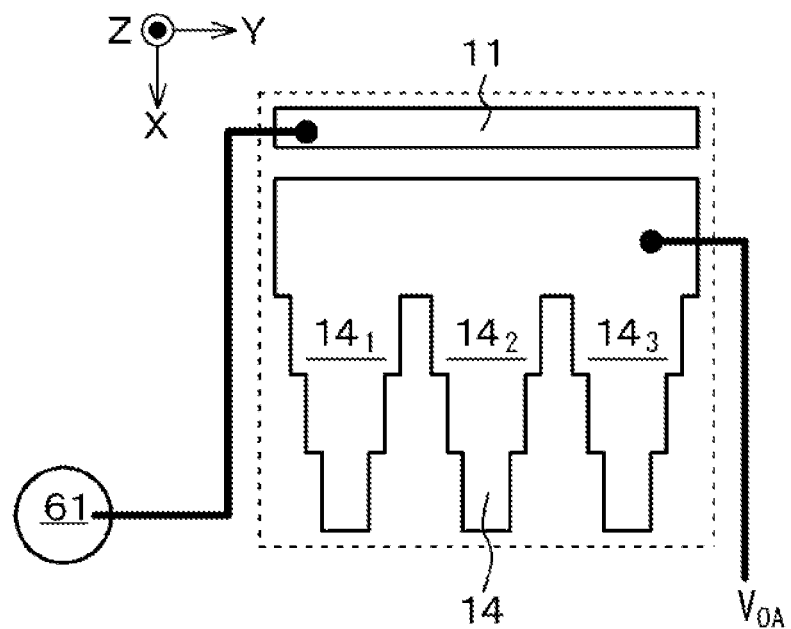

Example 17 relates to an imaging device of the sixth configuration. FIG. 66 shows a schematic partial cross-sectional view of an imaging device and a stacked imaging device of Example 17. Further, FIGS. 67A and 67B show schematic plan views of charge storage electrode segments in Example 17. An imaging device of Example 17 includes a photoelectric conversion unit formed by stacking the first electrode 11, the photoelectric conversion layer 13, and the second electrode 12, and the photoelectric conversion unit further includes the charge storage electrode 14 that is disposed at a distance from the first electrode 11 and is positioned to face the photoelectric conversion layer 13 via the insulating layer 82. Further, where the stacking direction of the charge storage electrode 14, the insulating layer 82, and the photoelectric conversion layer 13 is the Z direction, and the direction away from the first electrode 11 is the X direction, the cross-sectional area of a stacked portion of the charge storage electrodes 14, the insulating layer 82, and the photoelectric conversion layer 13 taken along a Y-Z virtual plane varies depending on the distance from the first electrode 11.

Specifically, in an imaging device of Example 17, the thicknesses of cross-sections of stacked portions are constant, and the width of a cross-section of a stacked portion is narrower at a longer distance from the first electrode 11. Note that the widths may be narrowed continuously (see FIG. 67A) or may be narrowed stepwise (see FIG. 67B).

As described above, in an imaging device of Example 16, a kind of charge transfer gradient is formed, and the electric charges generated through photoelectric conversion can be transferred more easily and reliably, because cross-sectional areas of the stacked portions of the charge storage electrode 14, the insulating layer 82, and the photoelectric conversion layer 13 taken along a Y-Z virtual plane vary depending on the distance from the first electrode.

Example 18

Example 18 relates to solid-state imaging apparatuses of the first configuration and the second configuration.

A solid-state imaging apparatus of Example 18 includes a photoelectric conversion unit in which a first electrode 11, a photoelectric conversion layer 13, and a second electrode 12 are stacked, the photoelectric conversion unit further includes a plurality of imaging devices each including a charge storage electrode 14 that is disposed at a distance from the first electrode 11 and is positioned to face the photoelectric conversion layer 13 via an insulating layer 82, an imaging device block is formed with a plurality of imaging devices, and the first electrode 11 is shared by the plurality of imaging devices that constitute the imaging device block.

Alternatively, a solid-state imaging apparatus of Example 18 includes a plurality of imaging devices described in any of Examples 6 to 17.

In Example 18, one floating diffusion layer is provided for a plurality of imaging devices. The timing of a charge transfer period is then appropriately controlled, so that the plurality of imaging devices can share the one floating diffusion layer. Further, in this case, the plurality of imaging devices can share one contact hole portion.

Note that a solid-state imaging apparatus of Example 18 has a configuration and a structure that are similar to those of the solid-state imaging apparatuses described in Examples 6 to 17, except that the plurality of imaging devices constituting an imaging device block shares the first electrode 11.

Figure 68:
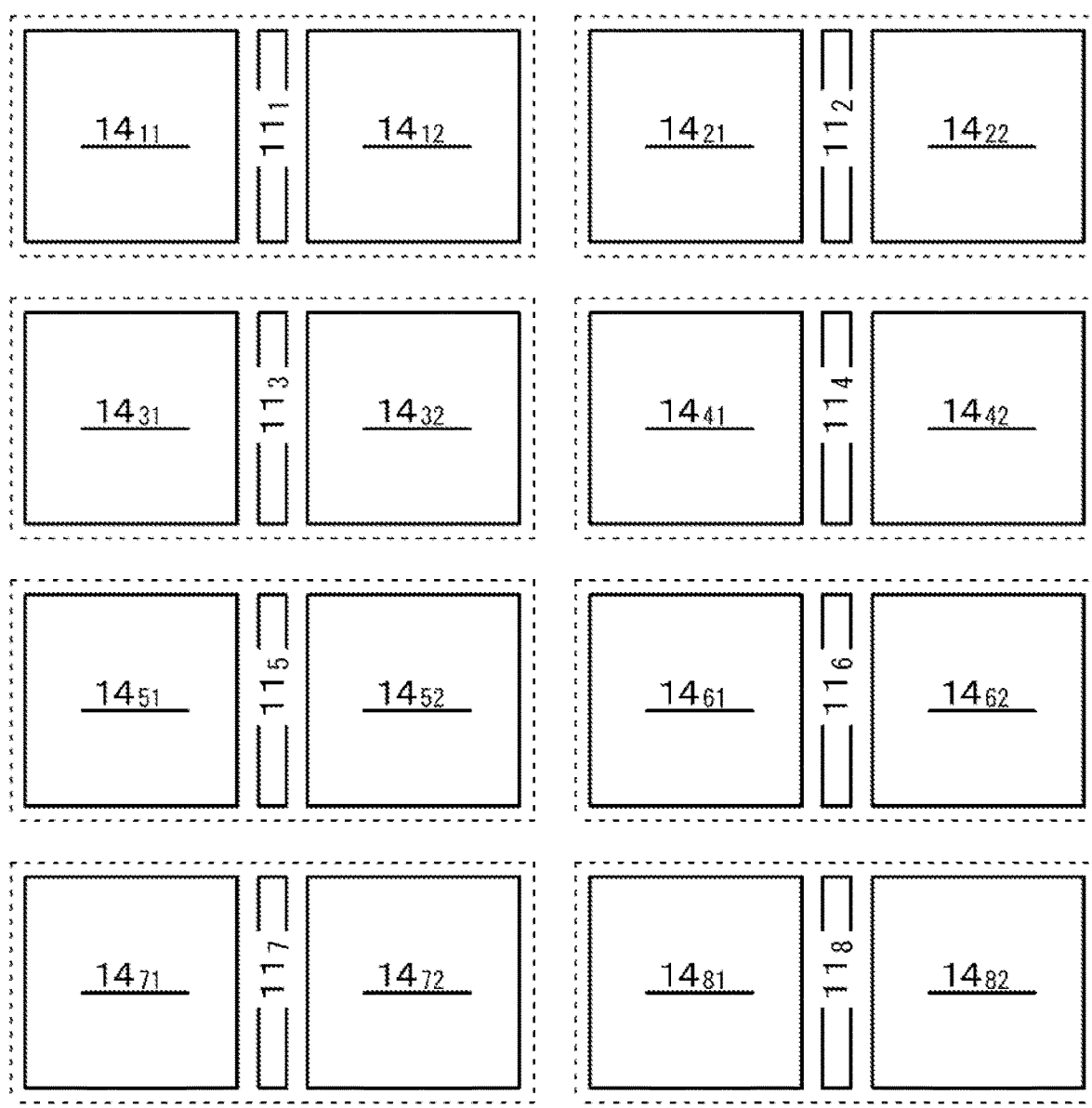
FIG. 68 is a schematic plan view of first electrodes and charge storage electrode segments in a solid-state imaging apparatus of Example 18.
Figure 69:
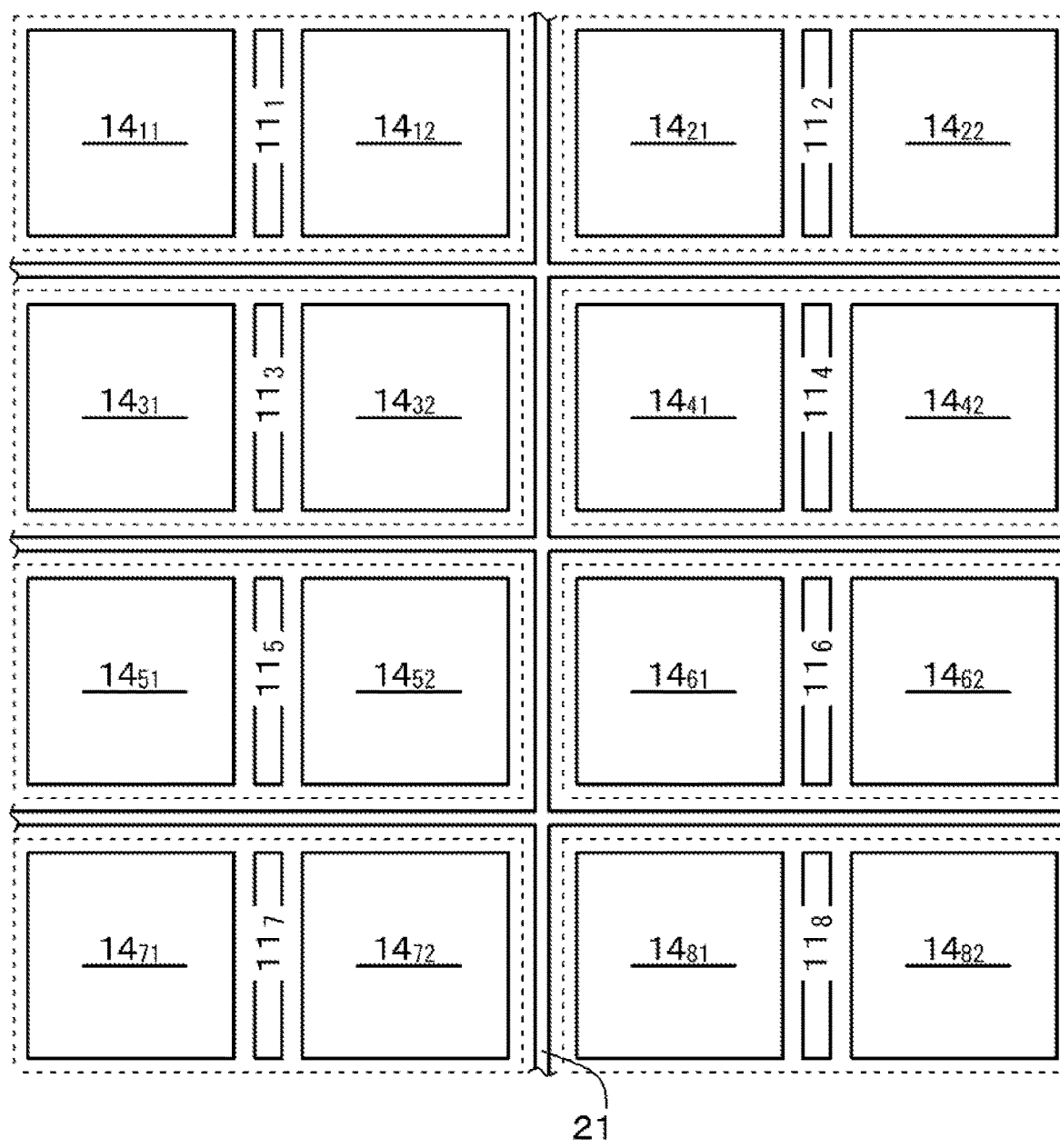
FIG. 69 is a schematic plan view of first electrodes and charge storage electrode segments in a first modification of a solid-state imaging apparatus of Example 18.
Figure 70:
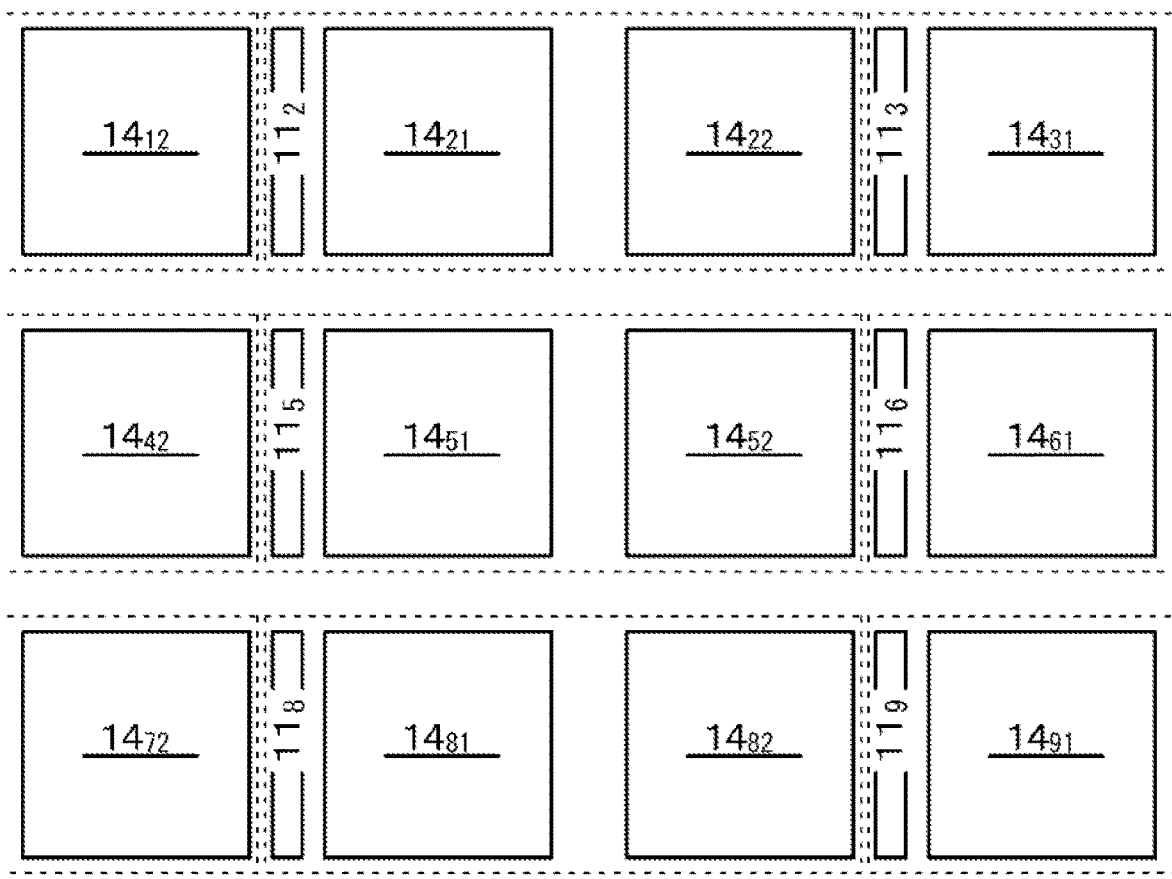
FIG. 70 is a schematic plan view of first electrodes and charge storage electrode segments in a second modification of a solid-state imaging apparatus of Example 18.
Figure 71:
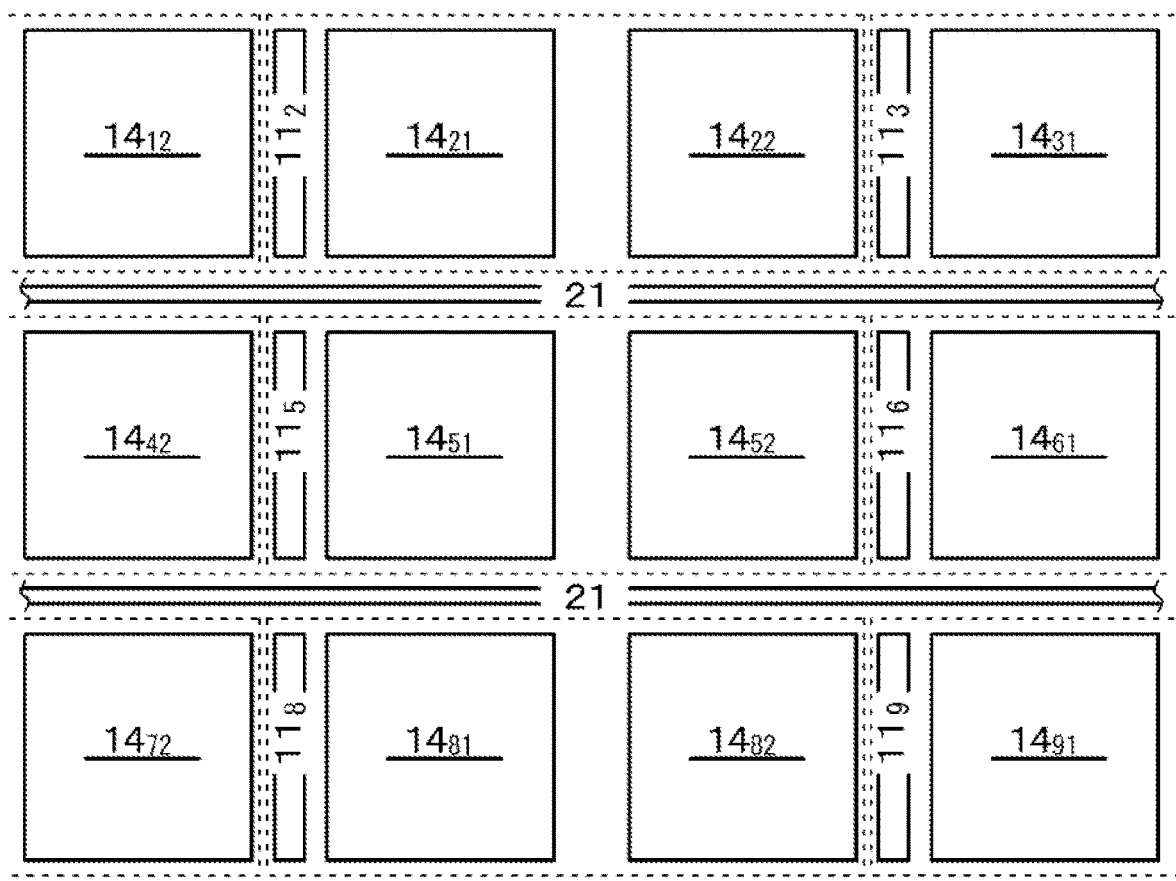
FIG. 71 is a schematic plan view of first electrodes and charge storage electrode segments in a third modification of a solid-state imaging apparatus of Example 18.
Figure 72:
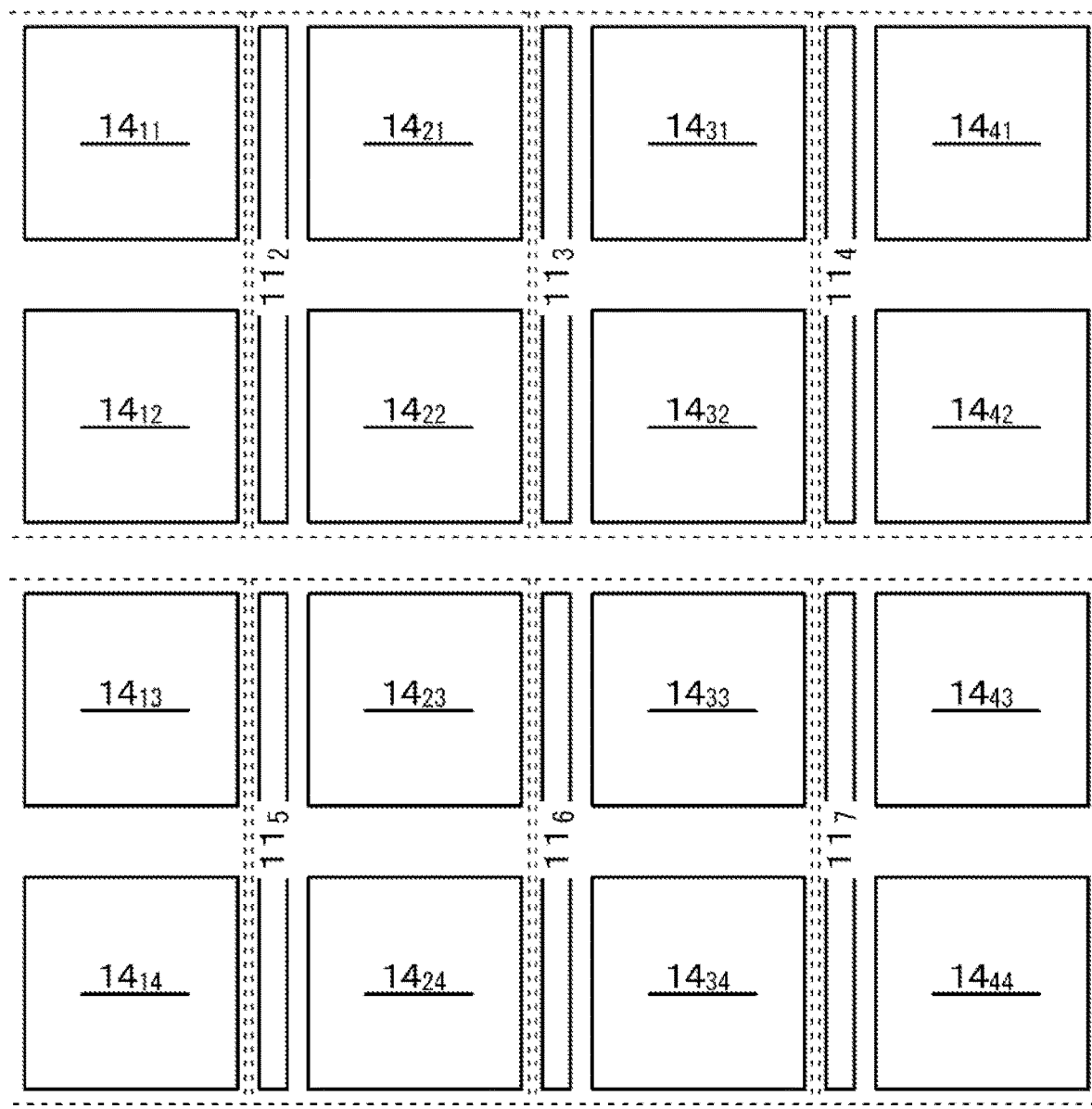
FIG. 72 is a schematic plan view of first electrodes and charge storage electrode segments in a fourth modification of a solid-state imaging apparatus of Example 18.
Figure 73:
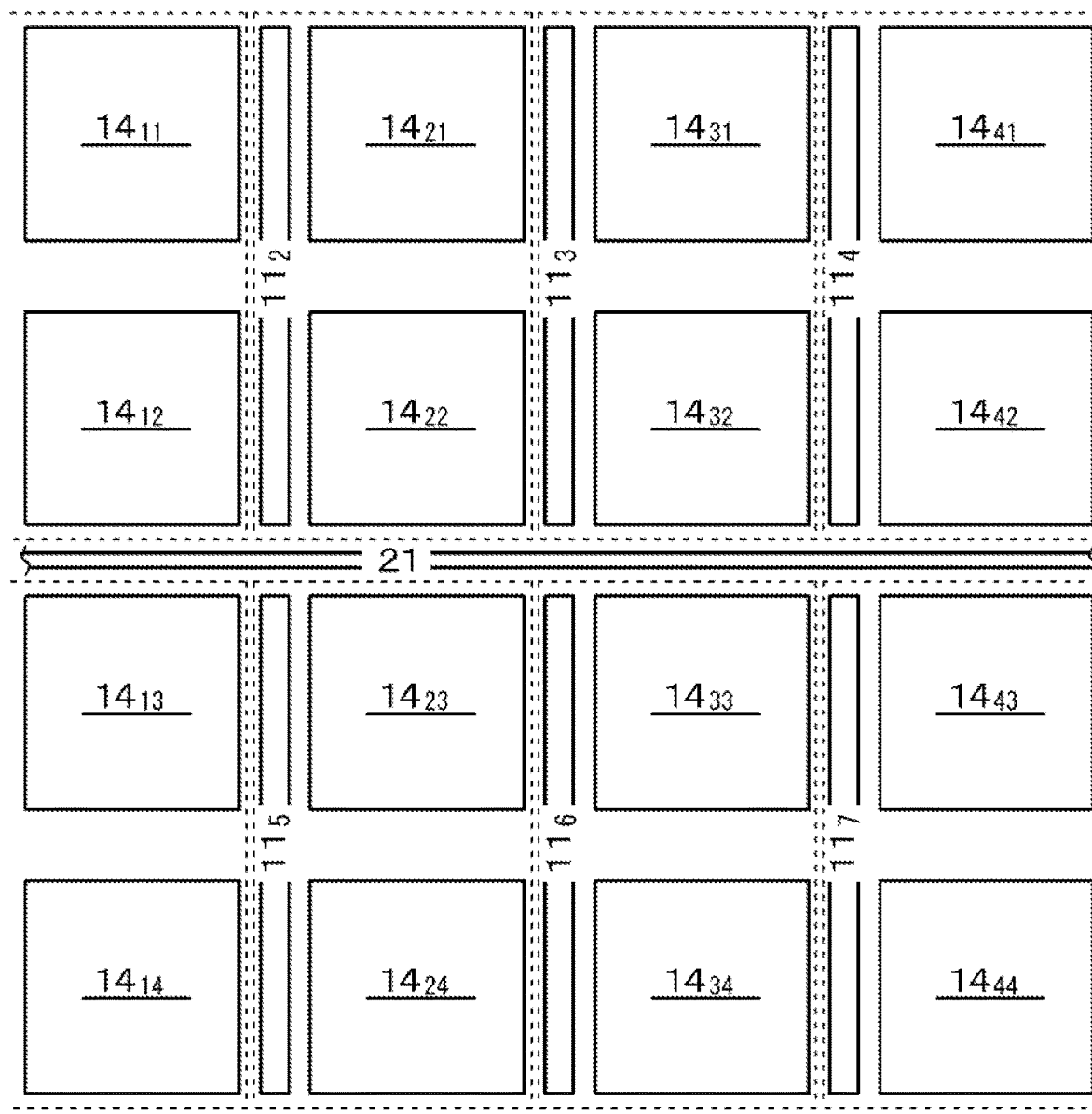
FIG. 73 is a schematic plan view of first electrodes and charge storage electrode segments in a fifth modification of a solid-state imaging apparatus of Example 18.

Layouts of first electrodes 11 and charge storage electrodes 14 in solid-state imaging apparatuses of Example 18 are schematically shown in FIG. 68 (Example 18), FIG. 69 (a first modification of Example 18), FIG. 70 (a second modification of Example 18), FIG. 71 (a third modification of Example 18), and FIG. 72 (a fourth modification of Example 18). FIGS. 68, 69, 72, and 73 each show 16 imaging devices, and FIGS. 70 and 71 each show 12 imaging devices. Further, each imaging device block is formed with two imaging devices. Each imaging device block is surrounded by a dotted line in the drawings. The suffixes attached to the first electrodes 11 and the charge storage electrodes 14 are for distinguishing the first electrodes 11 and the charge storage electrodes 14 from one another. The same applies to in the descriptions below. Meanwhile, one on-chip microlens (not shown in FIGS. 68 to 77) is disposed above one imaging device. Further, in each one imaging device block, two charge storage electrodes 14 are disposed, with one first electrode 11 being interposed in between (see FIGS. 68 and 69). Alternatively, one first electrode 11 is disposed to face two charge storage electrodes 14 that are arranged side by side (see FIGS. 72 and 73). In other words, the first electrodes are disposed adjacent to the charge storage electrodes in the respective imaging devices. Alternatively, a first electrode is disposed adjacent to the charge storage electrode of one imaging device of a plurality of imaging devices, and is not adjacent to the charge storage electrodes of the remaining imaging devices (see FIGS. 70 and 71). In such a case, electric charges are transferred from the remaining imaging devices to the first electrode via the one imaging device of the plurality of imaging devices. To ensure electric charge transfer from each imaging device to a first electrode, the distance A between the charge storage electrode of an imaging device and the charge storage electrode of another imaging device is preferably longer than the distance B between the first electrode and the charge storage electrodes in the imaging devices adjacent to the first electrode. Further, the value of the distance A is preferably greater for an imaging device located farther away from the first electrode. Meanwhile, in the examples shown in FIGS. 69, 71, and 73, a charge transfer control electrode 21 is disposed between a plurality of imaging devices constituting imaging device blocks. As the charge transfer control electrode 21 is provided, it is possible to reliably reduce electric charge transfer in the imaging device blocks located to interpose the charge transfer control electrode 21. Note that, where the potential to be applied to the charge transfer control electrode 21 is represented by $V_{13}$, $V_{12} > V_{13}$ (for example, $V_{12\text{-}2} > V_{13}$).

The charge transfer control electrode 21 may be formed on the first electrode side at the same level as the first electrodes 11 or the charge storage electrodes 14, or may be formed at a different level (specifically, at a level lower than the first electrodes 11 or the charge storage electrodes 14). In the former case, the distance between the charge transfer control electrode 21 and the photoelectric conversion layer can be shortened, and accordingly, the potential can be easily controlled. In the latter case, on the other hand, the distance between the charge transfer control electrode 21 and the charge storage electrodes 14 can be shortened, which is advantageous for miniaturization.

The following is a description of operation of an imaging device block formed with a first electrode 11$_2$ and two charge storage electrodes 14$_{21}$ and 14$_{22}$.

In a charge accumulation period, the drive circuit applies a potential $V_a$ to the first electrode 11$_2$, and a potential $V_A$ to the charge storage electrodes 14$_{21}$ and 14$_{22}$. Light that has entered the photoelectric conversion layer 13 causes photoelectric conversion in the photoelectric conversion layer 13. Holes generated by the photoelectric conversion are sent from the second electrode 12 to the drive circuit via a wiring line $V_{OU}$. Meanwhile, since the potential of the first electrode 11$_2$ is higher than the potential of the second electrode 12, or a positive potential is applied to the first electrode 11$_2$ while a negative potential is applied to the second electrode 12, for example, $V_A \geq V_a$, or preferably, $V_A > V_a$. As a result, electrons generated by the photoelectric conversion are attracted to the charge storage electrodes 14$_{21}$ and 14$_{22}$, and stay in the regions of the photoelectric conversion layer 13 facing the charge storage electrodes 14$_{21}$ and 14$_{22}$. In other words, electric charges are accumulated in the photoelectric conversion layer 13. Since $V_A \geq V_a$, electrons generated in the photoelectric conversion layer 13 will not move toward the first electrode 11$_2$. With the passage of time for photoelectric conversion, each potential in the regions of the photoelectric conversion layer 13 facing the charge storage electrodes 14$_{21}$ and 14$_{22}$ becomes a more negative value.

A reset operation is performed in the latter period in the charge accumulation period. As a result, the potential of the first floating diffusion layer is reset, and the potential of the first floating diffusion layer becomes equal to the potential $V_{DD}$ of the power supply.

After completion of the reset operation, the electric charges are read out. Specifically, in a charge transfer period, the drive circuit applies a potential $V_b$ to the first electrode 11$_2$, a potential $V_{21\text{-}B}$ to the charge storage electrode 14$_{21}$, and a potential $V_{22\text{-}B}$ to the charge storage electrode 14$_{22}$. Here, $V_{21\text{-}B} < V_b < V_{22\text{-}B}$. As a result, the electrons remaining in the region of the photoelectric conversion layer 13 facing the charge storage electrode 14$_{21}$ are read into the first electrode 11$_2$ and further into the first floating diffusion layer. In other words, the electric charges stored in the region of the photoelectric conversion layer 13 facing the charge storage electrode 14$_{21}$ are read into the control unit. After the reading is completed, $V_{22\text{-}B} \leq V_{21\text{-}B} < V_b$. Note that, in the examples shown in FIGS. 72 and 73, $V_{22\text{-}B} < V_b < V_{21\text{-}B}$ may be satisfied. As a result, the electrons remaining in the region of the photoelectric conversion layer 13 facing the charge storage electrode 14$_{22}$ are read into the first electrode 11$_2$ and further into the first floating diffusion layer. Further, in the examples shown in FIGS. 70 and 71, the electrons remaining in the region of the photoelectric conversion layer 13 facing the charge storage electrode 14$_{22}$ may be read into the first floating diffusion layer via the first electrode 11$_3$ to which the charge storage electrode 14$_{22}$ is adjacent. In this manner, the electric charges stored in the region of the photoelectric conversion layer 13 facing the charge storage electrode 14$_{22}$ are read into the control unit. Note that, after all the electric charges stored in the region of the photoelectric conversion layer 13 facing the charge storage electrode 14$_{21}$ have been read into the control unit, the potential of the first floating diffusion layer may be reset.

Figure 78A:
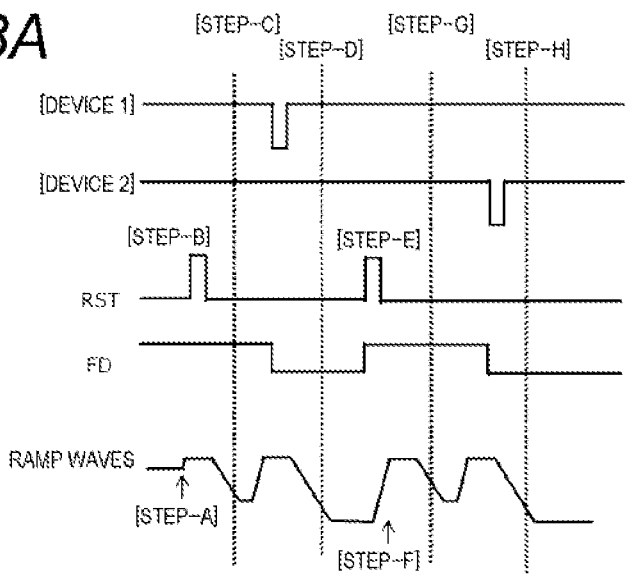
FIGS. 78A, 78B, and 78C are charts showing examples of readout driving in an imaging device block of Example 18.

FIG. 78A shows an example of readout driving in an imaging device block of Example 18.

[Step-A]

Autozero signal input to a comparator;

[Step-B]

a reset operation on a shared floating diffusion layer;

[Step-C]

P-phase readout and electric charge transfer to the first electrode $11_2$ in the imaging device corresponding to the charge storage electrode $14_{21}$;

[Step-D]

D-phase readout and electric charge transfer to the first electrode $11_2$ in the imaging device corresponding to the charge storage electrode $14_{21}$;

[Step-E]

a reset operation on a shared floating diffusion layer;

[Step-F]

autozero signal input to the comparator;

[Step-G]

P-phase readout and electric charge transfer to the first electrode $11_2$ in the imaging device corresponding to the charge storage electrode $14_{22}$; and

[Step-H]

D-phase readout and electric charge transfer to the first electrode $11_2$ in the imaging device corresponding to the charge storage electrode $14_{22}$.

In this flow, signals from the two imaging devices corresponding to the charge storage electrode $14_{21}$ and the charge storage electrode $14_{22}$ are read out. On the basis of a correlated double sampling (CDS) process, the difference between the P-phase readout in [Step-C] and the D-phase readout in [Step-D] is a signal from the imaging device corresponding to the charge storage electrode $14_{21}$, and the difference between the P-phase readout in [Step-G] and the D-phase readout in [Step-H] is a signal from the imaging device corresponding to the charge storage electrode $14_{22}$.

Figure 78B:
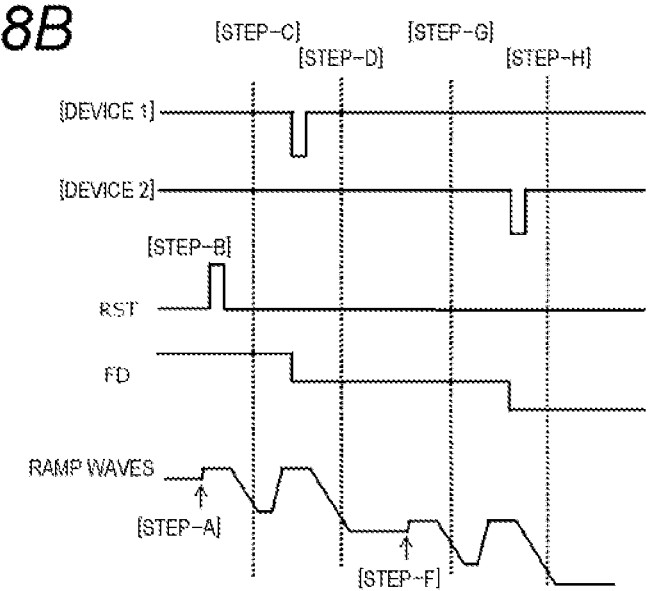
Figure 78C:
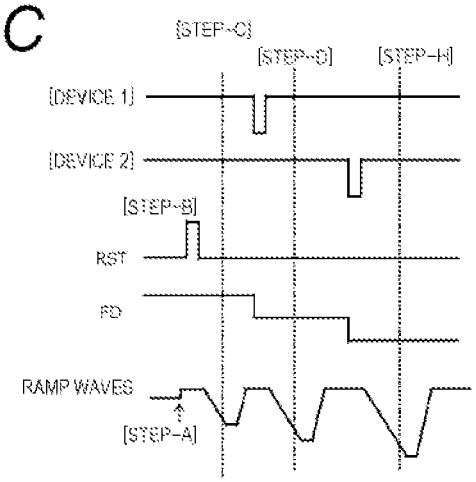
Figure 79:
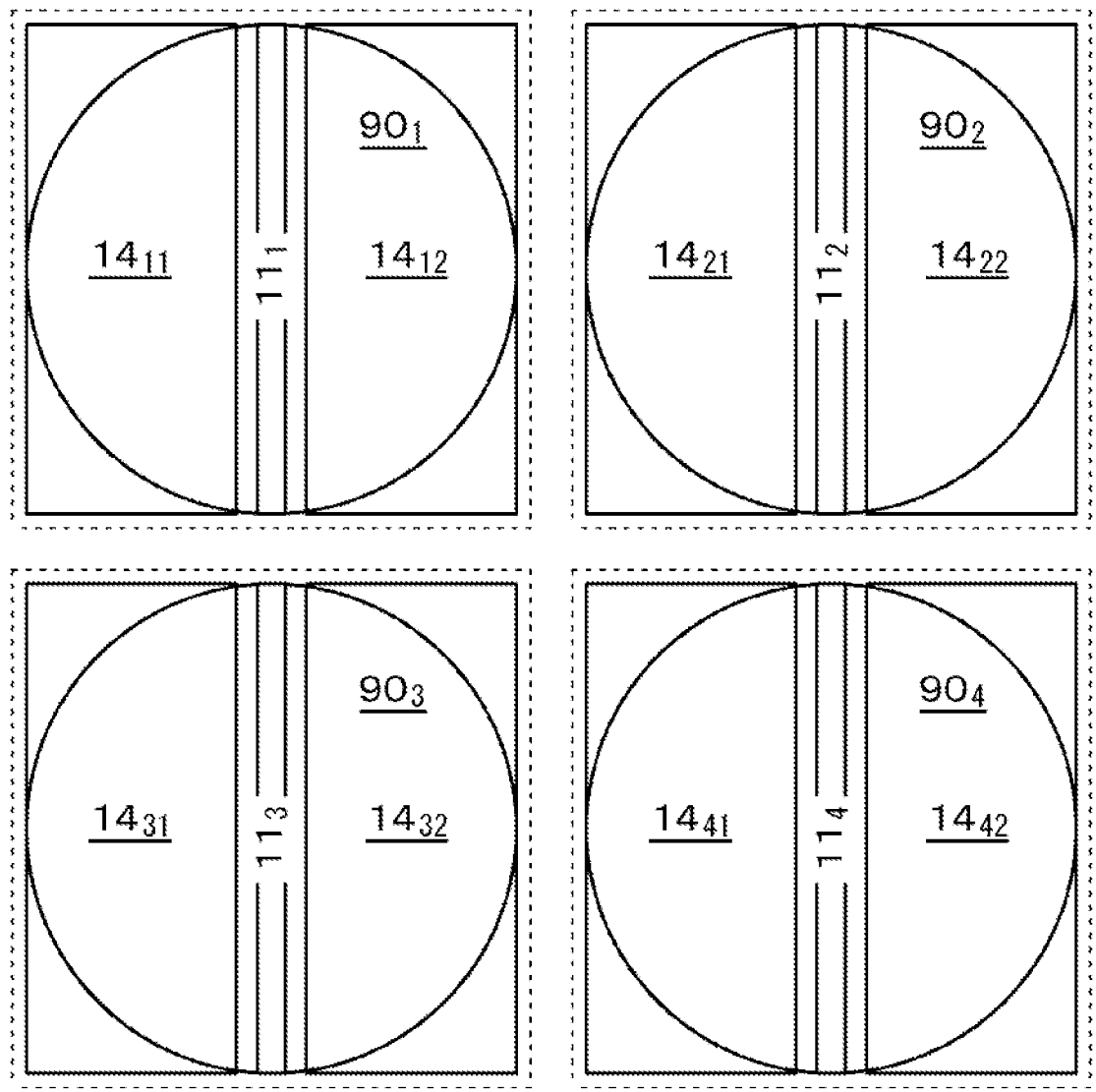
FIG. 79 is a schematic plan view of first electrodes and charge storage electrode segments in a solid-state imaging apparatus of Example 19.
Figure 80:
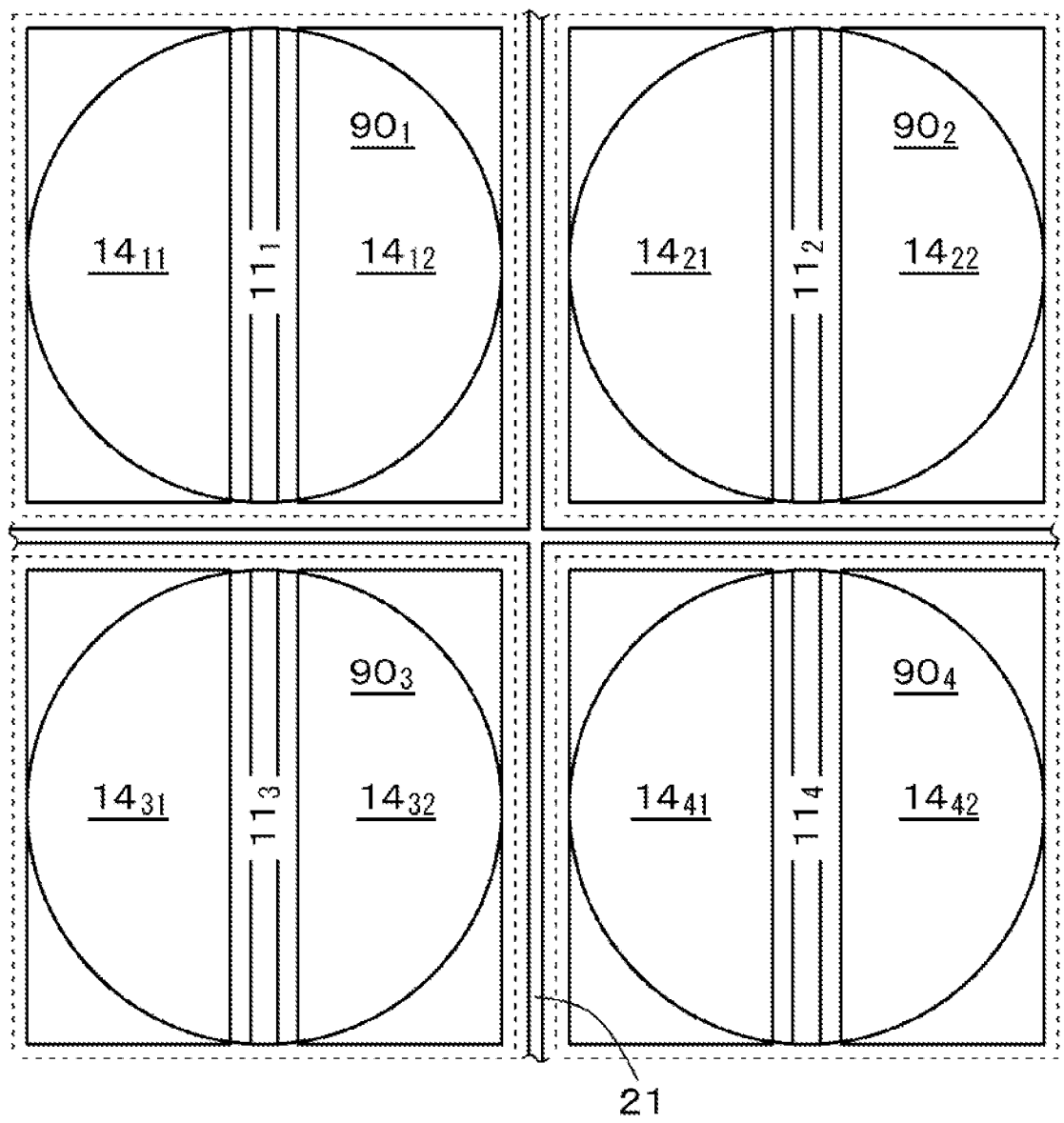
FIG. 80 is a schematic plan view of first electrodes and charge storage electrode segments in a modification of a solid-state imaging apparatus of Example 19.
Figure 81:
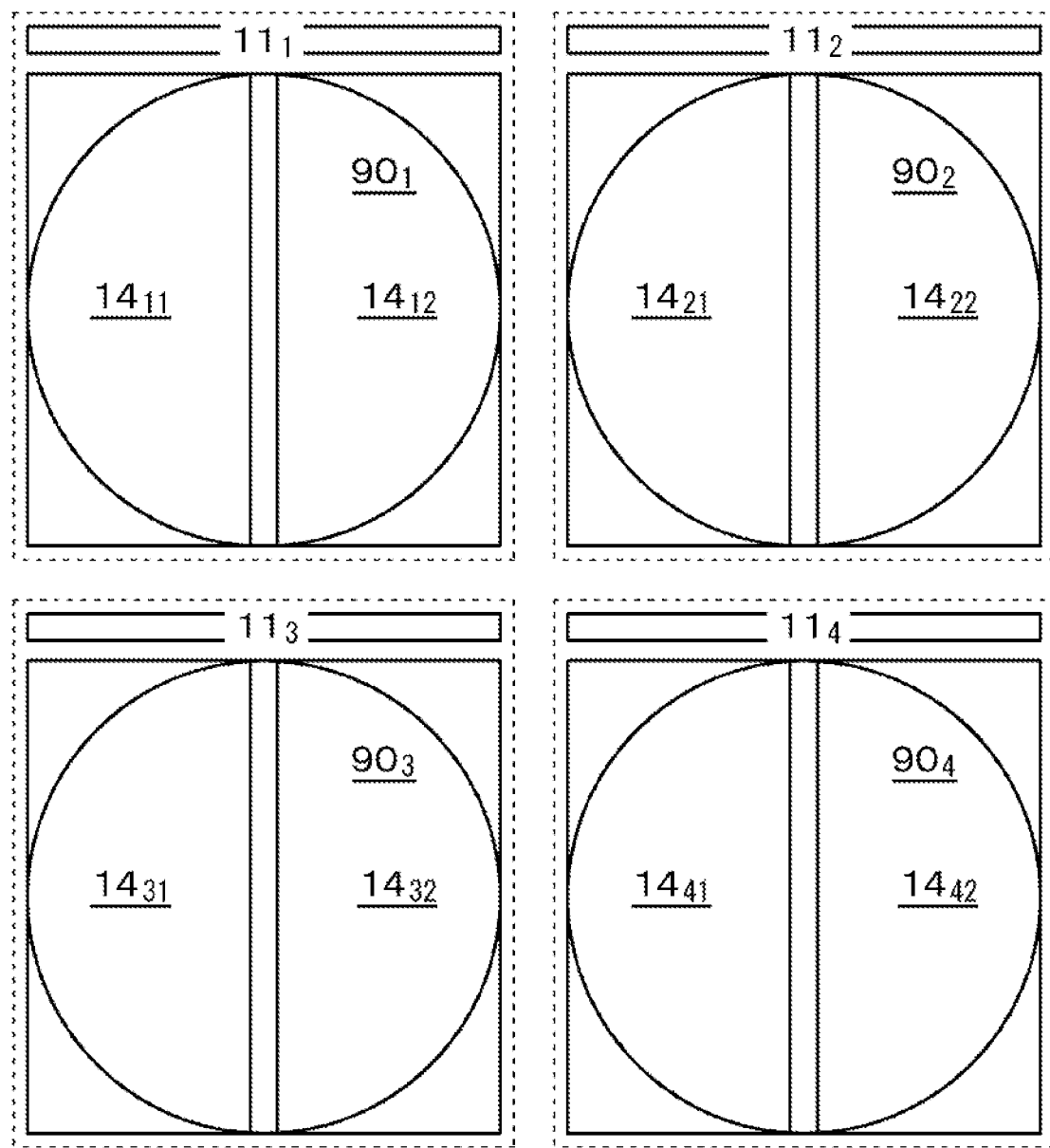
FIG. 81 is a schematic plan view of first electrodes and charge storage electrode segments in a modification of a solid-state imaging apparatus of Example 19.
Figure 82:
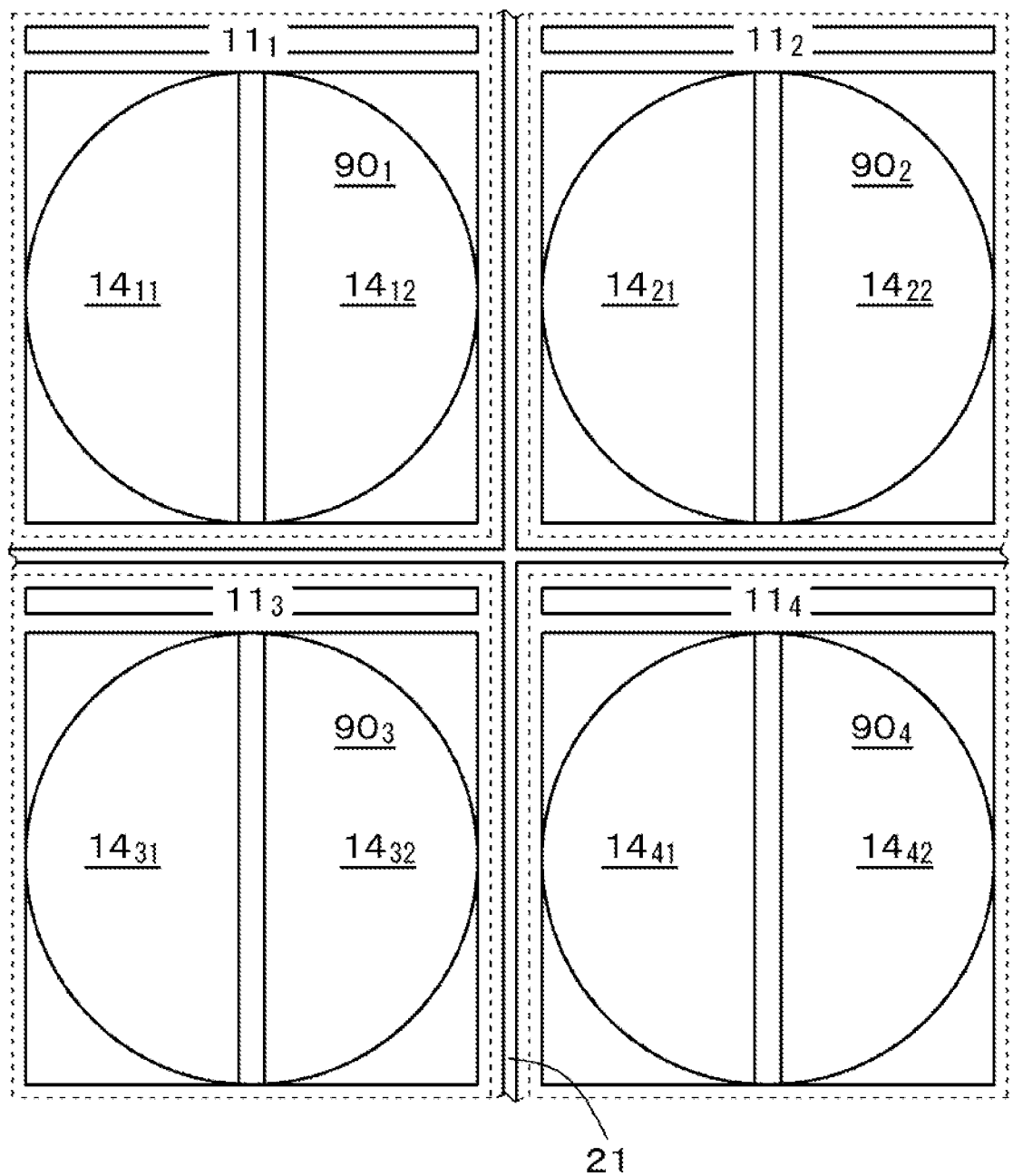
FIG. 82 is a schematic plan view of first electrodes and charge storage electrode segments in a modification of a solid-state imaging apparatus of Example 19.

Note that the operation in [Step-E] may be omitted (see FIG. 78B). Further, the operation in [Step-F] may also be omitted, and furthermore, in this case, [Step-G] may also be omitted (see FIG. 78C). The difference between the P-phase readout in [Step-C] and the D-phase readout in [Step-D] is a signal from the imaging device corresponding to the charge storage electrode $14_{21}$, and the difference between the D-phase readout in [Step-D] and the D-phase readout in [Step-H] is a signal from the imaging device corresponding to the charge storage electrode $14_{22}$.

Figure 74:
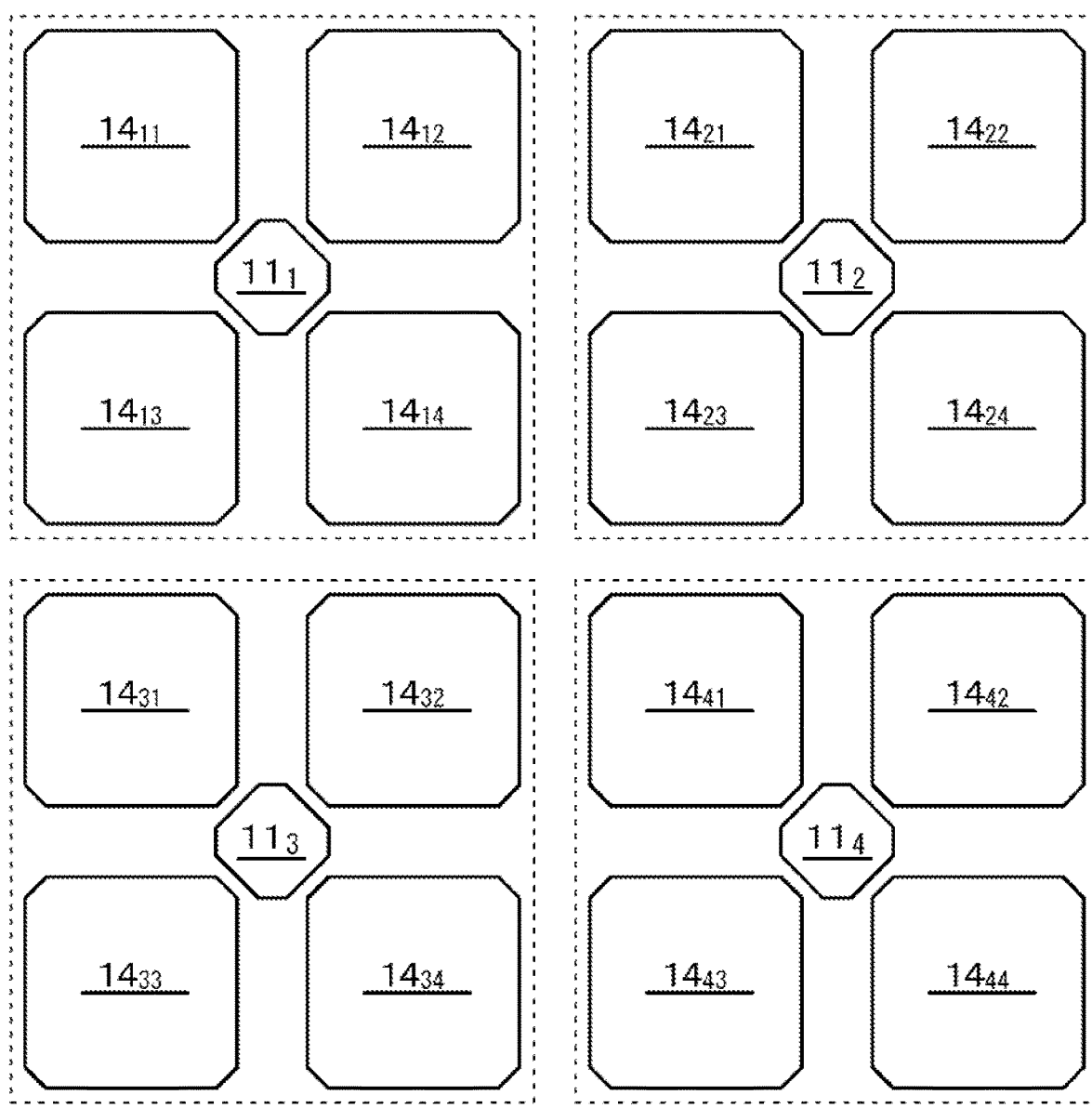
FIG. 74 is a schematic plan view of first electrodes and charge storage electrode segments in a sixth modification of a solid-state imaging apparatus of Example 18.
Figure 75:
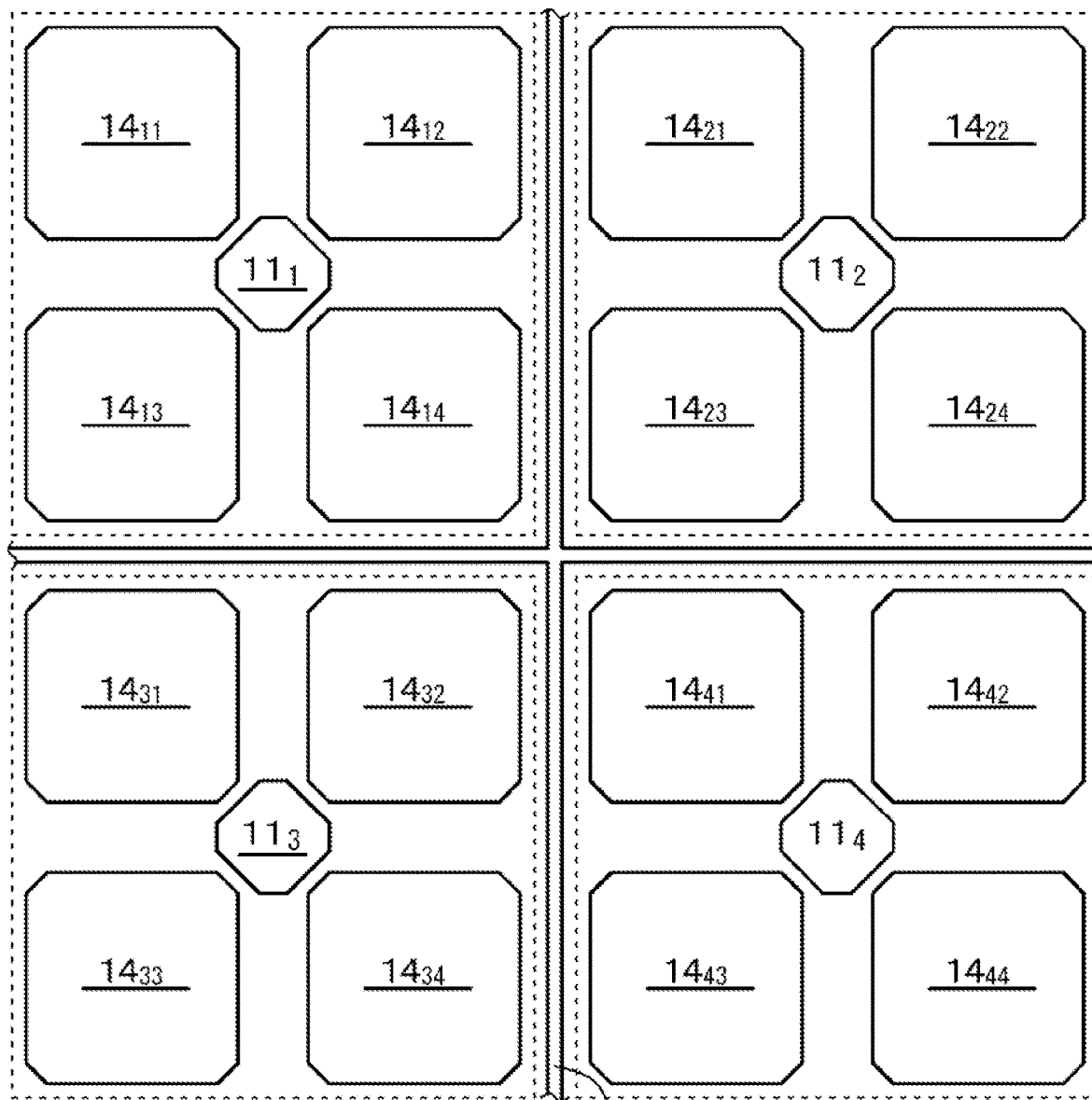
FIG. 75 is a schematic plan view of first electrodes and charge storage electrode segments in a seventh modification of a solid-state imaging apparatus of Example 18.

In the modifications shown in FIG. 74 (a sixth modification of Example 18) and FIG. 75 (a seventh modification of Example 18) schematically showing layouts of first electrodes 11 and charge storage electrodes 14, an imaging device block is formed with four imaging devices. Operations of these solid-state imaging apparatuses may be substantially similar to operations of the solid-state imaging apparatuses shown in FIGS. 68 to 73.

Figure 76:
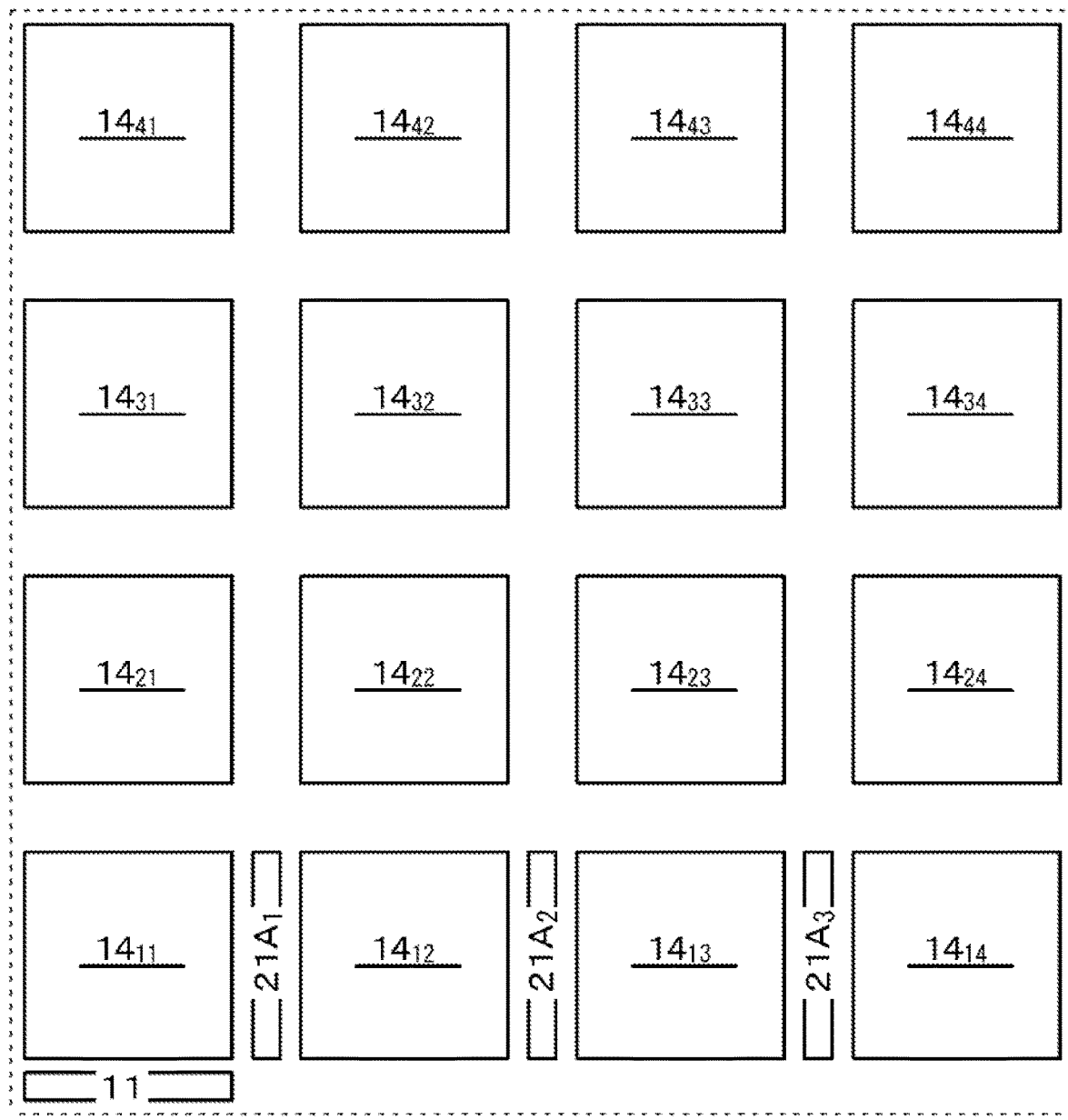
FIG. 76 is a schematic plan view of first electrodes and charge storage electrode segments in an eighth modification of a solid-state imaging apparatus of Example 18.
Figure 77:
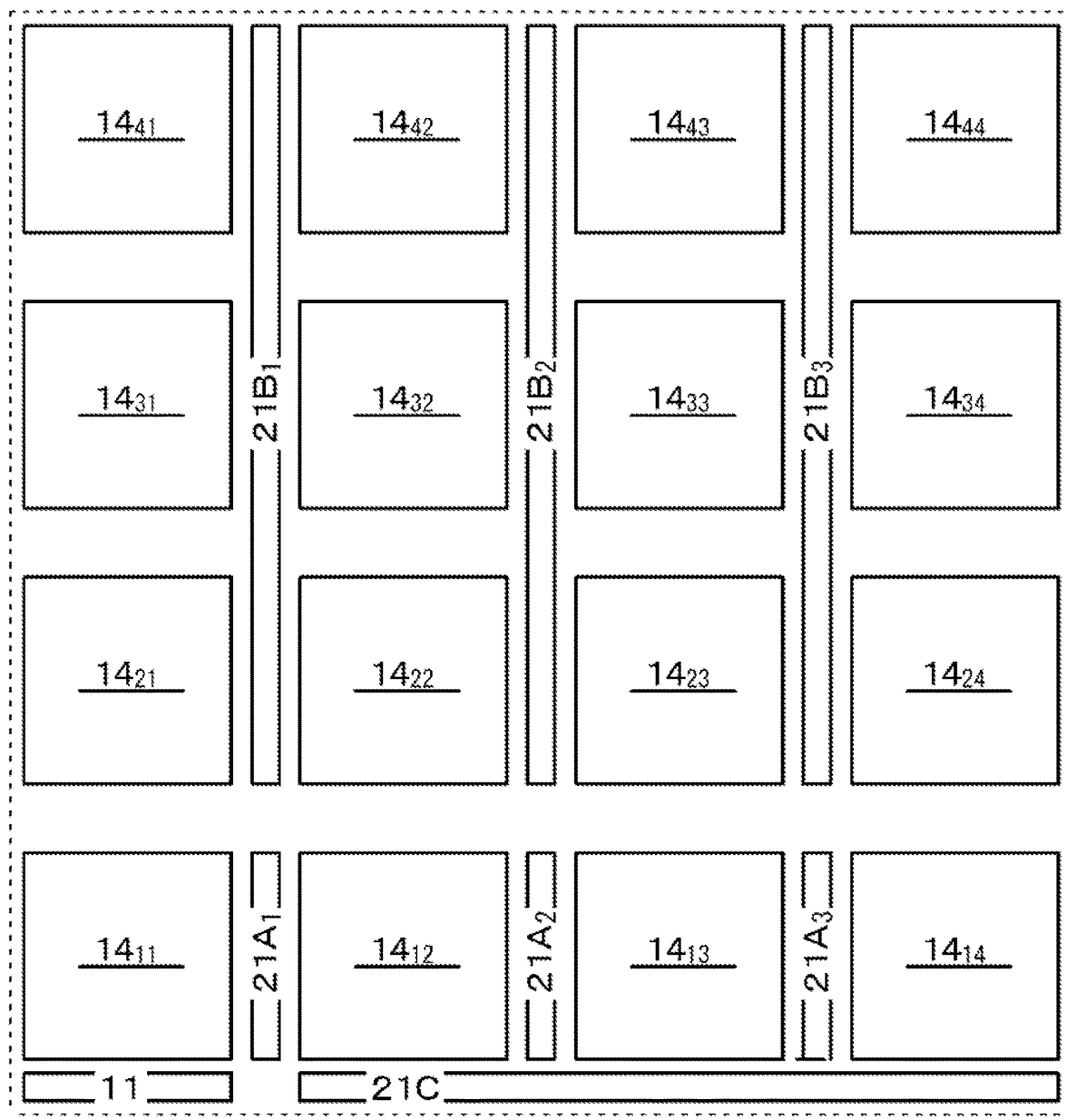
FIG. 77 is a schematic plan view of first electrodes and charge storage electrode segments in a ninth modification of a solid-state imaging apparatus of Example 18.

In an eighth modification shown in FIG. 76 and a ninth modification shown in FIG. 77 schematically showing layouts of a first electrode 11 and charge storage electrodes 14, an imaging device block is formed with 16 imaging devices. As shown in FIGS. 76 and 77, charge transfer control electrodes $21A_1$, $21A_2$, and $21A_3$ are disposed between the charge storage electrode $14_{11}$ and the charge storage electrode $14_{12}$, between the charge storage electrode $14_{12}$ and the charge storage electrode $14_{13}$, and between the charge storage electrode $14_{13}$ and the charge storage electrode $14_{14}$. Further, as shown in FIG. 77, charge transfer control electrodes $21B_1$, $21B_2$, and $21B_3$ are disposed between the charge storage electrodes $14_{21}$, $14_{31}$, and $14_{41}$ and the charge storage electrodes $14_{22}$, $14_{32}$, and $14_{42}$, between the charge storage electrodes $14_{22}$, $14_{32}$, and $14_{42}$ and the charge storage electrodes $14_{23}$, $14_{33}$, and $14_{43}$, and between the charge storage electrodes $14_{23}$, $14_{33}$, and $14_{43}$ and the charge storage electrodes $14_{24}$, $14_{34}$, and $14_{44}$. Furthermore, a charge transfer control electrode 21C is disposed between an imaging device block and an imaging device block. Further, in these solid-state imaging apparatuses, the 16 charge storage electrodes 14 are controlled, so that the electric charges stored in the photoelectric conversion layer 13 can be read out from the first electrode 11.

[Step-10]

Specifically, the electric charges stored in the region of the photoelectric conversion layer 13 facing the charge storage electrode $14_{11}$ are first read out from the first electrode 11. The electric charges stored in the region of the photoelectric conversion layer 13 facing the charge storage electrode $14_{12}$ are then read from the first electrode 11 via the region of the photoelectric conversion layer 13 facing the charge storage electrode $14_{11}$. The electric charges stored in the region of the photoelectric conversion layer 13 facing the charge storage electrode $14_{13}$ are then read from the first electrode 11 via the regions of the photoelectric conversion layer 13 facing the charge storage electrode $14_{12}$ and the charge storage electrode 141.

[Step-20]

After that, the electric charges stored in the region of the photoelectric conversion layer 13 facing the charge storage electrode $14_{21}$ are transferred to the region of the photoelectric conversion layer 13 facing the charge storage electrode $14_{11}$. The electric charges stored in the region of the photoelectric conversion layer 13 facing the charge storage electrode $14_{22}$ are transferred to the region of the photoelectric conversion layer 13 facing the charge storage electrode $14_{12}$. The electric charges stored in the region of the photoelectric conversion layer 13 facing the charge storage electrode $14_{23}$ are transferred to the region of the photoelectric conversion layer 13 facing the charge storage electrode $14_{13}$. The electric charges stored in the region of the photoelectric conversion layer 13 facing the charge storage electrode $14_{24}$ are transferred to the region of the photoelectric conversion layer 13 facing the charge storage electrode $14_{14}$.

[Step-21]

The electric charges stored in the region of the photoelectric conversion layer 13 facing the charge storage electrode $14_{31}$ are transferred to the region of the photoelectric conversion layer 13 facing the charge storage electrode $14_{21}$. The electric charges stored in the region of the photoelectric conversion layer 13 facing the charge storage electrode $14_{32}$ are transferred to the region of the photoelectric conversion layer 13 facing the charge storage electrode $14_{22}$. The electric charges stored in the region of the photoelectric conversion layer 13 facing the charge storage electrode $14_{33}$ are transferred to the region of the photoelectric conversion layer 13 facing the charge storage electrode $14_{23}$. The electric charges stored in the region of the photoelectric conversion layer 13 facing the charge storage electrode $14_{34}$ are transferred to the region of the photoelectric conversion layer 13 facing the charge storage electrode $14_{24}$.

[Step-22]

The electric charges stored in the region of the photoelectric conversion layer 13 facing the charge storage electrode $14_{41}$ are transferred to the region of the photoelectric conversion layer 13 facing the charge storage electrode $14_{31}$. The electric charges stored in the region of the photoelectric conversion layer 13 facing the charge storage electrode $14_{42}$ are transferred to the region of the photoelectric conversion layer 13 facing the charge storage electrode $14_{32}$. The electric charges stored in the region of the photoelectric conversion layer 13 facing the charge storage electrode $14_{43}$ are transferred to the region of the photoelectric conversion layer 13 facing the charge storage electrode $14_{33}$. The electric charges stored in the region of the photoelectric conversion layer 13 facing the charge storage electrode $14_{44}$ are transferred to the region of the photoelectric conversion layer 13 facing the charge storage electrode $14_{34}$.

[Step-30]

[Step-10] is then carried out again, so that the electric charges stored in the region of the photoelectric conversion layer 13 facing the charge storage electrode $14_{21}$, the electric charges stored in the region of the photoelectric conversion layer 13 facing the charge storage electrode $14_{22}$, the electric charges stored in the region of the photoelectric conversion layer 13 facing the charge storage electrode $14_{23}$, and the electric charges stored in the region of the photoelectric conversion layer 13 facing the charge storage electrode $14_{24}$ can be read out via the first electrode 11.

[Step-40]

After that, the electric charges stored in the region of the photoelectric conversion layer 13 facing the charge storage electrode $14_{21}$ are transferred to the region of the photoelectric conversion layer 13 facing the charge storage electrode $14_{11}$. The electric charges stored in the region of the photoelectric conversion layer 13 facing the charge storage electrode $14_{22}$ are transferred to the region of the photoelectric conversion layer 13 facing the charge storage electrode $14_{12}$. The electric charges stored in the region of the photoelectric conversion layer 13 facing the charge storage electrode $14_{23}$ are transferred to the region of the photoelectric conversion layer 13 facing the charge storage electrode $14_{13}$. The electric charges stored in the region of the photoelectric conversion layer 13 facing the charge storage electrode $14_{24}$ are transferred to the region of the photoelectric conversion layer 13 facing the charge storage electrode $14_{14}$.

[Step-41]

The electric charges stored in the region of the photoelectric conversion layer 13 facing the charge storage electrode $14_{31}$ are transferred to the region of the photoelectric conversion layer 13 facing the charge storage electrode $14_{21}$. The electric charges stored in the region of the photoelectric conversion layer 13 facing the charge storage electrode $14_{32}$ are transferred to the region of the photoelectric conversion layer 13 facing the charge storage electrode $14_{22}$. The electric charges stored in the region of the photoelectric conversion layer 13 facing the charge storage electrode $14_{33}$ are transferred to the region of the photoelectric conversion layer 13 facing the charge storage electrode $14_{23}$. The electric charges stored in the region of the photoelectric conversion layer 13 facing the charge storage electrode $14_{34}$ are transferred to the region of the photoelectric conversion layer 13 facing the charge storage electrode $14_{24}$.

[Step-50]

[Step-10] is then carried out again, so that the electric charges stored in the region of the photoelectric conversion layer 13 facing the charge storage electrode $14_{31}$, the electric charges stored in the region of the photoelectric conversion layer 13 facing the charge storage electrode $14_{32}$, the electric charges stored in the region of the photoelectric conversion layer 13 facing the charge storage electrode $14_{33}$, and the electric charges stored in the region of the photoelectric conversion layer 13 facing the charge storage electrode $14_{34}$ can be read out via the first electrode 11.

[Step-60]

After that, the electric charges stored in the region of the photoelectric conversion layer 13 facing the charge storage electrode $14_{21}$ are transferred to the region of the photoelectric conversion layer 13 facing the charge storage electrode $14_{11}$. The electric charges stored in the region of the photoelectric conversion layer 13 facing the charge storage electrode $14_{22}$ are transferred to the region of the photoelectric conversion layer 13 facing the charge storage electrode $14_{12}$. The electric charges stored in the region of the photoelectric conversion layer 13 facing the charge storage electrode $14_{23}$ are transferred to the region of the photoelectric conversion layer 13 facing the charge storage electrode $14_{13}$. The electric charges stored in the region of the photoelectric conversion layer 13 facing the charge storage electrode $14_{24}$ are transferred to the region of the photoelectric conversion layer 13 facing the charge storage electrode $14_{14}$.

[Step-70]

[Step-10] is then carried out again, so that the electric charges stored in the region of the photoelectric conversion layer 13 facing the charge storage electrode $14_{41}$, the electric charges stored in the region of the photoelectric conversion layer 13 facing the charge storage electrode $14_{42}$, the electric charges stored in the region of the photoelectric conversion layer 13 facing the charge storage electrode $14_{43}$, and the electric charges stored in the region of the photoelectric conversion layer 13 facing the charge storage electrode $14_{44}$ can be read out via the first electrode 11.

In a solid-state imaging apparatus of Example 18, a plurality of imaging devices that constitute an imaging device block shares a first electrode, and accordingly, the configuration and the structure in the pixel region in which the plurality of imaging devices is disposed can be simplified and miniaturized. Note that the plurality of imaging devices provided for one floating diffusion layer may be formed with a plurality of first-type imaging devices, or may be formed with at least one first-type imaging device and one or more second-type imaging devices.

Example 19

Example 19 is a modification of Example 18. In solid-state imaging apparatuses of Example 19 shown in FIGS. 79, 80, 81, and 82 schematically showing the layouts of first electrodes 11 and charge storage electrodes 14, an imaging device block is formed with two imaging devices. One on-chip microlens 90 is then disposed above the imaging device block. Note that, in the examples shown in FIGS. 80 and 82, a charge transfer control electrode 21 is disposed between the plurality of imaging devices constituting the imaging device blocks.

For example, the photoelectric conversion layers corresponding to the charge storage electrodes $14_{11}$, $14_{21}$, $14_{31}$, and $14_{41}$ of imaging device blocks have high sensitivity to incident light from upper right in the drawings. Meanwhile, the photoelectric conversion layers corresponding to the charge storage electrodes $14_{12}$, $14_{22}$, $14_{32}$, and $14_{42}$ of the imaging device blocks have high sensitivity to incident light from upper left in the drawings. Accordingly, the imaging device including the charge storage electrode $14_{11}$ and the imaging device including the charge storage electrode $14_{12}$ are combined, for example, to enable acquisition of an image plane phase difference signal. Further, a signal from the imaging device including the charge storage electrode $14_{11}$ and a signal from the imaging device including the charge storage electrode $14_{12}$ are added to each other, so that one imaging device can be formed with the combination of these imaging devices. In the example shown in FIG. 79, the first electrode $11_1$ is disposed between the charge storage electrode $14_1$ and the charge storage electrode $14_{12}$. However, as in the example shown in FIG. 81, the single first electrode $11_1$ may be disposed to face the two charge storage electrodes $14_{11}$ and $14_{12}$, which are arranged side by side. Thus, sensitivity can be further increased.

Although the present disclosure has been described so far on the basis of preferred examples, the present disclosure is not limited to those examples. The structures, the configurations, the manufacturing conditions, the manufacturing methods, and the materials used for the imaging devices, the stacked imaging devices, and the solid-state imaging apparatuses described in Examples are merely examples, and may be modified as appropriate. The imaging devices of the respective Examples may be combined as appropriate. For example, it is possible to combine an imaging device of Example 12, an imaging device of Example 13, an imaging device of Example 14, an imaging device of Example 15, and an imaging device of Example 16 in a desired manner. It is also possible to combine an imaging device of Example 12, an imaging device of Example 13, an imaging device of Example 14, an imaging device of Example 15, and an imaging device of Example 17 in a desired manner.

In some cases, floating diffusion layers $FD_1$, $FD_{21}$, $FD_3$, 51C, 45C, and 46C can be shared.

Figure 83:
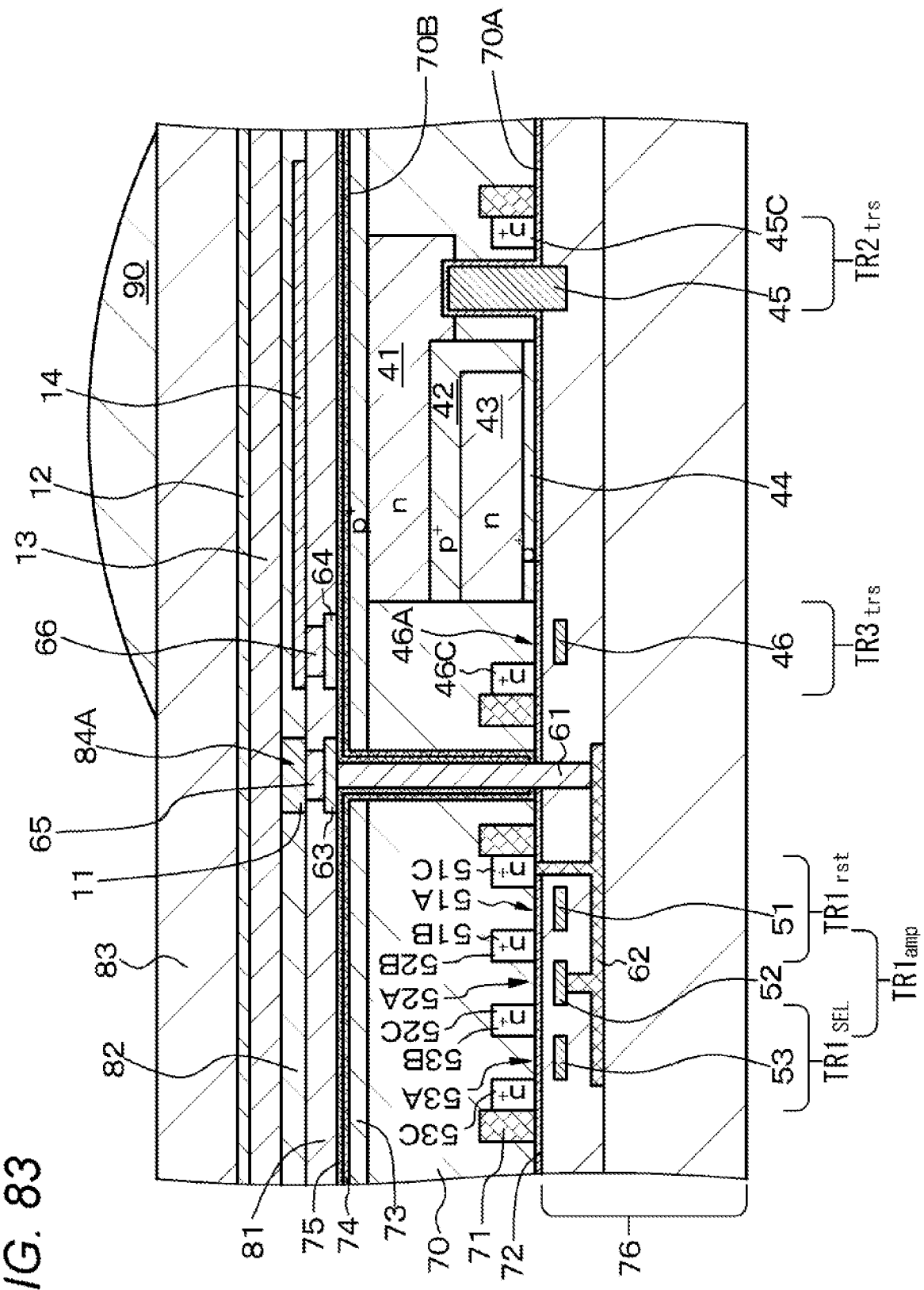
FIG. 83 is a schematic partial cross-sectional view of another modification of an imaging device and a stacked imaging device of Example 6.

As shown in FIG. 83, which shows a modification of an imaging device and a stacked imaging device described in Example 6, the first electrode 11 may extend in an opening 84A formed in the insulating layer 82, and be connected to the photoelectric conversion layer 13, for example.

Figure 84:
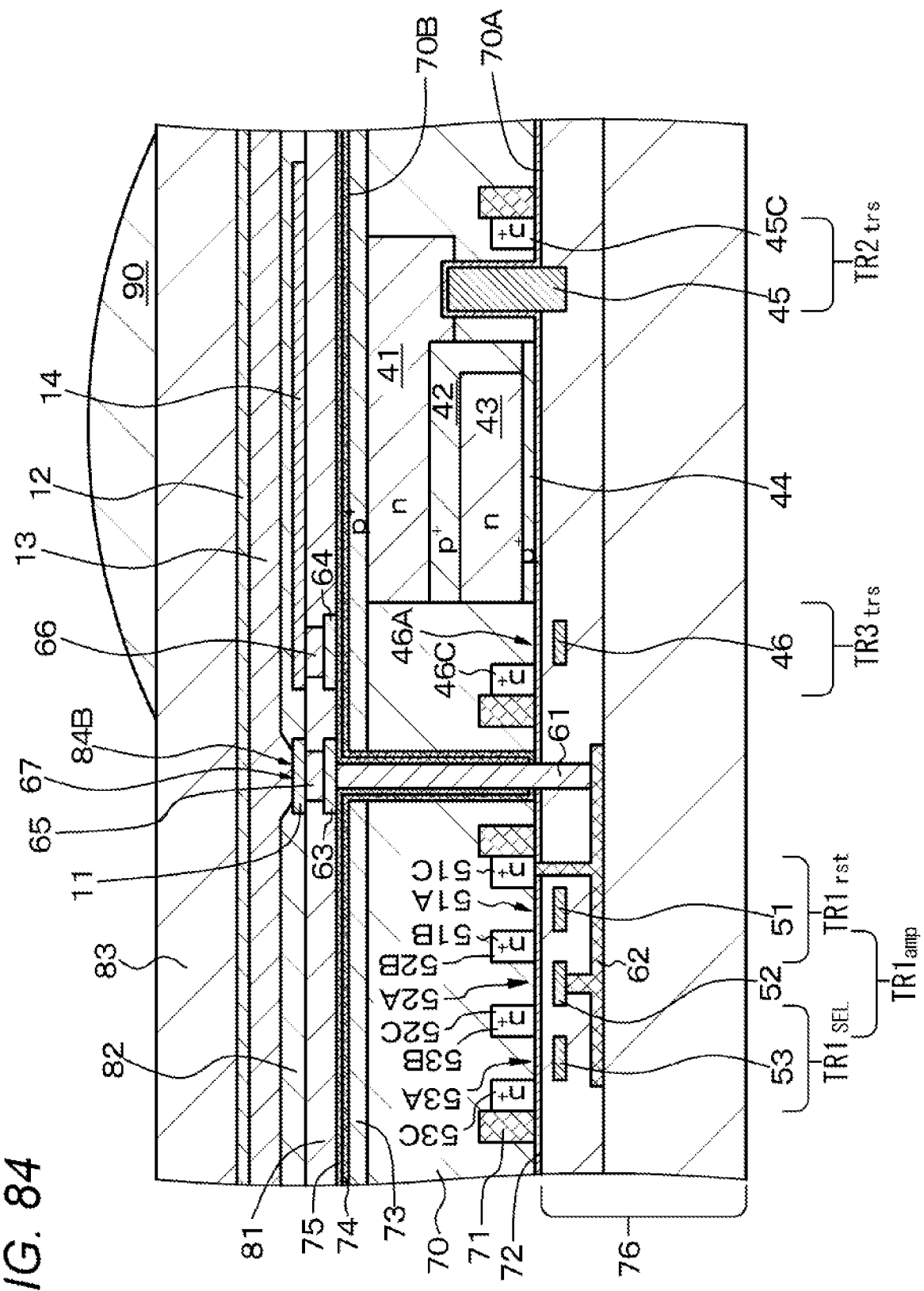
FIG. 84 is a schematic partial cross-sectional view of yet another modification of an imaging device and a stacked imaging device of Example 6.
Figure 85A:
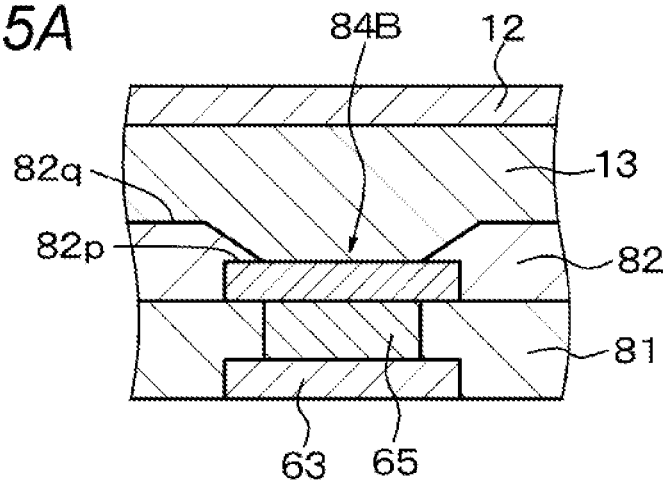
FIGS. 85A, 85B, and 85C are schematic partial cross-sectional views that are enlarged views of first electrode portions and the like in yet another modification of an imaging device and a stacked imaging device of Example 6.
Figure 85B:
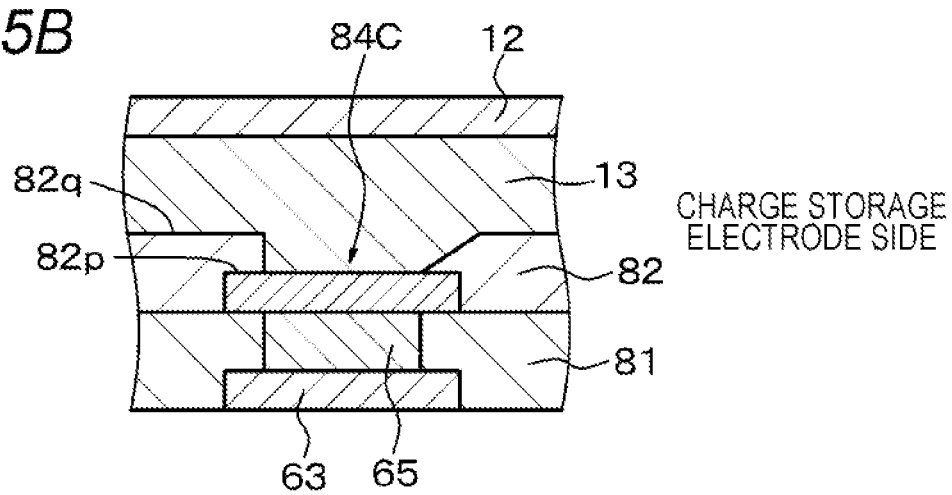
Figure 85C:
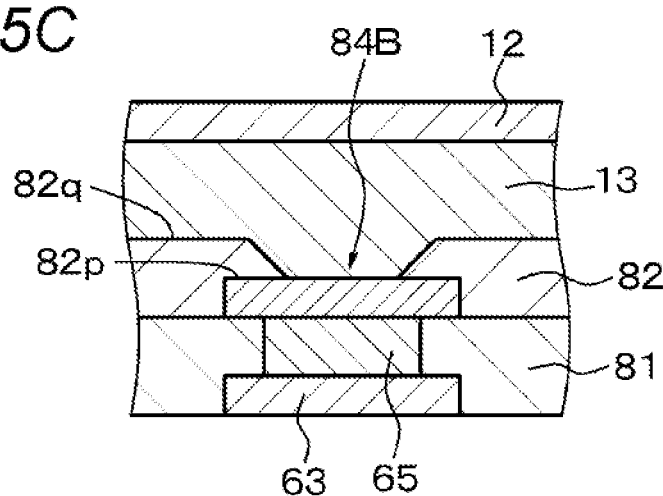

Alternatively, as shown in FIG. 84 showing a modification of an imaging device and a stacked imaging device explained in Example 6, and as shown in FIG. 85A showing a schematic partial cross-sectional view with an enlarged view of the portion of the first electrode and the like, the edge portion of the top surface of the first electrode 11 is covered with the insulating layer 82, and the first electrode 11 is exposed through the bottom surface of an opening 84B. Where the surface of the insulating layer 82 in contact with the top surface of the first electrode 11 is a first surface 82p, and the surface of the insulating layer 82 in contact with the portion of the photoelectric conversion layer 13 facing the charge storage electrode 14 is a second surface 82q, the side surfaces of the opening 84B are slopes spreading from the first surface 82p toward the second surface 82q, for example. As the side surfaces of the opening 84B are sloped as above, electric charge transfer from the photoelectric conversion layer 13 to the first electrode 11 becomes smoother. Note that, in the example shown in FIG. 85A, the side surfaces of the opening 84B are rotationally symmetrical about the axis line of the opening 84B. However, as shown in FIG. 85B, an opening 84C may be designed so that a side surface of the opening 84C having a slope spreading from the first surface 82p toward the second surface 82q is located on the side of the charge storage electrode 14. This makes it difficult for electric charges to transfer from the portion of the photoelectric conversion layer 13 on the opposite side of the opening 84C from the charge storage electrode 14. While the side surface of the opening 84B has a slope that spreads from the first surface 82p to the second surface 82q, the edge portions of the side surfaces of the opening 84B in the second surface 82q may be located on the outer side of the edge portion of the first electrode 11 as shown in FIG. 85A, or may be located on the inner side of the edge portion of the first electrode 11 as shown in FIG. 85C. The former configuration is adopted to further facilitate electric charge transfer. The latter configuration is adopted to reduce the variation in the shape of the opening at the time of formation.

To form these openings 84B and 84C, an etching mask including the resist material formed when an opening is formed in an insulating layer by an etching method is reflowed, so that the side surface(s) of the opening of the etching mask is (are) sloped, and etching is performed on the insulating layer 82 with the etching mask.

Figure 86:
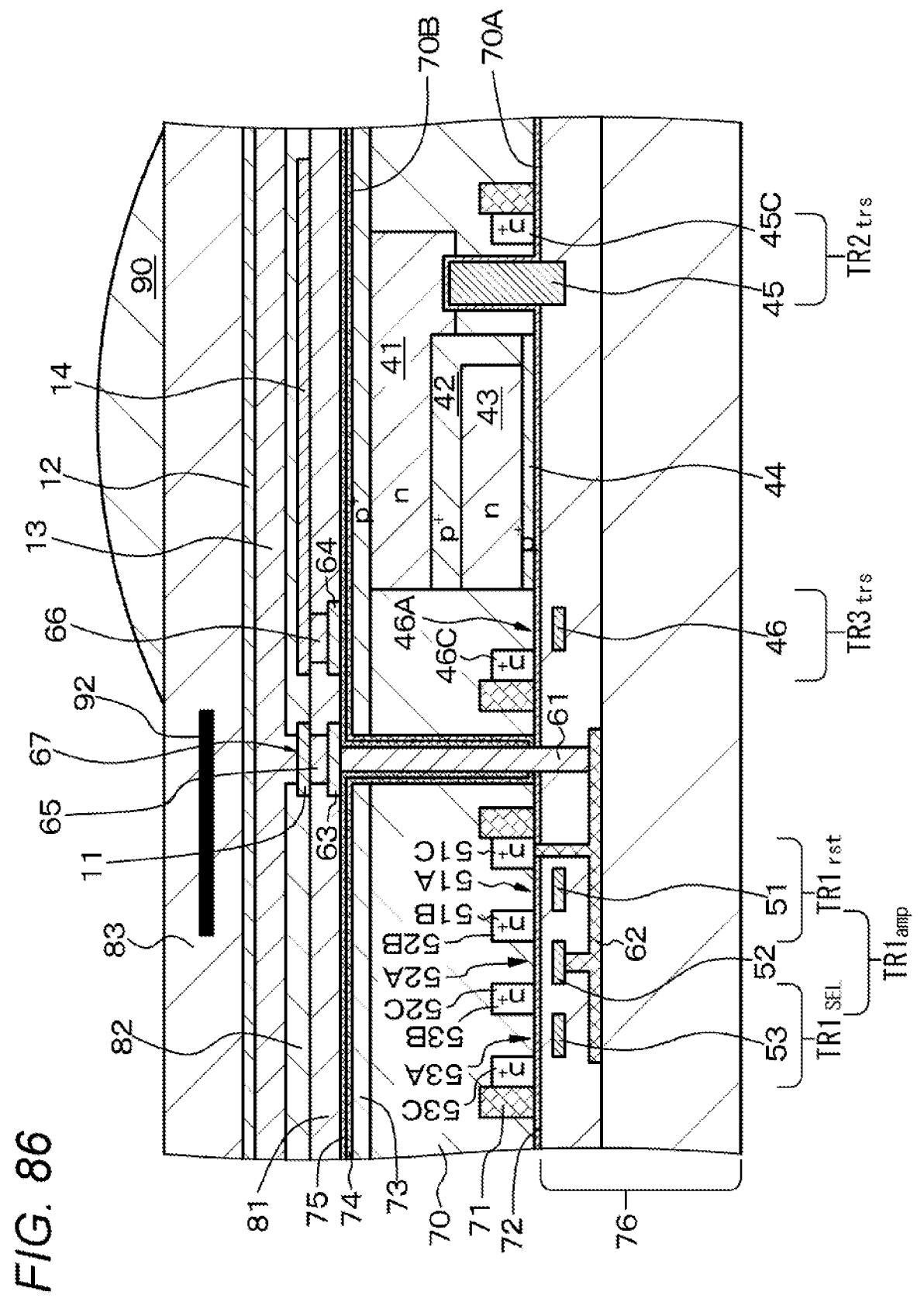

Further, as shown in FIG. 86, which shows a modification of an imaging device and a stacked imaging device explained in Example 6, light may enter from the side of the second electrode 12, and a light blocking layer 92 may be formed on the light incident side closer to the second electrode 12, for example. Note that the various wiring lines provided on the light incident side of the photoelectric conversion layer may also function as a light blocking layer.

Figure 87:
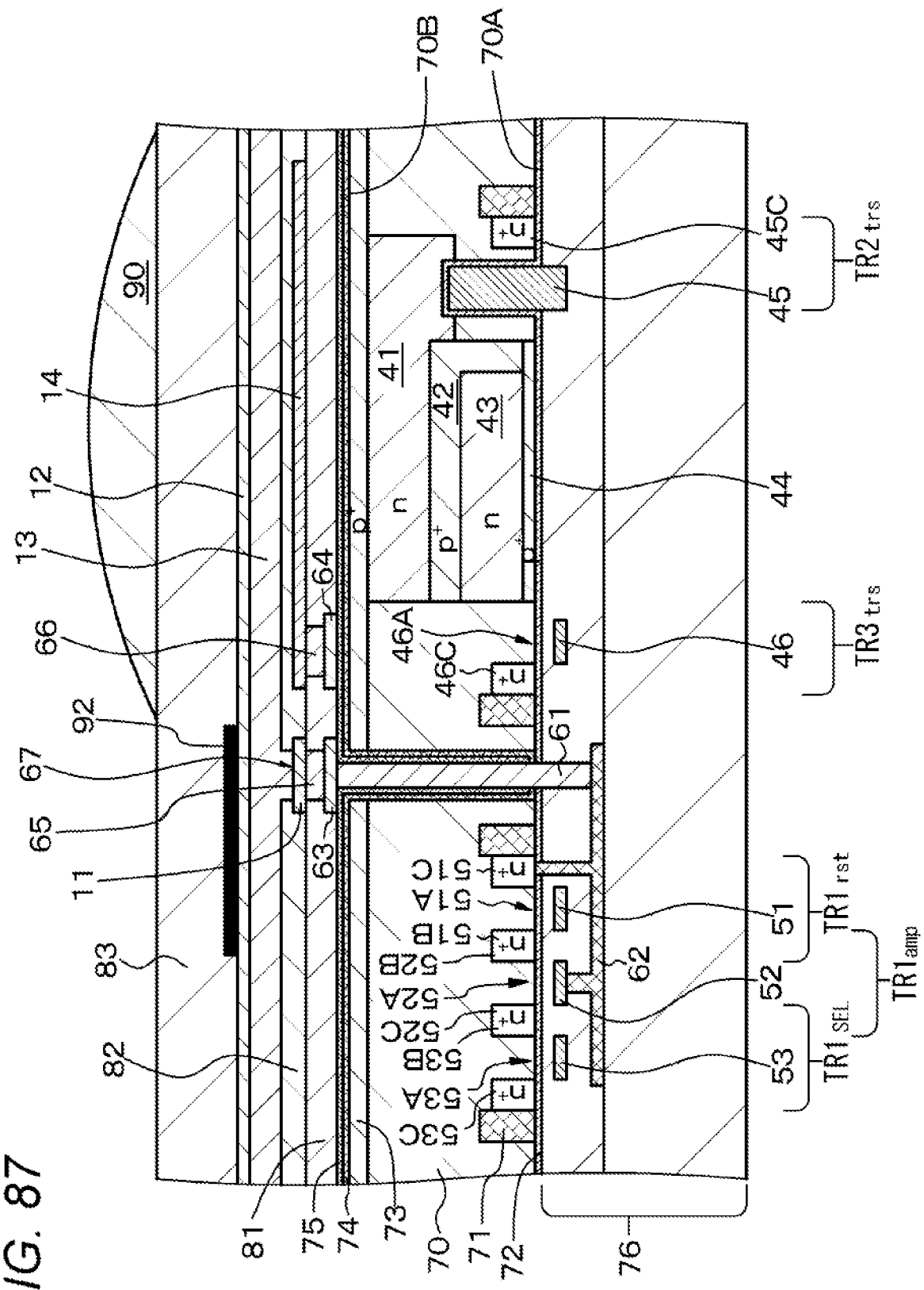
FIG. 87 is a schematic partial cross-sectional view of still another modification of an imaging device and a stacked imaging device of Example 6.
Figure 88:
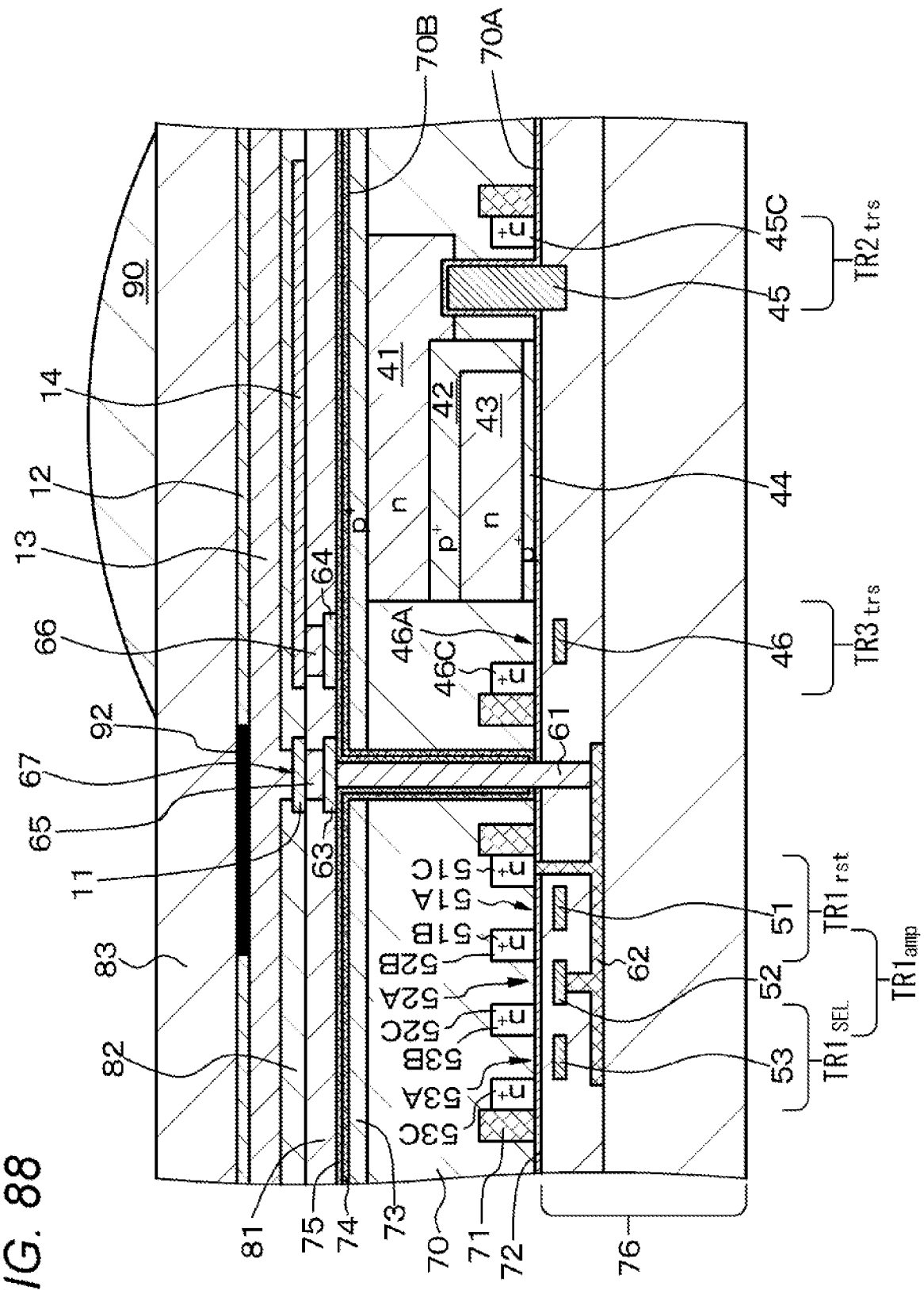
FIG. 88 is a schematic partial cross-sectional view of yet another modification of an imaging device and a stacked imaging device of Example 6.

Note that, in the example shown in FIG. 86, the light blocking layer 92 is formed above the second electrode 12, or the light blocking layer 92 is formed on the light incident side closer to the second electrode 12 and above the first electrode 11. However, the light blocking layer 92 may be disposed on a surface on the light incident side of the second electrode 12, as shown in FIG. 87. Further, in some cases, the light blocking layer 92 may be formed in the second electrode 12, as shown in FIG. 88.

Figure 89:
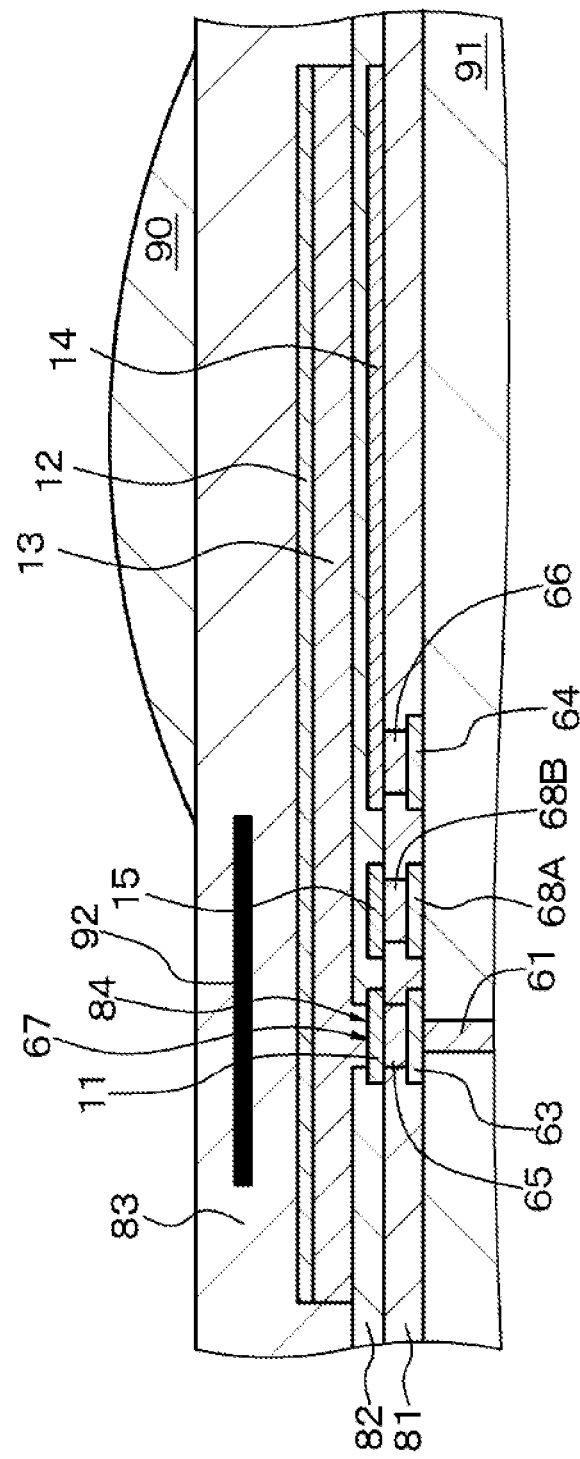
FIG. 89 is a schematic partial cross-sectional view of another modification of an imaging device and a stacked imaging device of Example 10.
Figure 90:
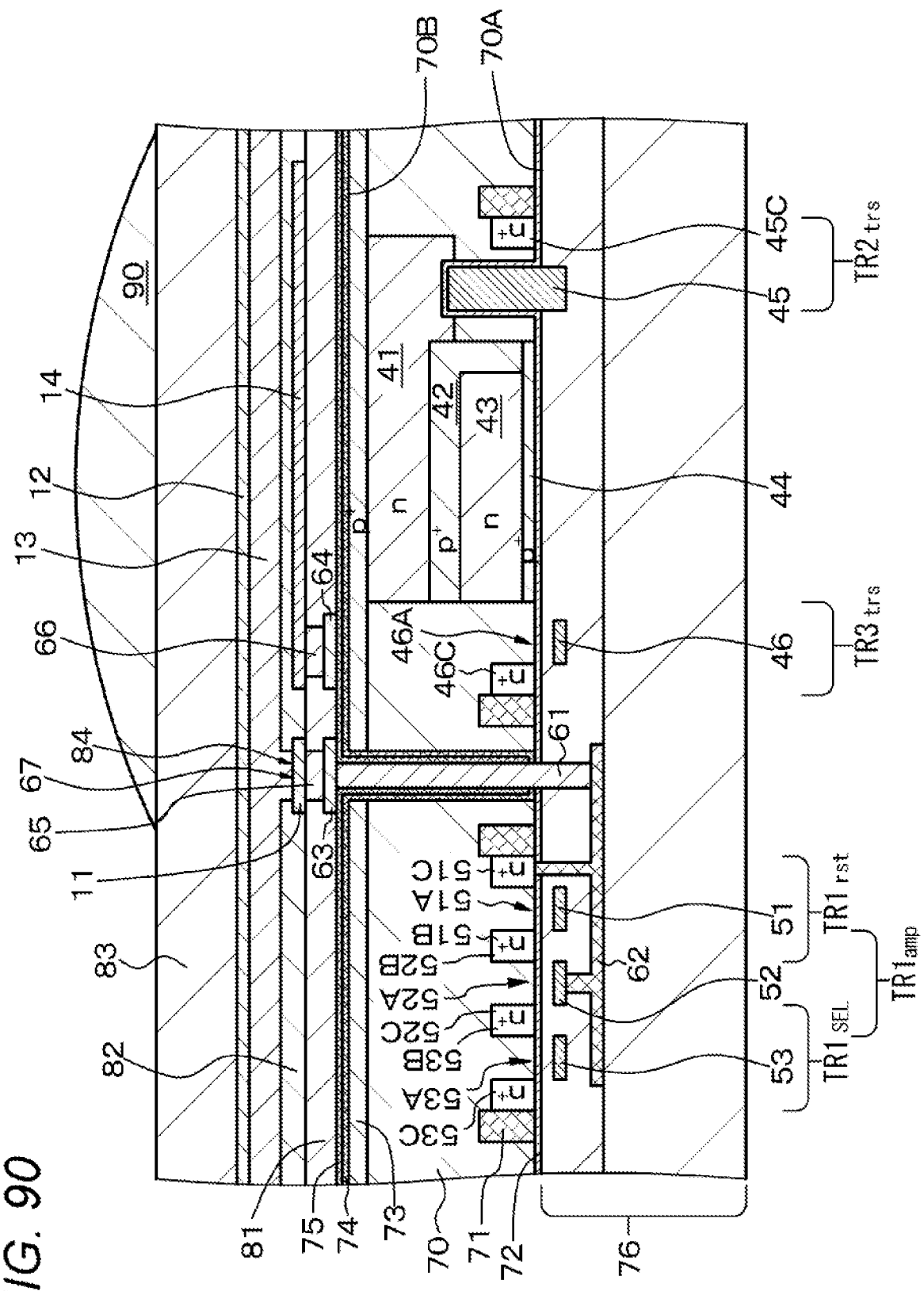
FIG. 90 is a schematic partial cross-sectional view of yet another modification of an imaging device and a stacked imaging device of Example 6.

Alternatively, light may enter from the side of the second electrode 12 while light does not enter the first electrode 11. Specifically, as shown in FIG. 86, the light blocking layer 92 is formed on the light incident side closer to the second electrode 12 and above the first electrode 11. Alternatively, as shown in FIG. 90, an on-chip microlens 90 may be provided above the charge storage electrode 14 and the second electrode 12, so that light that enters the on-chip microlens 90 is gathered to the charge storage electrode 14 and does not reach the first electrode 11. Note that, in a case where the transfer control electrode 15 is provided, light can be prohibited from entering the first electrode 11 and the transfer control electrode 15, as described in Example 10. Specifically, as shown in FIG. 89, the light blocking layer 92 may be formed above the first electrode 11 and the transfer control electrode 15. Alternatively, light that enters the on-chip microlens 90 may not reach the first electrode 11, or may not reach the first electrode 11 and the transfer control electrode 15.

As the above configuration and structure are adopted, or as the light blocking layer 92 is provided or the on-chip microlens 90 is designed so that light enters only the portion of the photoelectric conversion layer 13 located above the charge storage electrode 14, the portion of the photoelectric conversion layer 13 located above the first electrode 11 (or above the first electrode 11 and the transfer control electrode 15) does not contribute to photoelectric conversion. Thus, all the pixels can be reset more reliably at the same time, and the global shutter function can be achieved more easily. In other words, in a method for driving a solid-state imaging apparatus including a plurality of imaging devices having the above configuration and structure, the following steps are repeated.

In all the imaging devices, the electric charges in the first electrodes 11 are simultaneously released out of the system, while electric charges are accumulated in the photoelectric conversion layer 13.

After that, in all the imaging devices, the electric charges accumulated in the photoelectric conversion layer 13 are simultaneously transferred to the first electrodes 11, and after the transfer is completed, the electric charges transferred to the first electrode 11 are sequentially read out in each of the imaging devices.

In such a method for driving a solid-state imaging apparatus, each imaging device has a structure in which light that has entered from the second electrode side does not enter the first electrode, and the electric charges in the first electrodes are released out of the system while electric charges are accumulated in the photoelectric conversion layers in all the imaging devices. Thus, the first electrodes can be reliably reset at the same time in all the imaging devices. After that, the electric charges accumulated in the photoelectric conversion layers are simultaneously transferred to the first electrodes in all the imaging devices, and, after the transfer is completed, the electric charges transferred to the first electrode are sequentially read out in each imaging device. Thus, a so-called global shutter function can be easily achieved.

Figure 91:
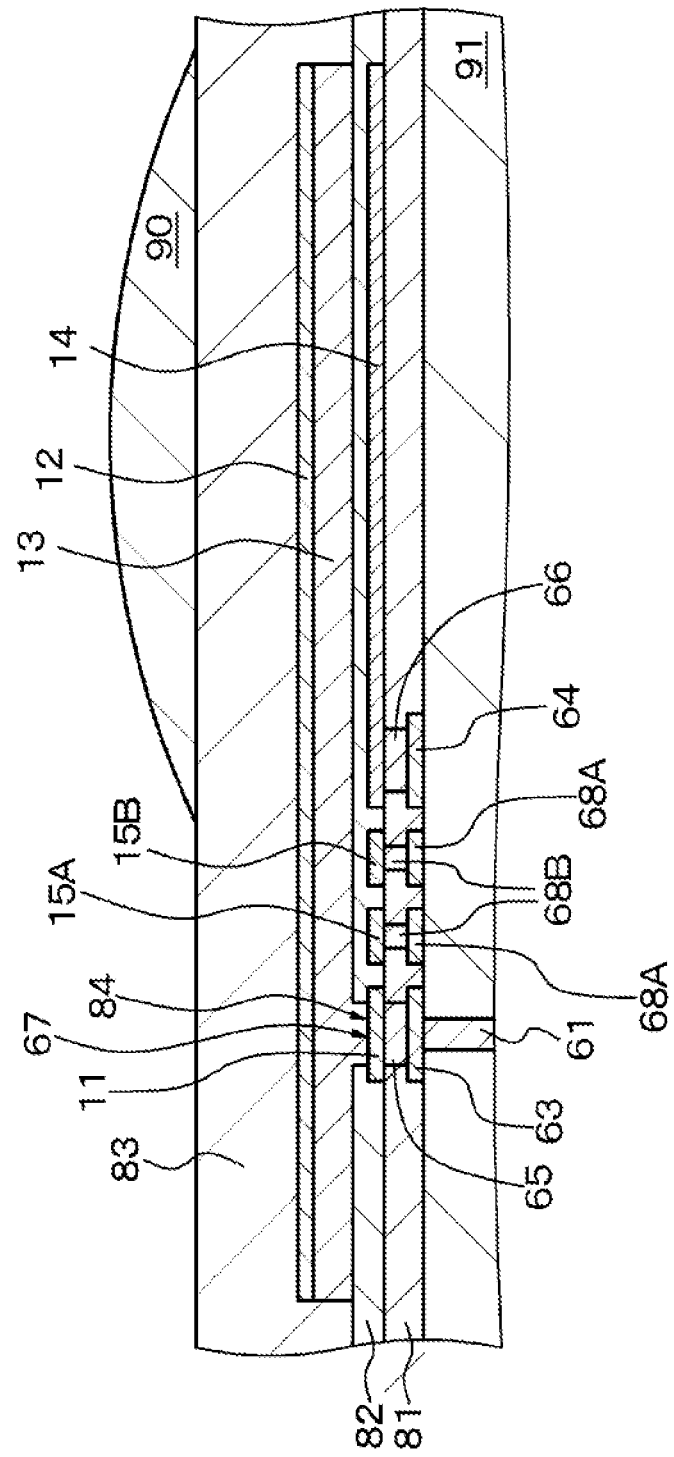
FIG. 91 is a schematic partial cross-sectional view of still another modification of an imaging device and a stacked imaging device of Example 6.

Further, in a modification of Example 10, a plurality of transfer control electrodes may be arranged from the position closest to the first electrode 11 toward the charge storage electrode 14, as shown in FIG. 90. Note that FIG. 91 shows an example in which two transfer control electrodes 15A and 15B are provided. Further, the on-chip microlens 90 may be provided above the charge storage electrode 14 and the second electrode 12, so that light that enters the on-chip microlens 90 is gathered to the charge storage electrode 14 and does not reach the first electrode 11 and the transfer control electrodes 15A and 15B.

Figure 92:
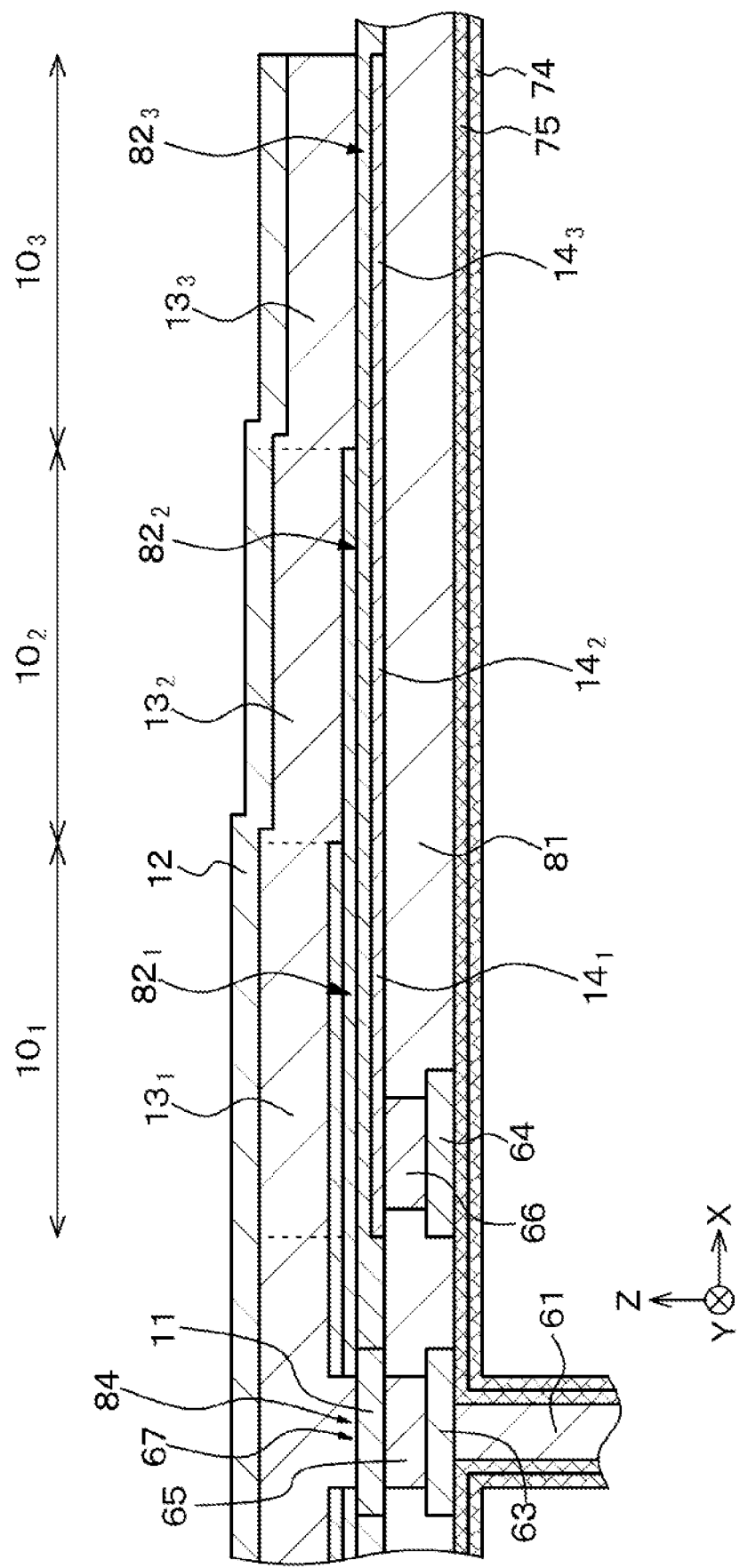
FIG. 92 is a schematic partial cross-sectional view showing an enlarged view of the portion in which a charge storage electrode, a photoelectric conversion layer, and a second electrode are stacked in a modification of an imaging device of Example 12.

In Example 12 shown in FIGS. 56 and 57, the thicknesses of the charge storage electrode segments $14_1$, $14_2$, and $14_3$ are made to become gradually smaller, so that the thicknesses of the insulating layer segments $82_1$, $82_2$, and $82_3$ become gradually greater. On the other hand, as shown in FIG. 92, which shows a schematic partial cross-sectional view with an enlarged view of the portion in which the charge storage electrode, the photoelectric conversion layer, and the second electrode are stacked in a modification of Example 12, the thicknesses of the charge storage electrode segments $14_1$, $14_2$, and $14_3$ may be made uniform, while the thicknesses of the insulating layer segments $82_1$, $82_2$, and $82_3$ are made to become gradually greater. Note that the thicknesses of the photoelectric conversion layer segments $13_1$, $13_2$, and $13_3$ are uniform.

Figure 93:
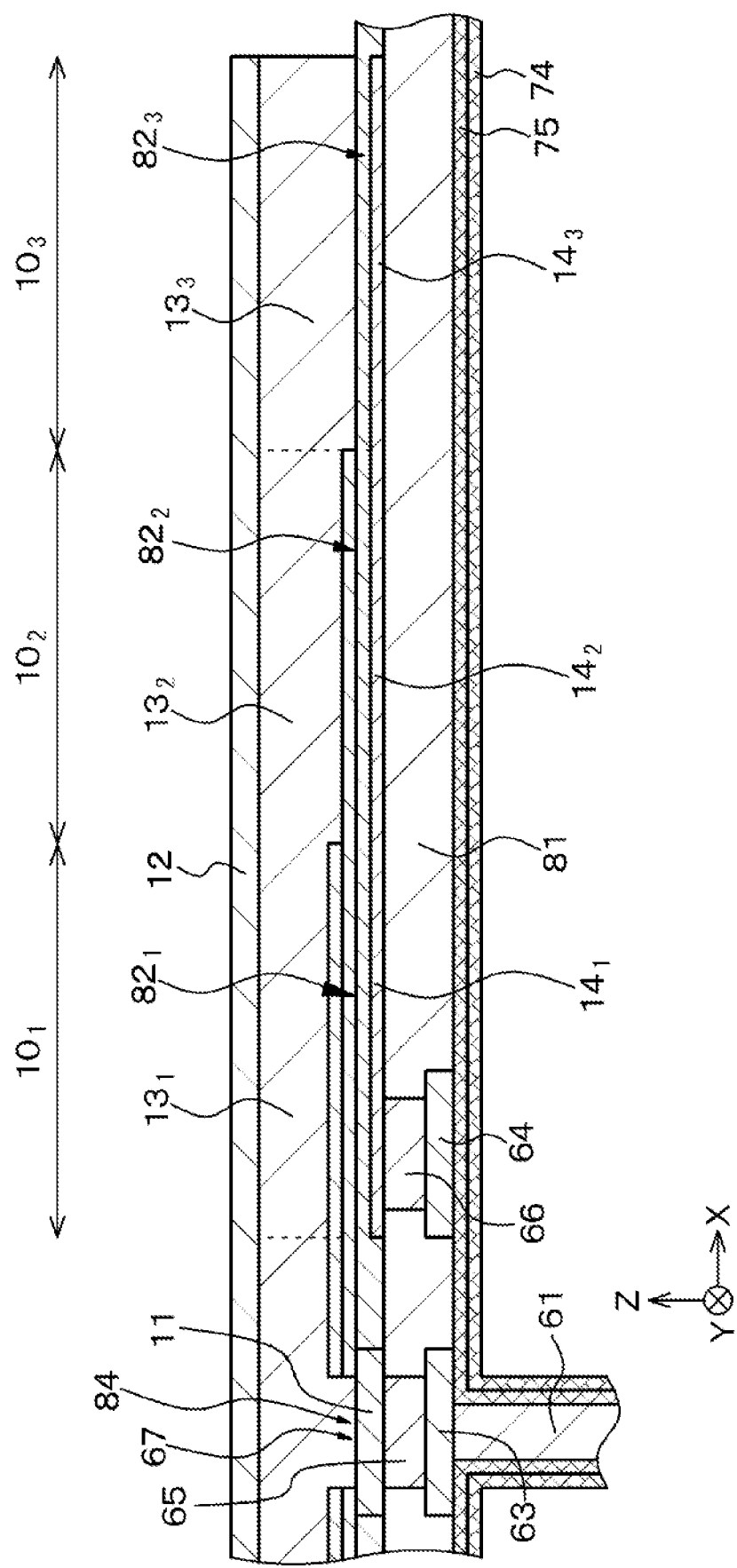
FIG. 93 is a schematic partial cross-sectional view showing an enlarged view of the portion in which a charge storage electrode, a photoelectric conversion layer, and a second electrode are stacked in a modification of an imaging device of Example 13.

Further, in Example 13 shown in FIG. 59, the thicknesses of the charge storage electrode segments $14_1$, $14_2$, and $14_3$ are made to become gradually smaller, so that the thicknesses of the photoelectric conversion layer segments $13_1$, $13_2$, and $13_3$ become gradually greater. On the other hand, as shown in FIG. 93, which is a schematic partial cross-sectional view with an enlarged view of the portion in which the charge storage electrode, the photoelectric conversion layer, and the second electrode are stacked in a modification of Example 13, the thicknesses of the charge storage electrode segments $14_1$, $14_2$, and $14_3$ may be made uniform, and the thicknesses of the insulating layer segments $82_1$, $82_2$, and $82_3$ may be made to become gradually smaller, so that the thicknesses of the photoelectric conversion layer segments $13_1$, $13_2$, and $13_3$ become gradually greater.

It should go without saying that the various modifications described above may also be applied to Examples other than Example 6.

In Examples, electrons are used as signal charges, and the conductivity type of the photoelectric conversion layer formed on the semiconductor substrate is n-type. However, the present technology may also be applied to a solid-state imaging apparatus in which holes are used as signal charges. In this case, each semiconductor region is only required to be formed with a semiconductor region of the opposite conductivity type, and the conductivity type of the photoelectric conversion layer formed on the semiconductor substrate is only required to be p-type.

Further, in the example cases described in Examples, the present technology is applied to CMOS solid-state imaging apparatuses in each of which unit pixels that detect signal charges corresponding to incident light quantities as physical quantities are arranged in a matrix. However, the present technology is not necessarily applied to such CMOS solid-state imaging apparatuses, and may also be applied to CCD solid-state imaging apparatuses. In the latter case, signal charges are transferred in a vertical direction by a vertical transfer register of a CCD structure, are transferred in a horizontal direction by a horizontal transfer register, and are amplified, so that pixel signals (image signals) are output. Further, the present disclosure is not necessarily applied to general solid-state imaging apparatuses of a column type in which pixels are arranged in a two-dimensional matrix, and a column signal processing circuit is provided for each pixel row. Furthermore, the selection transistor may also be omitted in some cases.

Further, imaging devices and stacked imaging devices of the present disclosure are not necessarily used in a solid-state imaging apparatus that senses a distribution of visible incident light and captures the distribution as an image, but may also be used in a solid-state imaging apparatus that captures an incident amount distribution of infrared rays, X-rays, particles, or the like as an image. Also, in a broad sense, the present disclosure may be applied to any solid-state imaging apparatus (physical quantity distribution detection apparatus), such as a fingerprint detection sensor that detects a distribution of other physical quantities such as pressure and capacitance and captures such a distribution as an image.

Further, the present disclosure is not limited to solid-state imaging apparatuses that sequentially scan respective unit pixels in the imaging region by the row, and read pixel signals from the respective unit pixels. The present disclosure may also be applied to a solid-state imaging apparatus of an X-Y address type that selects desired pixels one by one, and reads pixel signals from the selected pixels one by one. A solid-state imaging apparatus may be in the form of a single chip, or may be in the form of a module that is formed by packaging an imaging region together with a drive circuit or an optical system, and has an imaging function.

Further, the present disclosure is not necessarily applied to solid-state imaging apparatuses, but may also be applied to imaging apparatuses. Here, an imaging apparatus is a camera system, such as a digital still camera or a video camera, or an electronic apparatus that has an imaging function, such as a portable telephone device. The form of a module mounted on an electronic apparatus, or a camera module, is an imaging apparatus in some cases.

Figure 94:
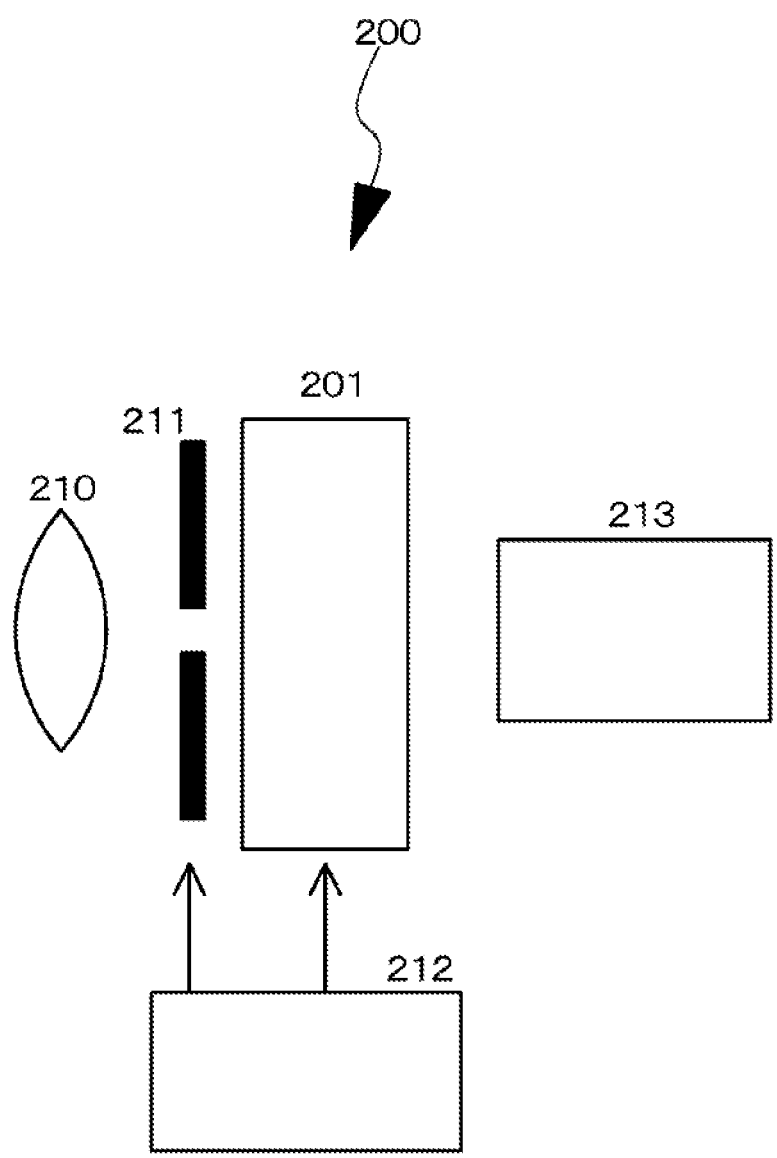
FIG. 94 is a conceptual diagram of an example using a solid-state imaging apparatus including imaging devices and stacked imaging devices of the present disclosure in an electronic apparatus (a camera).
Figure 95:
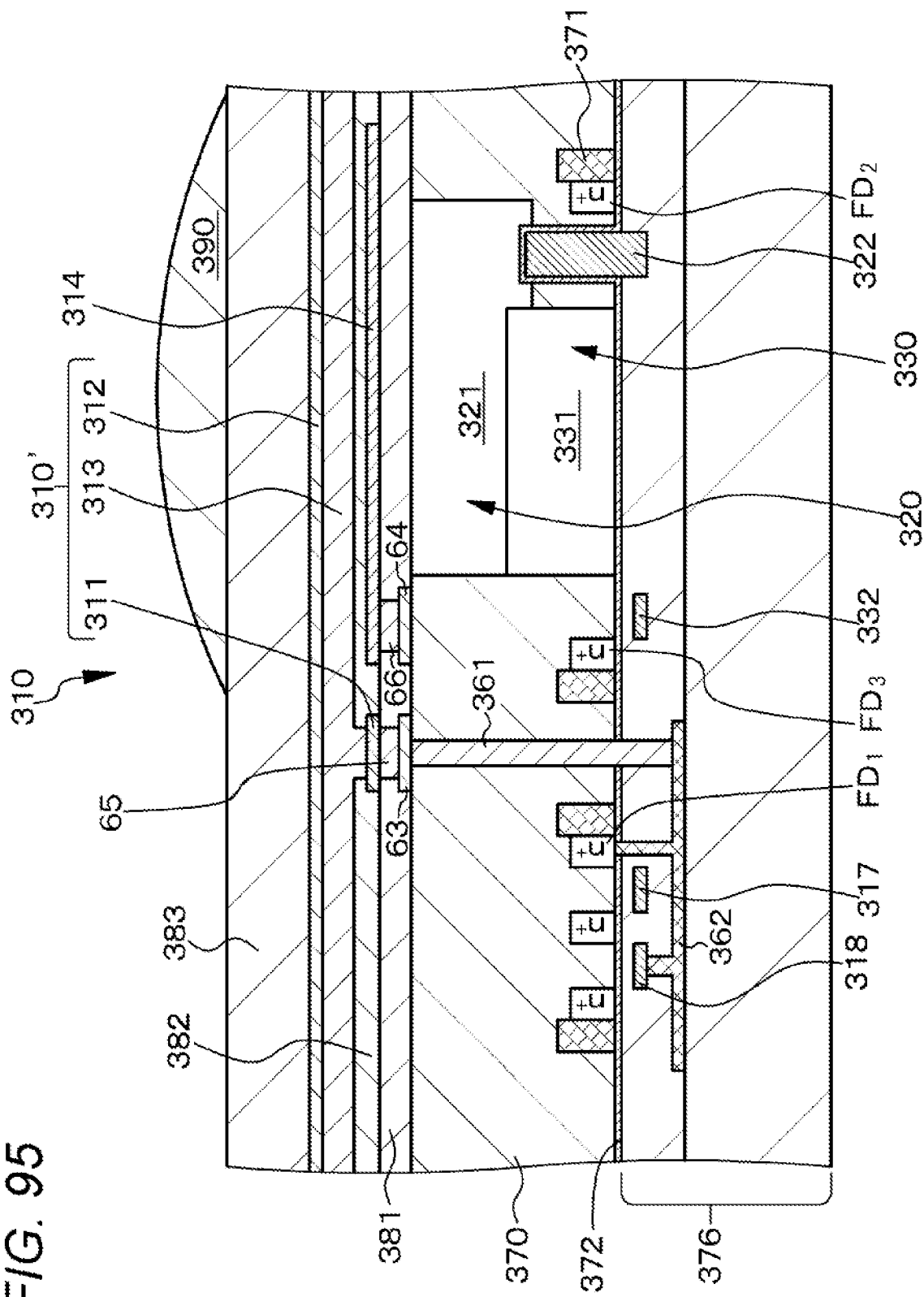
FIG. 95 is a conceptual diagram of a conventional stacked imaging device (a stacked solid-state imaging apparatus).

FIG. 94 is a conceptual diagram showing an example in which a solid-state imaging apparatus 201 including imaging devices and stacked imaging devices of the present disclosure is used for an electronic apparatus (a camera) 200. An electronic apparatus 200 includes the solid-state imaging apparatus 201, an optical lens 210, a shutter device 211, a drive circuit 212, and a signal processing circuit 213. The optical lens 210 gathers image light (incident light) from an object, and forms an image on the imaging surface of the solid-state imaging apparatus 201. With this, signal charges are stored in the solid-state imaging apparatus 201 for a certain period of time. The shutter device 211 controls the light exposure period and the light blocking period for the solid-state imaging apparatus 201. The drive circuit 212 supplies drive signals for controlling transfer operation and the like of the solid-state imaging apparatus 201, and shutter operation of the shutter device 211. In accordance with a drive signal (a timing signal) supplied from the drive circuit 212, the solid-state imaging apparatus 201 performs signal transfer. The signal processing circuit 213 performs various kinds of signal processing. Video signals subjected to the signal processing are stored into a storage medium such as a memory, or are output to a monitor. In such an electronic apparatus 200, it is possible to achieve miniaturization of the pixel size and improvement of the transfer efficiency in the solid-state imaging apparatus 201. Thus, the electronic apparatus 200 having its pixel characteristics improved can be obtained. The electronic apparatus 200 to which the solid-state imaging apparatus 201 can be applied is not necessarily a camera, but may be an imaging apparatus such as a camera module for mobile devices such as a digital still camera and a portable telephone device.

Note that the present disclosure may also be embodied in the configurations described below.

[A01] «Imaging Apparatus: The First Embodiment»

An imaging device including:
a first electrode;
a charge storage electrode disposed at a distance from the first electrode;
a photoelectric conversion layer that is formed in contact with the first electrode and is located above the charge storage electrode, with an insulating layer being interposed between the charge storage electrode and the photoelectric conversion layer; and
a second electrode formed on the photoelectric conversion layer, in which
the portion of the insulating layer located between the charge storage electrode and the photoelectric conversion layer includes a first region and a second region,
the portion of the insulating layer that occupies the first region is formed with a first insulating layer,
the portion of the insulating layer that occupies the second region is formed with a second insulating layer, and
the absolute value of the fixed charge of the material forming the second insulating layer is smaller than the absolute value of the fixed charge of the material forming the first insulating layer.

[A02] The imaging device according to [A01], in which
the second region is located facing the first electrode, and
the first region is located adjacent to the second region.

[A03] The imaging device according to [A02], in which the material forming the first insulating layer has the same polarity as the polarity of carriers to be generated in the photoelectric conversion layer and be sent to the first electrode.

[A04] The imaging device according to [A03], in which
the carriers to be sent to the first electrode are electrons,
the first insulating layer is formed with at least one material selected from the group including aluminum oxide, hafnium oxide, zirconium oxide, tantalum oxide, and titanium oxide, and
the second insulating layer is formed with silicon oxide.

[A05] The imaging device according to any one of [A02] to [A04], in which a second insulating layer extension portion extending from the second insulating layer is formed between the first insulating layer and the photoelectric conversion layer.

[A06] The imaging device according to [A01], in which
the first region is located facing the first electrode, and
the second region is located adjacent to the first region.

[A07] The imaging device according to [A06], in which the material forming the first insulating layer has a different polarity from the polarity of carriers to be generated in the photoelectric conversion layer and be sent to the first electrode.

[A08] The imaging device according to [A07], in which
the carriers to be sent to the first electrode are electrons,
the first insulating layer is formed with silicon oxynitride or silicon nitride, and
the second insulating layer is formed with silicon oxide.

[A09] The imaging device according to any one of [A06] to [A08], in which a second insulating layer extension portion extending from the second insulating layer is formed between the first insulating layer and the photoelectric conversion layer.

[A10] The imaging device according to [A01], in which
the portion of the insulating layer located between the charge storage electrode and the photoelectric conversion layer further includes a third region,
the first region is located facing the first electrode,
the third region is located adjacent to the first region,
the second region is located between the first region and the photoelectric conversion layer, and between the third region and the photoelectric conversion layer,
the portion of the insulating layer that occupies the third region is formed with a third insulating layer, and
the absolute value of the fixed charge of the material forming the second insulating layer is smaller than the absolute value of the fixed charge of the material forming the third insulating layer.

[A11] The imaging device according to [A10], in which
the material forming the first insulating layer has a different polarity from the polarity of the carriers to be generated in the photoelectric conversion layer and be sent to the first electrode, and
the material forming the third insulating layer has the same polarity as the polarity of the carriers to be generated in the photoelectric conversion layer and be sent to the first electrode.

[A12] The imaging device according to [A11], in which
the carriers to be sent to the first electrode are electrons,
the first insulating layer is formed with silicon oxynitride or silicon nitride,
the third insulating layer is formed with at least one material selected from the group including aluminum oxide, hafnium oxide, zirconium oxide, tantalum oxide, and titanium oxide, and
the second insulating layer is formed with silicon oxide.

[A13] The imaging device according to any one of [A01] to [A12], in which
an insulating material layer is provided between the first electrode and the charge storage electrode, and
the material forming the insulating material layer has a different polarity from the polarity of the carriers to be generated in the photoelectric conversion layer and be sent to the first electrode.

[A14] The imaging device according to any one of [A01] to [A13], in which
a second insulating material layer is provided in contact with at least part of the portion of the charge storage electrode not facing the first electrode, and the material forming the second insulating material layer has the same polarity as the polarity of the carriers to be generated in the photoelectric conversion layer and be sent to the first electrode.

[A15] «Imaging Device: The Second Embodiment»

An imaging device including:
a first electrode;
a charge storage electrode disposed at a distance from the first electrode;
a photoelectric conversion layer that is formed in contact with the first electrode and is located above the charge storage electrode, with an insulating layer being interposed between the charge storage electrode and the photoelectric conversion layer; and
a second electrode formed on the photoelectric conversion layer, in which
an insulating material layer is provided between the first electrode and the charge storage electrode, and
the material forming the insulating material layer has a different polarity from the polarity of carriers to be generated in the photoelectric conversion layer and be sent to the first electrode.

[A16] The imaging device according to [A15], in which the insulating layer extends along at least a portion between the photoelectric conversion layer and the insulating material layer.

[A17] The imaging device according to [A15] or [A16], in which
a second insulating material layer is provided in contact with at least part of the portion of the charge storage electrode not facing the first electrode, and
the material forming the second insulating material layer has the same polarity as the polarity of the carriers to be generated in the photoelectric conversion layer and be sent to the first electrode.

[A18] The imaging device according to [A17], in which
the carriers to be sent to the first electrode are electrons,
the insulating material layer is formed with silicon oxynitride or silicon nitride, and
the second insulating material layer is formed with at least one material selected from the group including aluminum oxide, hafnium oxide, zirconium oxide, tantalum oxide, and titanium oxide.

[A19] «Imaging Device: The Third Embodiment»

An imaging device including:
a first electrode;
a charge storage electrode disposed at a distance from the first electrode;
a photoelectric conversion layer that is formed in contact with the first electrode and is located above the charge storage electrode, with an insulating layer being interposed between the charge storage electrode and the photoelectric conversion layer; and
a second electrode formed on the photoelectric conversion layer, in which
an insulating material layer is formed in contact with at least part of the portion of the charge storage electrode not facing the first electrode, and
the material forming the insulating material layer has the same polarity as the polarity of carriers to be generated in the photoelectric conversion layer and be sent to the first electrode.

[A20] The imaging device according to [A19], in which
the carriers to be sent to the first electrode are electrons, and
the insulating material layer is formed with at least one material selected from the group including aluminum oxide, hafnium oxide, zirconium oxide, tantalum oxide, and titanium oxide.

[B01] The imaging device according to any one of [A01] to [A20], in which a charge transfer control electrode is formed a region facing the region of the photoelectric conversion layer located between the imaging device and an adjacent imaging device, with an insulating layer being interposed between the region and the charge transfer control electrode.

[B02] The imaging device according to any one of [A01] to [A20], in which a charge transfer control electrode, instead of the second electrode, is formed on the region of the photoelectric conversion layer located between the imaging device and an adjacent imaging device.

[B03] The imaging device according to [B01], further including
a control unit that is disposed in a semiconductor substrate, and includes a drive circuit,
the first electrode, the second electrode, the charge storage electrode, and the charge transfer control electrode are connected to the drive circuit,
in a charge accumulation period, the drive circuit applies a potential $V_{11}$ to the first electrode, a potential $V_{12}$ to the charge storage electrode, and a potential $V_{13}$ to the charge transfer control electrode, to accumulate electric charges in the photoelectric conversion layer, and,
in a charge transfer period, the drive circuit applies a potential $V_{21}$ to the first electrode, a potential $V_{22}$ to the charge storage electrode, and a potential $V_{23}$ to the charge transfer control electrode, to read the electric charges accumulated in the photoelectric conversion layer into the control unit via the first electrode.

Here, in a case where the potential of the first electrode is higher than the potential of the second electrode, $V_{12} \geq V_{11}, V_{12} > V_{13}$, and $V_{21} > V_{22} > V_{23}$, and, in a case where the potential of the first electrode is lower than the potential of the second electrode, $V_{12} \leq V_{11}, V_{12} < V_{13}$, and $V_{21} < V_{22} < V_{23}$.

[B04] The imaging device according to [B02], further including
a control unit that is disposed in a semiconductor substrate, and includes a drive circuit,
the first electrode, the second electrode, the charge storage electrode, and the charge transfer control electrode are connected to the drive circuit,
in a charge accumulation period, the drive circuit applies a potential $V_2'$ to the second electrode, and a potential $V_{13}'$ to the charge transfer control electrode, to accumulate electric charges in the photoelectric conversion layer, and,
in a charge transfer period, the drive circuit applies a potential $V_2''$ to the second electrode, and a potential $V_{23}''$ to the charge transfer control electrode, to read the electric charges accumulated in the photoelectric conversion layer into the control unit via the first electrode.

Here, in a case where the potential of the first electrode is higher than the potential of the second electrode, $V_2' \geq V_{13}'$ and $V_2'' \geq V_{23}''$, and, in a case where the potential of the first electrode is lower than the potential of the second electrode, $V_2' \leq V_{13}'$ and $V_2'' \leq V_{23}''$.

[B05] The imaging device according to any one of [A01] to [B04], further including
a semiconductor substrate,
in which a photoelectric conversion unit is disposed above the semiconductor substrate.
[B06] The imaging device according to any one of [A01] to [B05], further including
a transfer control electrode that is disposed between the first electrode and the charge storage electrode, is located at a distance from the first electrode and the charge storage electrode, and is positioned to face the photoelectric conversion layer via the insulating layer.
[B07] The imaging device according to any one of [A01] to [B06], in which the charge storage electrode is formed with a plurality of charge storage electrode segments.
[B08] The imaging device according to any one of [A01] to [B07], in which the size of the charge storage electrode is larger than the first electrode.
[B09] The imaging device according to any one of [A01] to [B08], in which the first electrode extends in an opening formed in the insulating layer, and is connected to the photoelectric conversion layer.
[B10] The imaging device according to any one of [A01] to [B08], in which the photoelectric conversion layer extends in an opening formed in the insulating layer, and is connected to the first electrode.
[B11] The imaging device according to [B10], in which
the edge portion of the top surface of the first electrode is covered with the insulating layer,
the first electrode is exposed through the bottom surface of the opening, and
a side surface of the opening is a slope spreading from a first surface toward a second surface, the first surface being the surface of the insulating layer in contact with the top surface of the first electrode, the second surface being the surface of the insulating layer in contact with the portion of the photoelectric conversion layer facing the charge storage electrode.
[B12] The imaging device according to [B11], in which the side surface of the opening having the slope spreading from the first surface toward the second surface is located on the charge storage electrode side.
[B13]«Control of the Potentials of the First Electrode and the Charge Storage Electrode»
The imaging device according to any one of [A01] to [B12], further including
a control unit that is disposed in a semiconductor substrate, and includes a drive circuit, in which
the first electrode and the charge storage electrode are connected to the drive circuit,
in a charge accumulation period, the drive circuit applies a potential $V_{11}$ to the first electrode, and a potential $V_{12}$ to the charge storage electrode, to accumulate electric charges in the photoelectric conversion layer, and,
in a charge transfer period, the drive circuit applies a potential $V_{21}$ to the first electrode, and a potential $V_{22}$ to the charge storage electrode, to read the electric charges accumulated in the photoelectric conversion layer into the control unit via the first electrode.
Here, in a case where the potential of the first electrode is higher than the potential of the second electrode, $V_{12} \geq V_{11}$, and $V_{22} < V_{21}$, and, in a case where the potential of the first electrode is lower than the potential of the second electrode, $V_{12} \leq V_{11}$, and $V_{22} > V_{21}$.

[B14]«Charge Storage Electrode Segments»
The imaging device according to any one of [A01] to [B06], in which the charge storage electrode is formed with a plurality of charge storage electrode segments.
[B15] The imaging device according to [B14], in which,
in a case where the potential of the first electrode is higher than the potential of the second electrode, the potential to be applied to the charge storage electrode segment located closest to the first electrode is higher than the potential to be applied to the charge storage electrode segment located farthest from the first electrode in a charge transfer period, and,
in a case where the potential of the first electrode is lower than the potential of the second electrode, the potential to be applied to the charge storage electrode segment located closest to the first electrode is lower than the potential to be applied to the charge storage electrode segment located farthest from the first electrode in a charge transfer period.
[B16] The imaging device according to any one of [A01] to [B15], in which
at least a floating diffusion layer and an amplification transistor that constitute a control unit are disposed in a semiconductor substrate, and
the first electrode is connected to the floating diffusion layer and the gate portion of the amplification transistor.
[B17] The imaging device according to [B16], in which
a reset transistor and a selection transistor that constitute the control unit are further disposed in the semiconductor substrate,
the floating diffusion layer is connected to one source/drain region of the reset transistor, and
one source/drain region of the amplification transistor is connected to one source/drain region of the selection transistor, and the other source/drain region of the selection transistor is connected to a signal line.
[B18] The imaging device according to any one of [A01] to [B17], in which light enters from the second electrode side, and a light blocking layer is formed on a light incident side closer to the second electrode.
[B19] The imaging device according to any one of [A01] to [B17], in which light enters from the second electrode side, and light does not enter the first electrode.
[B20] The imaging device according to [B19], in which a light blocking layer is formed on a light incident side closer to the second electrode and above the first electrode.
[B21] The imaging device according to [B19], in which
an on-chip microlens is provided above the charge storage electrode and the second electrode, and
light that enters the on-chip microlens is gathered to the charge storage electrode.
[C01]«Imaging Device: The First Configuration»
The imaging device according to any one of [A01] to [B21], in which
a photoelectric conversion unit is formed with N (N≥2) photoelectric conversion unit segments,
the photoelectric conversion layer is formed with N photoelectric conversion layer segments,
the insulating layer is formed with N insulating layer segments,
the charge storage electrode is formed with N charge storage electrode segments,
the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the thicknesses of the insulating layer segments gradually vary from the first photoelectric conversion unit segment to the Nth photoelectric conversion unit segment.

[C02]«Imaging Device: The Second Configuration»

The imaging device according to any one of [A01] to [B21], in which a photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the thicknesses of the photoelectric conversion layer segments gradually vary from the first photoelectric conversion unit segment to the Nth photoelectric conversion unit segment.

[C03]«Imaging Device: The Third Configuration»

The imaging device according to any one of [A01] to [B21], in which a photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the insulating layer segment differs between adjacent photoelectric conversion unit segments.

[C04]«Imaging Device: The Fourth Configuration»

The imaging device according to any one of [A01] to [B21], in which a photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments that are disposed at a distance from one another, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the material forming the charge storage electrode segment differs between adjacent photoelectric conversion unit segments.

[C05]«Imaging Device: The Fifth Configuration»

The imaging device according to any one of [A01] to [B21], in which the photoelectric conversion unit is formed with N (N≥2) photoelectric conversion unit segments, the photoelectric conversion layer is formed with N photoelectric conversion layer segments, the insulating layer is formed with N insulating layer segments, the charge storage electrode is formed with N charge storage electrode segments that are disposed at a distance from one another, the nth (n=1, 2, 3, . . . , N) photoelectric conversion unit segment includes the nth charge storage electrode segment, the nth insulating layer segment, and the nth photoelectric conversion layer segment, a photoelectric conversion unit segment having a greater value as n is located farther away from the first electrode, and the areas of the charge storage electrode segments become gradually smaller from the first photoelectric conversion unit segment to the Nth photoelectric conversion unit segment.

[C06]«Imaging Device: The Sixth Configuration»

The imaging device according to any one of [A01] to [B21], in which, when the stacking direction of the charge storage electrode, the insulating layer, and the photoelectric conversion layer is the Z direction, and the direction away from the first electrode is the X direction, the cross-sectional area of a stacked portion of the charge storage electrode, the insulating layer, and the photoelectric conversion layer taken along a Y-Z virtual plane varies depending on the distance from the first electrode.

[D01]«Stacked Imaging Device»

A stacked imaging device including at least one imaging device according to any one of [A01] to [C06].

[E01] «Solid-State Imaging Apparatus: The First Embodiment»

A solid-state imaging apparatus including a plurality of imaging devices according to any one of [A01] to [C06].

[E02] «Solid-State Imaging Apparatus: The Second Embodiment»

A solid-state imaging apparatus including a plurality of stacked imaging devices according to [D01].

[E03]«Solid-State Imaging Apparatus: The First Configuration»

A solid-state imaging apparatus including a plurality of imaging devices according to any one of [A01] to [B06], in which an imaging device block is formed with a plurality of imaging devices, and a first electrode is shared by the plurality of imaging devices constituting the imaging device block.

[E04]«Solid-State Imaging Apparatus: The Second Configuration»

A solid-state imaging apparatus including a plurality of stacked imaging devices including at least one imaging device according to any one of [A01] to [C06], in which an imaging device block is formed with a plurality of stacked imaging devices, and a first electrode is shared by the plurality of imaging devices constituting the imaging device block.

[E05] The solid-state imaging apparatus according to any one of [E01] to [E04], in which one on-chip microlens is disposed above one imaging device.

[E06] The solid-state imaging apparatus according to any one of [E01] to [E04], in which an imaging device block is formed with two imaging devices, and one on-chip microlens is disposed above the imaging device block.

[E07] The solid-state imaging apparatus according to any one of [E01] to [E06], in which one floating diffusion layer is provided for a plurality of imaging devices.

[E08] The solid-state imaging apparatus according to any one of [E01] to [E07], in which a first electrode is disposed adjacent to the charge storage electrode of each imaging device.

[E09] The solid-state imaging apparatus according to any one of [E01] to [E08], in which a first electrode is disposed adjacent to the charge storage electrode of one or some imaging devices of a plurality of imaging devices, and is not adjacent to the remaining charge storage electrodes of the plurality of imaging devices.

[E10] The solid-state imaging apparatus according to [E09], in which the distance between the charge storage electrode forming an imaging device and the charge storage electrode forming another imaging device is longer than the distance between the first electrode and the charge storage electrode in the imaging device adjacent to the first electrode.

[F01]«Method for Driving a Solid-State Imaging Apparatus»

A method for driving a solid-state imaging apparatus including: a photoelectric conversion unit in which a first electrode, a photoelectric conversion layer, and a second electrode are stacked, the photoelectric conversion unit further including a charge storage electrode that is disposed at a distance from the first electrode and is positioned to face the photoelectric conversion layer via an insulating layer; and a plurality of imaging devices each having a structure in which light enters from the second electrode side, and light does not enter the first electrode, the method including the steps of:

releasing electric charges in the first electrode from the system while accumulating electric charges in the photoelectric conversion layer simultaneously in all the imaging devices, and transferring the electric charges accumulated in the photoelectric conversion layer to the first electrode simultaneously in all the imaging devices, and then sequentially reading the electric charges transferred to the first electrode in each imaging device, the steps being repeatedly carried out.

REFERENCE SIGNS LIST $10_1$, $10_2$, $10_3$ Photoelectric conversion unit segment
11 First electrode
12 Second electrode
13 Photoelectric conversion layer
$13_A$ Region of photoelectric conversion layer located between first electrode and charge storage electrode (region-A of photoelectric conversion layer)
$13_B$ Region of photoelectric conversion layer located between imaging device and adjacent imaging device (region-B of photoelectric conversion layer)
$13_C$ Portion of photoelectric conversion layer facing charge storage electrode
$13_{DN}$, $13_{DN}'$ Lower photoelectric conversion layer
$13_{UP}$, $13_{UP}'$ Upper photoelectric conversion layer
14 Charge storage electrode
14A, 14B, 14C Charge storage electrode segment
15, 15A, 15B Transfer control electrode (charge transfer electrode)
21 Charge transfer control electrode
22 Pad portion
23 Connecting hole
24, $24_1$, $24_2$ Charge transfer control electrode
41 n-type semiconductor region forming second imaging device
43 n-type semiconductor region forming third imaging device
42, 44, 73 $p^+$-layer
$FD_1$, $FD_2$, $FD_3$, 45C, 46C Floating diffusion layer
$TR1_{amp}$ Amplification transistor
$TR1_{rst}$ Reset transistor
$TR1_{sel}$ Selection transistor
51 Gate portion of reset transistor $TR1_{rst}$
51A Channel formation region of reset transistor $TR1_{rst}$
51B, 51C Source/drain region of reset transistor $TR1_{rst}$
52 Gate portion of amplification transistor $TR1_{amp}$
52A Channel formation region of amplification transistor $TR1_{amp}$
52B, 52C Source/drain region of amplification transistor $TR1_{amp}$
53 Gate portion of selection transistor $TR1_{sel}$
53A Channel formation region of selection transistor $TR1_{sel}$
53B, 53C Source/drain region of selection transistor $TR1_{sel}$
$TR2_{trs}$ Transfer transistor
45 Gate portion of transfer transistor
$TR2_{rst}$ Reset transistor
$TR2_{amp}$ Amplification transistor
$TR2_{sel}$ Selection transistor
$TR3_{trs}$ Transfer transistor
46 Gate portion of transfer transistor
$TR3_{rst}$ Reset transistor
$TR3_{amp}$ Amplification transistor
$TR3_{sel}$ Selection transistor
$V_{DD}$ Power supply
$RST_1$, $RST_2$, $RST_3$ Reset line
$SEL_1$, $SEL_2$, $SEL_3$ Selection line
117, $VSL_1$, $VSL_2$, $VSL_3$ Signal line
$TG_2$, $TG_3$ Transfer gate line
$V_{OA}$, $V_{OB}$, $V_{OT}$, $V_{OU}$ Wiring line
61 Contact hole portion
62 Wiring layer
63, 64, 68A Pad portion
65, 68B Connecting hole
66, 67, 69 Connecting portion
70 Semiconductor substrate
70A First surface (front surface) of semiconductor substrate
70B Second surface (back surface) of semiconductor substrate
71 Device separation region
72 Oxide film
74 $HfO_2$ film
75 Insulating film
76 Interlayer insulating layer
77, 78, 81 Interlayer insulating layer
82 Insulating layer
$82a_1$, $82b_1$, $82c_1$ First region
$82a_2$, $82b_2$, $82c_2$ Second region
$82c_3$ Third region 82 Insulating layer
82A$_1$, 82B$_1$, 82C$_1$ First insulating layer
82A$_2$, 82B$_2$, 82C$_2$ Second insulating layer
82A$_2$', 82B$_2$' Second insulating layer extension portion
82C$_3$ Third insulating layer
82D Insulating material layer (first insulating material layer)
82E Insulating material layer (second insulating material layer)
82$_A$ Region of first electrode and charge storage electrode (region-a)
82$_B$ Region between imaging device and adjacent imaging device (region-b)
82$_A$' Insulating material-A
82$_B$' Insulating material-B
82$p$ First surface of insulating layer
82$b$ Second surface of insulating layer
83 Protective layer
84, 84A, 84B, 84C Opening
85, 85A Second opening
90 On-chip microlens
91 Various imaging device components located below interlayer insulating layer
92 Light blocking layer
100 Solid-state imaging apparatus
101 Stacked imaging device
111 Imaging region
112 Vertical drive circuit
113 Column signal processing circuit
114 Horizontal drive circuit
115 Output circuit
116 Drive control circuit
118 Horizontal signal line
200 Electronic apparatus (camera)
201 Solid-state imaging apparatus
210 Optical lens
211 Shutter device
212 Drive circuit
213 Signal processing circuit

The invention claimed is:

1. An imaging device, comprising:
a first electrode;
a charge storage electrode disposed at a distance from the first electrode;
a photoelectric conversion layer, wherein the photoelectric conversion layer is in contact with the first electrode, wherein the photoelectric conversion layer is located above the charge storage electrode, and wherein an insulating layer is interposed between the charge storage electrode and the photoelectric conversion layer; and
a second electrode formed on the photoelectric conversion layer,
wherein a portion of the insulating layer located between the charge storage electrode and the photoelectric conversion layer includes a first region and a second region,
wherein a portion of the insulating layer that occupies the first region is formed with a first insulating layer,
wherein a portion of the insulating layer that occupies the second region is formed with a second insulating layer,
wherein an absolute value of fixed charge of a material forming the second insulating layer is smaller than an absolute value of fixed charge of a material forming the first insulating layer,
wherein the second region faces the first electrode,
wherein the first region is located adjacent to the second region,
wherein carriers generated in the photoelectric conversion layer to be sent to the first electrode are electrons,
wherein the first insulating layer is formed with at least one material selected from the group including aluminum oxide, hafnium oxide, zirconium oxide, tantalum oxide, and titanium oxide, and
wherein the second insulating layer is formed with silicon oxide.

2. The imaging device according to claim 1, wherein
carriers to be sent to the first electrode are electrons,
the first insulating layer is formed with silicon oxynitride or silicon nitride,
the third insulating layer is formed with at least one material selected from the group including aluminum oxide, hafnium oxide, zirconium oxide, tantalum oxide, and titanium oxide, and
the second insulating layer is formed with silicon oxide.

3. The imaging device according to claim 1, wherein
an insulating material layer is provided between the first electrode and the charge storage elect rode.

4. An imaging, device, comprising:
a first electrode;
a charge storage electrode disposed at a distance from the first electrode;
a photoelectric conversion layer, wherein the photoelectric conversion layer is in contact with the first electrode, wherein the photoelectric conversion layer is located above the charge storage electrode, and wherein an insulating layer is interposed between the charge storage electrode and the photoelectric conversion layer, and
a second electrode formed on the photoelectric conversion layer,
wherein a portion of the insulating layer located between the charge storage electrode and the photoelectric conversion layer includes a first region and a second region,
wherein a portion of the insulating layer that occupies the first region is formed with a first insulating layer,
wherein a portion of the insulating layer that occupies the second region is formed with a second insulating layer,
wherein an absolute value of fixed charge of a material forming the second insulating layer is smaller than an absolute value of fixed charge of a material forming the first insulating layer,
wherein an insulating material layer is provided in contact with at least part of a portion of the charge storage electrode not facing the first electrode, and
wherein a material forming the insulating material layer is in contact with at least part of a portion of the charge storage electrode not facing the first electrode.

5. A stacked imaging device comprising at least one imaging device according to claim 1.

6. A solid-state imaging apparatus comprising a plurality of imaging devices according to claim 1.

7. A solid-state imaging apparatus comprising a plurality of stacked imaging devices according to claim 5.

8. An imaging device, comprising;
a first electrode;
a charge storage electrode disposed at a distance from the first electrode;
a photoelectric conversion layer, wherein the photoelectric conversion layer is in contact with the first electrode, wherein the photoelectric conversion layer is located above the charge storage electrode, and wherein an insulating layer is interposed between the charge storage electrode and the photoelectric conversion layer; and a second electrode formed on the photoelectric conversion layer;

wherein a portion of the insulating layer located between the charge storage electrode and the photoelectric conversion layer includes a first region and a second region, wherein a portion the insulating layer that occupies the first region is formed with a first insulating layer, wherein a portion of the insulating layer that occupies the second region is formed with a second insulating layer, wherein an absolute value of fixed charge of a material forming the second insulating layer is smaller than an absolute value of fixed charge of a material forming the first insulating layer, wherein the second region is located facing the first electrode, wherein the first region is located adjacent to the second region, and wherein a second insulating layer extension portion extending from the second insulating layer is formed between the first insulating layer and the photoelectric conversion layer.

9. An imaging device, comprising;

a first electrode;

a charge storage electrode disposed at a distance from the first electrode;

a photoelectric conversion layer, wherein the photoelectric conversion layer is in contact with the first electrode, wherein the photoelectric conversion layer is located above the charge storage electrode, and wherein an insulating layer is interposed between the charge storage electrode and the photoelectric conversion layer; and a second electrode formed on the photoelectric conversion layer, wherein a portion of the insulating layer located between the charge storage electrode and the photoelectric conversion layer includes a first region and a second region, wherein a portion of the insulating layer that occupies the first region is formed with a first insulating layer, wherein a portion of the insulating layer that occupies the second region is formed with a second insulating layer, wherein an absolute value of fixed charge of a material forming the second insulating layer is smaller than an absolute value of fixed charge of a material forming the first insulating layer, wherein the first region is located facing the first electrode, wherein the second region is located adjacent to the first region, wherein carriers generated in the photoelectric conversion layer to be sent to the first electrode are electrons, wherein the first insulating layer is formed with silicon oxynitride or silicon nitride, and wherein the second insulating layer is formed with silicon oxide.

10. An imaging device, comprising:

a first electrode;

a charge storage electrode disposed at a distance from the first electrode;

a photoelectric conversion layer, wherein the photoelectric conversion layer is in contact with the first electrode, wherein the photoelectric conversion layer is located above the charge storage electrode, and wherein an insulating layer is interposed between the charge storage electrode and the photoelectric conversion layer; and a second electrode formed on the photoelectric conversion layer, wherein a portion of the insulating layer located between the charge storage electrode and the photoelectric conversion layer includes a first region and a second region, wherein a portion of the insulating layer that occupies the first region is formed with a first insulating layer, wherein a portion of the insulating layer that occupies the second region is formed with a second insulating layer, wherein an absolute value of fixed charge of a material forming the second insulating layer is smaller than an absolute value of fixed charge of a material forming the first insulating layer, wherein the first region is located facing the first electrode, wherein the second region is located facing the first region, and wherein a second insulating layer extension portion extending from the second insulating layer is formed between the first insulating layer and the photoelectric conversion layer.

11. An imaging device, comprising:

a first electrode;

a charge storage electrode disposed at a distance from the first electrode;

a photoelectric conversion layer, wherein the photoelectric conversion layer is in contact with the first electrode, wherein the photoelectric conversion layer is located above the charge storage electrode, and wherein an insulating layer is interposed between the charge storage electrode and the photoelectric conversion layer; and a second electrode formed on the photoelectric conversion layer, wherein a portion of the insulating layer located between the charge storage electrode and the photoelectric conversion layer includes a first region and a second region, wherein a portion of the insulating layer that occupies the first region is formed with a first insulating layer, wherein a portion of the insulating layer that occupies the second region is formed with a second insulating layer, wherein an absolute value of fixed charge of a material forming the second insulating layer is smaller than an absolute value of fixed charge of a material forming the first insulating layer, wherein the portion of the insulating layer located between the charge storage electrode and the photoelectric conversion layer further includes a third region, wherein the first region is located facing the first electrode, wherein the third region is located adjacent to the first region, wherein the second region is located between the first region and the photoelectric conversion layer, and between the third region and the photoelectric conversion layer, wherein a portion of the insulating layer that occupies the third region is formed with a third insulating layer, and wherein the absolute value of the fixed charge of the material forming the second insulating layer is smaller than an absolute value of fixed charge of a material forming the third insulating layer.

* * * * *